United States Patent
Kim et al.

(10) Patent No.: US 8,384,141 B2
(45) Date of Patent: *Feb. 26, 2013

(54) SEMICONDUCTOR DEVICE WITH VERTICAL CHANNEL TRANSISTOR

(75) Inventors: Daeik Kim, Yongin-si (KR); Yongchul Oh, Suwon-si (KR); Yoosang Hwang, Suwon-si (KR); Hyun-Woo Chung, Seoul (KR); Young-Seung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/097,343

(22) Filed: Apr. 29, 2011

(65) Prior Publication Data

US 2012/0086065 A1    Apr. 12, 2012

(30) Foreign Application Priority Data

Oct. 8, 2010   (KR) .................. 10-2010-0098119

(51) Int. Cl.
   *H01L 27/108*    (2006.01)
   *H01L 29/94*    (2006.01)
   *H01L 21/336*    (2006.01)

(52) U.S. Cl. .... 257/302; 257/303; 257/301; 257/E21.41

(58) Field of Classification Search .......... 257/301–303, 257/E21.41

See application file for complete search history.

(56) References Cited

U.S. PATENT DOCUMENTS

| 6,395,597 | B2* | 5/2002 | Noble | 438/242 |
|---|---|---|---|---|
| 7,129,541 | B2 | 10/2006 | Kim et al. | |
| 7,489,003 | B2* | 2/2009 | Rhie | 257/302 |
| 2001/0010957 | A1* | 8/2001 | Forbes et al. | 438/248 |
| 2002/0028541 | A1* | 3/2002 | Lee et al. | 438/149 |

FOREIGN PATENT DOCUMENTS

| JP | 2006-295180 | 10/2006 |
|---|---|---|
| KR | 10-2005-0028628 A | 3/2005 |
| KR | 10-0688576 B1 | 2/2007 |
| KR | 10-2009-0043999 A | 5/2009 |
| KR | 10-2009-0099400 A | 9/2009 |
| KR | 10-2009-0121475 A | 11/2009 |

* cited by examiner

*Primary Examiner* — Luan C Thai

(74) *Attorney, Agent, or Firm* — Myers Bigel Sibley & Sajovec, P.A.

(57) ABSTRACT

Provided is a semiconductor device having a vertical channel transistor and method of fabricating the same. The semiconductor device includes first and second field effect transistors, wherein a channel region of the first field effect transistor serves as source/drain electrodes of the second field effect transistor, and a channel region of the second field effect transistor serves as source/drain electrodes of the first field effect transistor.

15 Claims, 128 Drawing Sheets

SEMICONDUCTOR DEVICE WITH VERTICAL CHANNEL TRANSISTOR

CROSS-REFERENCE TO RELATED APPLICATION

This U.S. non-provisional patent application claims priority under 35 U.S.C. §119 to Korean Patent Application No. 10-2010-0098119, filed on Oct. 8, 2010. This application is further related to U.S. application Ser. No. 13/097,365, entitled SEMICONDUCTOR DEVICE WITH VERTICAL CHANNEL TRANSISTOR AND METHOD OF FABRICATING THE SAME , which also claims priority under 35 U.S.C. §119 to Korean Patent Application No. 10-2010-0098120, filed on Oct. 8, 2010. The entire contents of which all applications are hereby incorporated by reference in their entirety.

BACKGROUND

1. Technical Field

The present disclosure relates to a semiconductor device and a method of fabricating the same, and more particularly, to a semiconductor device with a vertical channel transistor and a method of fabricating the same.

2. Related Art

For a high integration of a semiconductor device, a line width of patterns can be reduced, and/or the area occupied by a transistor can be reduced. The transistor includes, for example, a two-dimensional metal oxide semiconductor field effect transistor (MOSFET). The two-dimensional MOSFET includes a source electrode and a drain electrode respectively disposed at both sides of a channel region.

SUMMARY

According to an embodiment, a semiconductor memory device comprises a semiconductor substrate, a semiconductor pillar extending from the semiconductor substrate, the semiconductor pillar comprising a first region, a second region, and a third region, the second region positioned between the first region and the third region, the third region positioned between the second region and the semiconductor substrate, a first gate pattern disposed on the second region with a first insulating layer therebetween, and a second gate pattern disposed on the third region with a second insulating layer therebetween.

The semiconductor memory device may further comprise a capacitor electrically connected to the first region, a word line electrically connected to the first gate pattern, and a bit line electrically connected to the third region, the bit line disposed between the word line and the substrate, the bit line extending in a first direction and the word line extending in a second direction that is substantially perpendicular to the first direction.

The first region and the third region may have a first conductivity type, and the second region and the substrate have a second conductivity type being different from the first conductivity type.

The first gate pattern and the second gate pattern may comprise at least one of a semiconductor material or metal.

The semiconductor memory device may further comprise a third gate pattern disposed on the third region opposite to the second gate pattern and disposed substantially coplanar with the first gate pattern with respect to the semiconductor pillar with a third insulating layer therebetween.

The second gate pattern may extend beyond a boundary between the second region and the third region toward the second region such that a part of the second gate pattern is disposed over the second region.

The second gate pattern may extend beyond a boundary between the second region and the third region toward the second region such that a part of the second gate pattern is disposed over the second region.

According to an embodiment, a semiconductor memory device comprises a semiconductor substrate, a semiconductor pillar extending from the semiconductor substrate, the semiconductor pillar comprising a first region, a second region, and a third region, the second region positioned between the first region and the third region, the third region positioned between the second region and the semiconductor substrate, a first gate pattern disposed on the second region with a first insulating layer therebetween, a second gate pattern disposed on the third region with a second insulating layer therebetween, a third gate pattern disposed on the third region opposite to the second gate pattern and disposed substantially coplanar with the first gate pattern with respect to the semiconductor pillar with a third insulating layer therebetween, and a capacitor electrically connected to the first region, a word line electrically connected to the first gate pattern, and a bit line electrically connected to the third region.

The first region and the third region may have a first conductivity type, and the second region and the substrate have a second conductivity type being different from the first conductivity type.

The first gate pattern and the second gate pattern may comprise at least one of a semiconductor material or metal.

The bit line can be disposed between the word line and the substrate, the bit line extending in a first direction and the word line extending in a second direction that is substantially perpendicular to the first direction.

According to an embodiment, a method of forming a semiconductor memory device comprises forming a first trench and a second trench having substantially a same configuration in a semiconductor substrate, the first and second trenches disposed next to each other and extending in a first direction, forming a first gate pattern in the first trench and a second gate pattern in the second trench, forming a third gate pattern on the first gate pattern and in the first trench, forming a third trench across the first trench in a second direction that is substantially perpendicular to the first direction, forming a bit line in the third trench, forming a plug insulation pattern on the second gate pattern and in the second trench, and forming a word line on the third gate pattern.

The method may further comprise forming a memory element on a semiconductor pillar disposed between the first trench and the second trench, the semiconductor pillar having an active region adjacent to the third gate pattern.

The method may further comprise forming a first insulating layer on a sidewall of the first trench prior to forming the first gate pattern.

The method may further comprise forming a second insulating layer on a lower sidewall of the second trench prior to forming the second gate pattern.

The method may further comprise forming a third insulating layer on an upper sidewall of the second trench and on a top surface of the first gate pattern prior to forming the third gate pattern.

The memory element may comprise a capacitor.

The method may further comprise prior to forming the bit line, forming a lower insulation pattern in the third trench.

The method may further comprise prior to forming the bit line, performing an operation of doping in the semiconductor pillar under the active region.

The operation of doping can be performed using impurities having a conductivity type different from a conductivity type of the semiconductor substrate.

According to an embodiment, a semiconductor memory device comprises a first field effect transistor and a second field effect transistor, wherein a channel region of the first field effect transistor constitutes a source electrode of the second field effect transistor, a channel region of the second field effect transistor constitutes a drain electrode of the first field effect transistor, and the channel regions of the first and second field effect transistors are in direct contact with each other.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5A to 19A are sectional views illustrating a method of fabricating a semiconductor device according to the embodiment of the inventive concept described with reference to FIG. 4;

FIGS. 5B to 19B are perspective views illustrating a method of fabricating a semiconductor device according to the embodiment of the inventive concept described with reference to FIG. 4;

FIGS. 24A to 31A are sectional views illustrating a method of fabricating a semiconductor device according to the embodiment of the inventive concept described with reference to FIG. 23;

FIGS. 24B to 31B are perspective views illustrating a method of fabricating a semiconductor device according to the embodiment of the inventive concept described with reference to FIG. 23;

FIGS. 33A to 40A are sectional views illustrating a method of fabricating a semiconductor device according to the embodiment of the inventive concept described with reference to FIG. 32;

FIGS. 33B to 40B are perspective views illustrating a method of fabricating a semiconductor device according to the embodiment of the inventive concept described with reference to FIG. 32;

FIGS. 42A to 46A are sectional views illustrating a method of fabricating a semiconductor device according to the embodiment of the inventive concept described with reference to FIG. 41;

FIGS. 42B to 46B are perspective views illustrating a method of fabricating a semiconductor device according to the embodiment of the inventive concept described with reference to FIG. 41;

FIGS. 48A to 56A are sectional views illustrating a method of fabricating a semiconductor device according to the embodiment of the inventive concept described with reference to FIG. 47;

FIGS. 48B to 56B are perspective views illustrating a method of fabricating a semiconductor device according to the embodiment of the inventive concept described with reference to FIG. 47;

DETAILED DESCRIPTION

Advantages and features of the inventive concept, and implementation methods thereof will be clarified through following embodiments described with reference to the accompanying drawings. The inventive concept may, however, be embodied in different forms and should not be construed as limited to the embodiments set forth herein.

Figure 1:
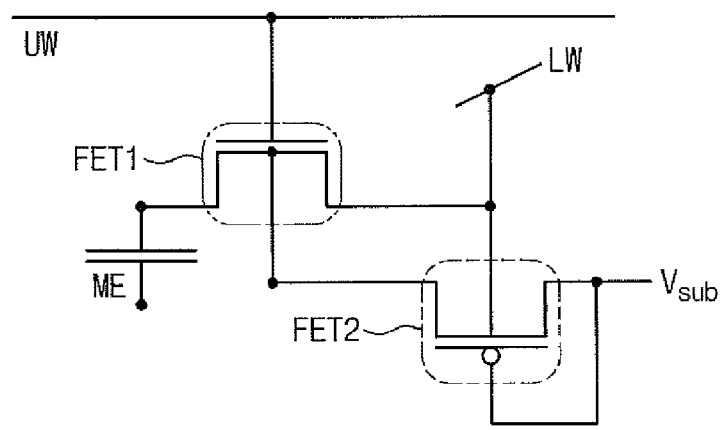
FIG. 1 is a circuit diagram schematically illustrating a semiconductor device according to an embodiment of the inventive concept.

FIG. 1 is a circuit diagram schematically illustrating a semiconductor device according to an embodiment of the inventive concept.

Referring to FIG. 1, a first field effect transistor FET1 and a second field effect transistor FET 2 connected in series are provided. According to an embodiment, as illustrated in FIG. 1, the first and second field effect transistors FET1 and FET2 may be an n-channel metal-oxide field-effect transistor (NMOSFET) and a p-channel MOSFET (PMOSFET), respectively. According to an embodiment, the first and second field effect transistors FET1 and FET2 may be a PMOSFET and an NMOSFET, respectively.

According to an embodiment of the inventive concept, as illustrated in FIG. 1, one of the source and drain electrodes of the first field effect transistor FET1 is used as a channel region of the second field effect transistor FET2 and one of the source and drain electrodes of the second field effect transistors FET2 is used as a channel region of the first field effect transistor FET1.

According to an embodiment, one of the source electrode and the drain electrode of the first field effect transistor FET1 may be electrically connected to a memory element ME, and one of the source electrode and the drain electrode of the second field effect transistor FET2 may be electrically connected to an external terminal to which a predetermined external voltage Vsub is supplied. According to an embodiment, a capacitor constituting a dynamic random access memory (DRAM) device is exemplarily described as the memory element. However, the first and second field effect transistors FET1 and FET2 may be used as switching elements to control an electrical connection to memory elements of various memory devices. According to an embodiment, the memory element ME may be, for example, a capacitor, a ferroelectric capacitor a magnetic tunnel junction (MTJ), a variable resistive element, or a charge storage mechanism.

The channel region of the second field effect transistor FET2 may be electrically connected to a lower wiring LW and a gate electrode of the first field effect transistor FET1 may be electrically connected to an upper wiring UW. According to an embodiment, the upper wiring UW may be disposed to cross the lower wiring LW.

Figure 2A:
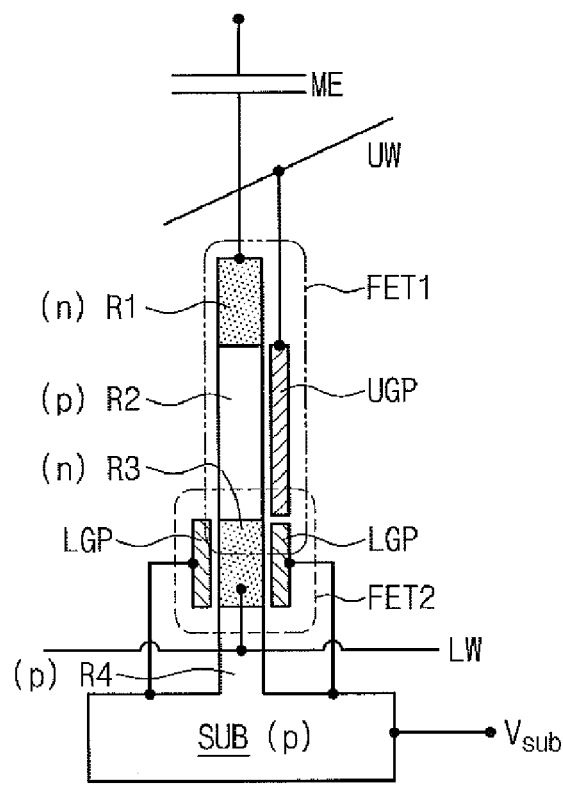
FIGS. 2A to 2C are schematic views illustrating semiconductor devices according to embodiments of the inventive concept.
Figure 2B:
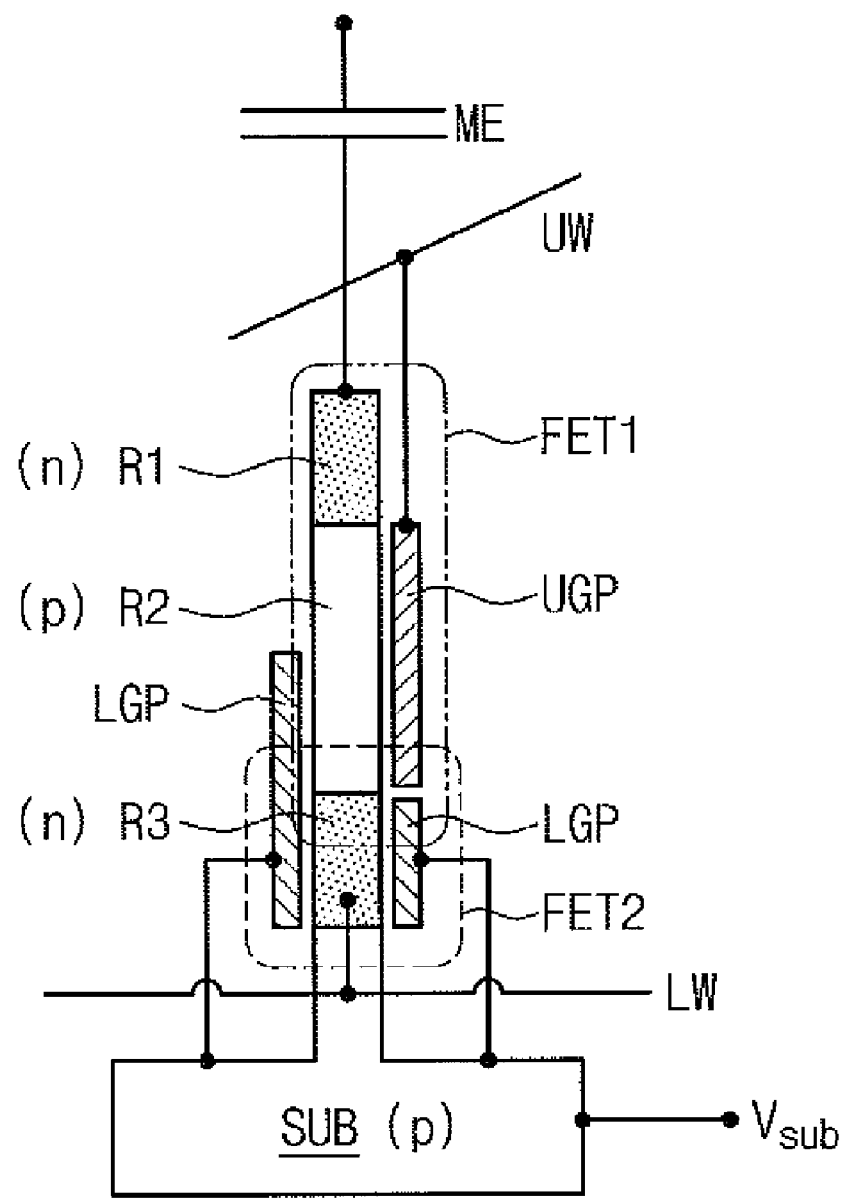
Figure 2C:
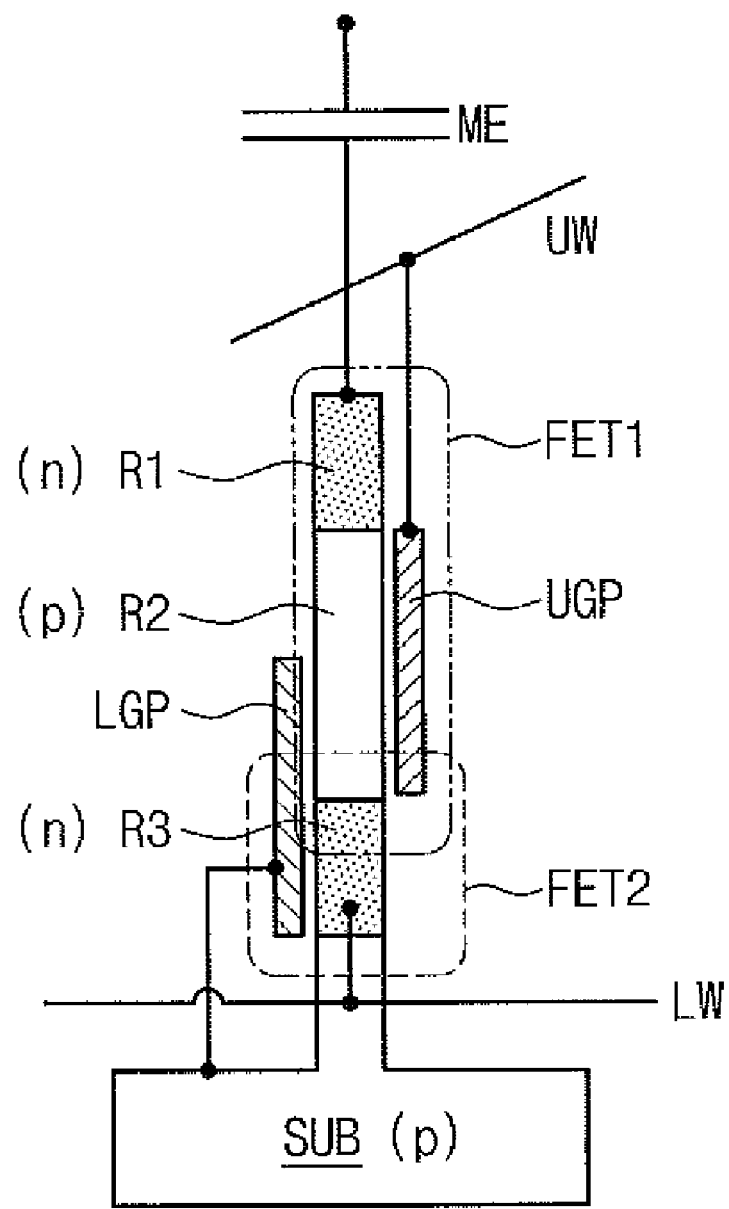

FIGS. 2A to 2C are schematic views illustrating semiconductor devices according to embodiments of the inventive concept.

Referring to FIGS. 2A to 2C, the first and second field effect transistors FET1 and FET2 described with reference to FIG. 1 may be vertical transistors which use an active pattern protruded upward from an upper surface of a substrate SUB as a channel region. The active pattern may comprise a material having semiconductor characteristics, and may include a first region R1 on the substrate SUB, a second region R2 between the substrate SUB and the first region R1, and a third region R3 between the substrate SUB and the second region R2. That is, the third, second and first regions R3, R2, and R1 are disposed sequentially on the substrate SUB while directly contacting each other. The first and third regions R1 and R3 may have a conductivity type that is different from the substrate SUB, and the second region R2 may have a conductivity type that is the same as the substrate SUB or may be an intrinsic semiconductor. Therefore, as exemplarily illustrated, when the substrate SUB is a p-type semiconductor substrate, the first and third regions R1 and R3 may be n-type regions and the second region R2 may be a p-type region or an intrinsic region.

In an embodiment, upper and lower gate patterns UGP and LGP respectively facing sidewalls of the second region R2 and the third region R3, may be disposed around the active pattern. In an embodiment, the upper and lower gate patterns UGP and LGP may be disposed spaced apart from sidewalls of the active pattern to thereby constitute MOS capacitors, respectively, together with the second region R2 and the third region R3. According to an embodiment of the inventive concept, the upper gate patter UGP may be ohmically connected to the upper wiring UW, and the lower gate pattern LGP may be ohmically connected to the substrate SUB.

The first field effect transistor FET1 may be configured by the first, second and third regions R1, R2 and R3, and the upper gate pattern UGP, and the second field effect transistor FET2 may be configured by the second and third regions R2 and R3, the substrate SUB, and the lower gate pattern LGP.

That is, the second and third regions R2 and R3 may be used as the channel regions of the first and second field effect transistors FET1 and FET2, respectively. According to an embodiment of the inventive concept, the second region R2 may be used as the source electrode of the second field effect transistor FET2, and the third region R3 may be used as the drain electrode of the first field effect transistor FET1.

According to an embodiment of the inventive concept, the memory element ME may be connected to the first region R1, and the lower wiring LW may be connected to the third region R3. The lower wiring LW may be disposed to cross the upper wiring UW. According to an embodiment of the inventive concept, the second region R2 may be electrically separated from any conductive patterns except for the first and third regions R1 and R3. In this case, since the second region R2 constitutes a diode together with the first and third regions R1 and R3, the second region R2 may be in a floating state. Since the second region R2 can used as the channel region of the first field effect transistor FET1, this floating state of the second region R2 allows a floating body effect to be generated in the first field effect transistor FET1. The floating body effect may cause the instability of a transistor at a threshold voltage to be increased and also cause dynamic reference properties of a memory semiconductor device to be deteriorated.

According to an embodiment of the inventive concept, the third region R3 can be used as the channel region of the second field effect transistor FET2. Therefore, as illustrated in FIG. 3, when a voltage capable of inverting the third region R3 is applied to the lower gate pattern LGP, the second region R2 is electrically connected to the fourth region R4, so that the foregoing floating body issue can be suppressed.

As illustrated in FIGS. 2A and 2B, the lower gate pattern LGP may be disposed on both sidewalls of the active pattern. In this case, the upper gate pattern UGP may be disposed over one of the lower gate patterns LPGs. In an embodiment, the lower gate pattern LGP may be disposed locally on one sidewall of the active pattern. The lower gate pattern LGP can be disposed on the third region R3 and a portion of the second region R2 as shown in FIG. 2C. In an embodiment, the lower gate pattern LGP can be disposed only on the third region R3.

According to an embodiment of the inventive concept, as illustrated in FIG. 2B, one of the lower gate patterns LGPs, or as illustrated in FIG. 2C, the lower gate pattern LGP may extend upward to face a sidewall of the second region R2. That is, an upper surface of the lower gate pattern LGP may be formed at a position more far away from the substrate SUB than a boundary between the second and third regions R2 and R3 or a lower surface of the upper gate pattern UGP. Thus, when some of the lower gate pattern LGP is formed to face the second region R2, the potential of the second region R2 used as the channel region of the first field effect transistor FET1 may be also controlled by the lower gate pattern LGP. The lower gate pattern LGP may be used in controlling an electrical characteristic of the first field effect transistor FET1.

Figure 3:
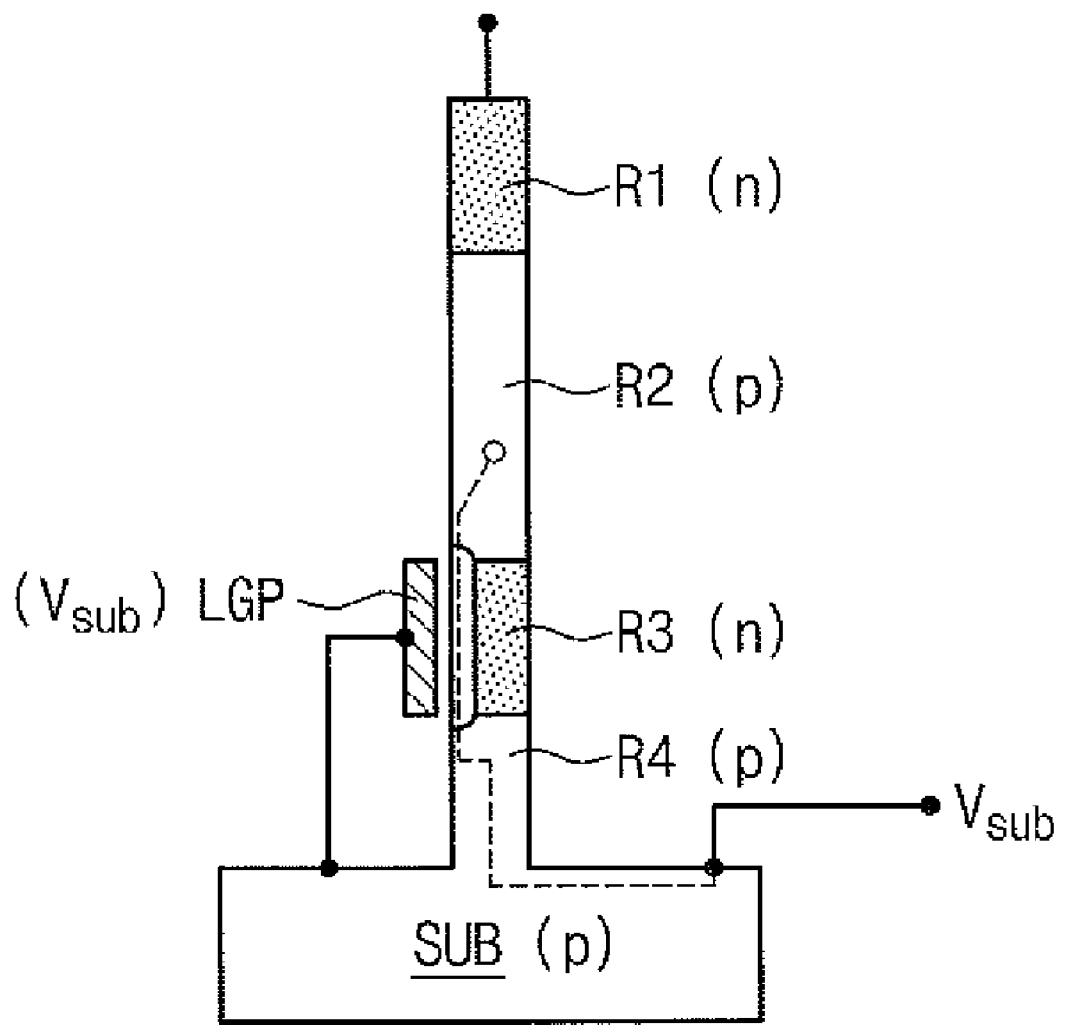
FIG. 3 is a schematic view illustrating a semiconductor device according to an embodiment of the inventive concept.

Referring to FIG. 3, when a voltage capable of inverting the third region R3 is applied to the lower gate pattern LGP, the second region R2 is electrically connected to the fourth region R4, so that the foregoing floating body issue can be suppressed.

Figure 4:
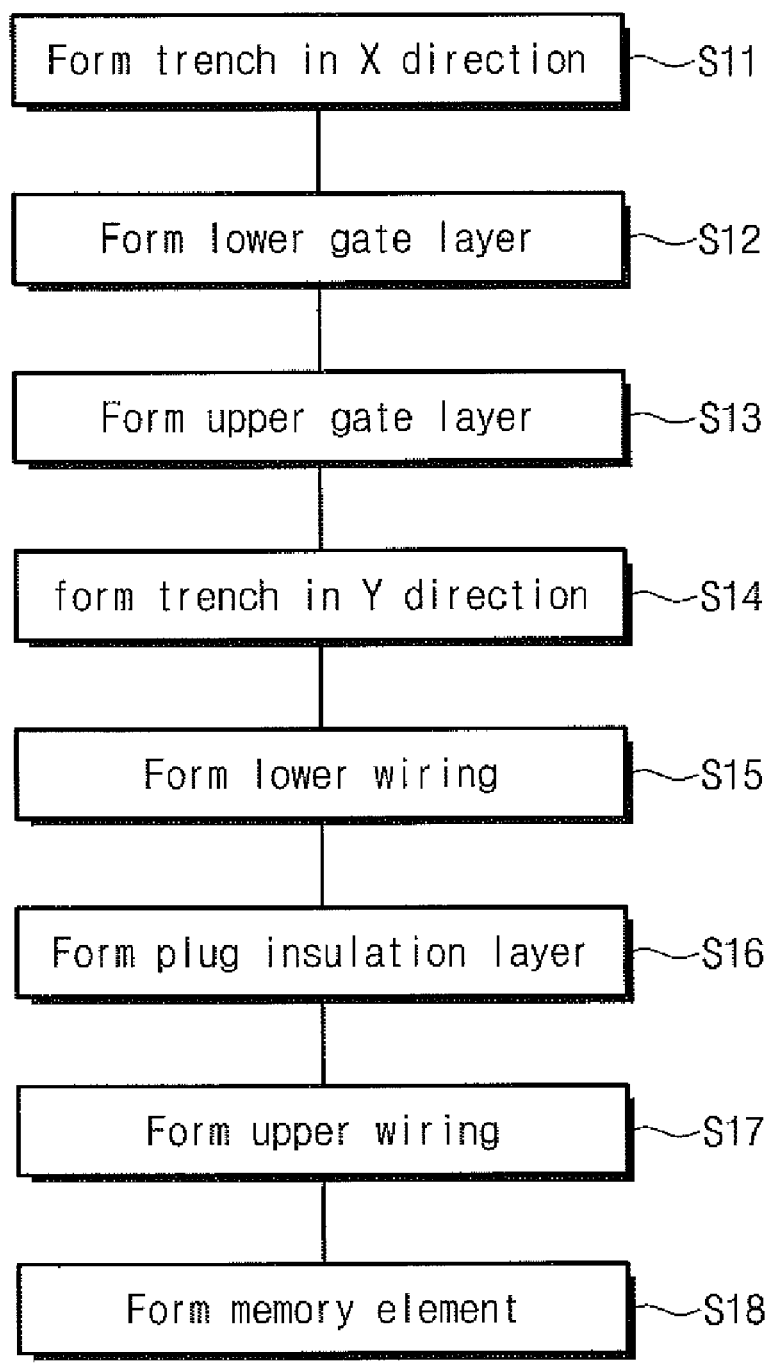
FIG. 4 is a flowchart illustrating a method of fabricating a semiconductor device according to an embodiment of the inventive concept.

FIG. 4 is a flowchart illustrating a method of fabricating a semiconductor device according to an embodiment of the inventive concept. FIGS. 5A to 19A and 5B to 19B are respectively sectional views and perspective views illustrating a method of fabricating a semiconductor device according to the embodiment of the inventive concept described with reference to FIG. 4.

Referring to FIG. 4, in operation S11, a substrate SUB is patterned to form first trenches TRC1, and then, in operation S12, a lower gate layer LGL is formed in the first trenches TRC1.

Figure 5A:
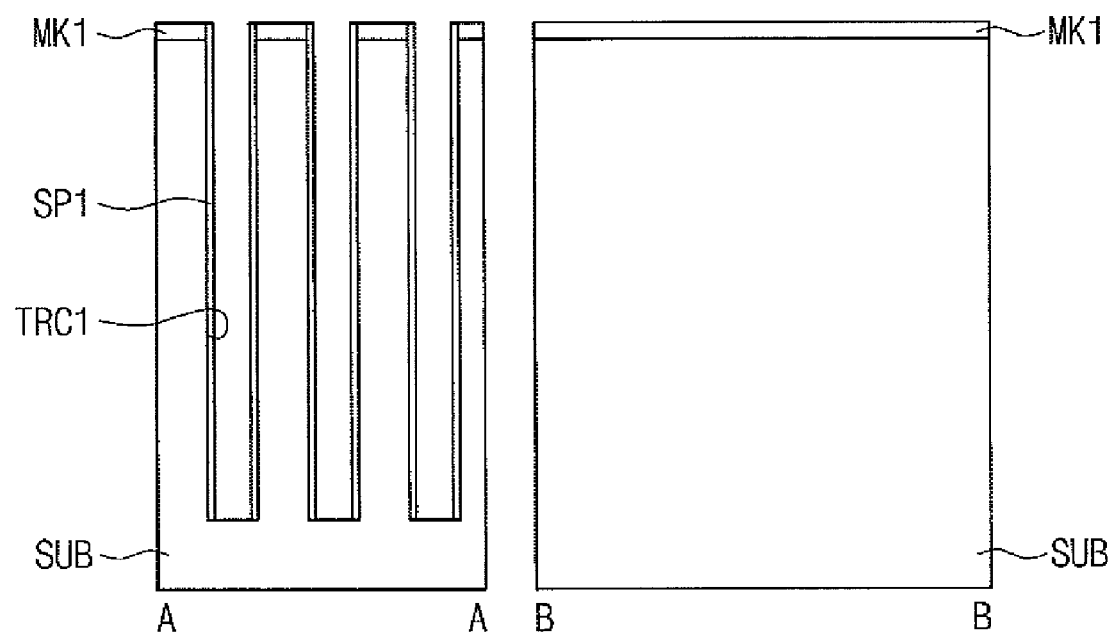
Figure 5A:
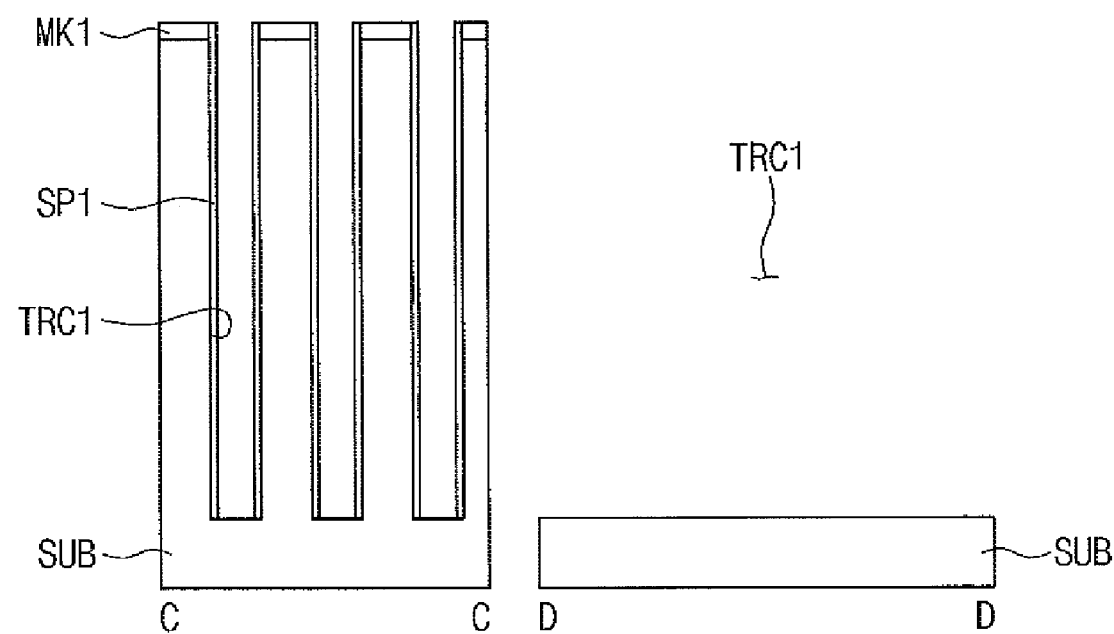
Figure 5B:
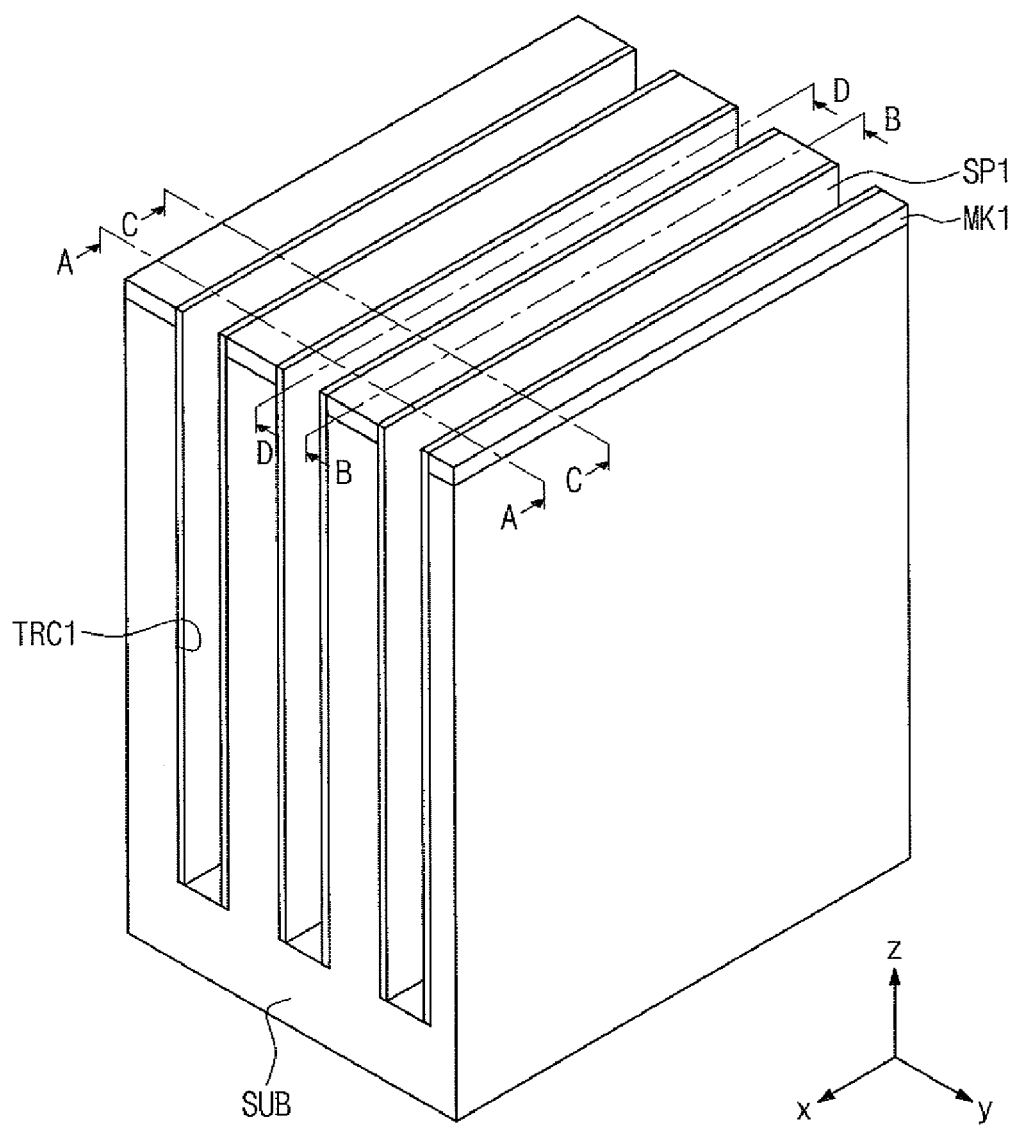

The first trenches TRC1 may be formed in parallel to a first direction (hereinafter referred to as "x-direction"). This operation S11 may include forming first mask patterns MK1 having a major axis parallel to the x-direction and then etching the substrate SUB by using the first mask patterns MK1 as an etch mask, as illustrated in FIGS. 5A and 5B.

The lower gate layer LGL may be formed such that the lower gate is directly connected to the substrate SUB at a bottom of the first trench TRC1 and is spaced apart from a sidewall of the first trench TRC1. In an embodiment, a first spacer SP1 may be disposed between the lower gate layer LGL and the sidewall of the first trench TRC1. The first spacer SP1 may comprise an insulation material. This operation S12 may include forming the first spacer SP1 exposing the bottom surface of the first trench TRC1 on the sidewall of the first trench TRC1 and then forming the lower gate layer LGL filling the first trench TRC1 of the resultant structure, as illustrated in FIGS. 6A and 6B.

Figure 6A:
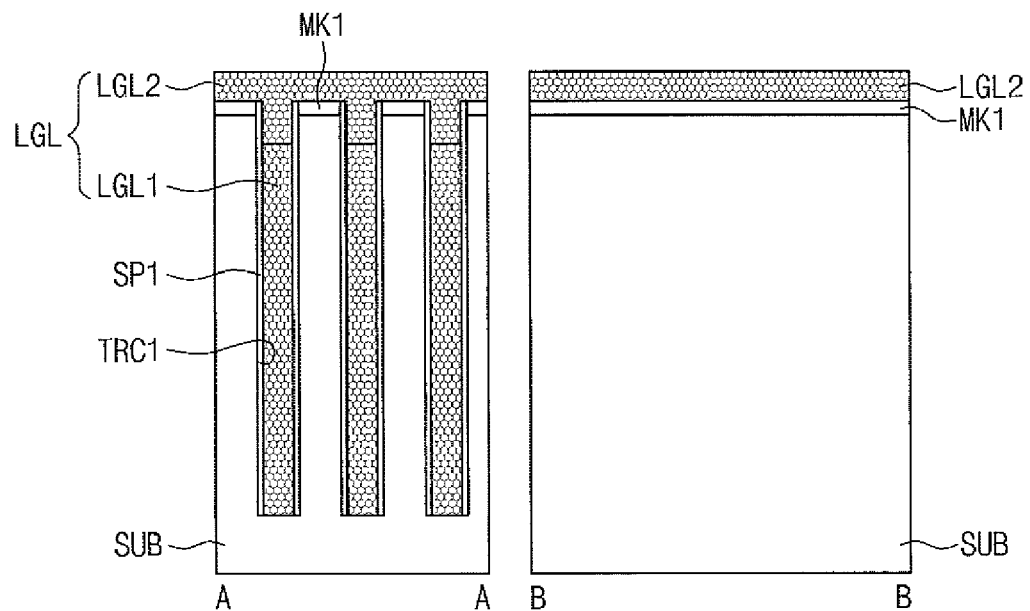
Figure 6A:
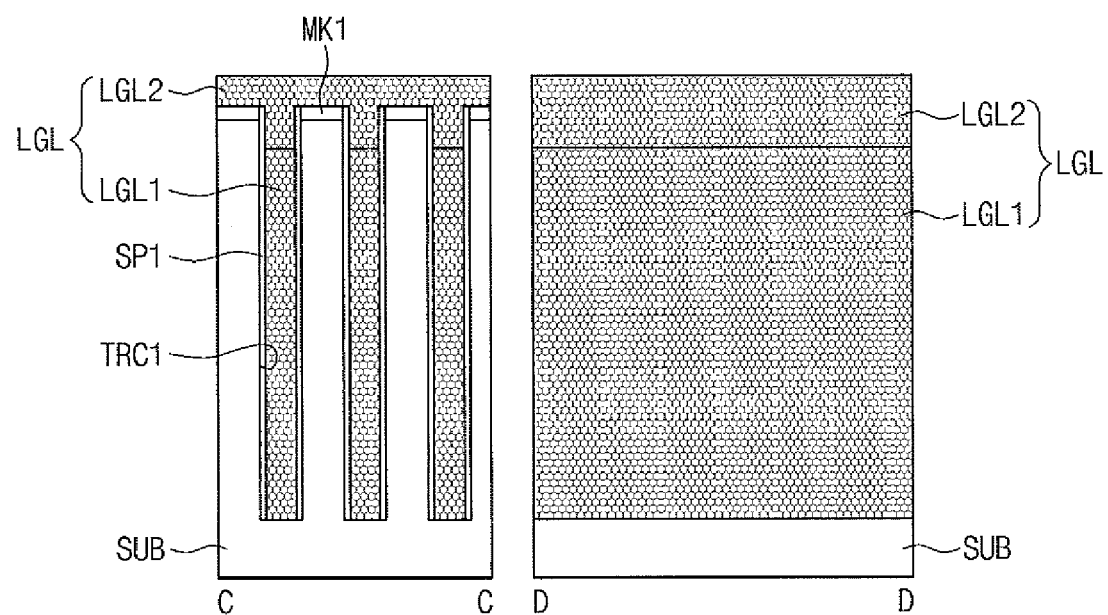
Figure 6B:
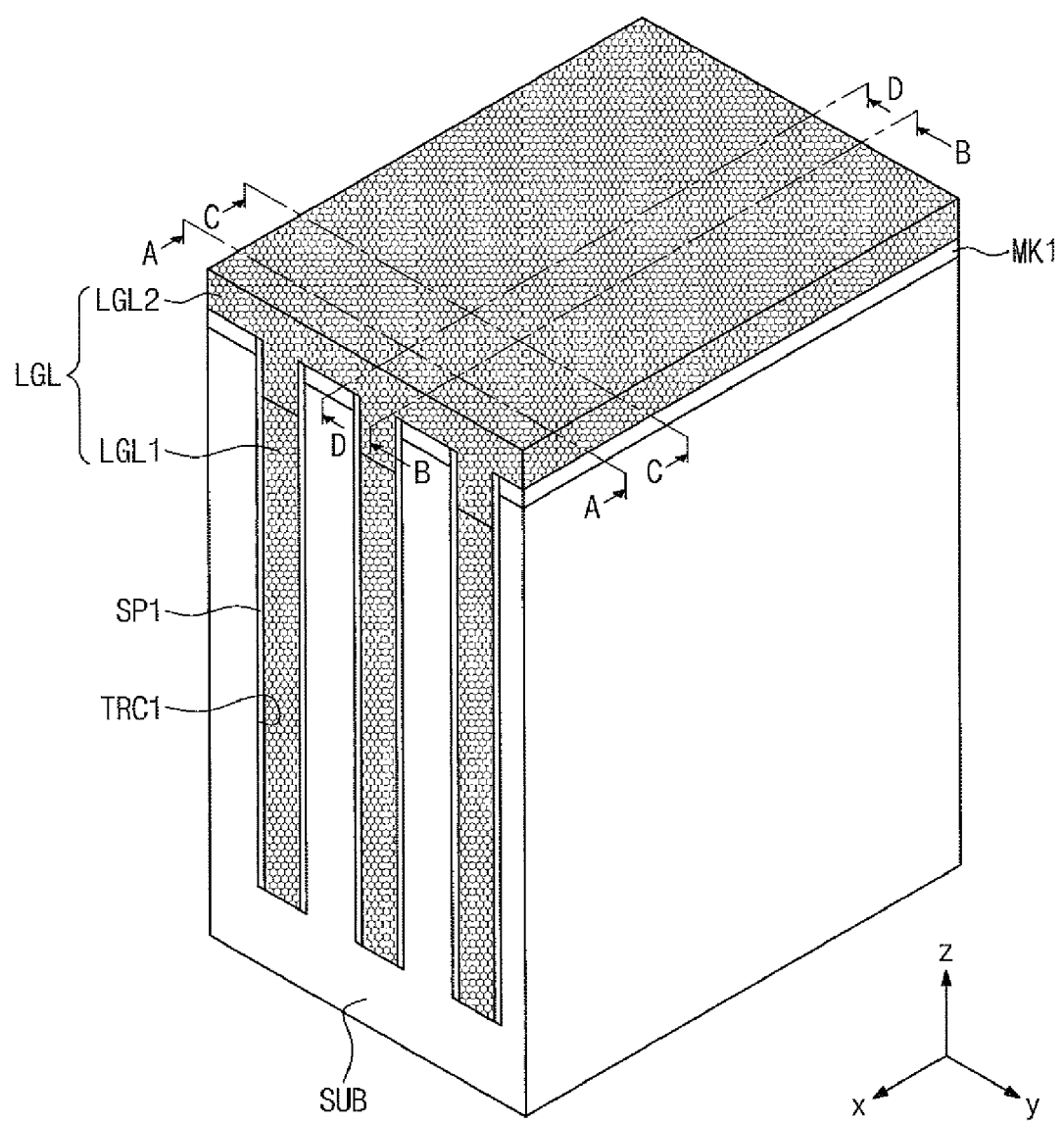

Referring to FIGS. 6A and 6B, the lower gate layer LGL may comprise a conductive material that can be ohmically connected to the substrate SUB. For example, the lower gate layer LGL may comprise a semiconductor material layer having the same conductivity type as the substrate SUB. According to an embodiment, the lower gate layer LGL may comprise a material having a specific resistance lower than the substrate SUB. For example, the lower gate layer LGL may comprise a semiconductor material layer having an impurity concentration higher than the substrate SUB while having the same conductivity type as the substrate SUB, or may include at least one of a barrier metal layer such as a metal nitride layer or metallic materials such as a metal or a metal silicide.

According to an embodiment, the operation of forming the lower gate layer LGL may include at least two layer-forming operations separated from each other. For example, as illustrated in FIGS. 6A and 6B, the lower gate layer LGL may include a first lower gate layer LGL1 and a second lower gate layer LGL2 sequentially filling a lower region and an upper region of the first trench TRC1. According to an embodiment, the first lower gate layer LGL1 may be an epitaxial layer which is grown by using the bottom surface of the first trench TRC1 as a seed, and the second lower gate layer LGL2 may be a deposition layer which is formed by using a deposition process. When the second lower gate layer LGL2 is formed, the flatness of the resultant structure is improved, so that a subsequent process can be easily performed. In an embodiment, the operation of forming the second lower gate layer LGL2 may be omitted. That is, the lower gate layer LGL may be an epitaxial layer or deposition layer which is formed through one layer-forming operation.

Figure 7A:
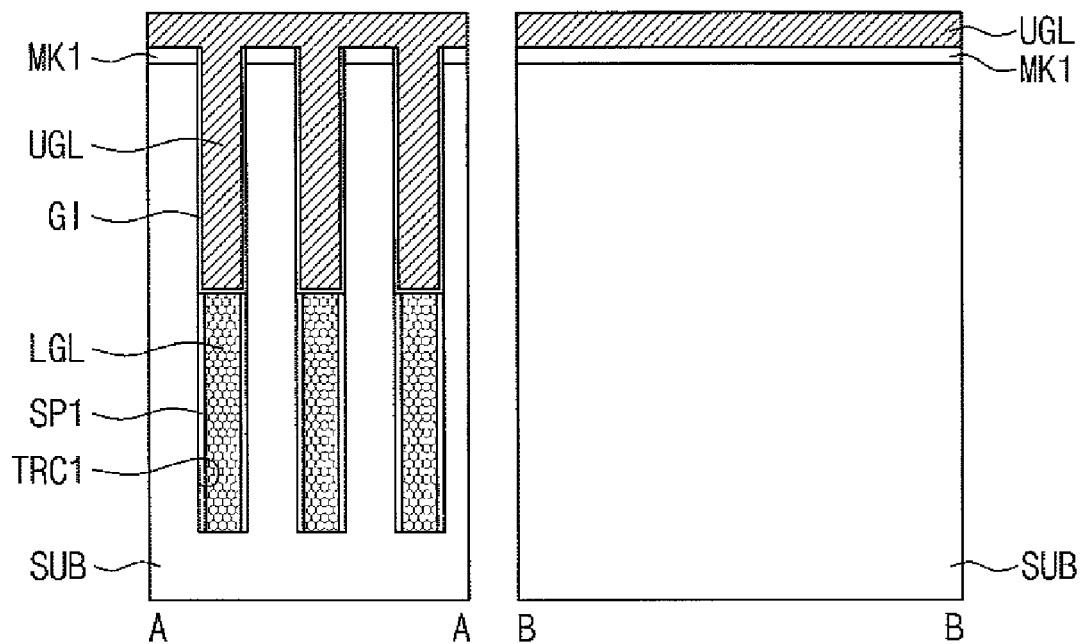
Figure 7A:
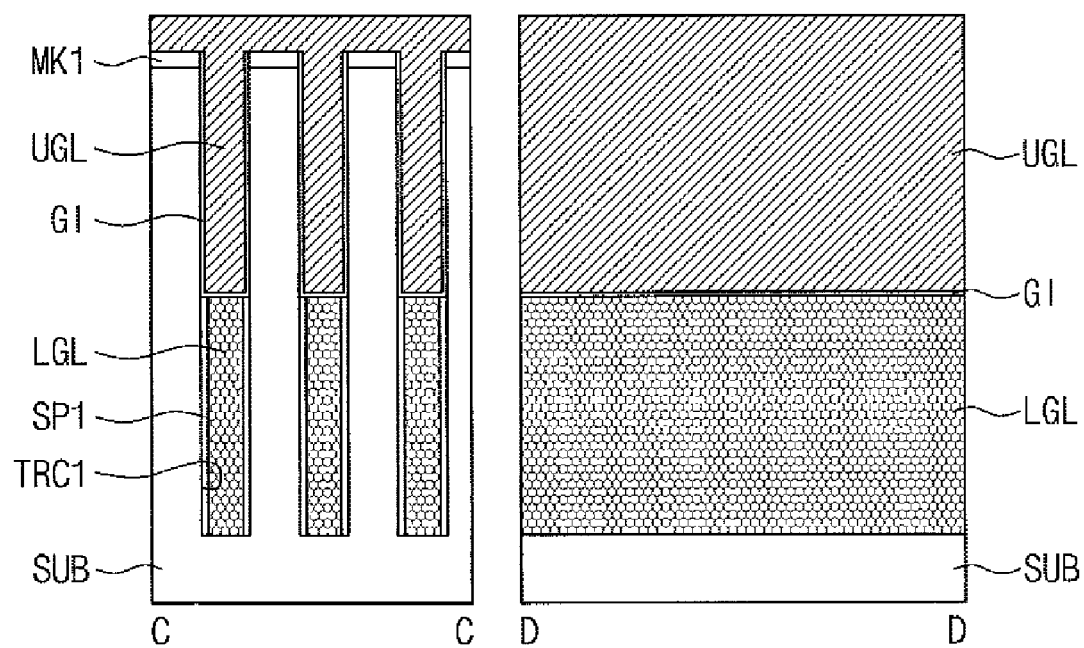
Figure 7B:
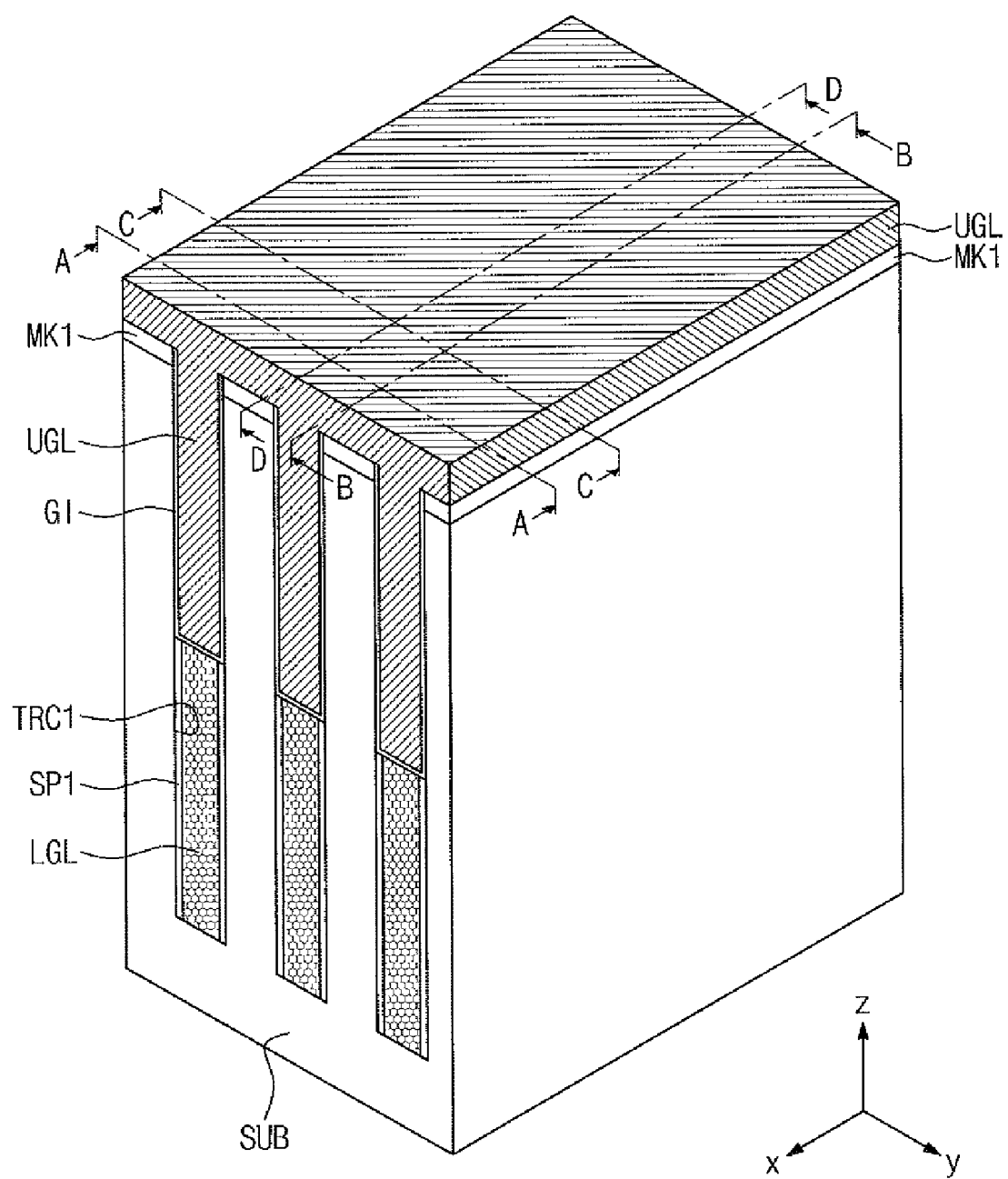

Referring to FIGS. 4, 7A and 7B, in operation S13, an upper gate layer UGL is formed at an upper region of the first trench TRC1. This operation S13 may include etching the lower gate layer LGL and the first spacer SP1 to expose an upper sidewall of the first trench TRC1 and then forming a gate insulator GI and the upper gate layer UGL on the resultant structure.

The operation of exposing the upper sidewall of the first trench TRC1 may include blanket-etching the lower gate layer LGL to expose an inner sidewall of the first spacer SP1 and then removing the exposed portion of the first spacer SP1. The operation of blanket-etching the lower gate layer LGL may be performed by using an isotropic or anisotropic etching having the etch selectivity with respect to the first spacer SP1. Also, the operation of blanket-etching the lower gate layer LGL may be performed such that the top surface of the lower gate layer LGL is lower than a bottom surface of the first mask pattern MK1 or a top surface of the substrate SUB. Therefore, as aforementioned, the inner sidewall of the first spacer SP1 may be again exposed at the upper region of the first trench TRC1. The operation of removing the first spacer SP1 may be performed by using an isotropic or anisotropic etching having the etch selectivity with respect to the substrate SUB and the lower gate layer LGL.

The gate insulator GI may be formed on an upper inner wall of the first trench TRC1, which is exposed by removing the first spacer SP1. The gate insulator GI may be also formed on the top surface of the lower gate layer LGL. The gate insulator GI may be also disposed between the lower and upper gate layers LGL and UGL. The forming of the gate insulator GI may be performed through a process of thermally oxidizing an exposed surface of the lower gate layer LGL. For example, when the substrate SUB and/or the lower gate layer LGL is silicon, the gate insulator GI may be a silicon oxide layer formed through a thermal oxidation process. However, according to an embodiment, the gate insulator GI may be a thin layer formed through a chemical vapor deposition or an atomic layer deposition, and may be silicon oxide or one of high-k dielectrics having a permittivity higher than silicon oxide.

The upper gate layer UGL may include at least one of conductive materials. For example, the upper gate layer UGL may include at least one of a doped silicon layer, metal nitrides or metal materials. The upper gate layer UGL may be formed to fill the first trench TRC1 having the gate insulator GI formed therein by using a chemical vapor deposition or a physical vapor deposition. In this case, the upper gate layer UGL may remain on the first mask pattern MK1. According to an embodiment of the inventive concept, after the upper gate layer UGL is formed, an operation of blanket-etching the upper gate layer UGL and/or the first mask pattern MK1 may be further performed such that the top surface of the first mask pattern MK1 or the substrate SUB is exposed.

Figure 21:
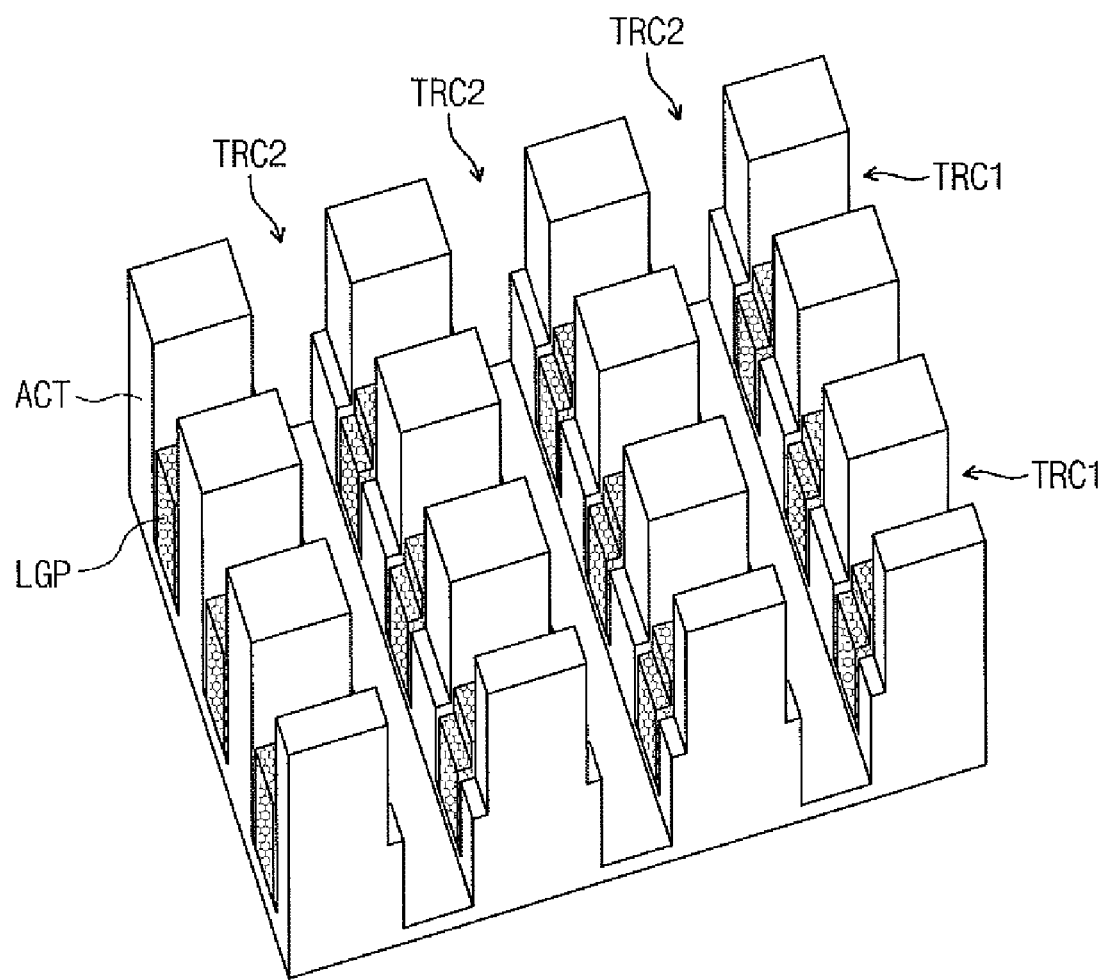

Referring to FIG. 4 again, in operation S14, the substrate SUB is again patterned to form second trenches TRC2. The second trenches TRC2 may be formed with major axes crossing the first trenches TRC1. Since the second trenches TRC2 cross the first trenches TRC1, the first and second trenches TRC1 and TRC2 define sidewalls of active patterns ACT arranged 2-dimensionally on the substrate SUB, as illustrated in FIG. 21. Also, since the active patterns ACT are formed through two patterning processes, a section of the active pattern ACT projected on the top plane surface of the substrate SUB may be substantially a quadrangle.

Figure 8A:
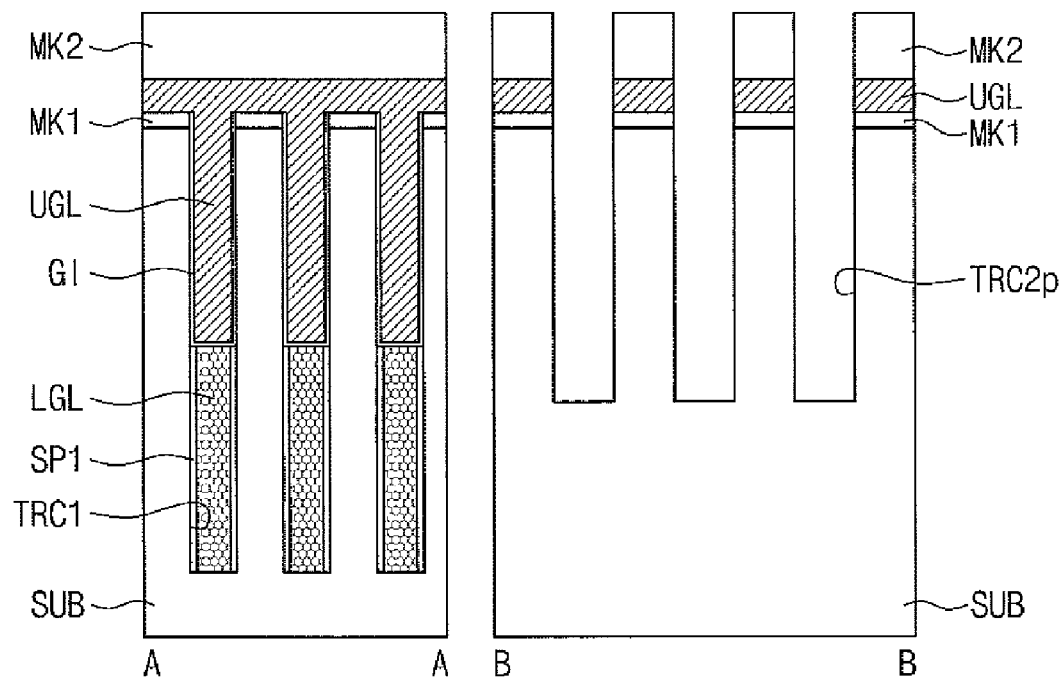
Figure 8A:
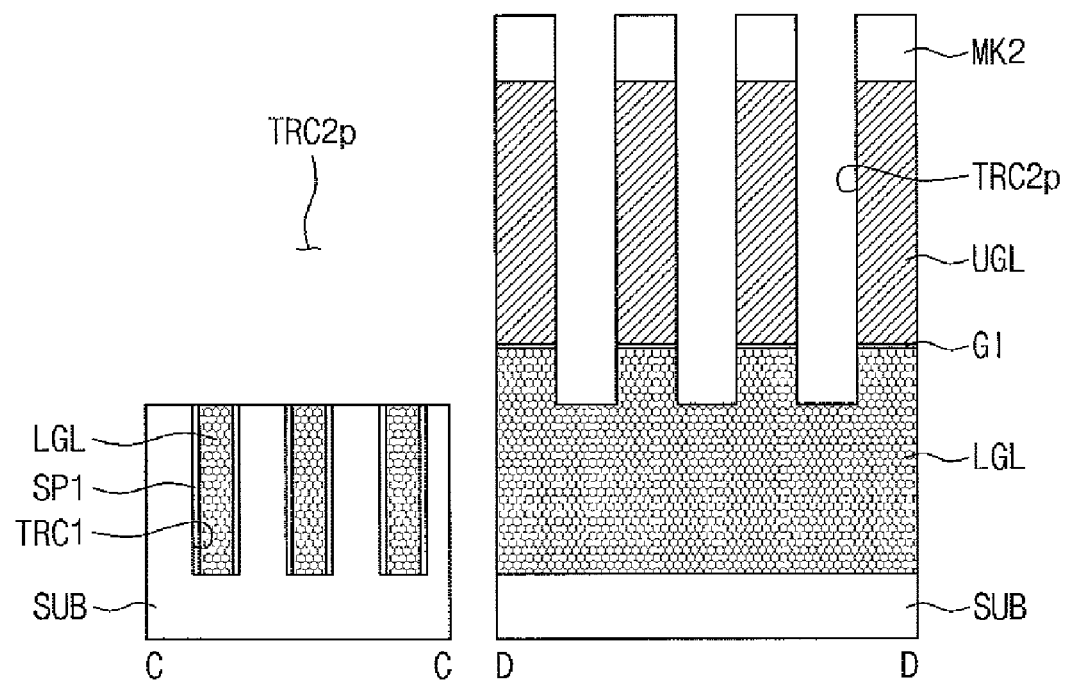
Figure 8B:
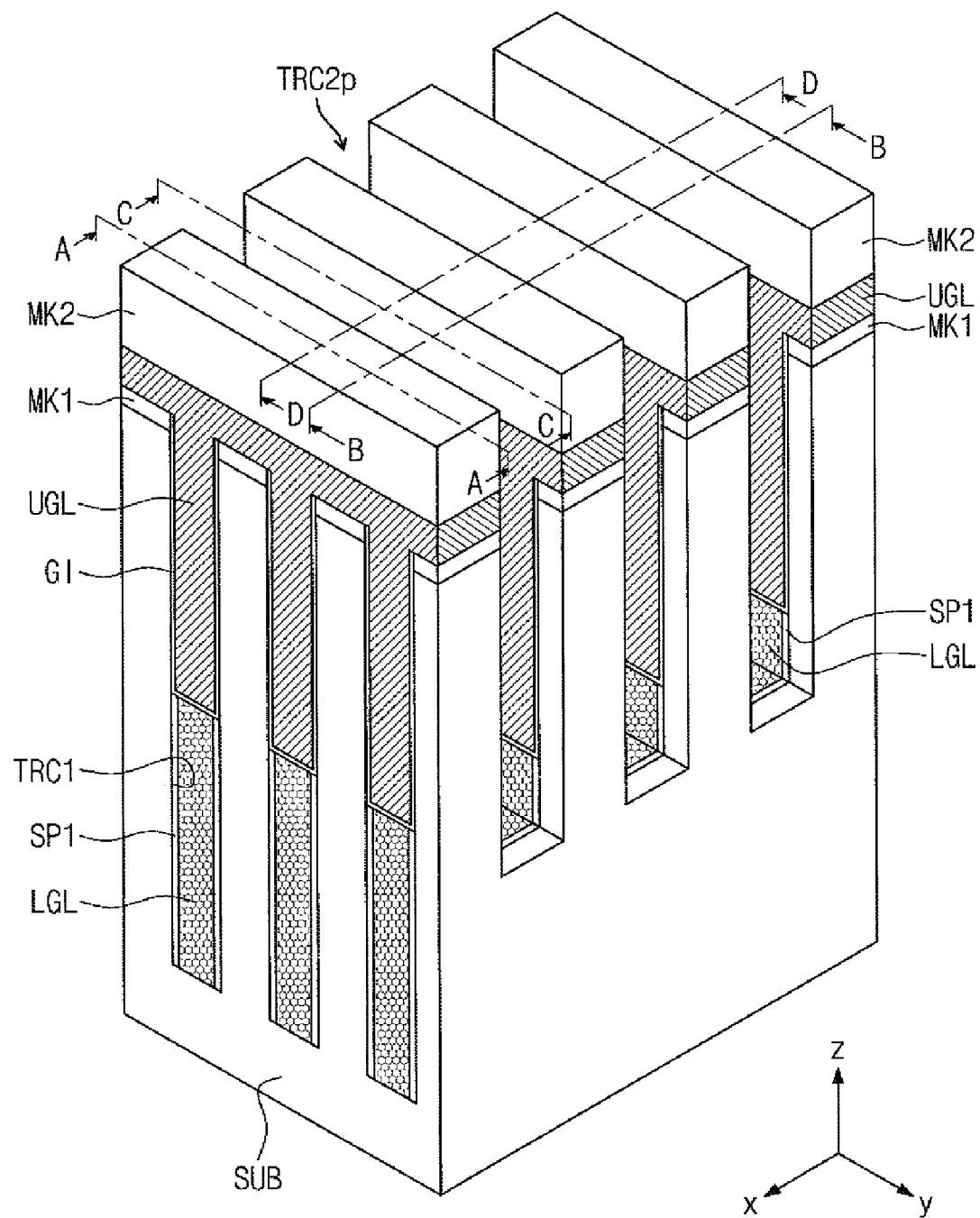
Figure 9A:
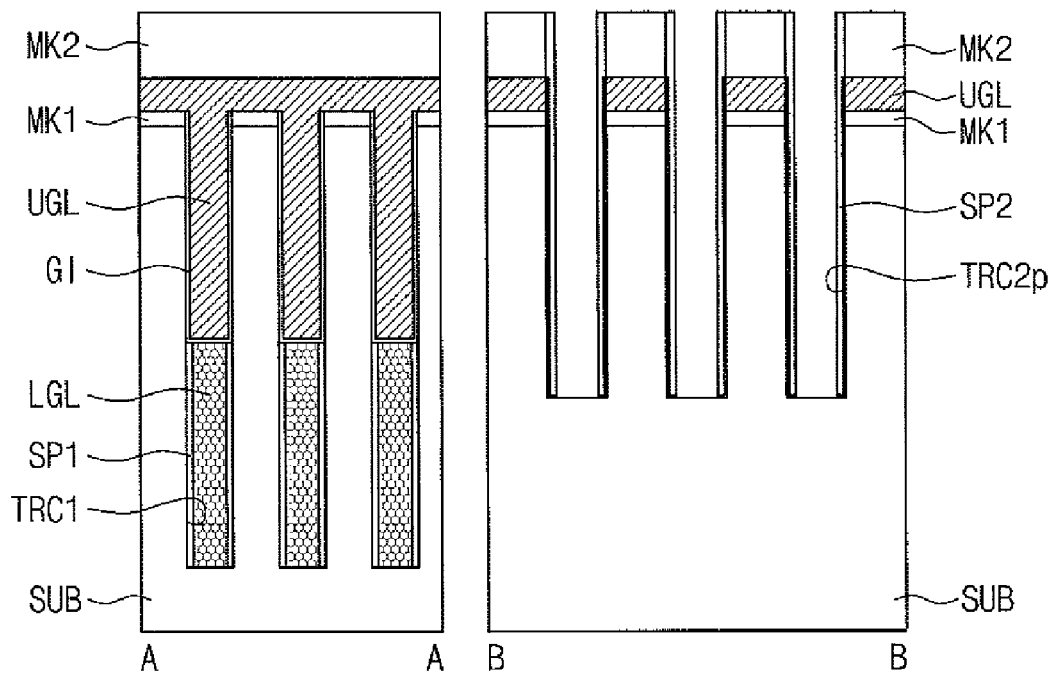
Figure 9A:
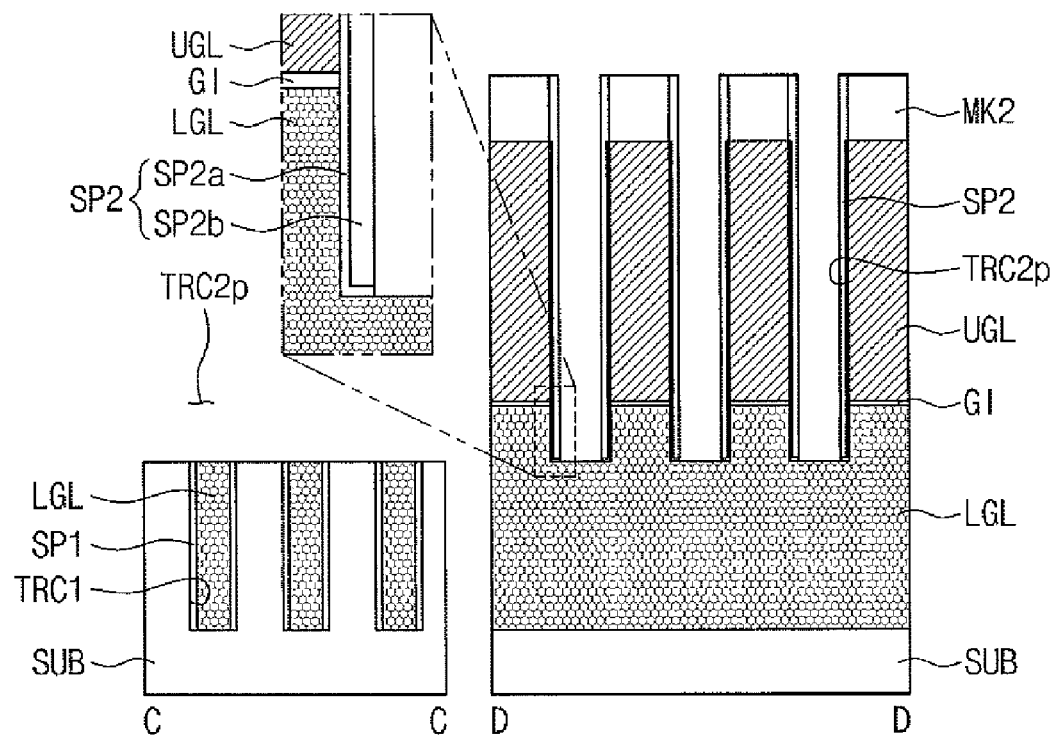
Figure 9B:
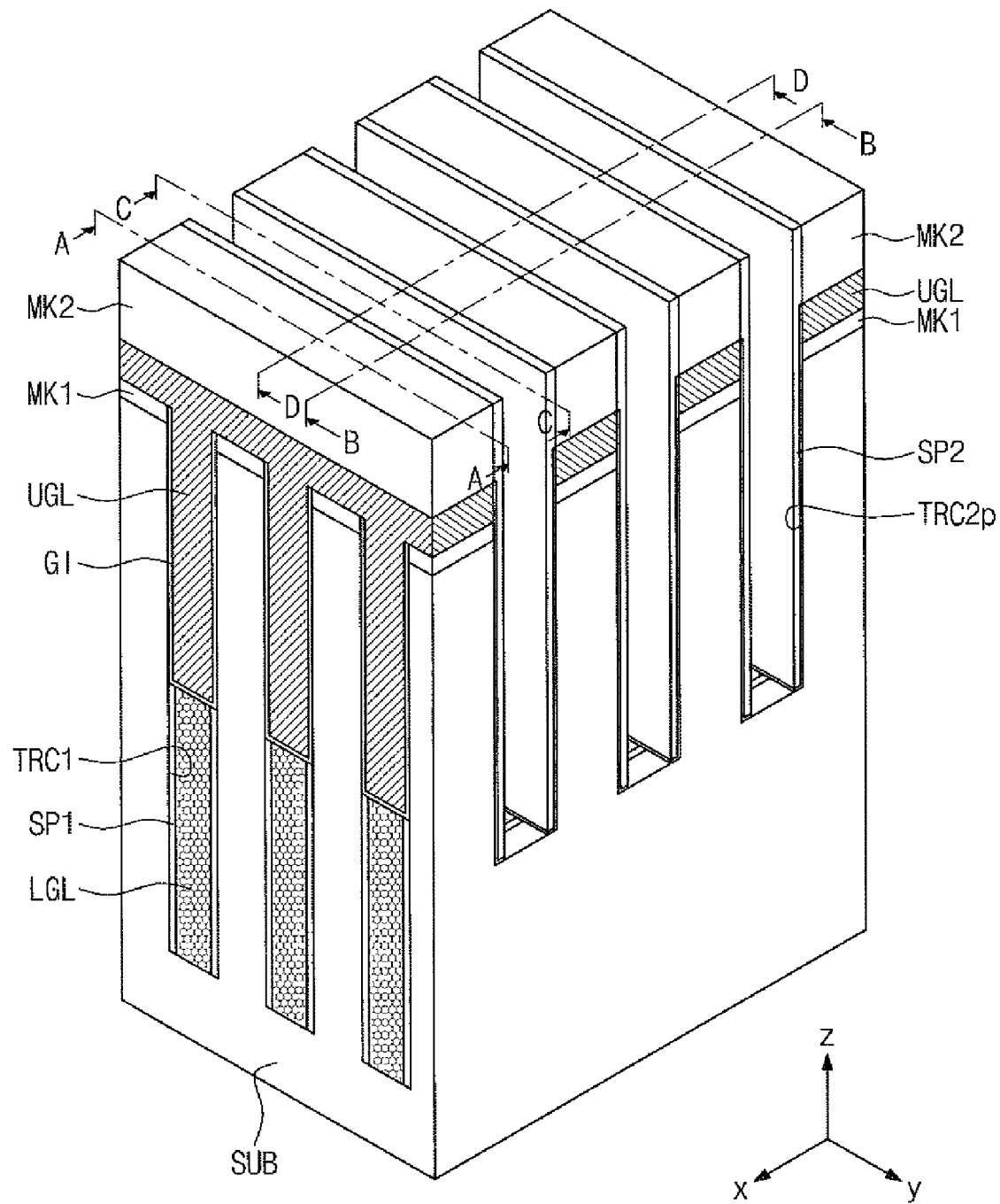
Figure 10A:
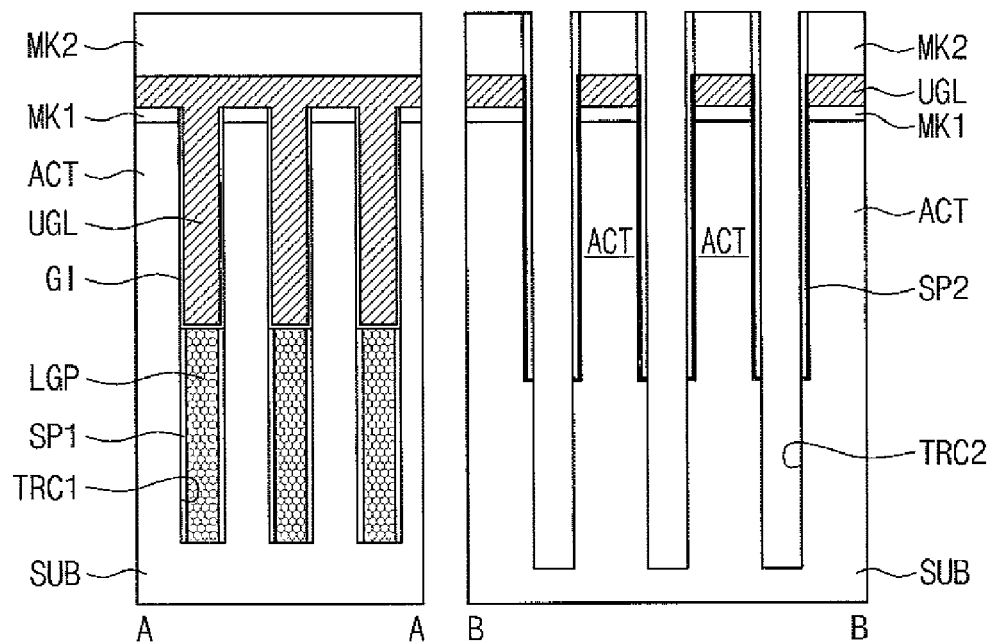
Figure 10A:
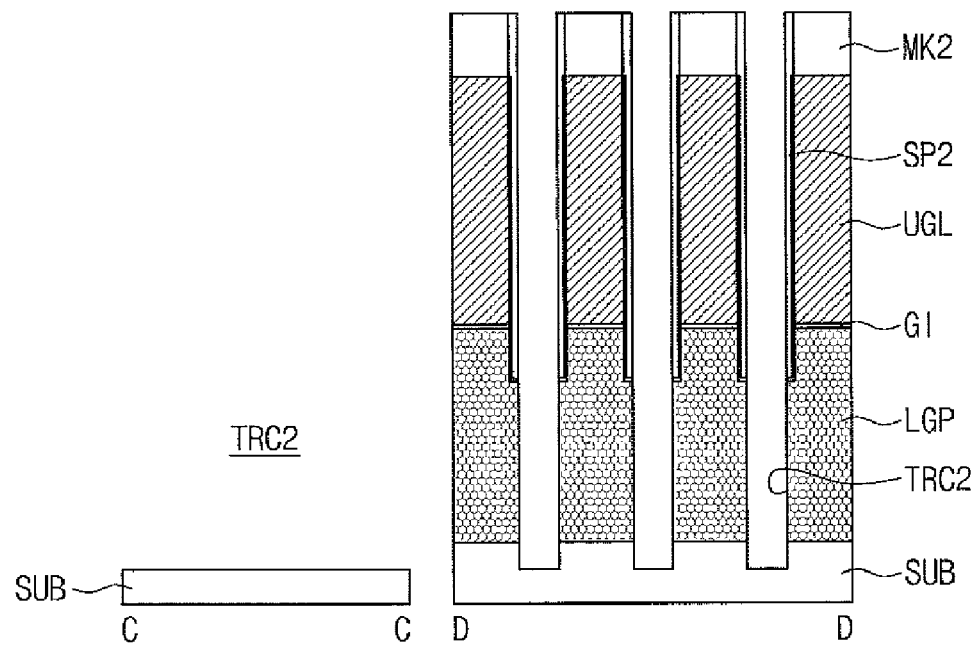
Figure 10B:
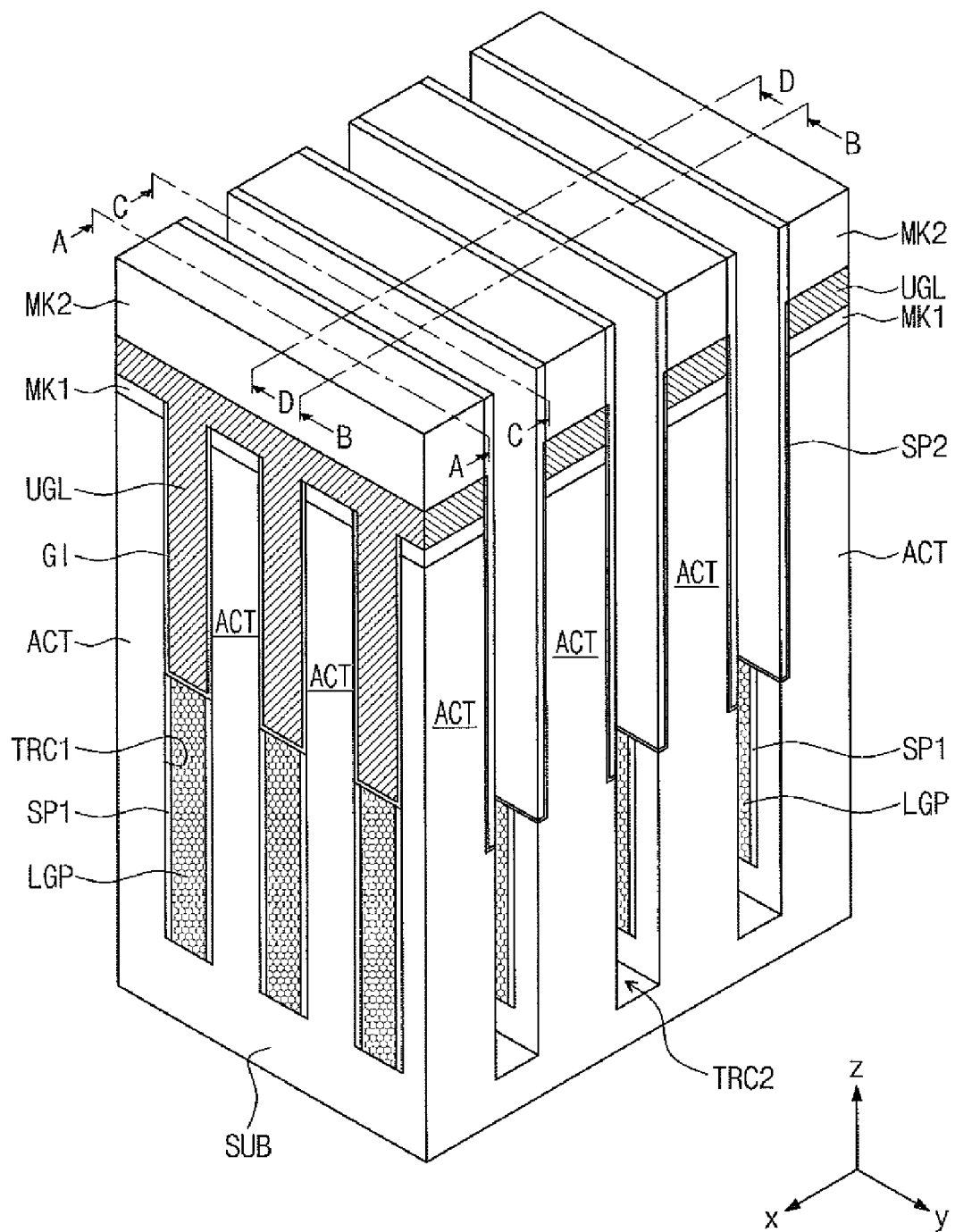

According to embodiments of the inventive concept, the operation S14 of forming the second trenches TRC2 may include preliminary trenches TRC2p crossing the first trenches TRC1 as illustrated in FIGS. 8A and 8B, forming second spacers SP2 on inner sidewalls of the preliminary trenches TRC2p as illustrated in FIGS. 9A and 9B, and extending the preliminary trenches TRC2p downward to form the second trenches TRC2 as illustrated in FIGS. 10A and 10B.

Figure 20:
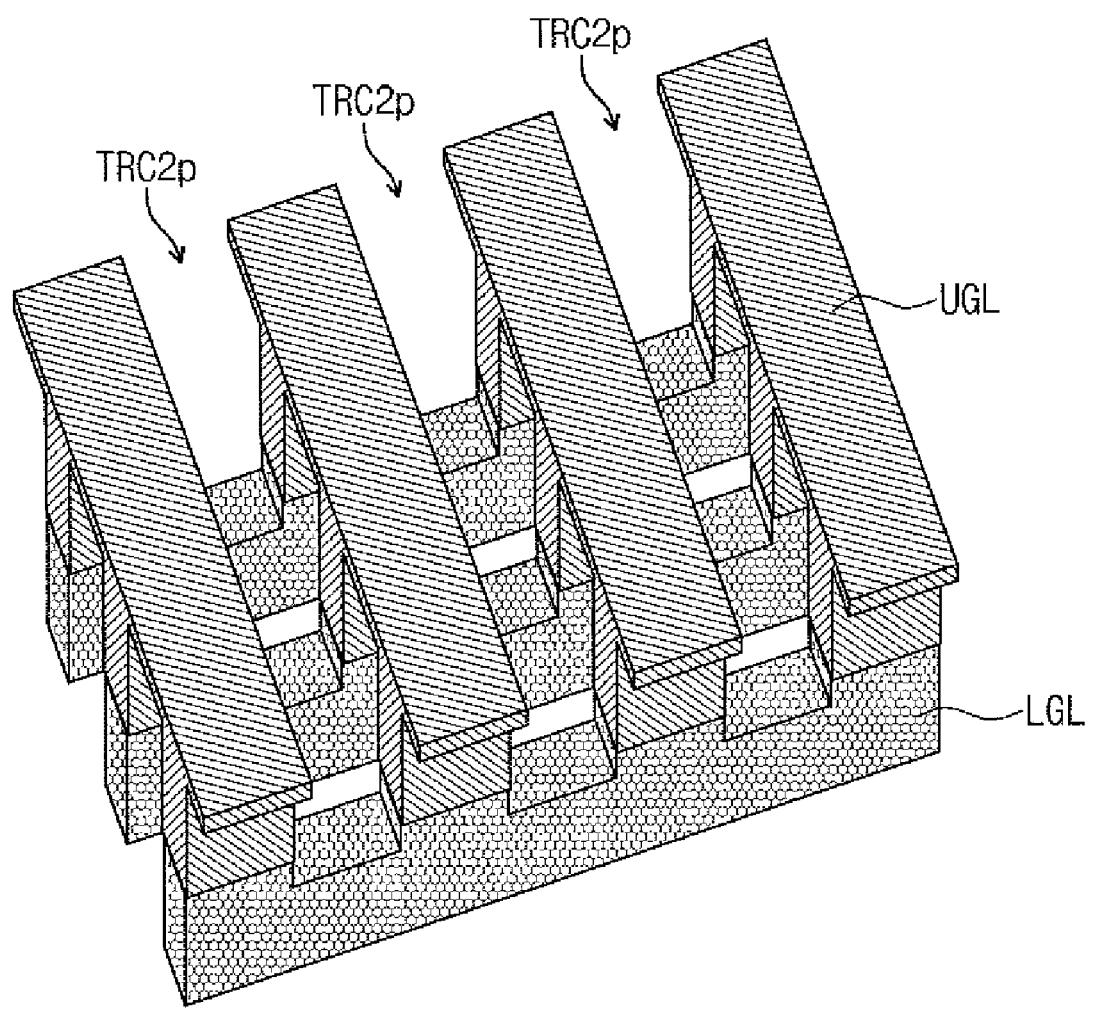
FIGS. 20 to 22 are perspective views describing a method of fabricating a semiconductor device according to an embodiment of the inventive concept.

Referring to FIGS. 8A and 8B, the operation of forming the preliminary trenches TRC2p may include forming second mask patterns MK2 having a major axis crossing the first trenches TRC1 on the resultant structure formed with the upper gate layer UGL, and then patterning the substrate SUB and the upper gate layer UGL by using the second mask patterns MK2 as an etch mask. Therefore, as illustrated in FIG. 20, the upper gate layer UGL is horizontally separated by the preliminary trenches TRC2p to cross the lower gate layer LGL disposed in the first trenches TRC1. During this operation, the first mask patterns MK1 and the gate insulator GI may be etched together. That is, the first mask patterns MK1 and the gate insulator GI may be separated by the preliminary trenches TRC2p and thus be 2-dimensionally arranged on the substrate SUB, like the active patterns ACT. According to embodiments, bottom surfaces of the preliminary trenches TRC2 may be lower than the bottom surface of the upper gate layer UGL.

Referring to FIGS. 9A and 9B, the second spacers SP2 are formed on sidewalls of the preliminary trenches TRC2p. Like the preliminary trench TRC2p, the second spacers SP2 may expose the bottom surface of the preliminary trench TRC2p while crossing the first trenches TRC1. According to embodiments, the second spacer SP2 may include a mask spacer SP2b which is formed of one (e.g., silicon nitride) of materials having an etch selectivity with respect to silicon oxide. The second spacer SP2 may further include a buffer spacer SP2a disposed between the mask spacer SP2b and the preliminary trenches TRC2p. The buffer spacer SP2a may be formed of silicon oxide, and may be an "L"-shaped spacer extending horizontally to include a portion disposed below the mask spacer SP2b.

Referring to FIGS. 10A and 10B, the bottom surface of the preliminary trench TRC2 is etched by using the second mask pattern MK2 and the second spacer SP2 as an etch mask. By the etching, the second trenches TRC2 having a width narrower than the preliminary trench TRC2p.

According to embodiments, as illustrated in section D-D of FIG. 10A, the bottom surface of the second trench TRC2 may be lower than the bottom surface of the lower gate layer LGL. In this case, the lower gate layer LGL is horizontally separated by the second trenches TRC2, so that lower gate patterns LGP arranged 2-dimensionally in the first trenches TRC1 may be formed. However, according to embodiments of the inventive concept, since the bottom surface of the second trench TRC2 is positioned above the bottom surface of the lower gate layer LGL, the lower gate layer LGL may not be completely separated by the second trenches TRC2. The description on these modified embodiments will be omitted for the simplicity of description.

Figure 22:
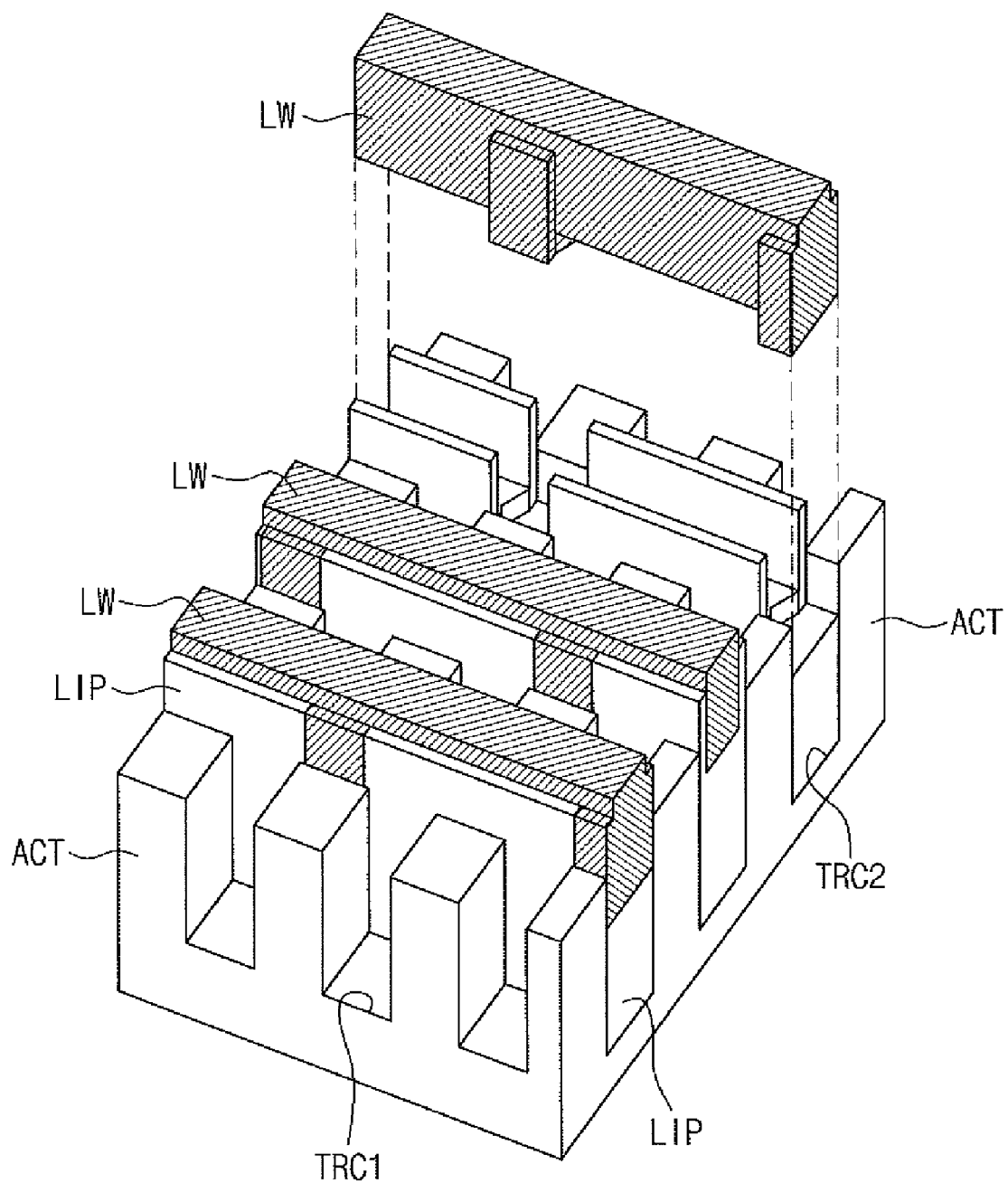

Referring to FIG. 4, in operation S15, lower wirings LW contacting a sidewall of the active pattern ACT in the lower region of the second trench TRC2 are formed. This operation S15 may include forming a lower insulation pattern LIP filling a lower region of the second trench TRC2, patterning the lower insulation pattern LIP to form ditches DCH crossing the first trenches TRC1 and undercut regions UCR exposing the sidewalls of the active patterns ACT, and then forming the lower wirings LW filling the ditches DCH and the undercut regions UCR. FIG. 22 is an exploded perspective view exemplarily illustrating configurations and shapes of the ditches, the undercut regions, and the lower wirings.

Figure 11A:
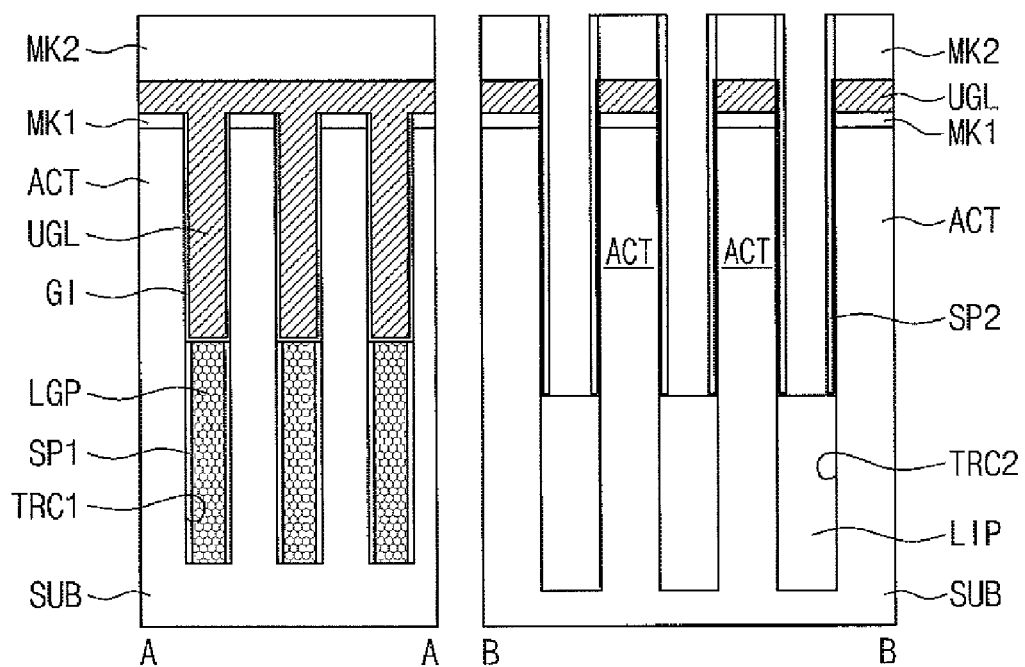
Figure 11A:
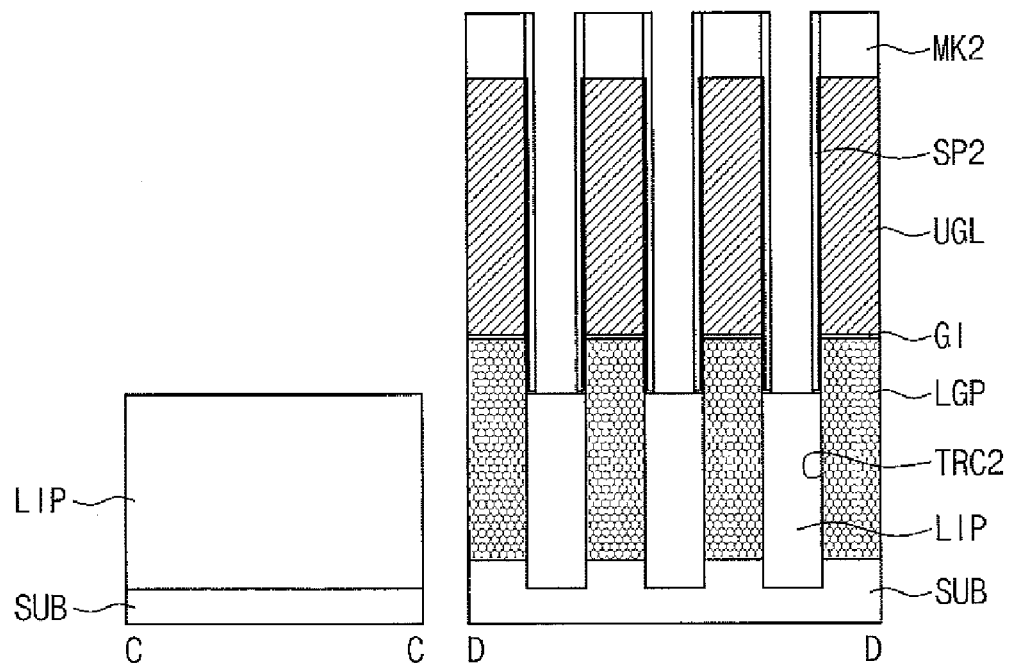
Figure 11B:
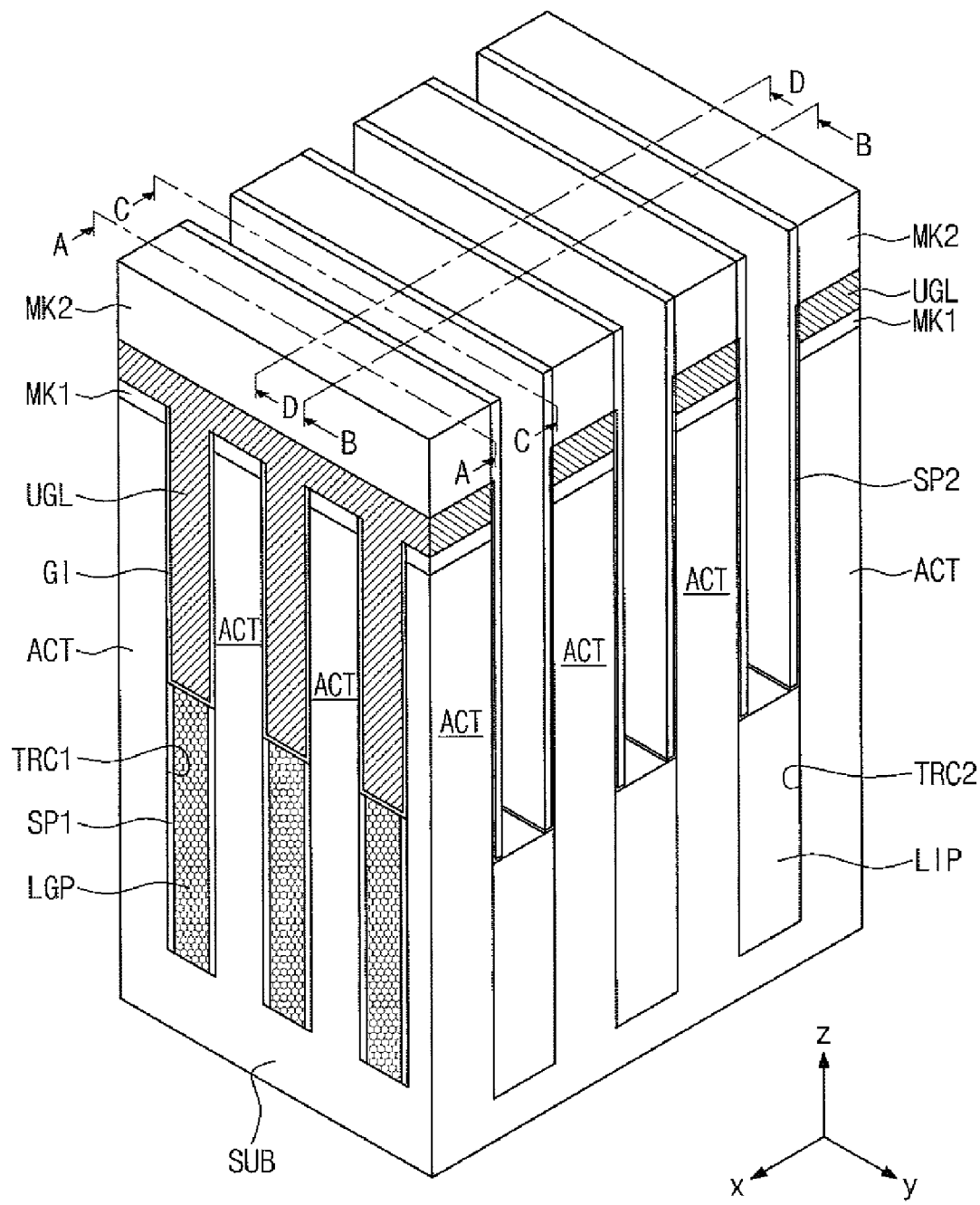

According to some embodiments, the lower insulation pattern LIP may be formed by thermal oxidizing the sidewalls of the active patterns ACT and the lower gate patterns LGP exposed by the second trench TRC2. In this case, as illustrated in FIGS. 11A and 11B, since atoms constituting the active pattern ACT are oxidized to form the lower insulation pattern LIP, the width of the lower insulation pattern LIP may be wider than the space between the second spacers SP2. That is, the lower insulation pattern LIP may be also formed below the second spacer SP2. According to embodiments, the lower insulation pattern LIP may be formed with a width wider than that of the preliminary trench TRC2p, as illustrated in FIGS. 11A and 11B. According to an embodiment, the lower insulation pattern LIP may be completed through a deposition process performed in addition to the foregoing thermal oxidation process.

Figure 12A:
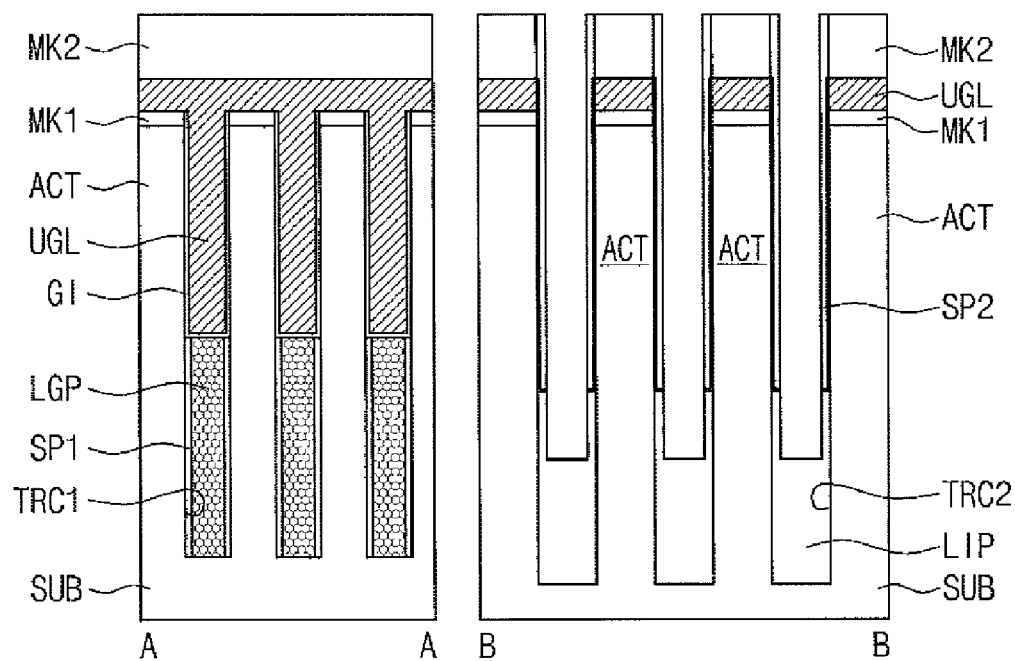
Figure 12A:
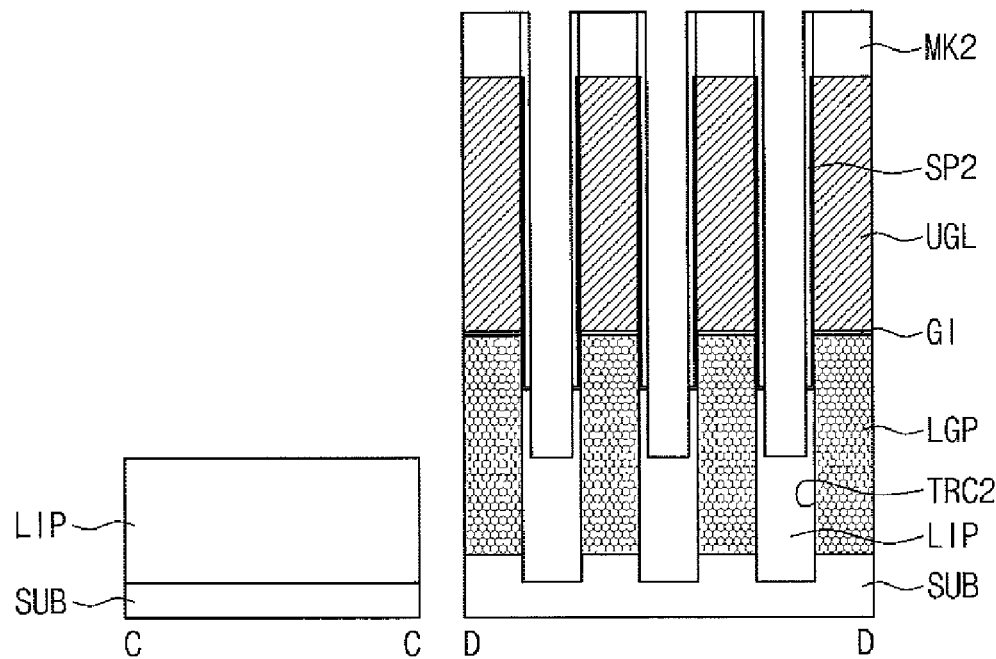
Figure 12B:
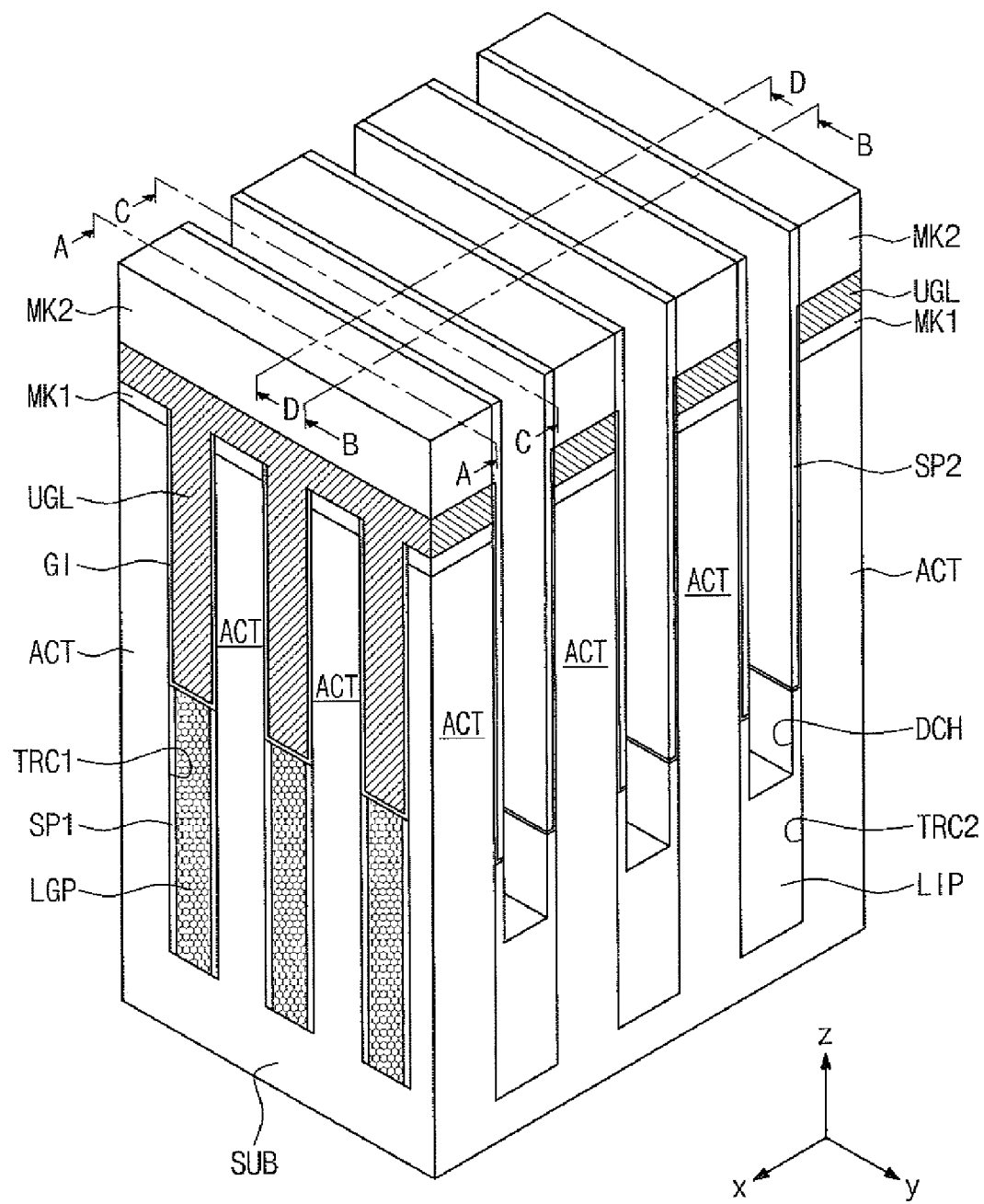

The ditches DCH may be formed by anisotropically etching an upper surface of the lower insulation pattern LIP using the second spacers SP2 as an etch mask. By doing so, as illustrated in FIGS. 12A and 12B, the ditches DCH are formed spaced apart from the sidewalls of the active patterns ACT in the second trench TRC2. That is, a portion of the lower insulation pattern LIP which is not etched during the anisotropic etching may remain below the second spacer SP2, and the ditch DCH and the active patterns ACT adjacent to the ditch DCH may be separated by the remaining portion of the lower insulation pattern LIP.

Figure 13A:
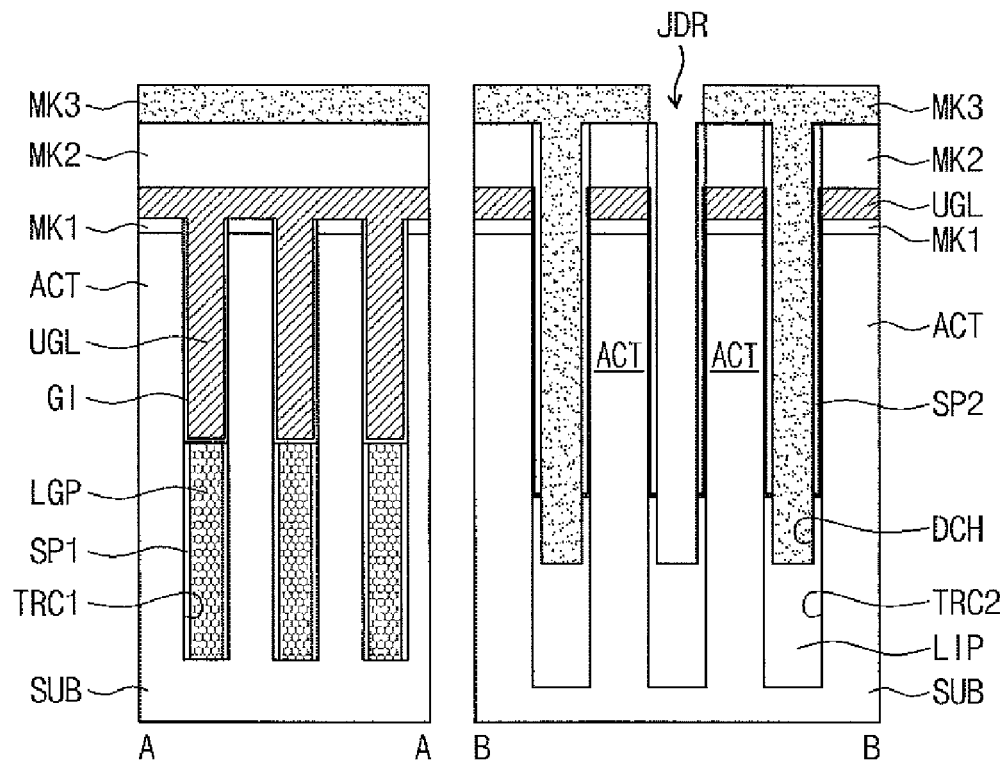
Figure 13A:
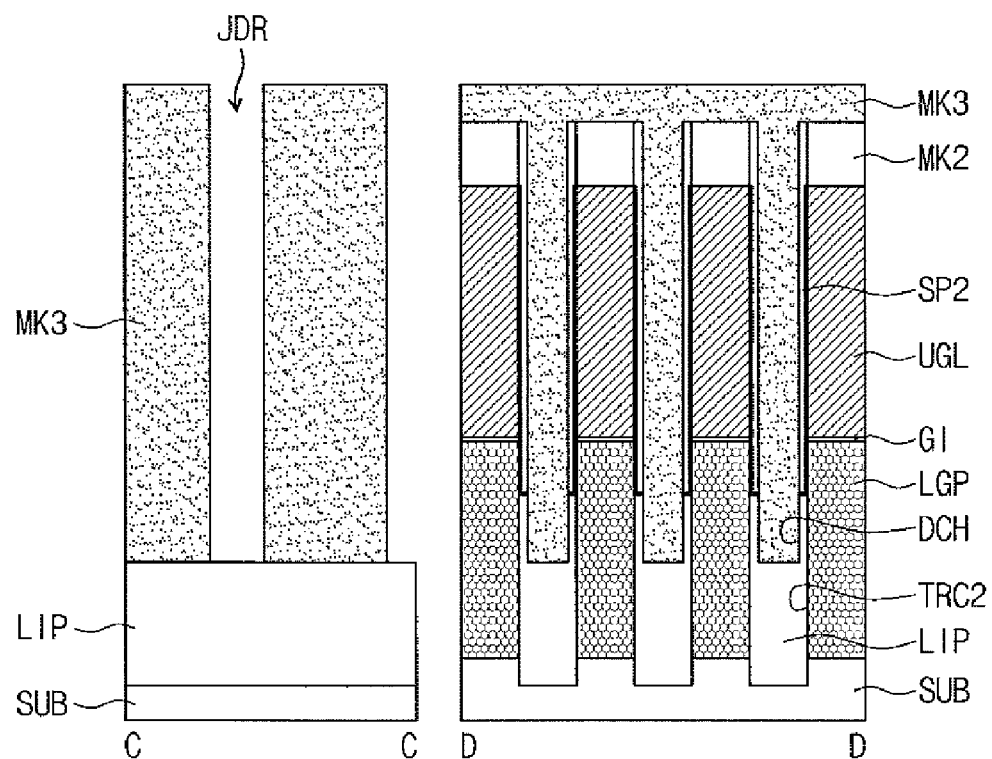
Figure 13B:
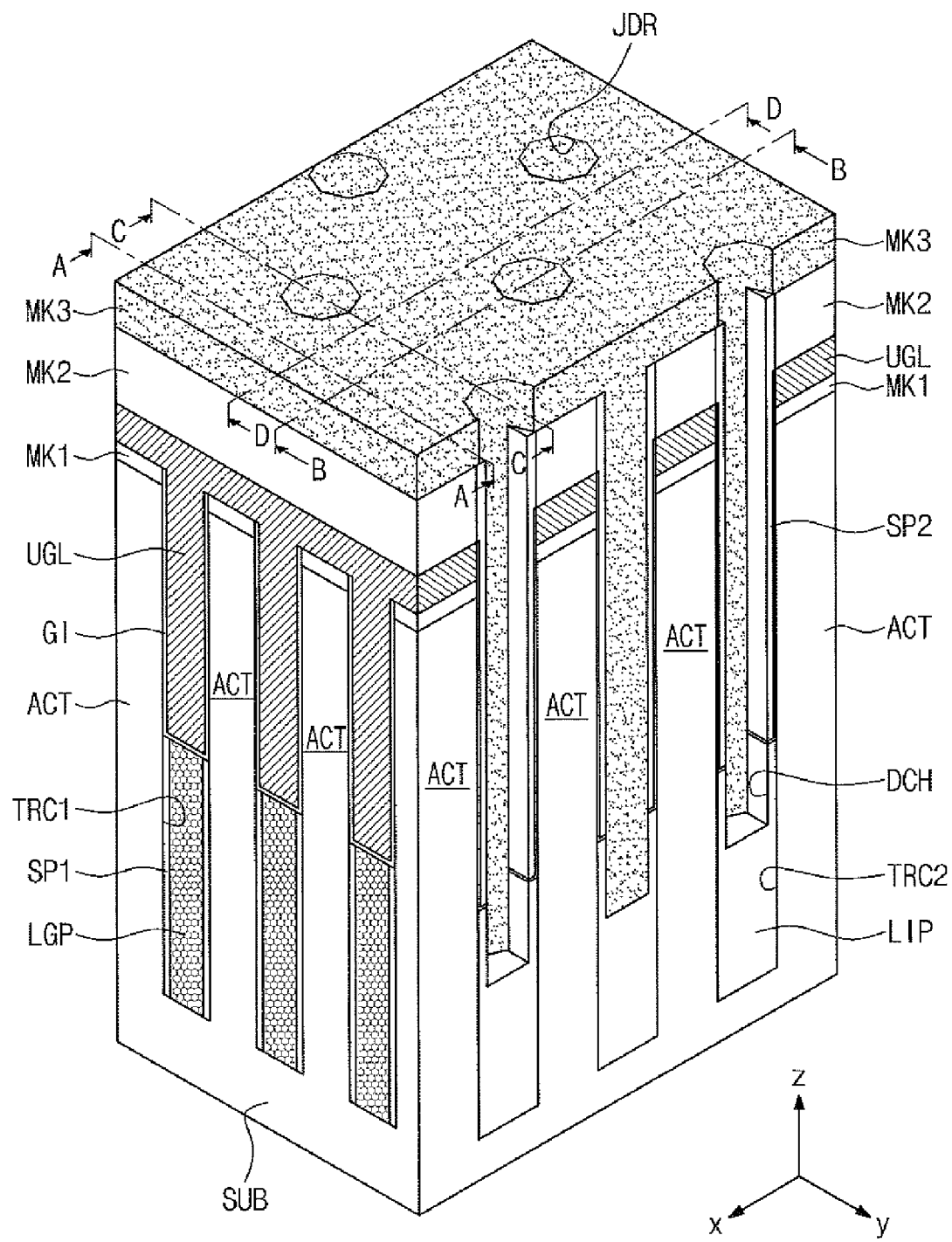
Figure 14A:
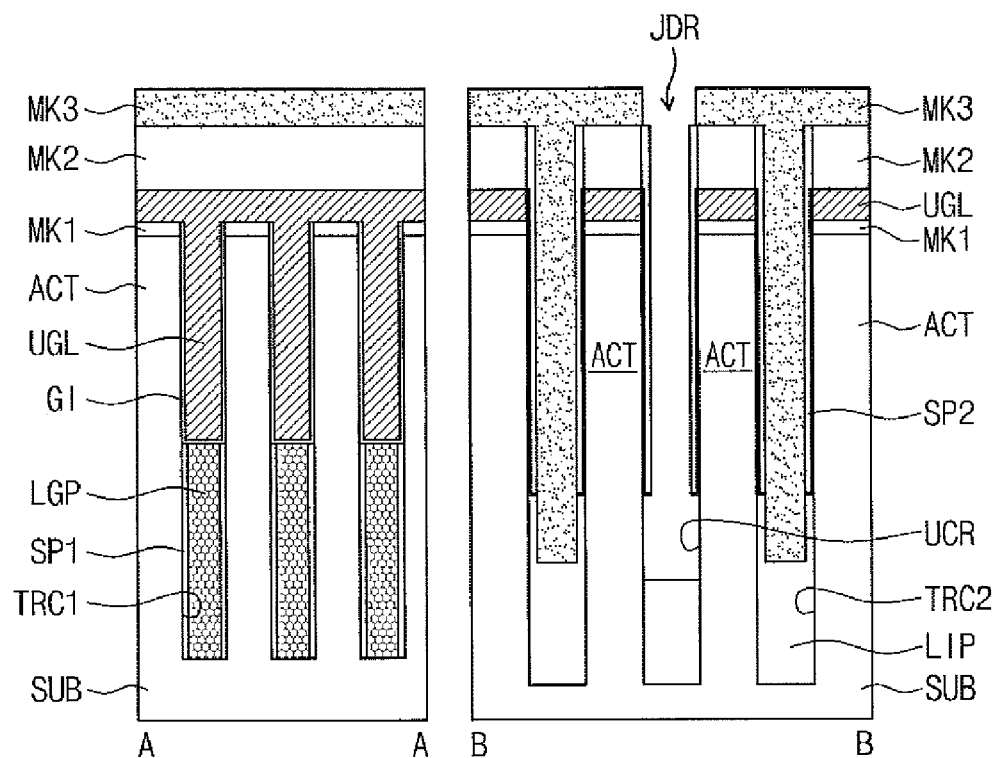
Figure 14A:
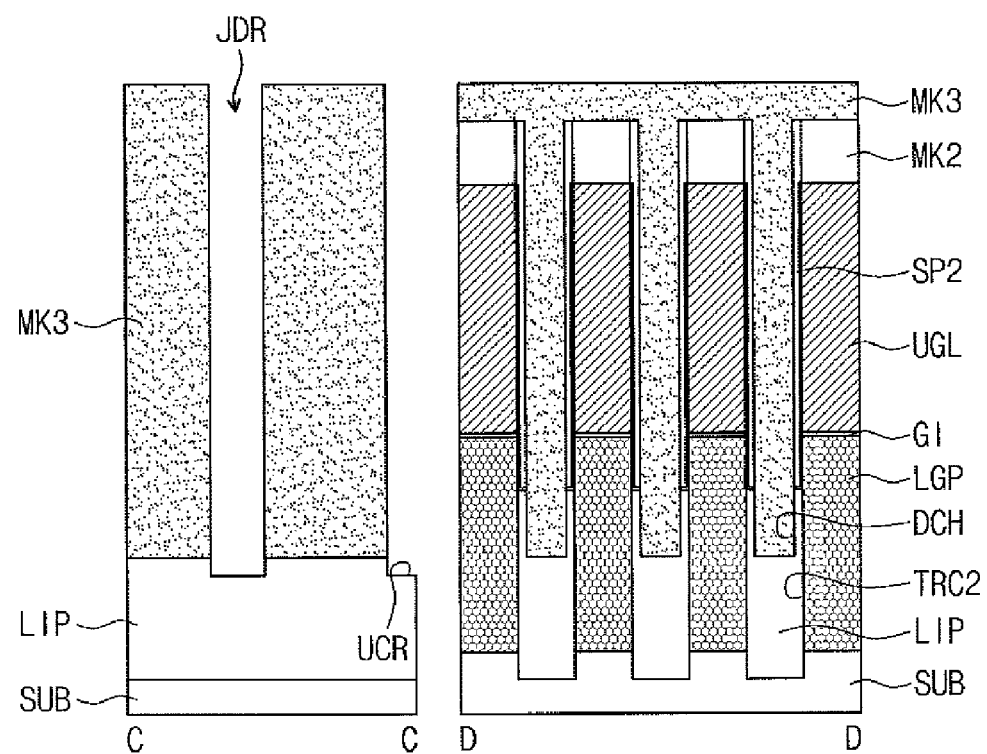
Figure 14B:
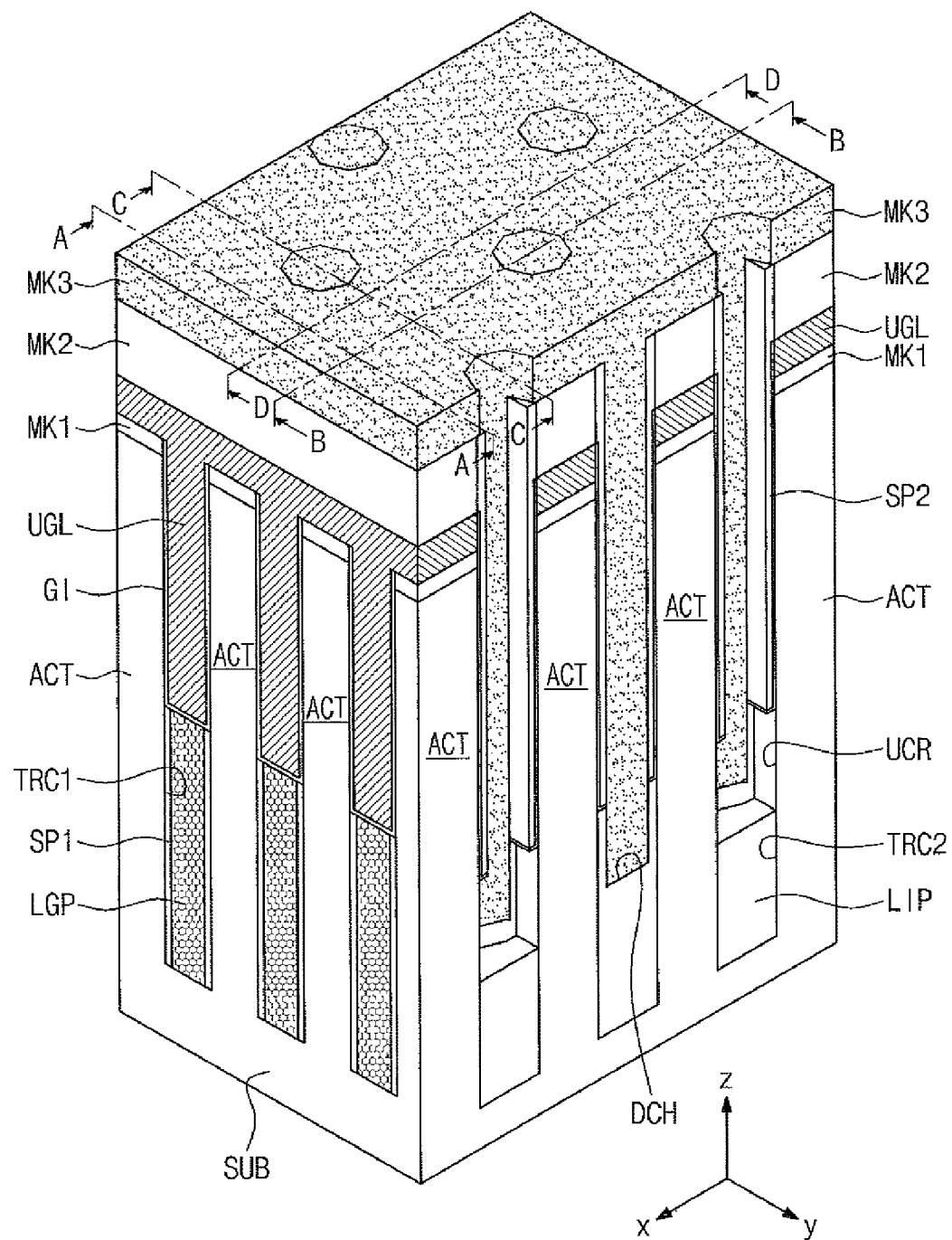

The undercut regions UCR may be formed by forming a third mask pattern MK3 as illustrated in FIGS. 13A and 13B and then patterning the lower insulation pattern LIP using the third mask pattern MK3 as a mask. More specifically, the third mask pattern MK3 may be formed to define a hole-shaped junction defining region JDR exposing some portion of the ditches DCH. According to embodiments of the inventive concept, the third mask pattern MK3 may be a photoresist pattern formed through a photolithography process. The undercut regions UCR are formed by isotropically extending the ditches DCH exposed by the junction defining regions JDR to expose the sidewalls of the active patterns ACT adjacent to the junction defining regions JDR. As a result of the isotropic expansion, as exemplarily illustrated in section C-C of FIG. 14A, the undercut region UCR may be formed with a bottom surface which is lower than the ditch DCH.

The junction defining regions JDR and the undercut regions UCR may be 2-dimensionally on the substrate SUB. According to an embodiment of the inventive concept, center points of the junction defining regions JDR and the undercut regions UCR may be positioned inside regions which are included in the second trench TRC2 but are not included in the first trenches TRC1. That is, the center points of the junction defining regions JDR and the undercut regions UCR may be positioned inside recess regions of the substrate which are newly formed by the second trenches TRC2. However, according to embodiments, another portion of the junction defining region JDR or the undercut region UCR escaping from the center point may extend to a region included in the first trench TRC1. That is, the width of the junction defining region JDR or the width of the undercut region UCR, which is measured in a major direction (hereinafter, referred to as "y-direction") of the second trench TRC2, may be greater than the width of the active pattern ACT.

The distance between the junction defining regions JDR or the distance between the undercut regions UCR, which is measured in the y-direction at the inside of one of the second trenches TRC2, may be greater than a pitch (i.e., sum of width and space) of the active pattern ACT. For example, the distance between the center points of the undercut regions UCR at the inside of one of the second trenches TRC2 may be two times greater than the pitch of the active pattern ACT. In this case, the undercut regions UCR are locally formed between even-numbered active patterns ACT in one of the second trenches TRC2 and may not be formed between odd-numbered active patterns ACT.

When considering the second trenches TRC2 in one pair adjacent to each other, the undercut regions UCR disposed at the inside of one of the second trenches TRC2 in one pair are formed to expose the sidewalls of the even-numbered active patterns ACT, and the undercut regions UCT disposed at the inside of the other are formed to expose the sidewalls of the odd-numbered active patterns ACT. The number of the junction defining regions JDR or the undercut regions UCR may be approximately half of the number of the active patterns ACT.

Figure 15A:
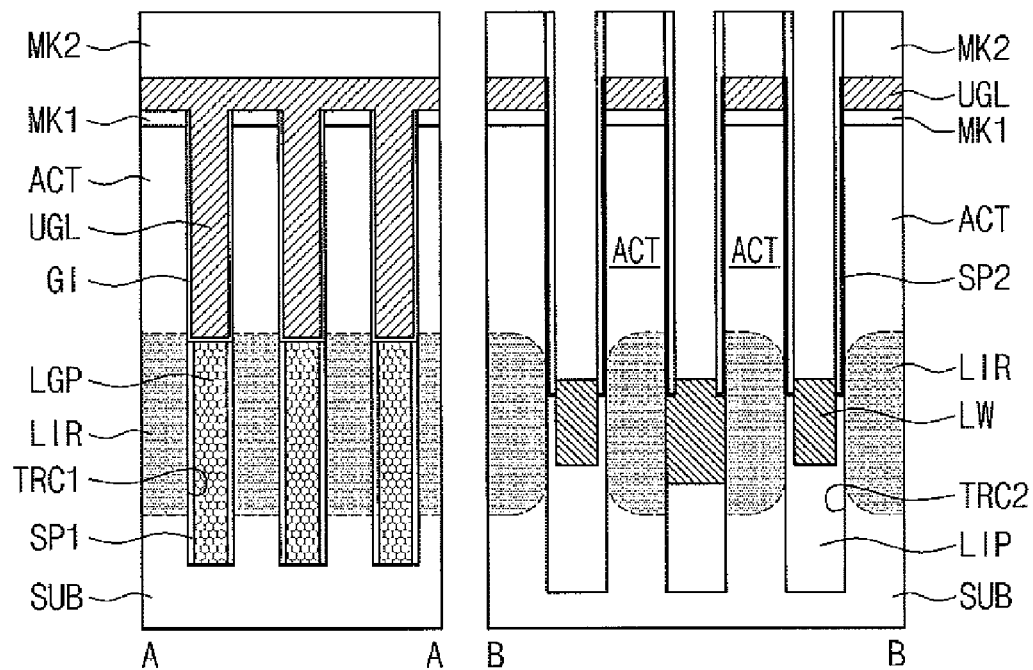
Figure 15A:
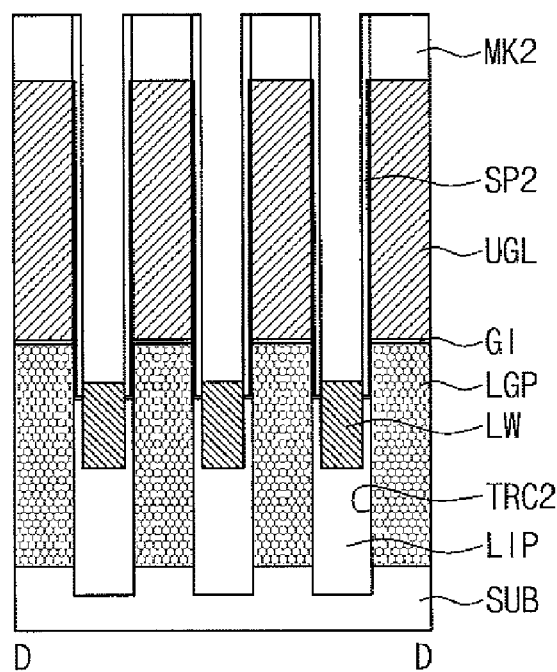
Figure 15B:
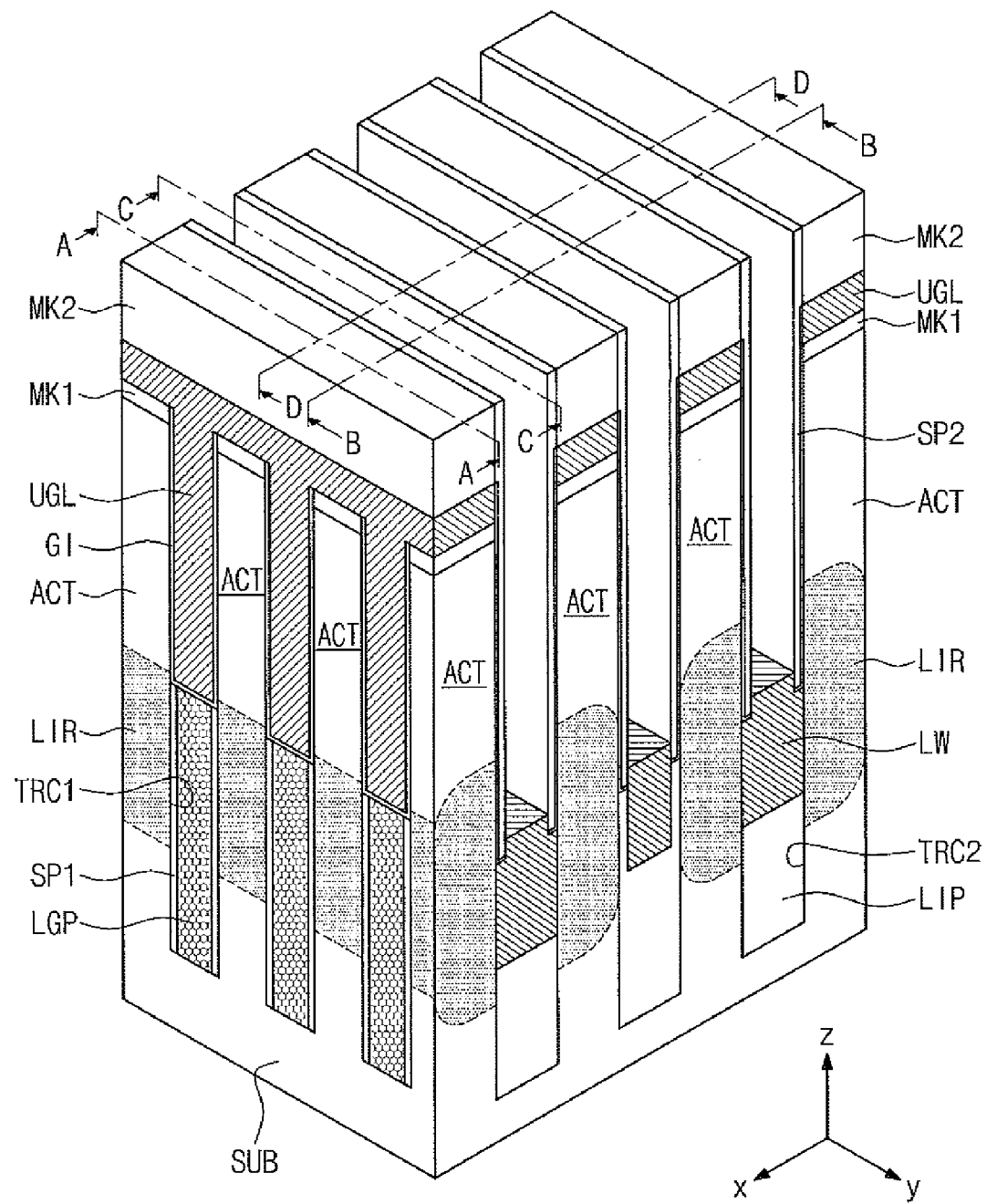

As illustrated in FIGS. 15A and 15B, prior to forming the lower wiring LW, an operation of doping a lower region of the active patterns ACT adjacent to the undercut regions UCR with impurities having a conductivity type different from the substrate SUB through the undercut regions UCR may be further performed. As a result of the doping operation, lower impurity regions LIR may be formed in the lower regions of the active patterns ACT.

According to embodiments of the inventive concept, the lower impurity regions LIR may horizontally extend from one sidewall of the active region adjacent to the undercut region UCR to another sidewall facing the one sidewall of the active region. Accordingly, the lower impurity region LIR, and upper and lower regions disposed thereover and thereunder, respectively, may form a p-n-p structure or an n-p-n structure. The upper region of the active pattern ACT may be electrically isolated from the substrate SUB or the lower region of the active pattern ACT by the lower impurity region LIR. The lower impurity region LIR may form the second region R2 described with reference to FIG. 1.

The lower impurity regions LIR may vertically extend from the undercut region UCR to the vicinity of the undersurface of the upper gate layer UGL. When the impurities are isotropically diffused in the active pattern ACT, the lower impurity region LIR may have a round section doping profile, as illustrated in FIG. 15A. That is, the distance between the top surface of the active pattern ACT and the lower impurity region LIR may be longer at a sidewall facing the undercut region UCR than at a sidewall facing a sidewall adjacent to the undercut region UCR.

The lower wirings LW may be formed so as to fill the ditches DCH and the undercut regions UCR. As a result, the lower wirings LW may contact the active patterns ACT or the lower impurity regions LIR through the undercut regions UCR. The lower wirings LW may include a conductive material such as a metal layer. For example, the lower wiring LW may include at least one of barrier metal layers and a metal layer in order to be in ohmic contact with the lower impurity region LIR.

Referring to FIG. 4 again, in operation S16, plug insulation patterns PIP disposed on some of the lower gate patterns LGP are formed. During this operation S16, upper insulation patterns UIP filling the second trenches TRC2 formed with the lower wirings LW may be further formed. According to an embodiment of the inventive concept, the plug insulation pattern PIP and the upper insulation pattern UIP may be a silicon oxide layer. Also, during this operation S16, the upper gate layer UGL may be separated along the y-direction to form upper gate patterns UGP.

The plug insulation patterns PIP may be formed by patterning the upper gate layer to form holes expose the gate insulator GI at an upper portion of the first trenches TRC1, forming a plug insulation layer filling the holes, and planarization-etching the plug insulation layer. As a result of the planarization-etching, as illustrated in the drawing, upper surfaces of the upper gate patterns UGP may be exposed, but the technical spirit of the inventive concept is not limited to this embodiment.

Figure 16A:
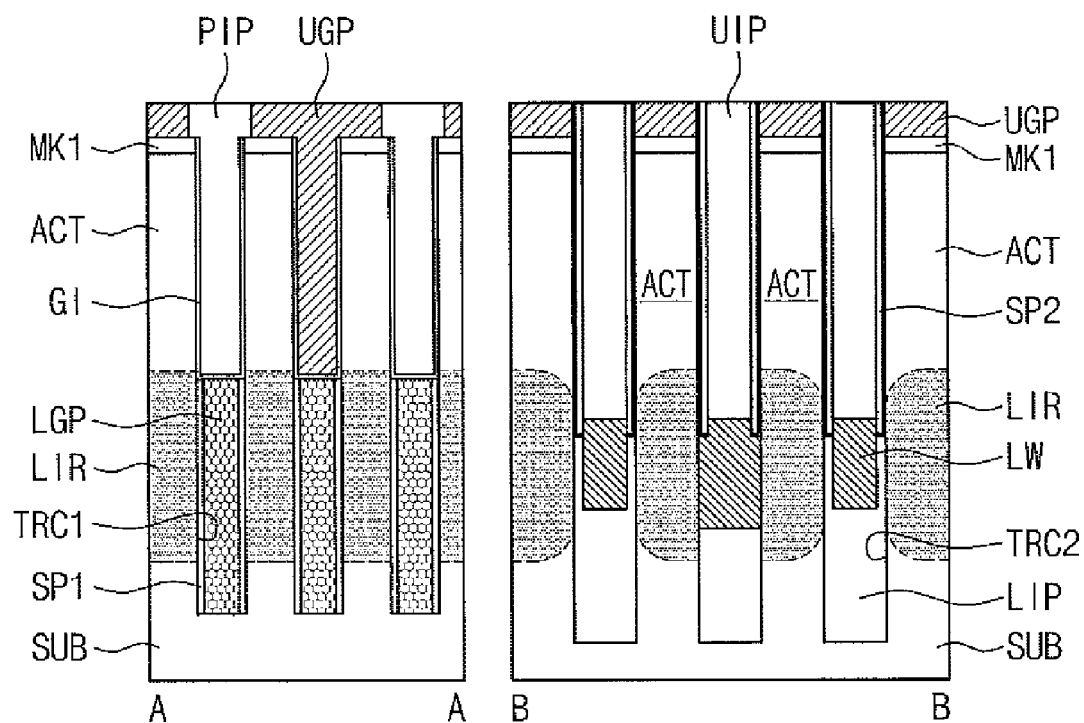
Figure 16A:
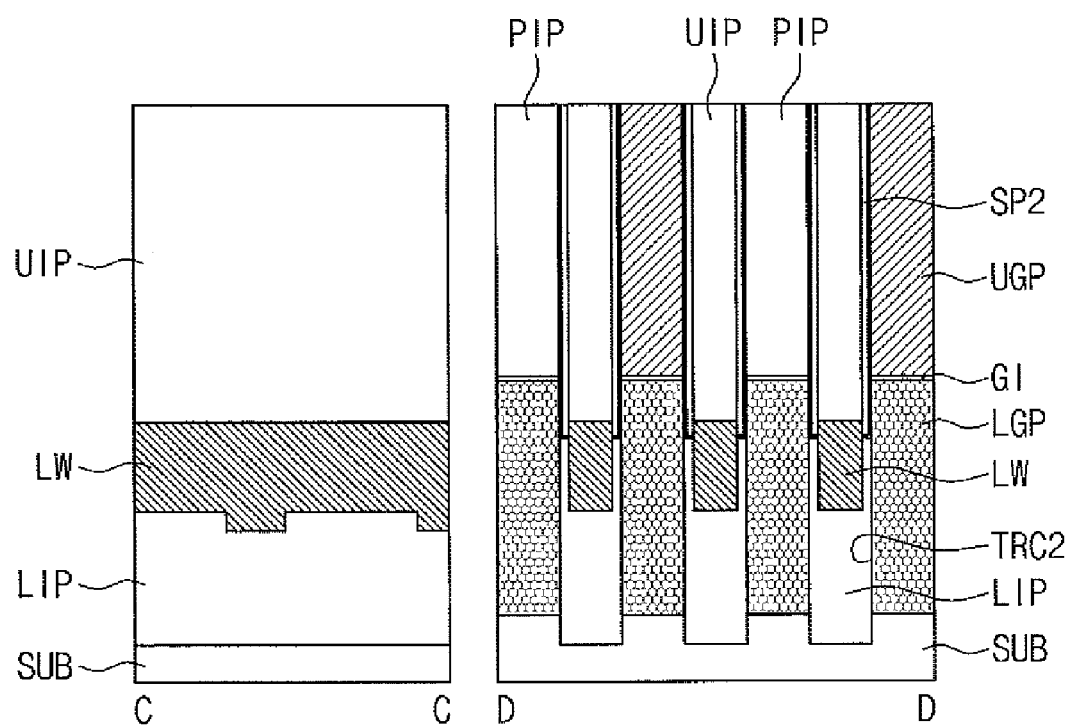
Figure 16B:
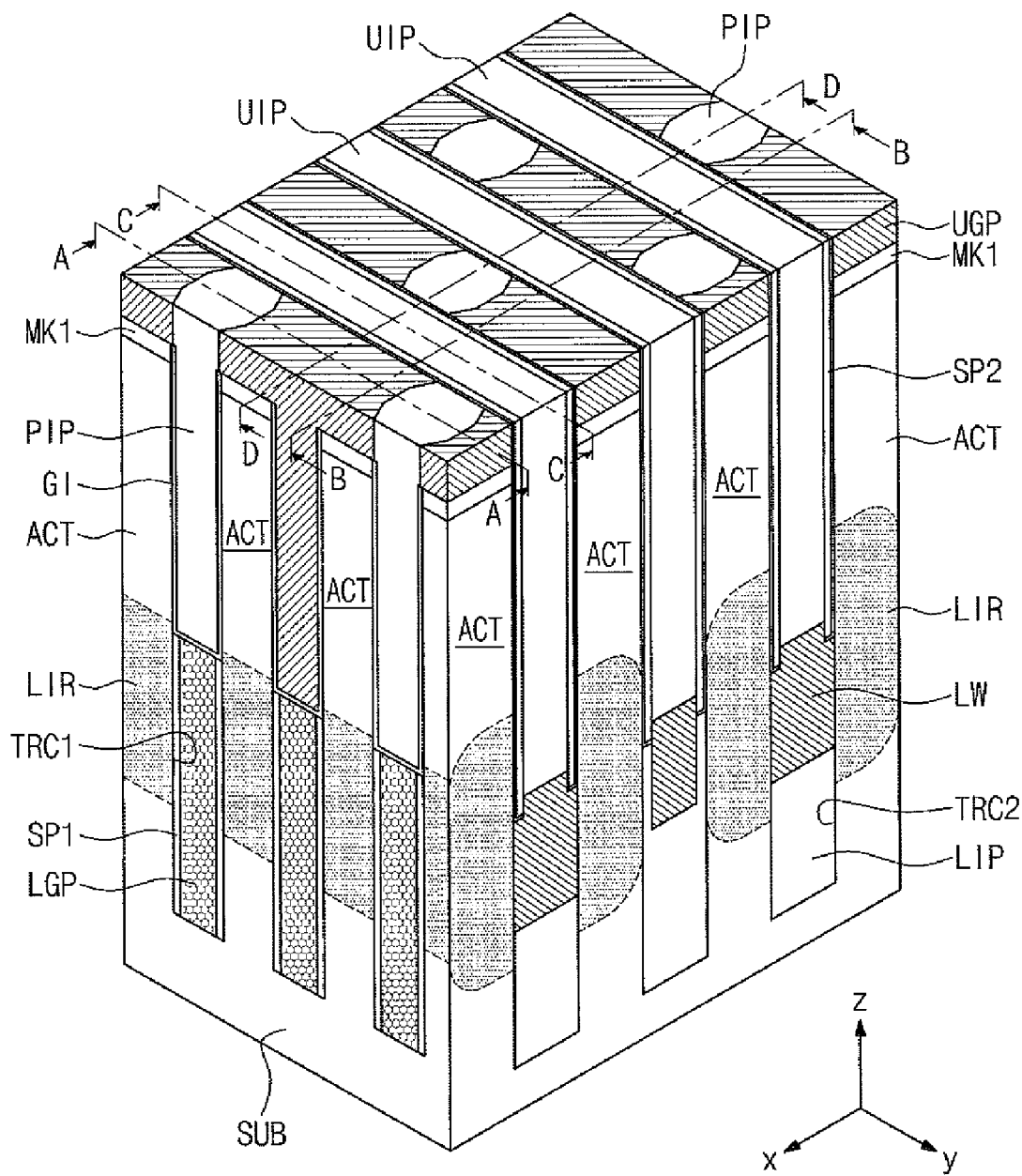

According to an embodiment, the gate insulator GI is removed while the holes for the plug insulation pattern PIP are formed, so that the upper sidewall of the active pattern ACT may be exposed. The holes may be formed to remove the upper gate layer UGL positioned thereunder. In this case, the plug insulation pattern PIP may directly contact the top surface of the lower gate pattern LGP, or as illustrated in FIGS. 16A and 16B, only the gate insulator GI may be disposed between the plug insulation pattern PIP and the lower gate pattern LGP.

According to an embodiment, the plug insulator may be formed at the same time with an insulator for the upper insulation pattern UIP. However, according to an embodiment, after an insulator for the upper insulation pattern UIP is formed, the plug insulator may be formed independently on the insulator for the upper insulation pattern UIP.

The center points of the plug insulation patterns PIP may be positioned inside regions which are included in the first trenches TRC1 but are not included in the second trenches TRC2. The distance between the center points of the plug insulation patterns PIP, which is measured in the y-direction, may be two times greater than the pitch of the active pattern ACT. That is, the plug insulation patterns PIP may be disposed within odd-numbered spaces among spaces formed between the active patterns ACT constituting a first group, and the upper gate patterns UGP may remain within even-numbered spaces among the spaces. Here, the first group may consist of some of the active patterns ACT, which have the same x-coordinate and are arranged along the y-direction.

The active patterns ACT, which are arranged along the y-direction with the same x-coordinate and are adjacent to the first group, may constitute a second group. In this case, the upper gate patterns UGP may remain within odd-numbered spaces among spaces formed between the active patterns ACT of the second group, and the plug insulation patterns PIP may remain at even-numbered spaces. That is, not only the plug insulation patterns PIP but also the gate patterns GP are disposed to form a checkerboard shaped configuration, but the plug insulation patterns PIP and the gate patterns GP are not overlap each other. FIG. 16B exemplarily illustrates a relative arrangement between the plug insulation patterns PIP and the gate patterns GP.

Referring to FIG. 4 again, in operation S17, upper wirings UW connected to the upper gate patterns UGP are formed. The upper wirings UW may be formed such that the upper wirings UW connect the upper gate patterns UGP while crossing the lower wirings LW or the second trenches TRC2.

Figure 17A:
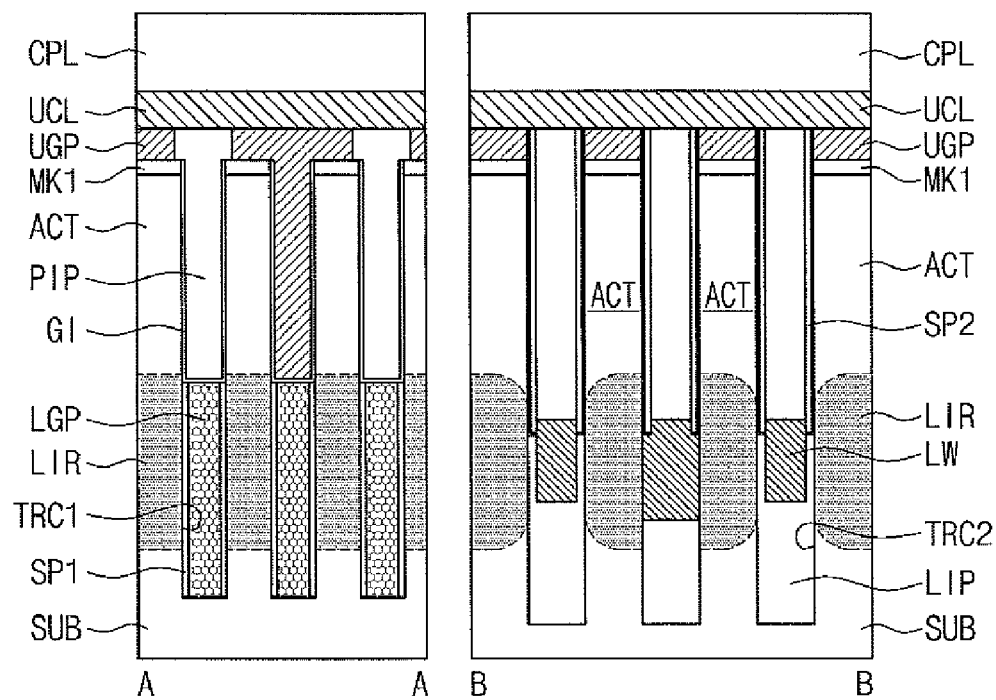
Figure 17A:
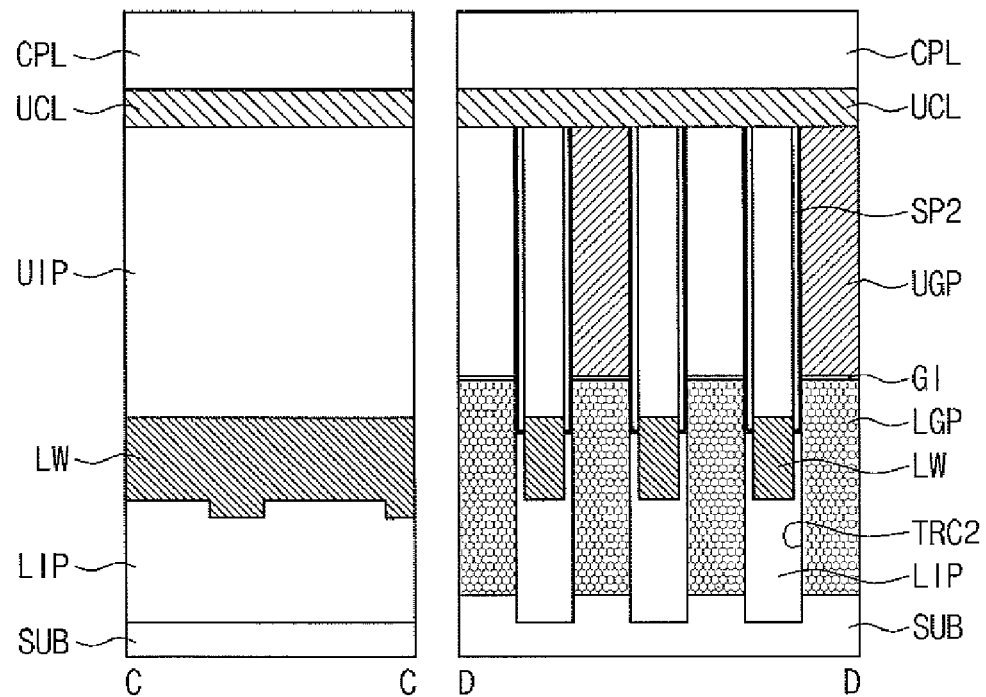
Figure 17B:
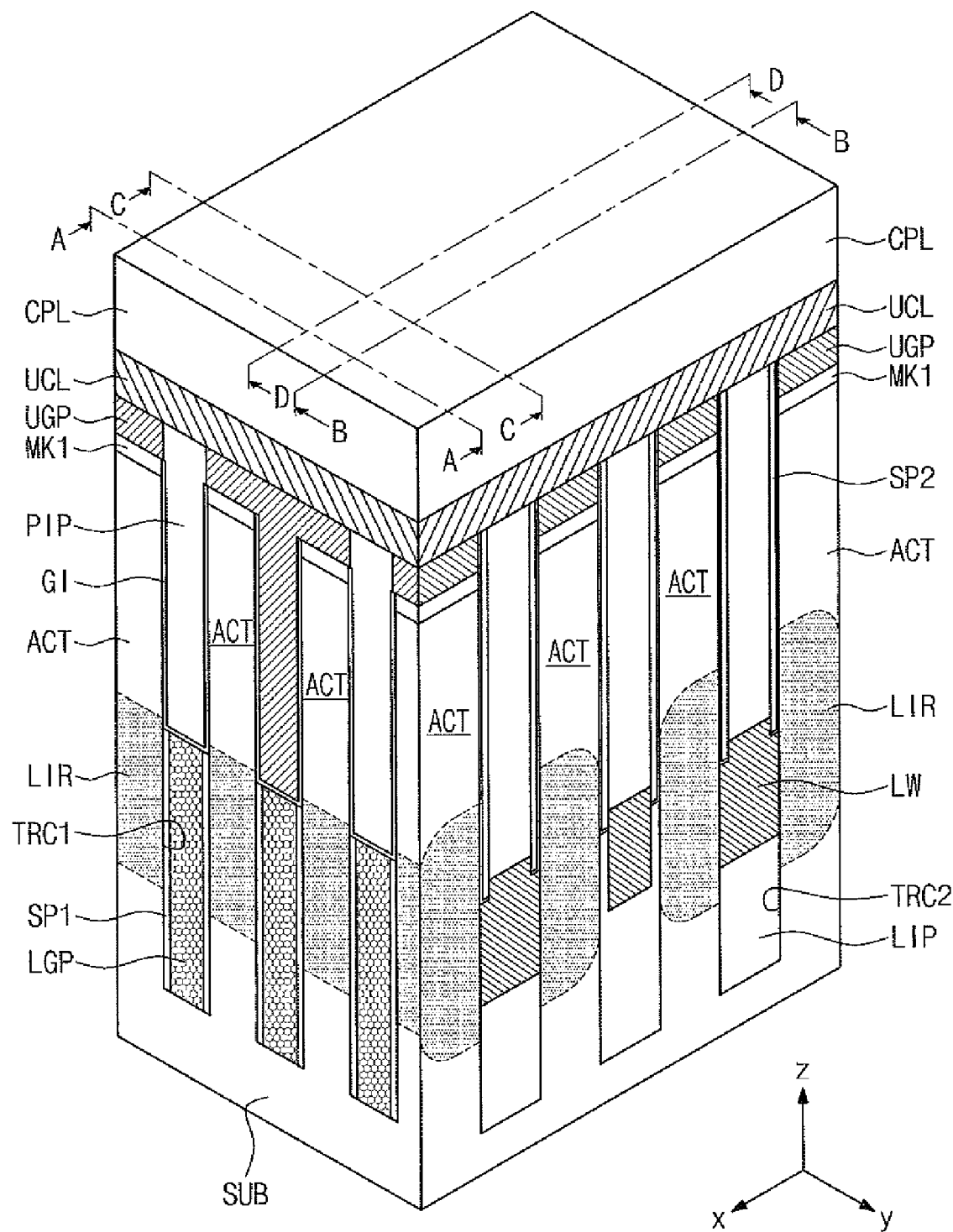
Figure 18A:
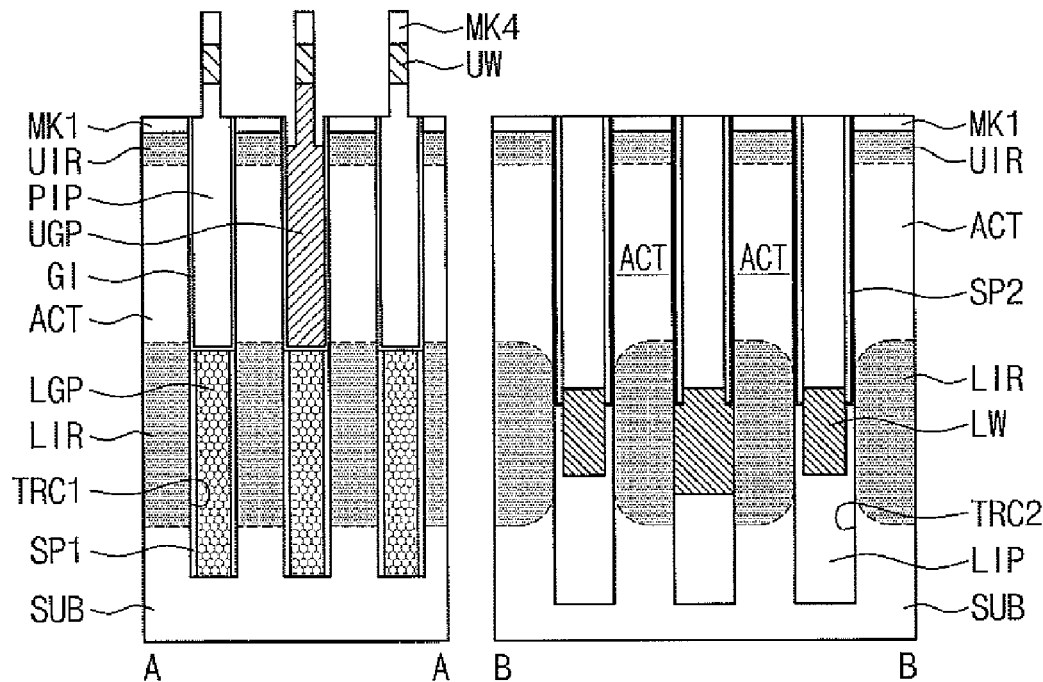
Figure 18A:
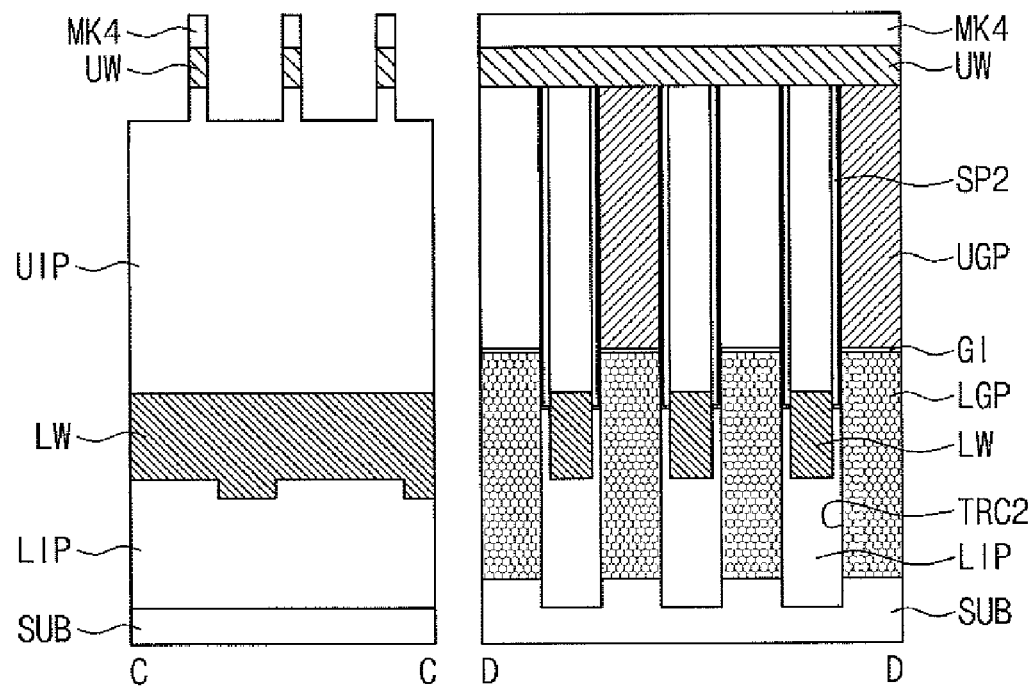
Figure 18B:
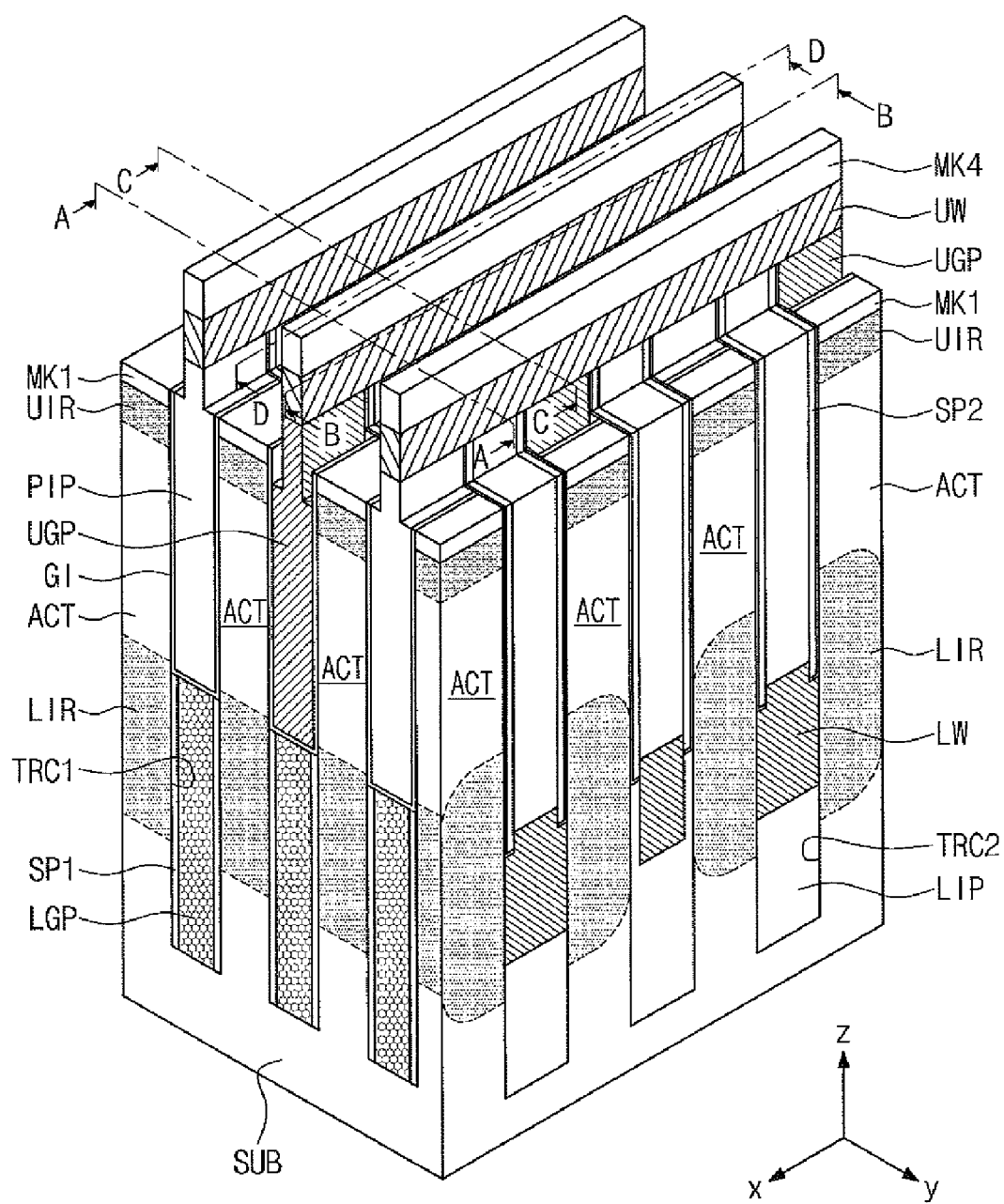

The operation S17 of forming the upper wirings UW may include sequentially forming an upper conductive layer UCL and a capping layer CPL on the resultant structure with the plug insulation patterns PIP formed as illustrated in FIGS. 17A and 17B, and then patterning the capping layer CPL and the upper conductive layer UCL to form the upper wiring UW and a fourth mask pattern MK4 stacked in sequential as illustrated in FIGS. 18A and 18B. The upper conductive layer UCL may include at least one of metal materials, metal nitrides or silicide materials. The capping layer CPL or the fourth mask pattern MK4 may be formed of a material (e.g., silicon nitride) that can be used as an etch mask during the patterning of the upper conductive layer UCL.

According to embodiments, the upper wiring UW may be formed with a width smaller than the active pattern ACT. Also, an upper surface of the upper gate pattern UGP may be recessed at both sides of the fourth mask pattern MK4 and thus lowered than the top surface of the active pattern ACT. Accordingly, a portion of the upper gate pattern UGP extending upward from the active pattern ACT may be removed. Additionally, while the upper wiring UW is formed, the first mask pattern MK1 is removed, so that the upper surface of the active pattern ACT may be exposed.

According to embodiments of the inventive concept, as illustrated in FIGS. 18A and 18B, upper impurity regions UIR may be formed by doping an upper region of the active pattern ACT with impurities having a conductivity type which is different from the substrate SUB. The upper impurity regions UIR may be formed through an ion implantation process.

Referring to FIG. 4 again, in operation S18, memory elements ME connected to the upper impurity regions UIR are formed. This operation S18 may include forming a third spacer SP3 covering a sidewall of the fourth mask pattern MK4 and the upper wiring UW, and then forming plugs PLG connected to the upper impurity regions UIR and the memory elements ME connected to the plugs PLG.

Figure 19A:
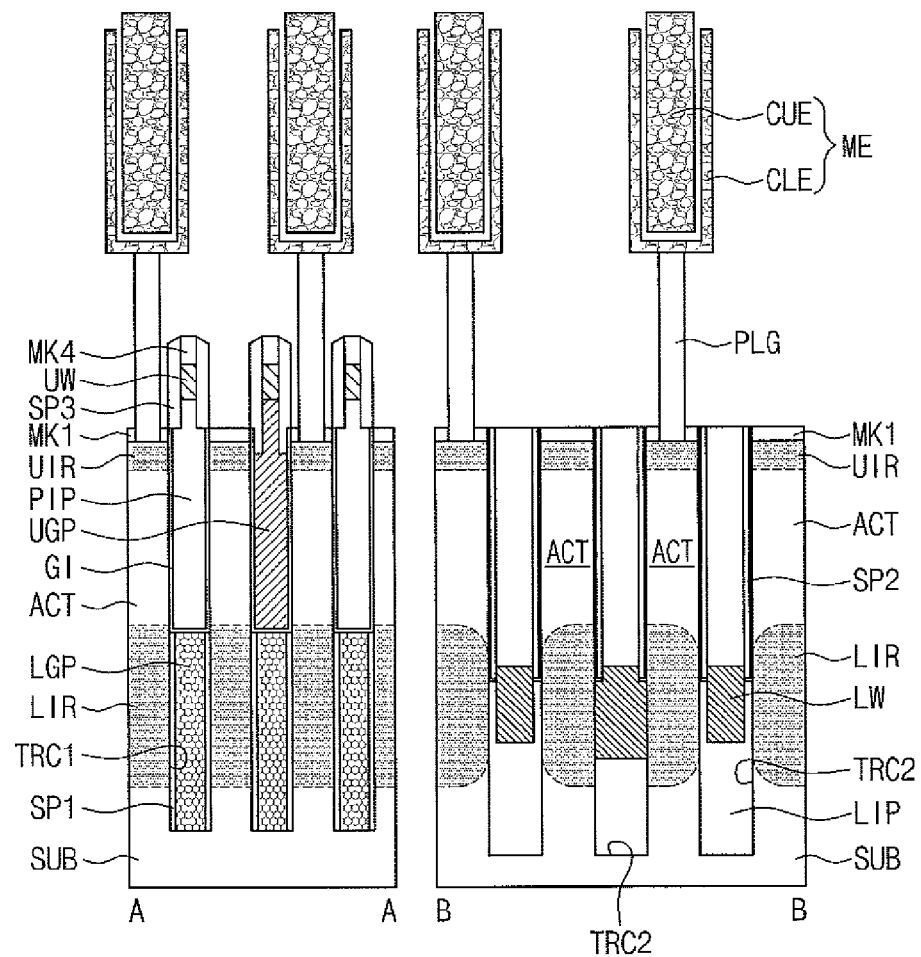
Figure 19A:
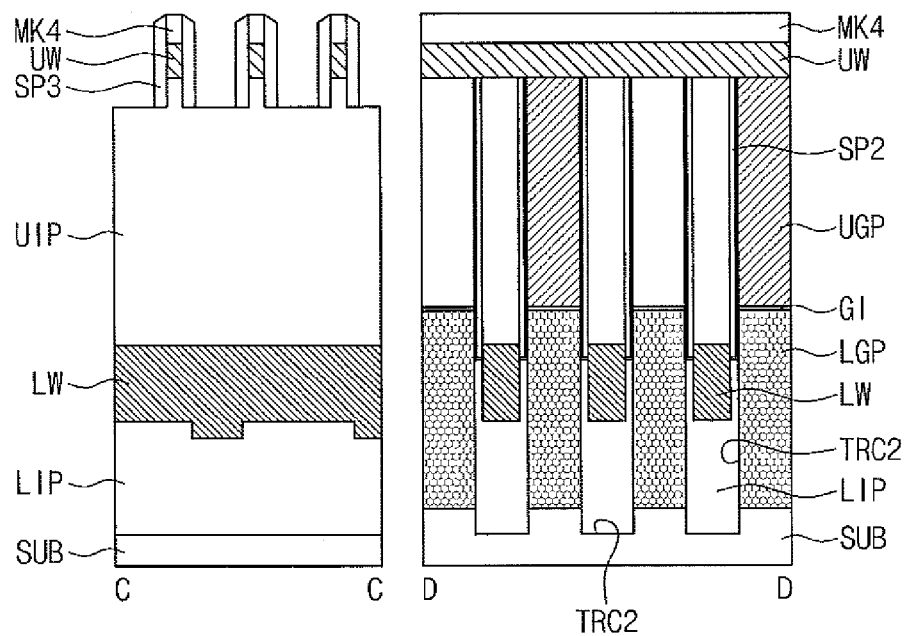
Figure 19B:
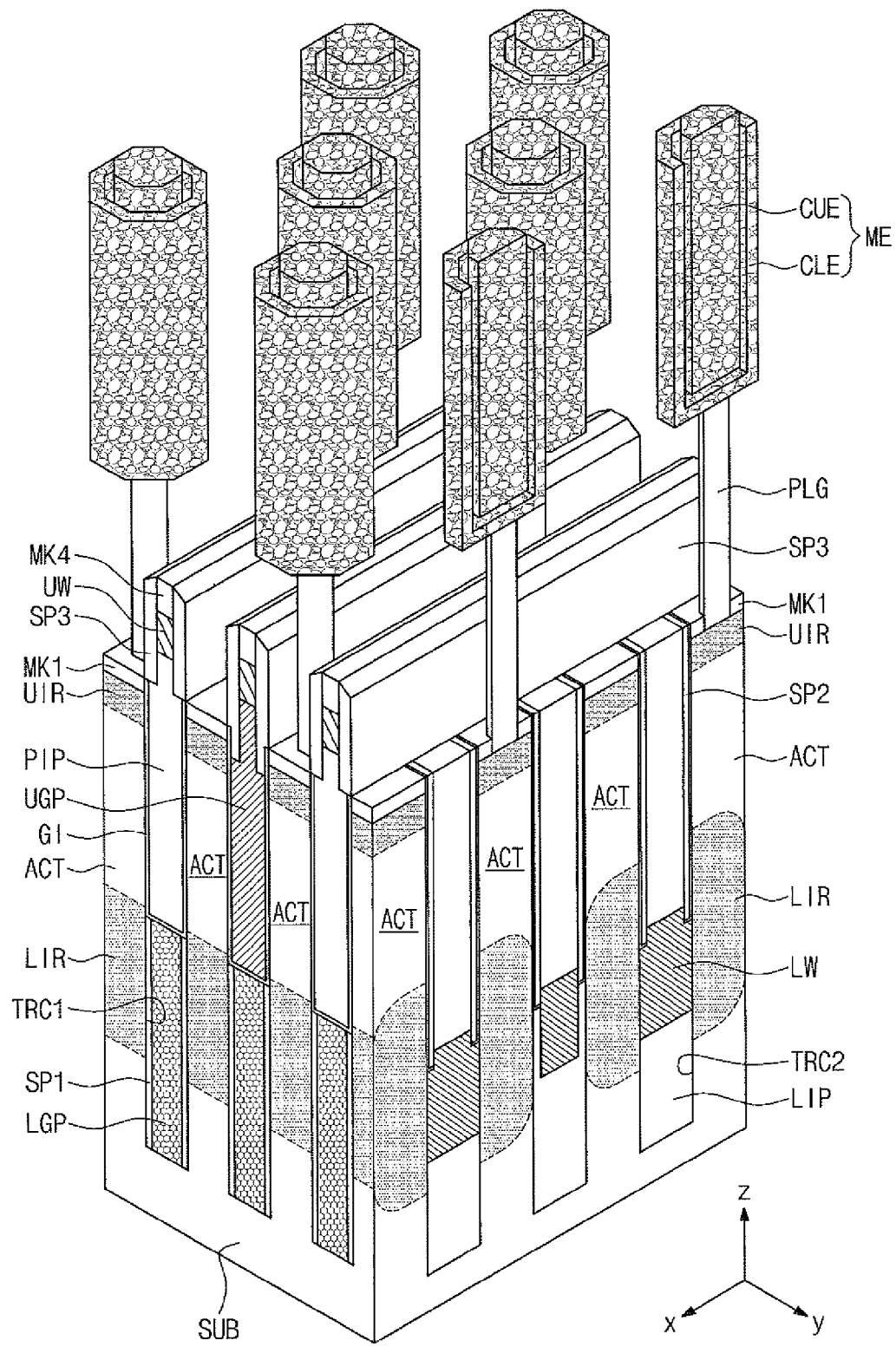

As illustrated in FIGS. 19A and 19B, the memory element ME may be a capacitor including a capacitor lower electrode CLE connected to the upper impurity region UIR through the plug PLG, and a capacitor upper electrode CUE facing the capacitor lower electrode CLE. However, according to an embodiment, the memory element ME may be a capacitor, a ferroelectric capacitor a magnetic tunnel junction (MTJ), a variable resistive element, or a charge storage mechanism. According to an embodiment, the upper impurity regions UIR may be formed after the third spacer SP3 is formed.

The active patterns ACT in one pair are disposed at both sides of the upper gate pattern UGP. According to embodiments of the inventive concept, as illustrated in FIG. 19, each of the plugs PLG may be formed on one of the active patterns ACT in one pair. That is, the number of the plugs PLG or the memory elements ME may be half of the number of the active patterns ACT included in the same area.

Figure 23:
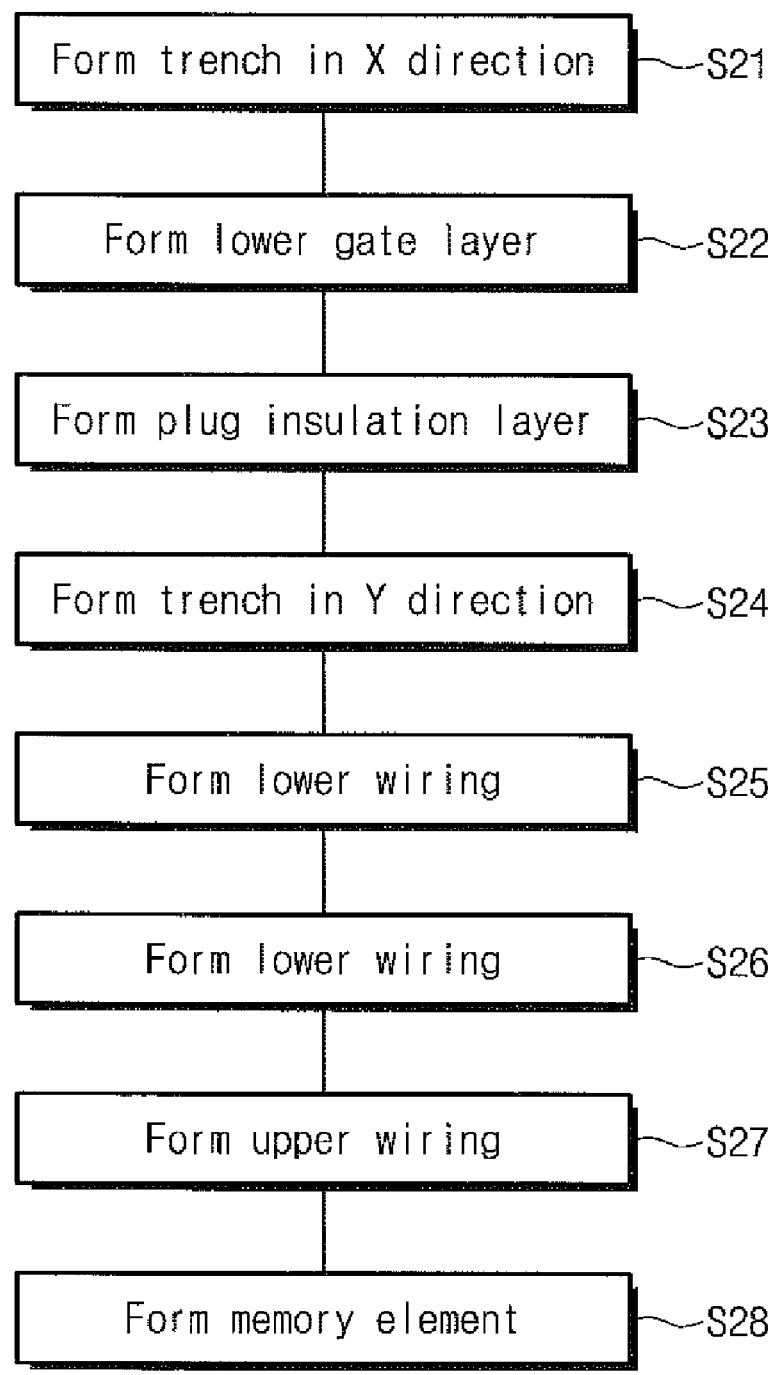
FIG. 23 is a flowchart illustrating a method of fabricating a semiconductor device according to an embodiment of the inventive concept.

FIG. 23 is a flowchart illustrating a method of fabricating a semiconductor device according to an embodiment of the inventive concept. FIGS. 24A to 31A are sectional views illustrating a method of fabricating a semiconductor device according to an embodiment of the inventive concept described with reference to FIG. 23. FIGS. 24B to 31B are perspective views illustrating a method of fabricating a semiconductor device according to an embodiment of the inventive concept described with reference to FIG. 23.

When comparing FIG. 23 with FIG. 4, the current embodiment differs from the embodiment described with reference to FIG. 4 in that the operation S23 of forming a plug insulator is performed prior to the operation S24 of forming a trench in the y-direction. Except for differences in the fabrication method caused by such a difference, the current embodiment may be implemented based on or by modifying the fabrication method of the embodiment described with reference to FIG. 4.

Figure 24A:
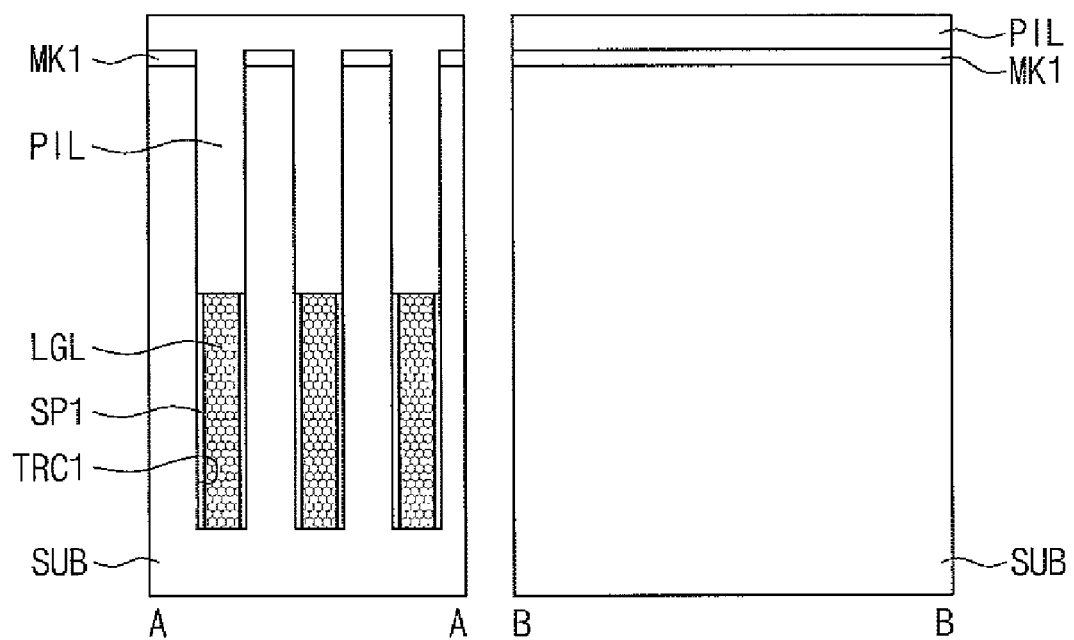
Figure 24A:
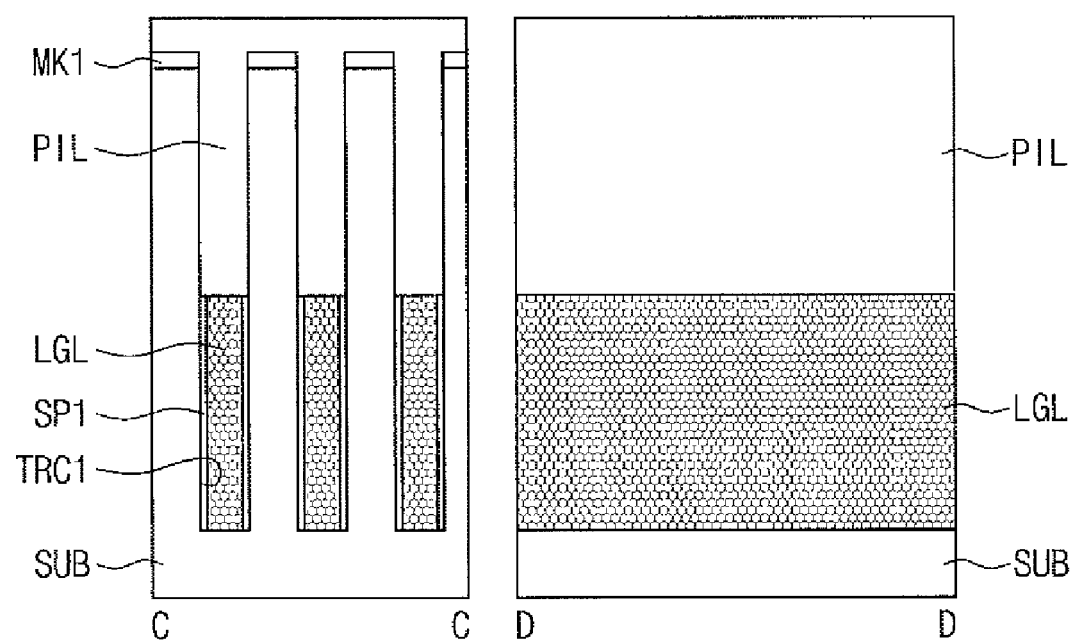
Figure 24B:
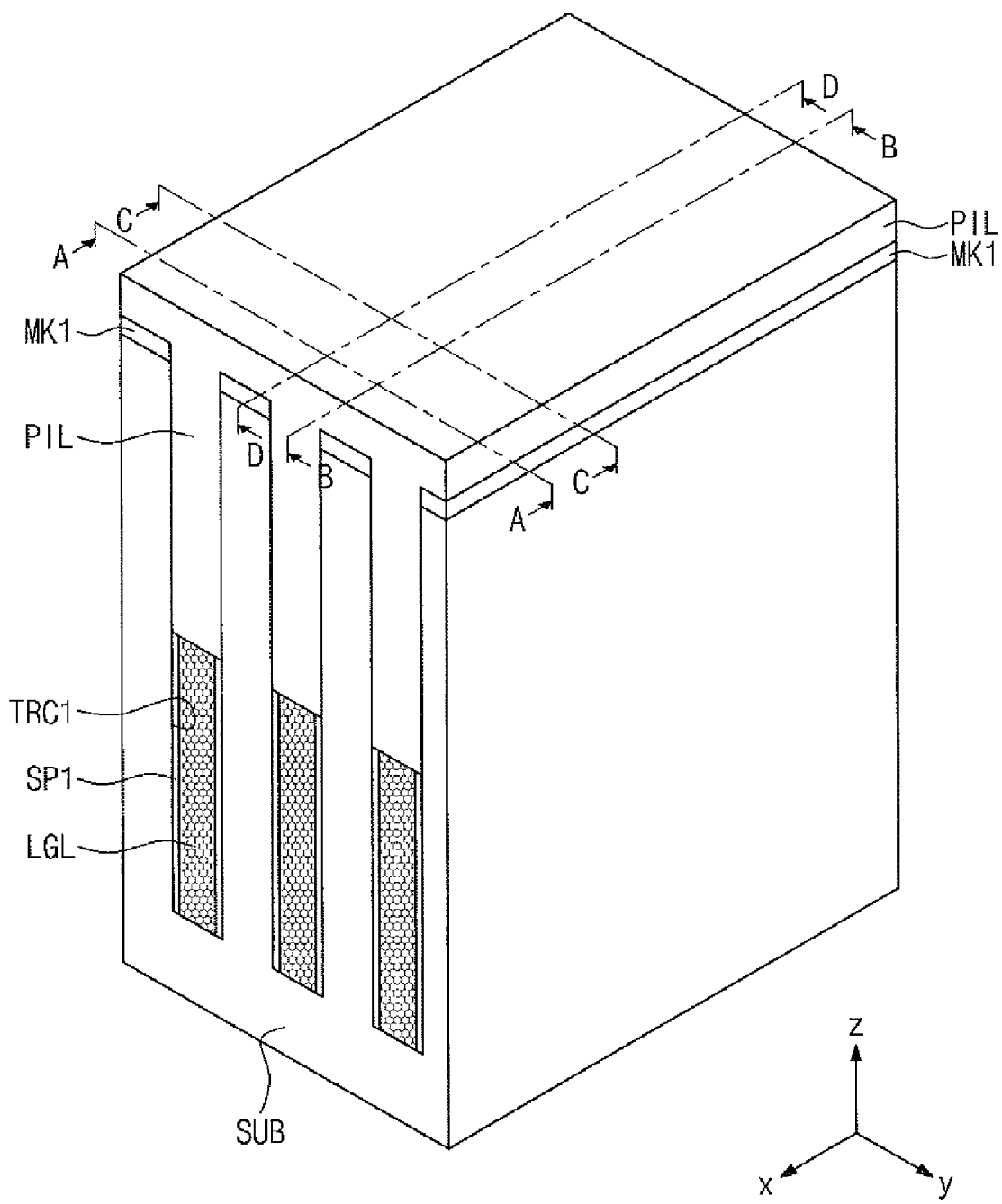

Referring to FIG. 23, first trenches TRC1 having a major axis in the x-direction are formed by patterning a substrate SUB in operation S21, and thereafter a lower gate layer LGL is formed to fill lower regions of the first trenches TRC1 in operation S22. The first trenches TRC1 and the lower gate layer LGL may be formed using the substantially same method as that of the first embodiment which has been described with reference to FIGS. 5A to 7A. Accordingly, first mask patterns MK1 defining the first trenches TRC1 may be formed on the substrate SUB, and first spacers SP1 may be formed between the first trench TRC1 and sidewalls of the lower gate layer LGL, as illustrated in FIGS. 24A and 24B.

Thereafter, a plug insulation layer PIL is formed to fill upper regions of the first trenches TRC1 in operation S23. The plug insulation layer PIL may be formed of one of insulation materials. For example, the plug insulation layer PIL may be a silicon oxide layer or silicon nitride layer. According to an embodiment, prior to forming the plug insulation layer PIL, an operation of forming a thermal oxidation layer covering the sidewall of the first trench TRC1 may be further performed. In this case, the thermal oxidation layer may be interposed between the plug insulation layer PIL and the first trench TRC1. According to an embodiment, the operation of forming the thermal oxidation may be omitted.

Figure 25A:
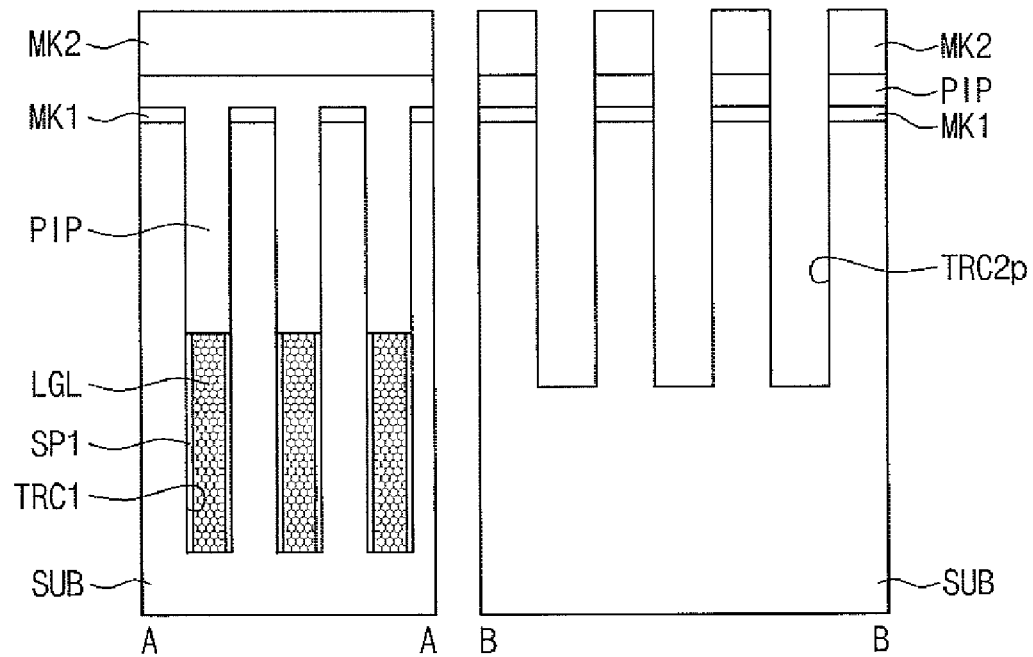
Figure 25A:
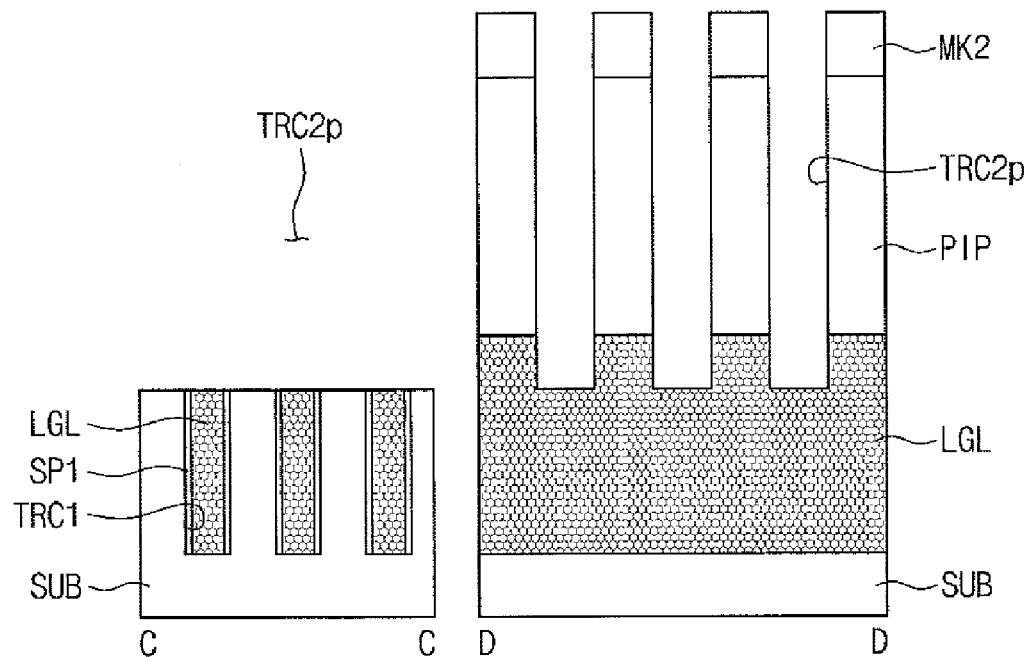
Figure 25B:
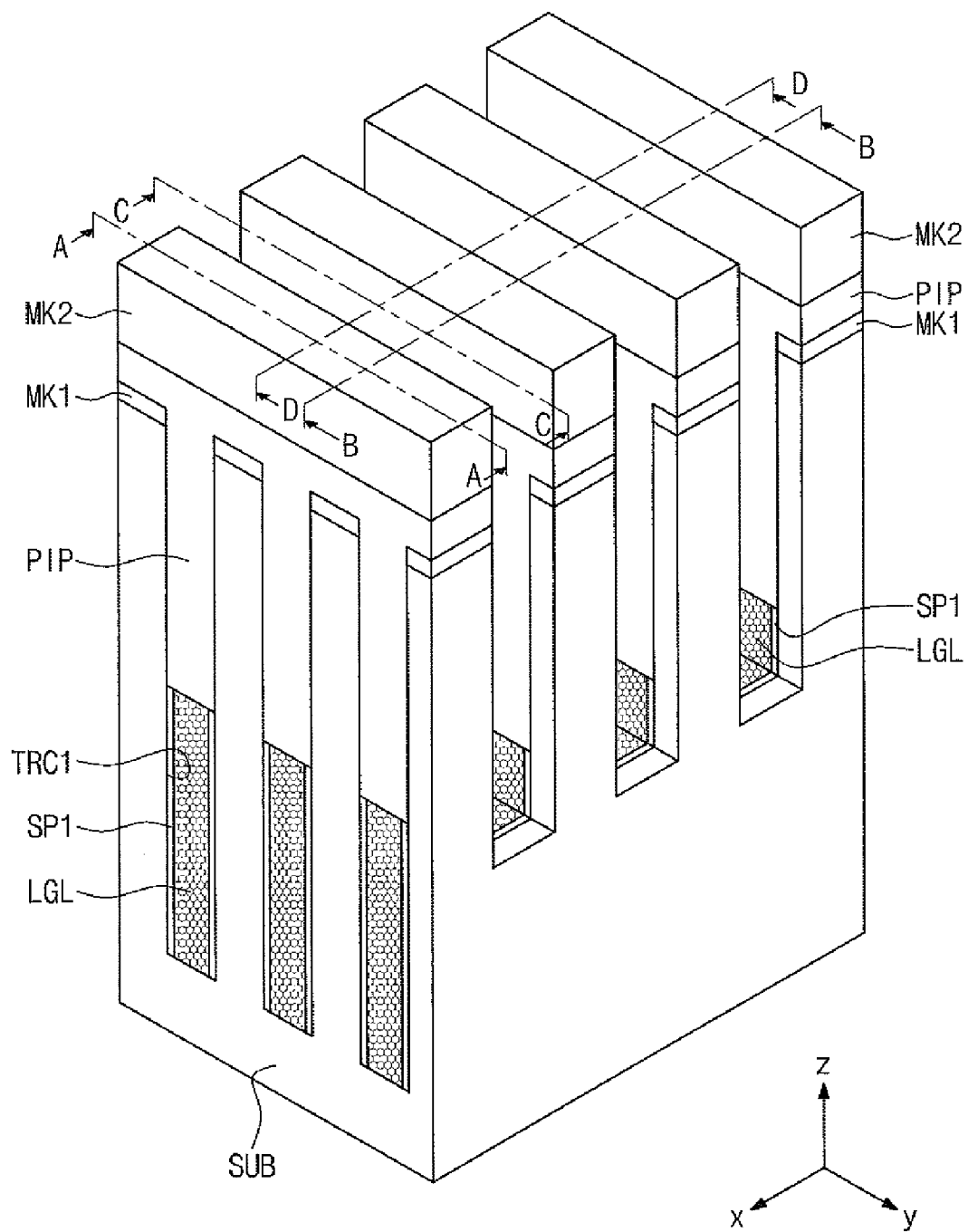
Figure 26A:
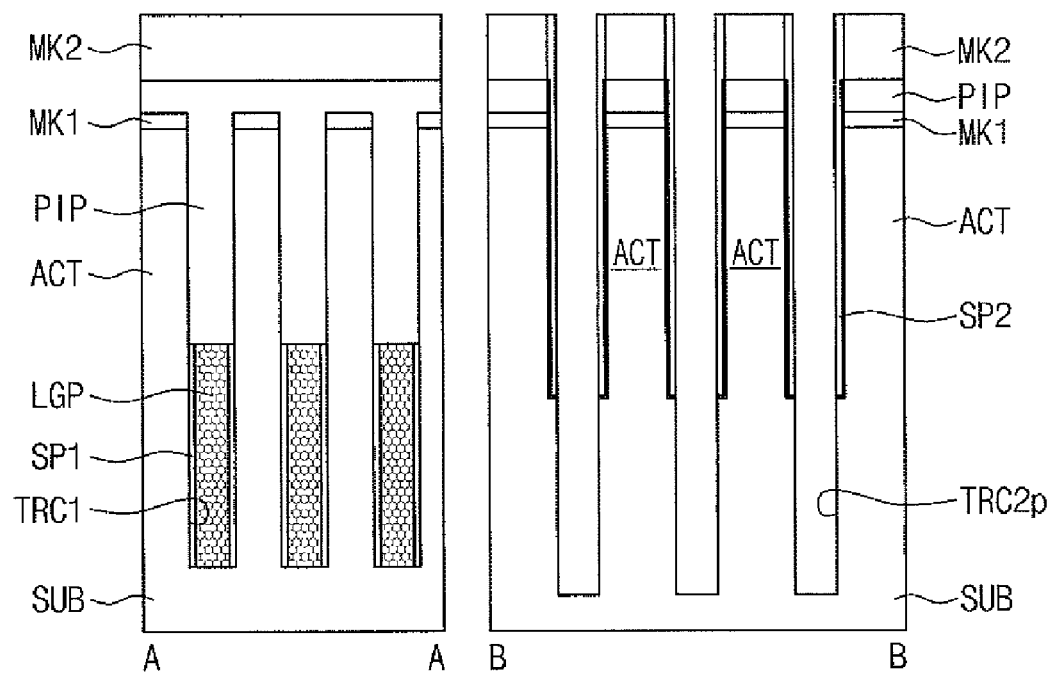
Figure 26A:
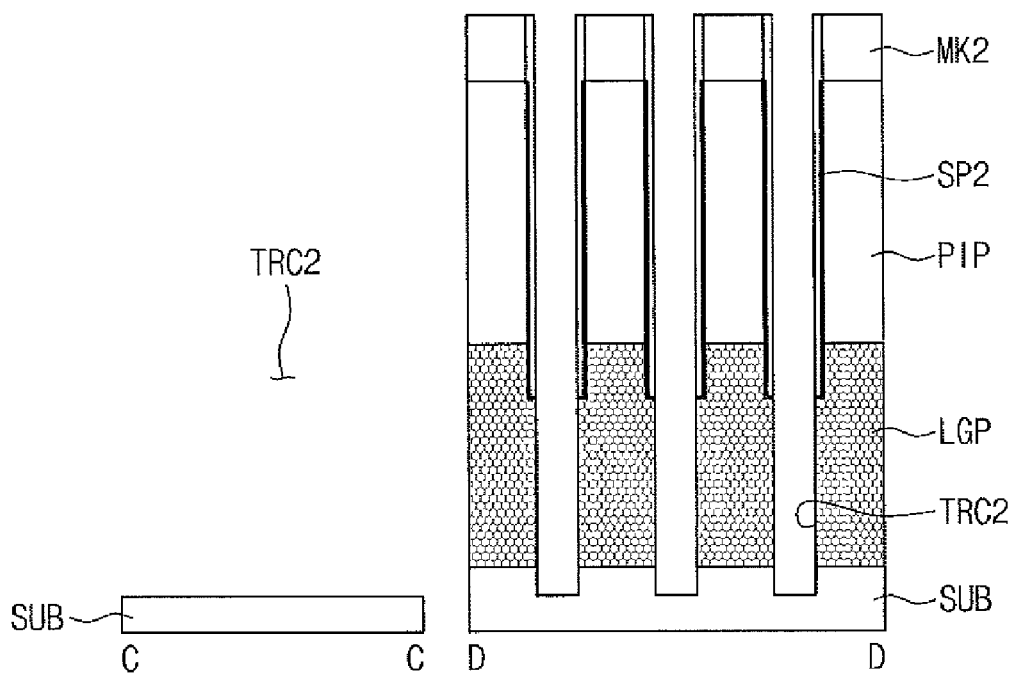
Figure 26B:
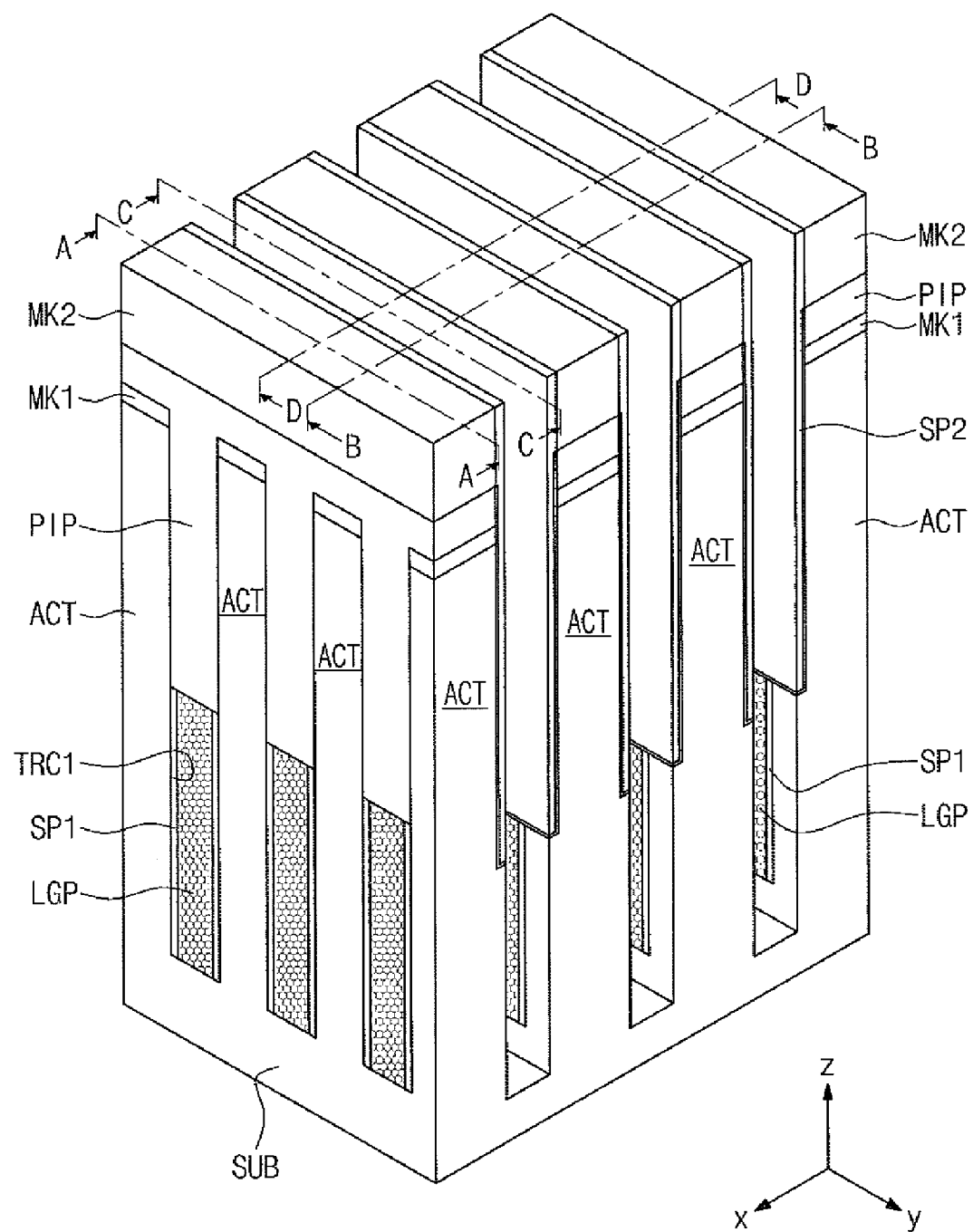

Afterwards, second mask patterns MK2 having a major axis crossing the first trenches TRC1 are formed, and then the plug insulation layer PIL, the substrate SUB and the lower gate layer LGL are patterned using the second mask pattern MK2 as an etch mask. Accordingly, in operation S24, second trenches TRC2 are formed, which define plug insulation patterns PIP, active patterns ACT and lower gate patterns LGP, as illustrated in FIGS. 26A and 26B. Specifically, the operation S24 may further include forming preliminary trenches TRC2p as illustrated in FIGS. 25A and 25B, and forming second spacers SP2 on sidewalls of the preliminary trenches TRC2p as illustrated in FIGS. 26A and 26B.

Figure 27A:
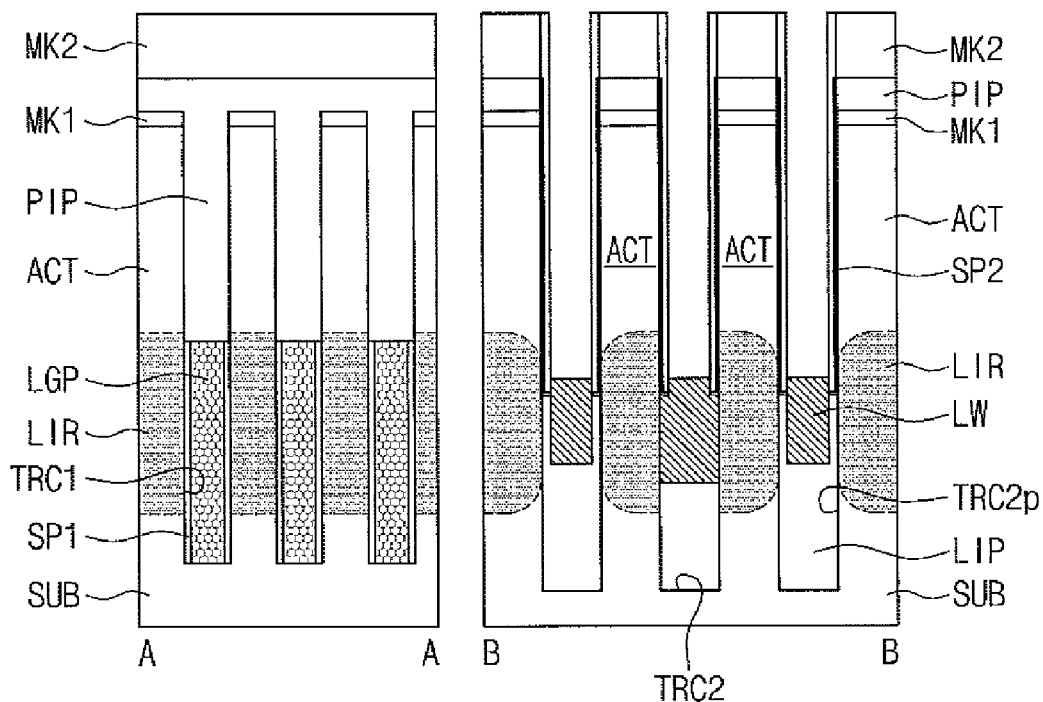
Figure 27A:
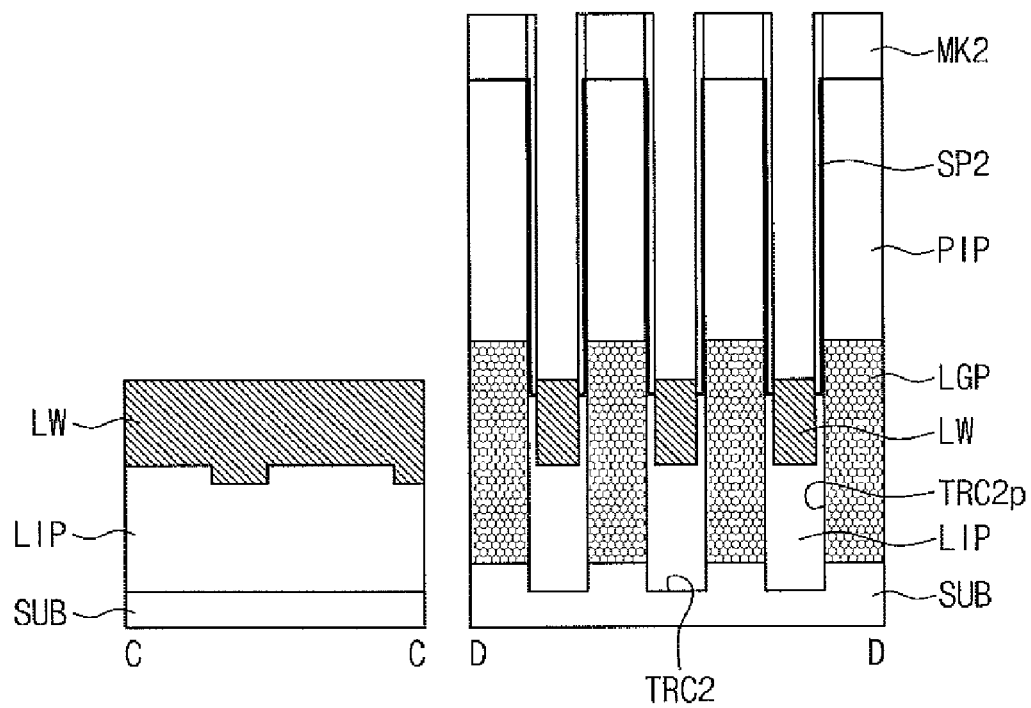
Figure 27B:
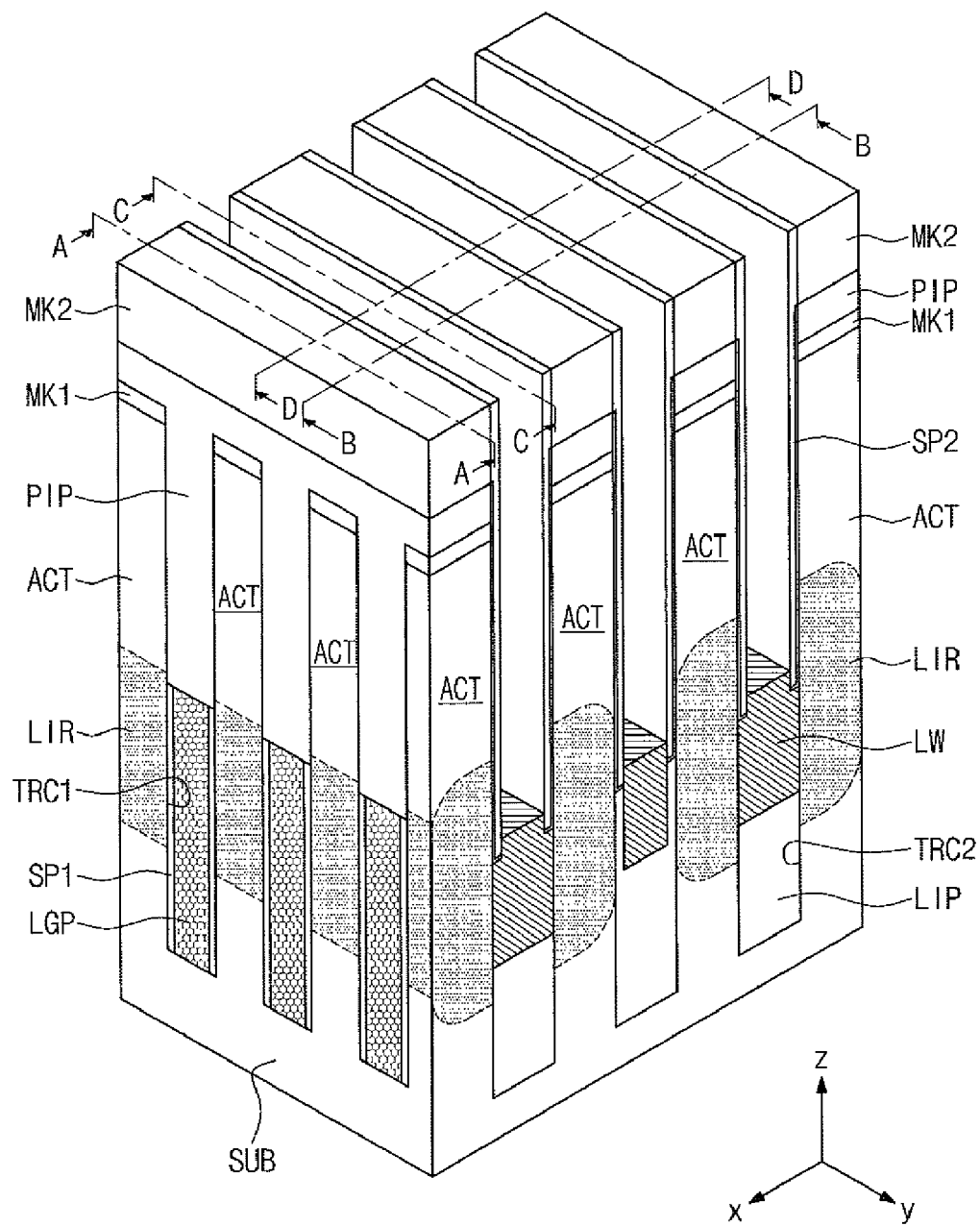

Subsequently, in operation S25, lower wirings LW are formed in the second trench TRC2. The operation S25 may be performed in the same manner as the embodiment described with reference to FIGS. 11A to 15A. As illustrated in FIGS. 27A and 27B, lower insulation patterns LIP, which are used as a template for forming the lower wiring LW, may be formed under the lower wiring LW, and lower impurity regions LIR connected by the lower wirings LW may be formed in the lower regions of the active patterns ACT.

Figure 28A:
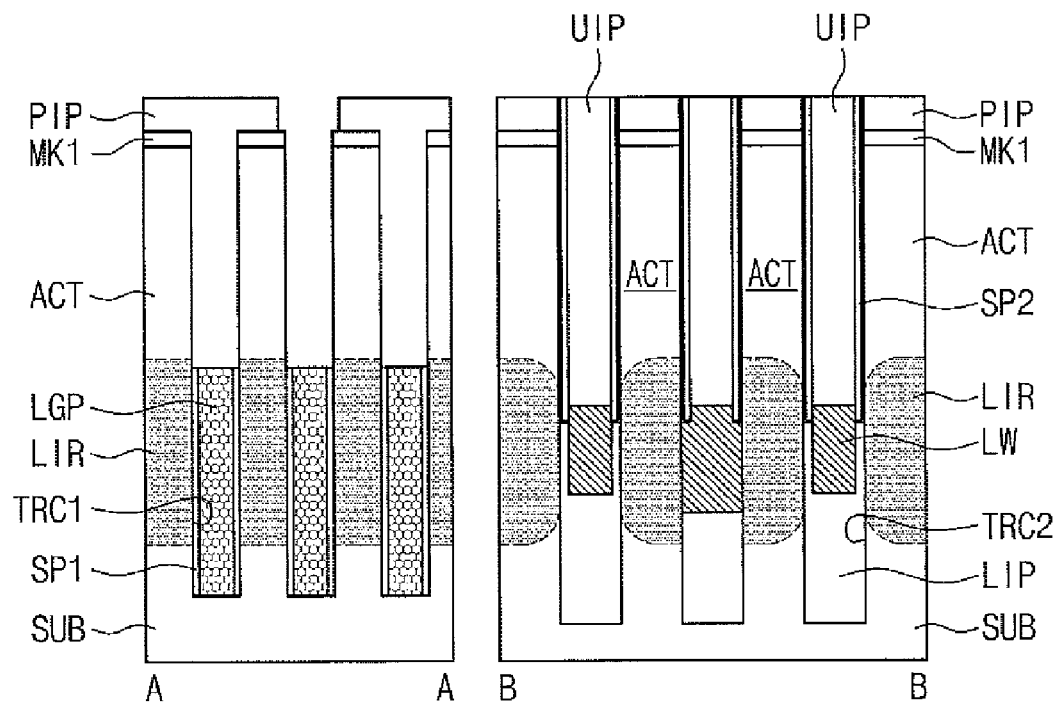
Figure 28A:
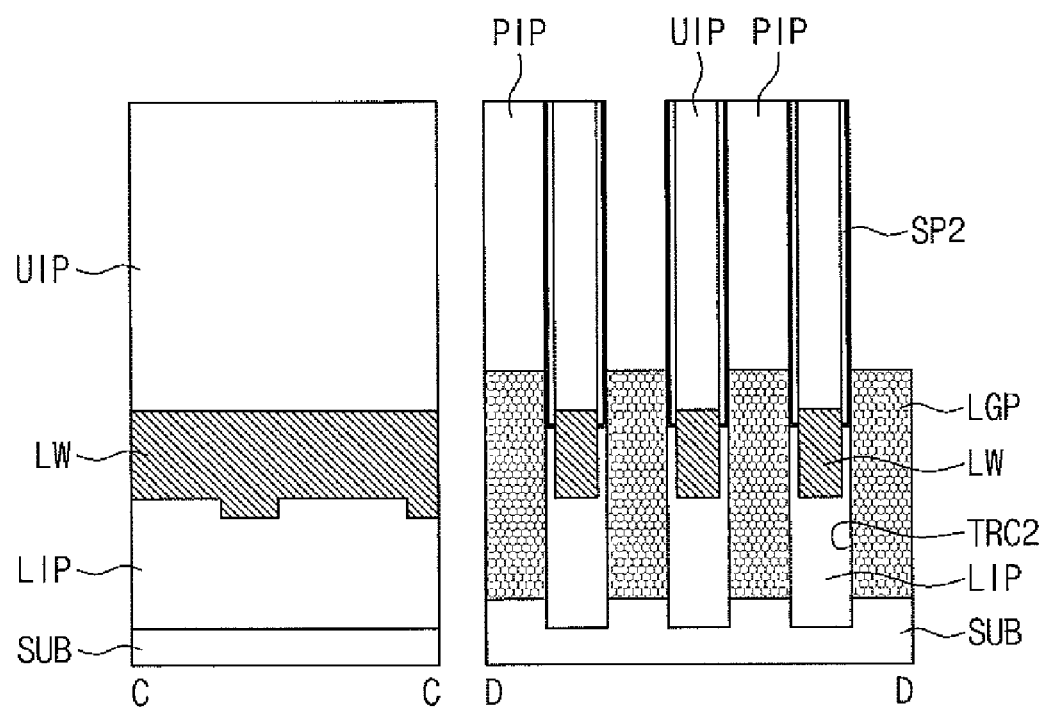
Figure 28B:
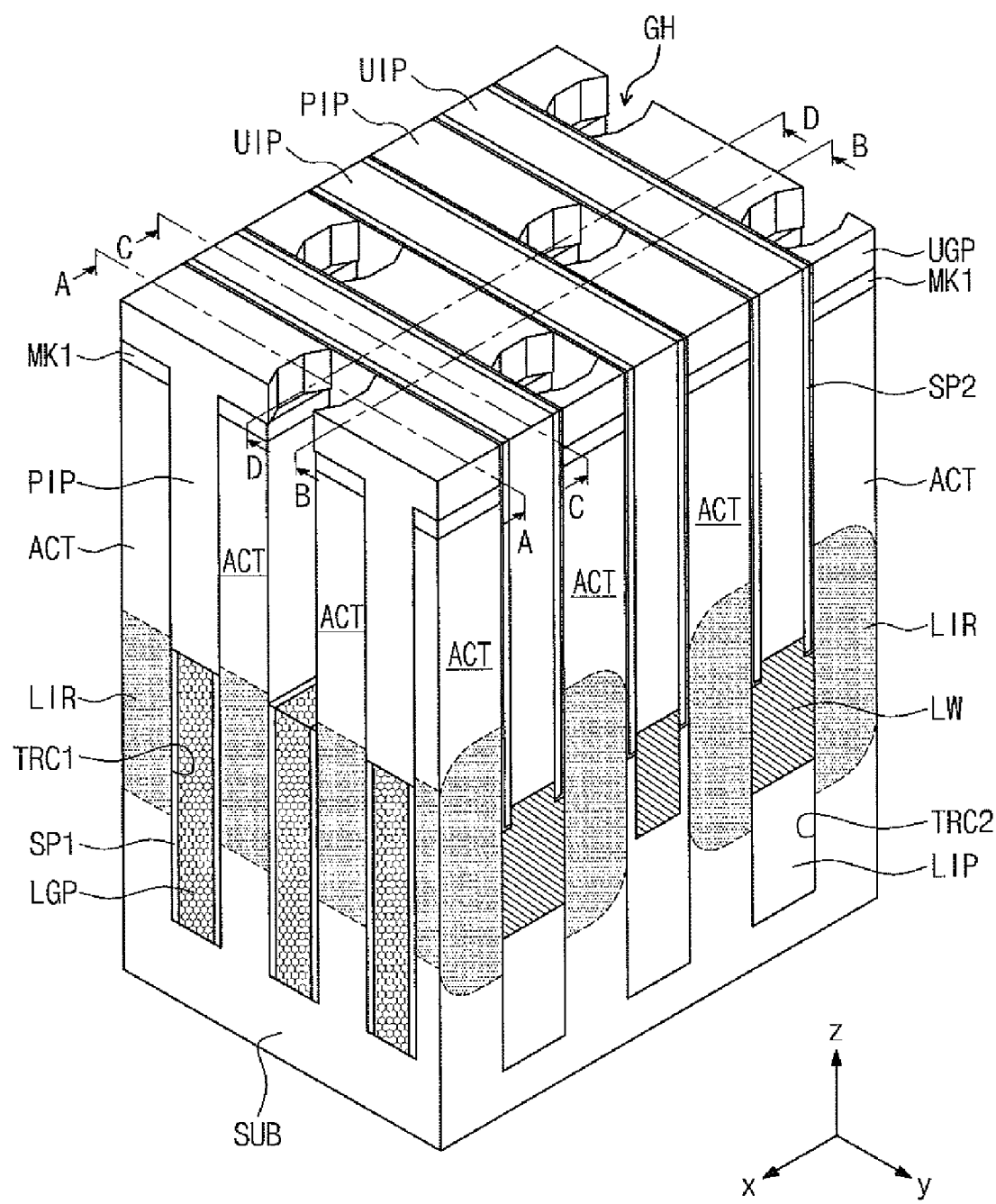

Upper insulation patterns UIP disposed on the lower wirings LW to fill the upper regions of the second trenches TRC2 are formed. Next, the plug insulation patterns PIP are patterned to form gate holes GH exposing top surfaces of some of the lower gate patterns LGP. As illustrated in FIGS. 28A and 28B, the gate holes GH may be formed at positions corresponding to regions where the upper gate patterns UGP are formed in FIG. 16A.

Figure 29A:
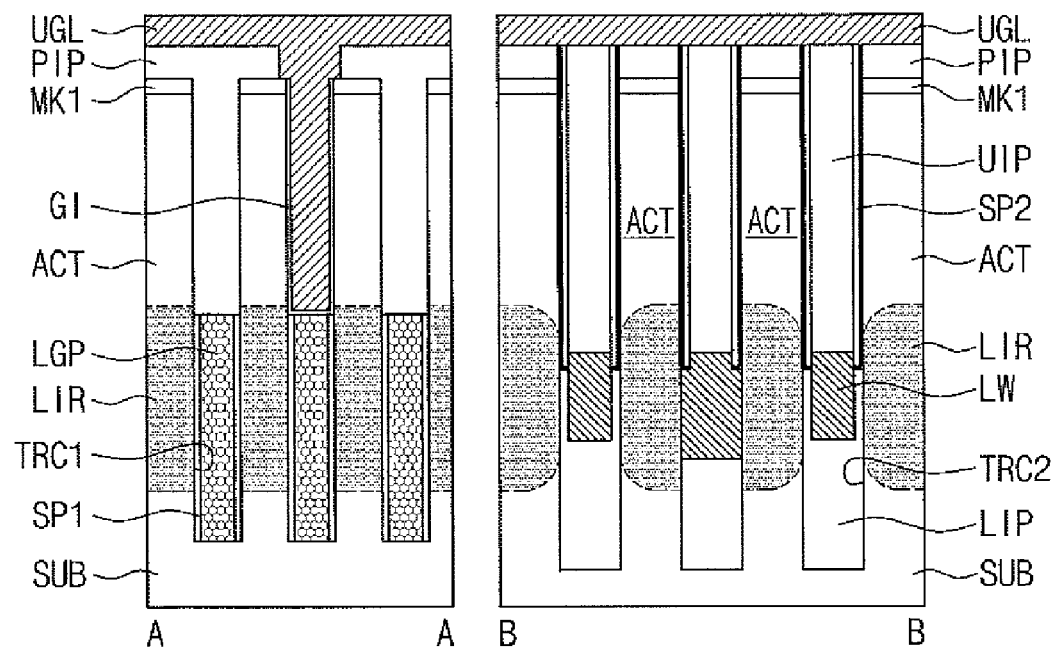
Figure 29A:
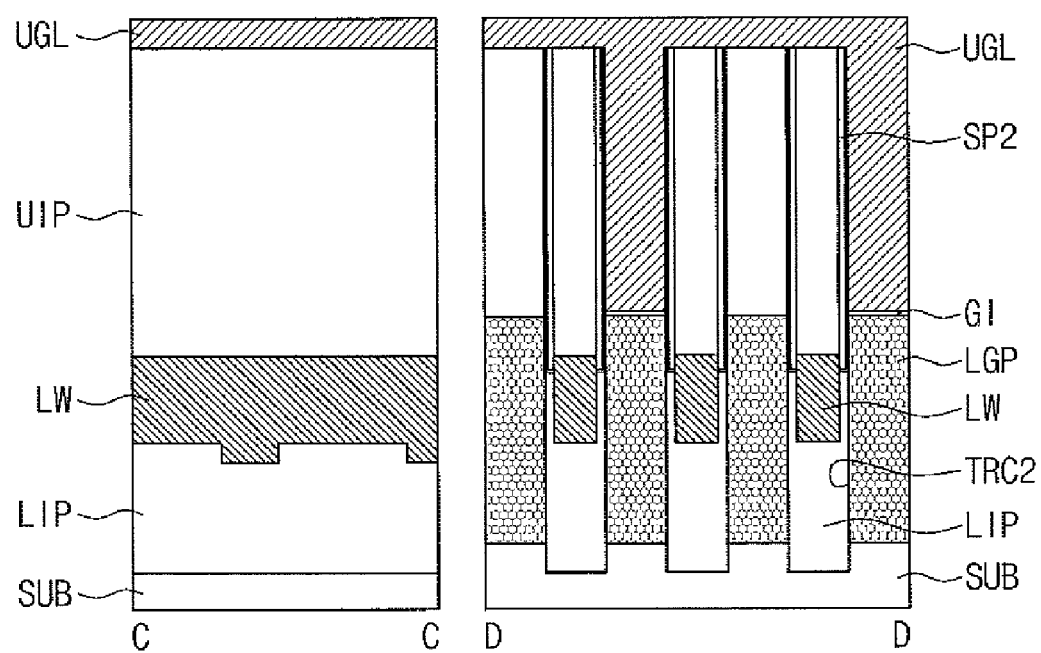
Figure 29B:
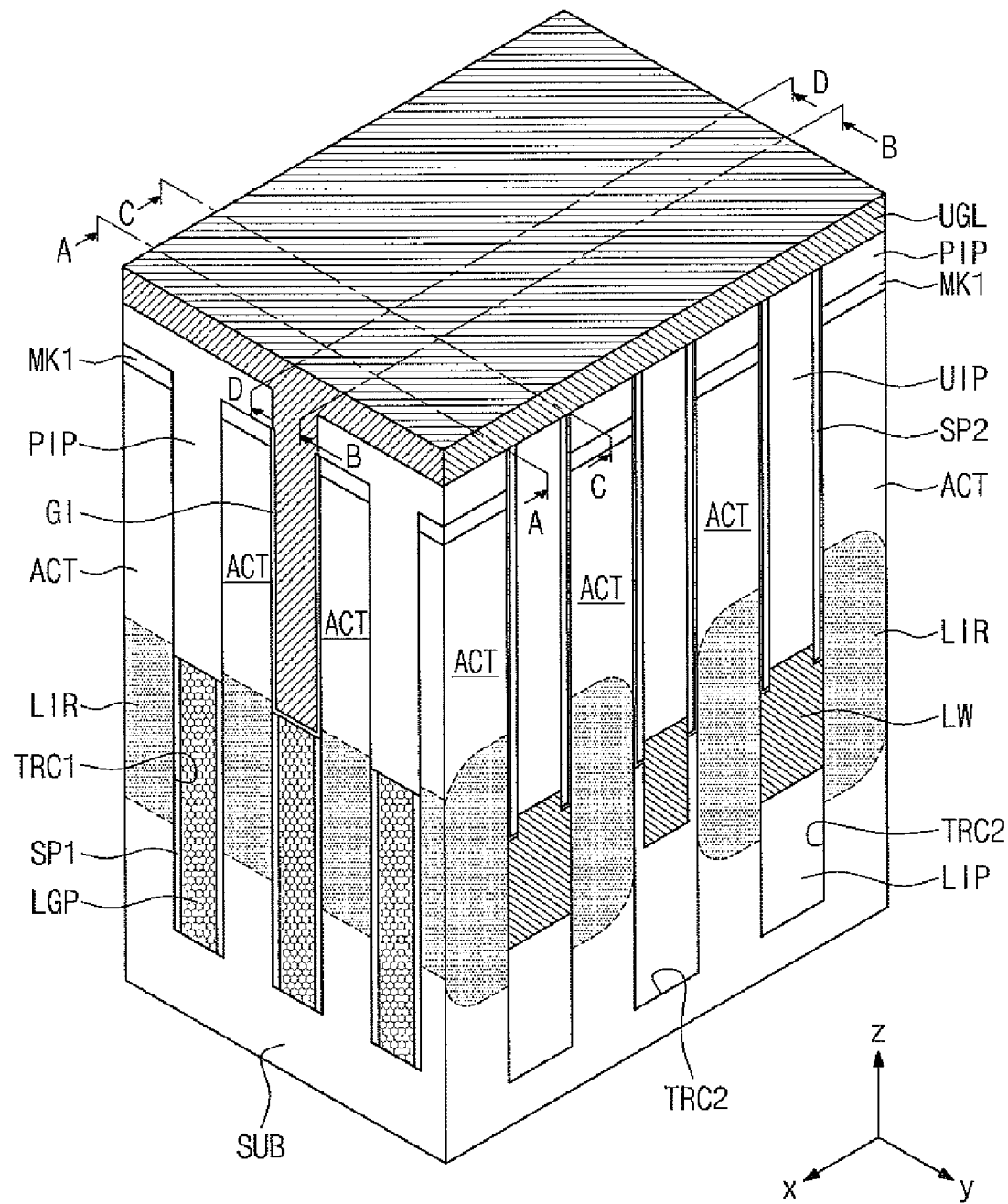
Figure 30A:
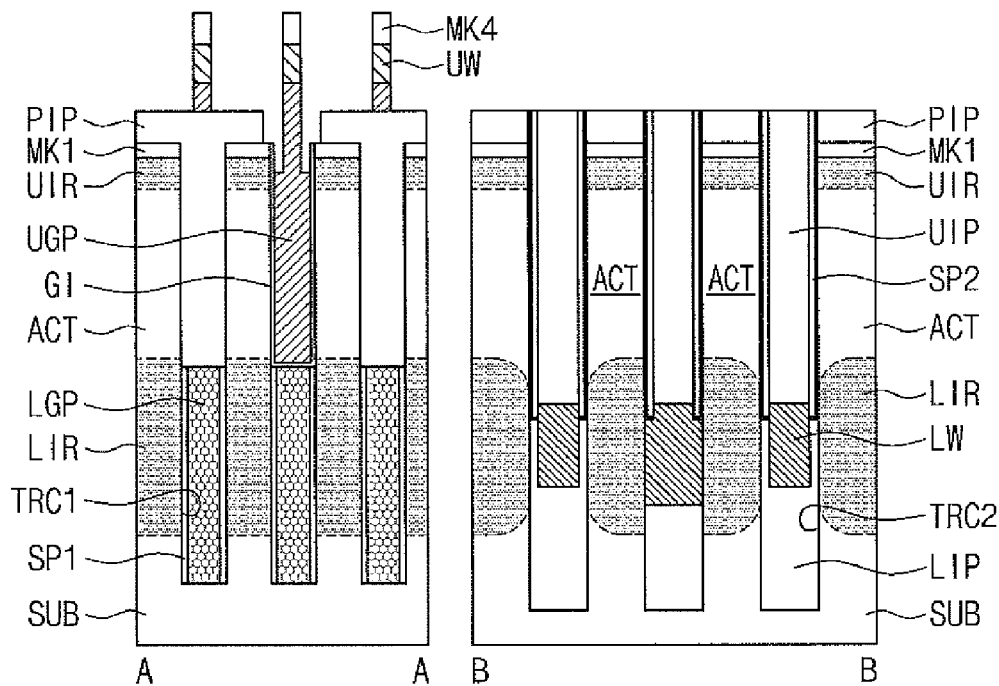
Figure 30A:
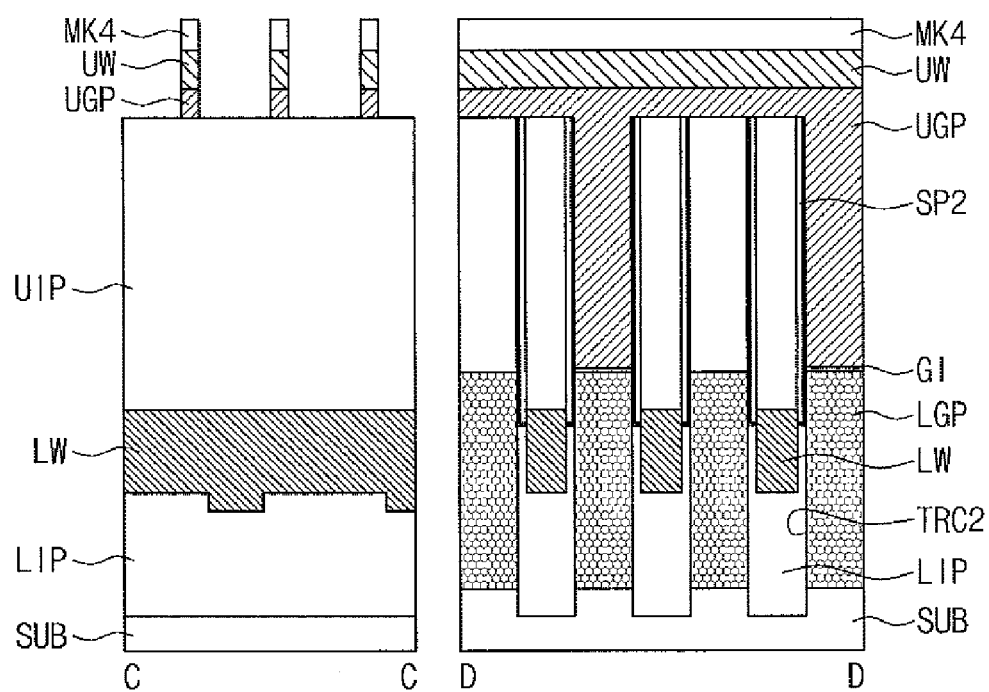
Figure 30B:
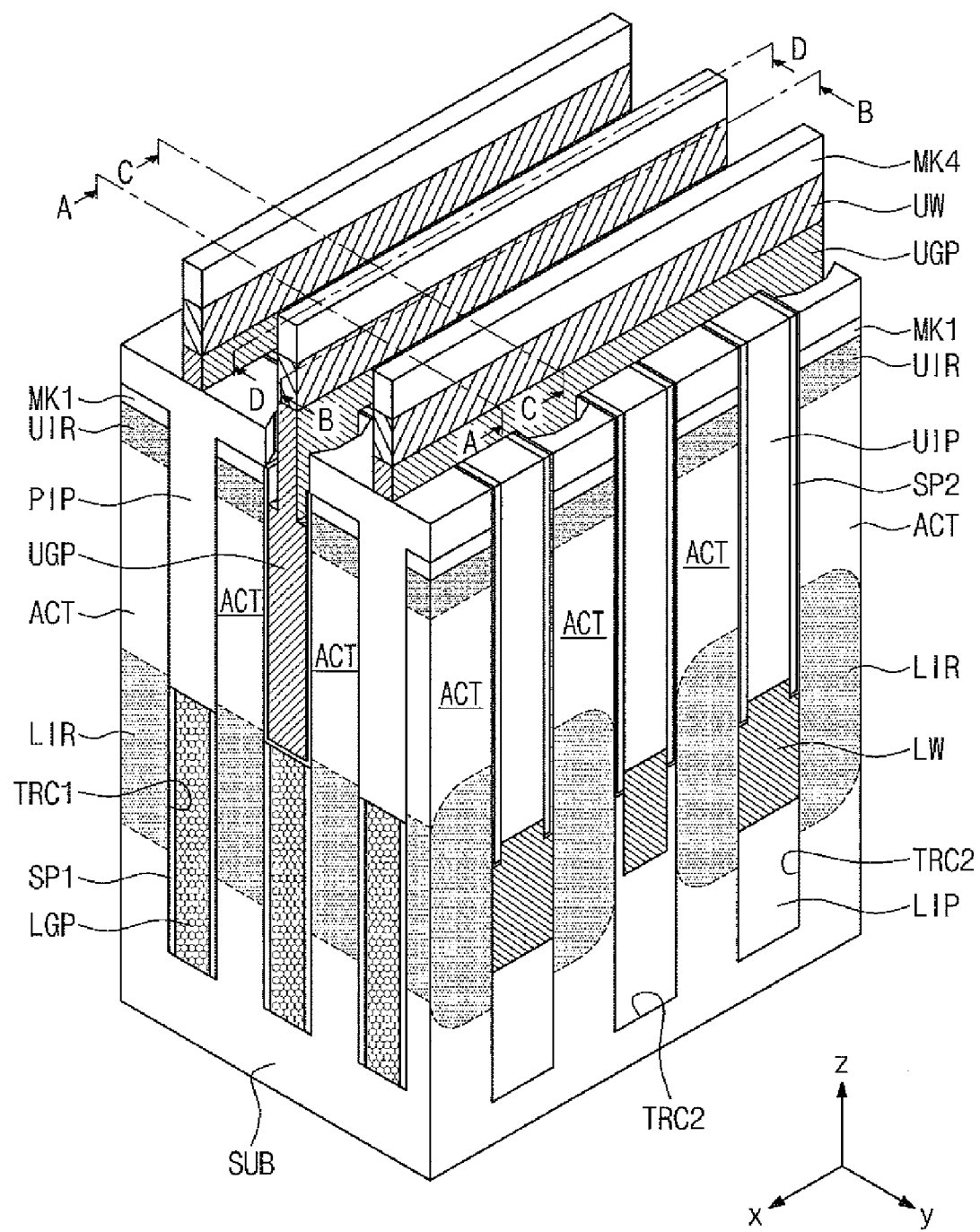
Figure 31A:
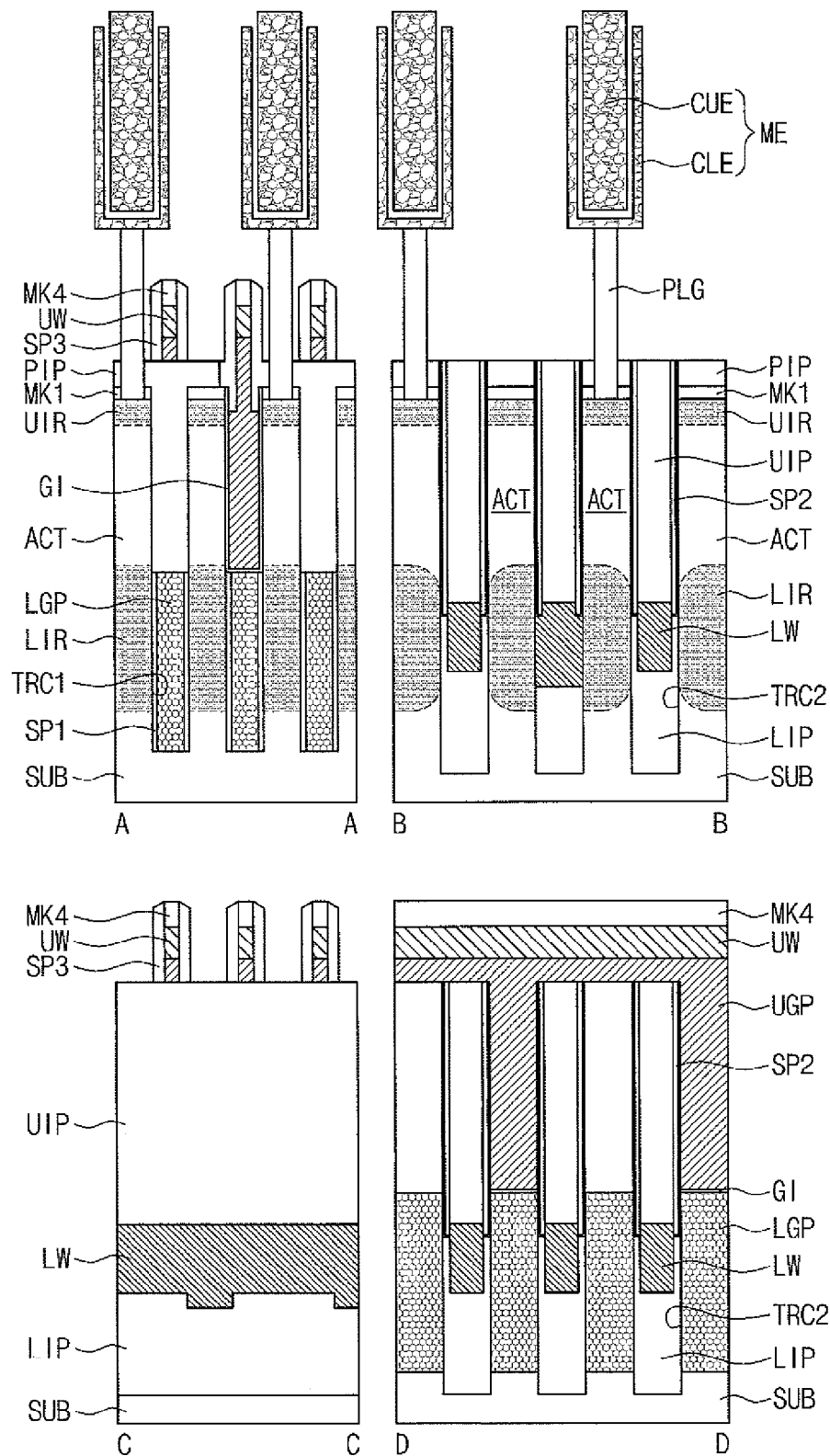
Figure 31B:
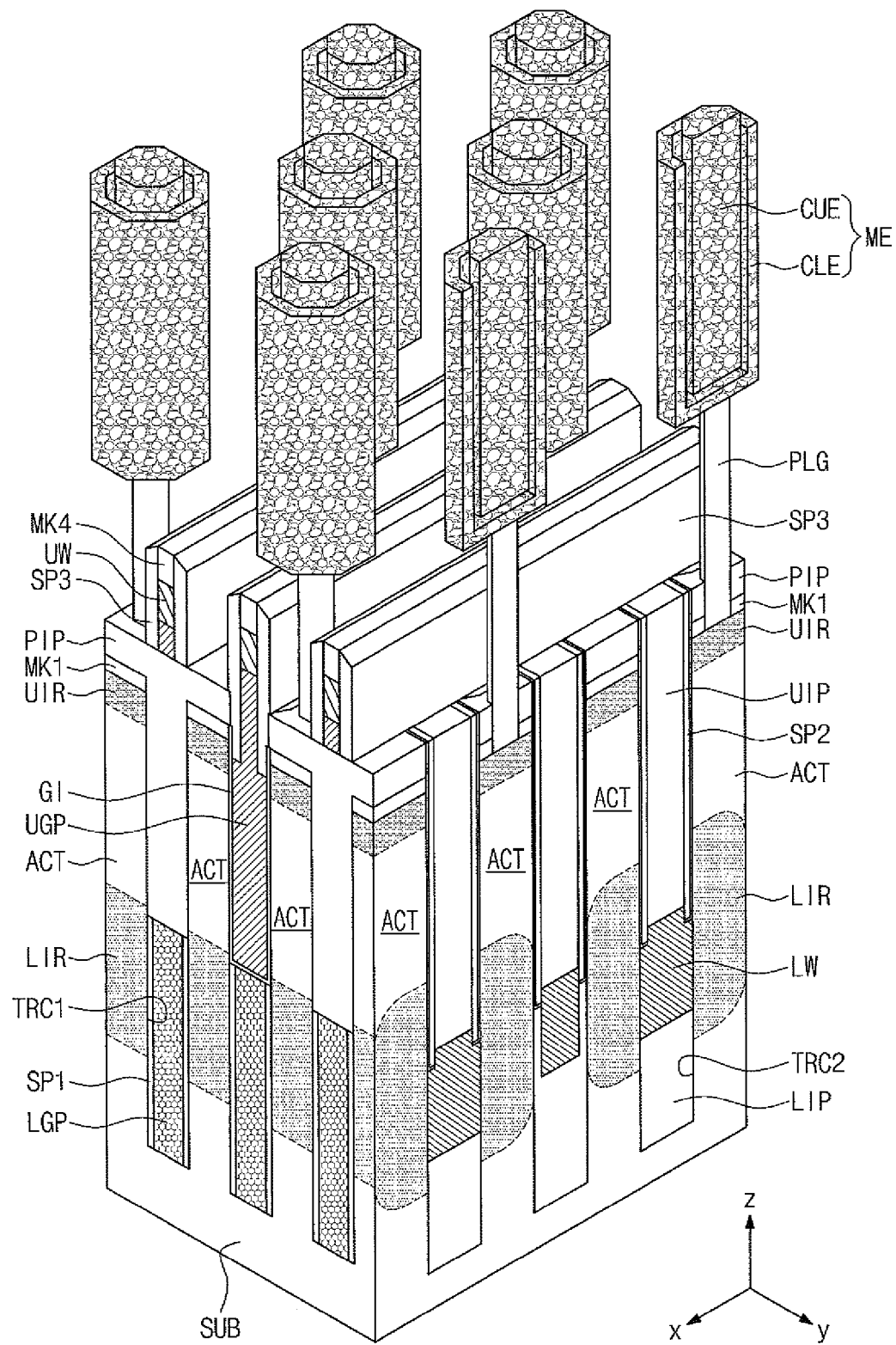

Thereafter, a gate insulator GI is formed on inner walls of the gate holes GH, and then an upper gate layer UGL is formed to fill the gate holes GH in operation S26. The upper gate layer UGL may extend from the gate holes GH to cover top surfaces of the plug insulation patterns PIP and the upper insulation patterns UIP, as illustrated in FIGS. 29A and 29B. The gate insulator GI and the upper gate insulation layer UGL may be formed using the fabrication method described with reference to FIG. 7A.

Afterwards, as illustrated in FIGS. 30A and 30B, and FIGS. 31A and 31B, an upper wiring UW and a memory element ME are sequentially formed in operations S27 and S28. These operations may be performed using the fabrication method described with reference to FIGS. 17A to 19A.

Figure 32:
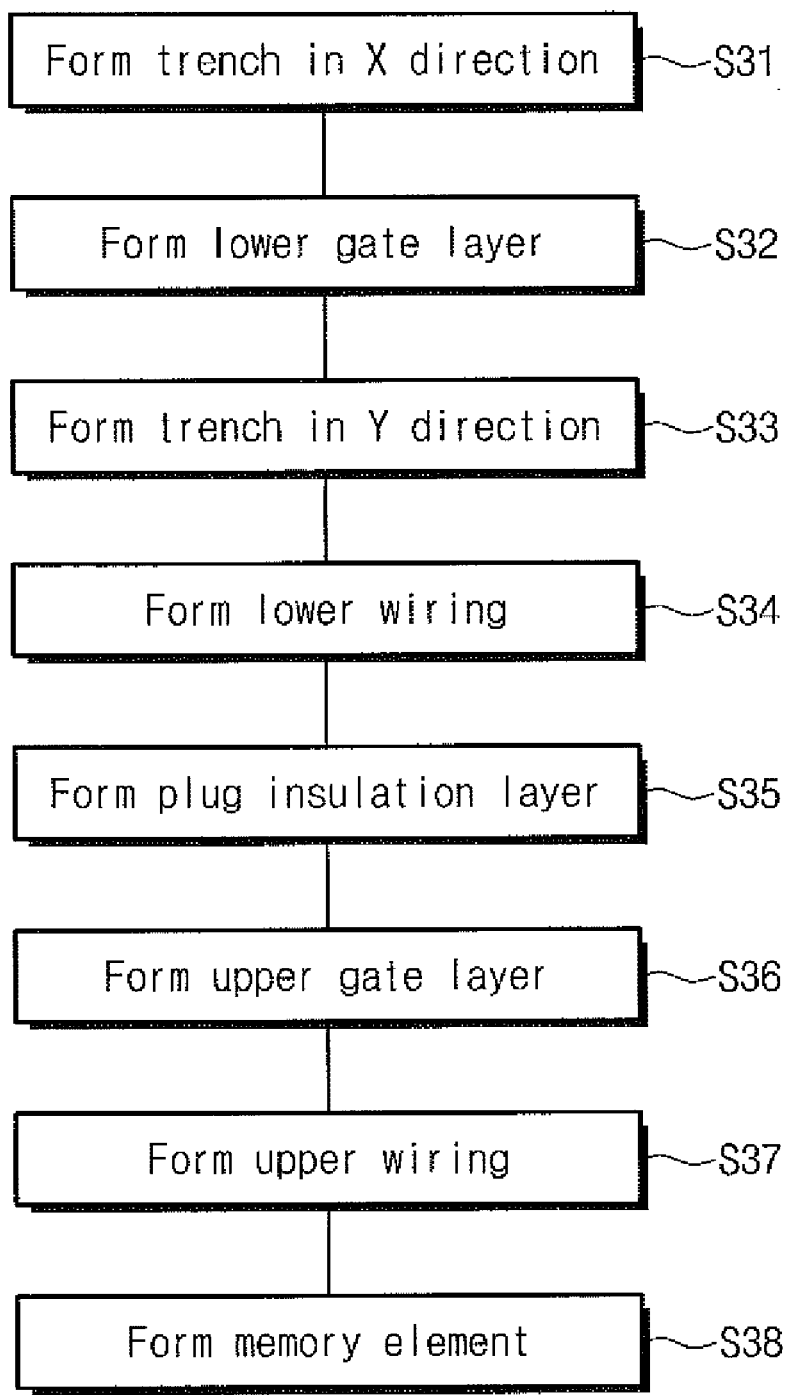
FIG. 32 is a flowchart illustrating a method of fabricating a semiconductor device according to an embodiment of the inventive concept.

FIG. 32 is a flowchart illustrating a method of fabricating a semiconductor device according to an embodiment of the inventive concept. FIGS. 33A to 40A are sectional views illustrating a method of fabricating a semiconductor device according to an embodiment of the inventive concept described with reference to FIG. 32. FIGS. 33B to 40B are perspective views illustrating a method of fabricating a semiconductor device according to an embodiment of the inventive concept described with reference to FIG. 32.

When comparing FIG. 32 with FIG. 4, the current embodiment differs from the embodiment described with reference to FIG. 4 in that the operation S36 of forming the upper gate layer is performed after the operation S35 of forming a plug insulation layer.

Referring to FIG. 32, first trenches TRC1 having a major axis in the x-direction are formed by patterning a substrate SUB in operation S31, and thereafter a lower gate layer LGL is formed to fill the first trenches TRC1 in operation S32.

Figure 33A:
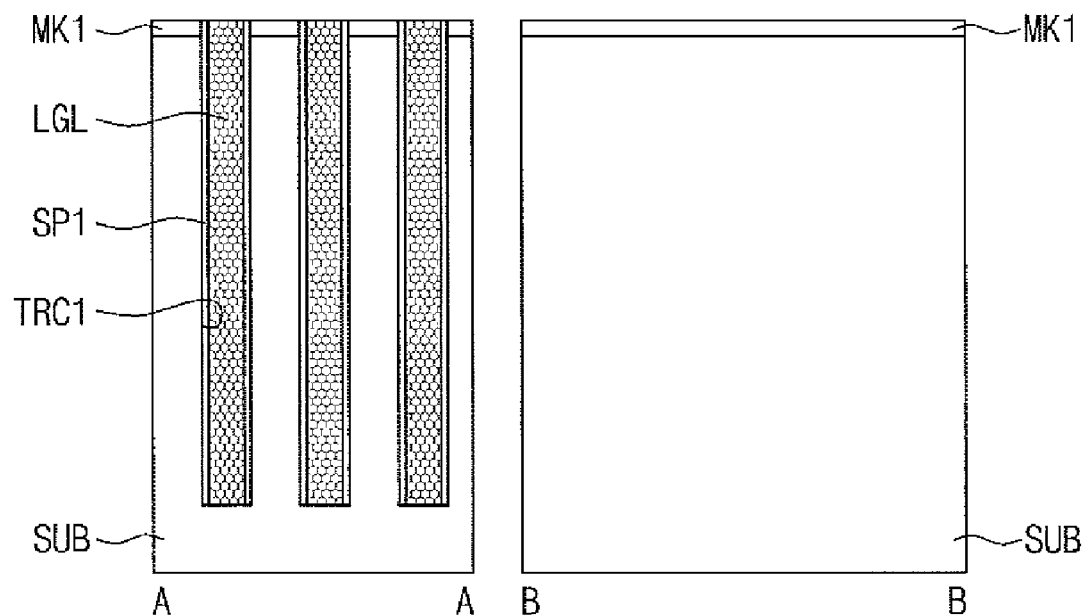
Figure 33A:
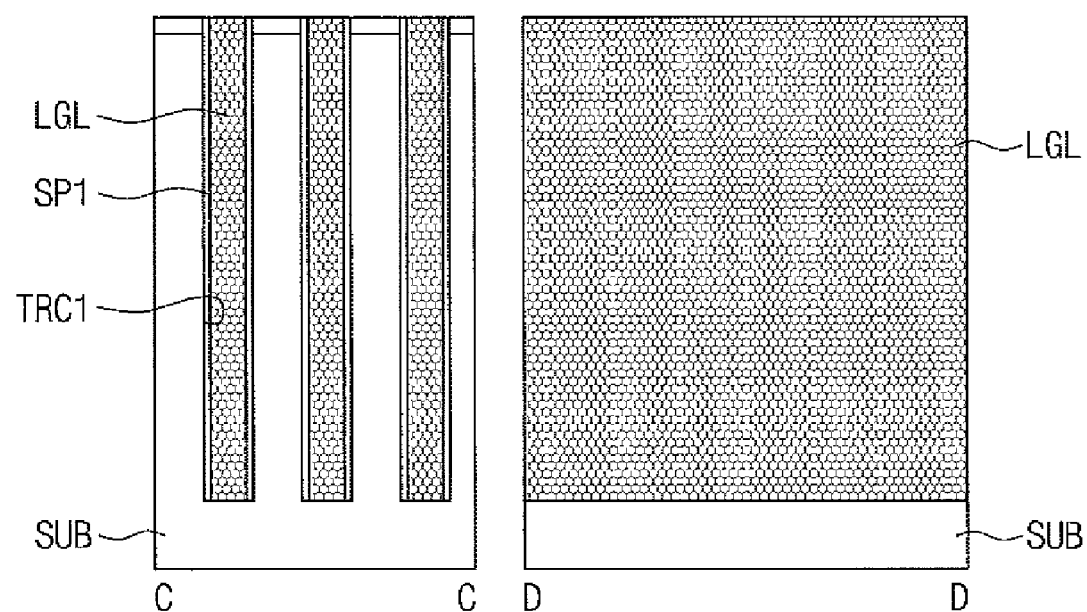
Figure 33B:
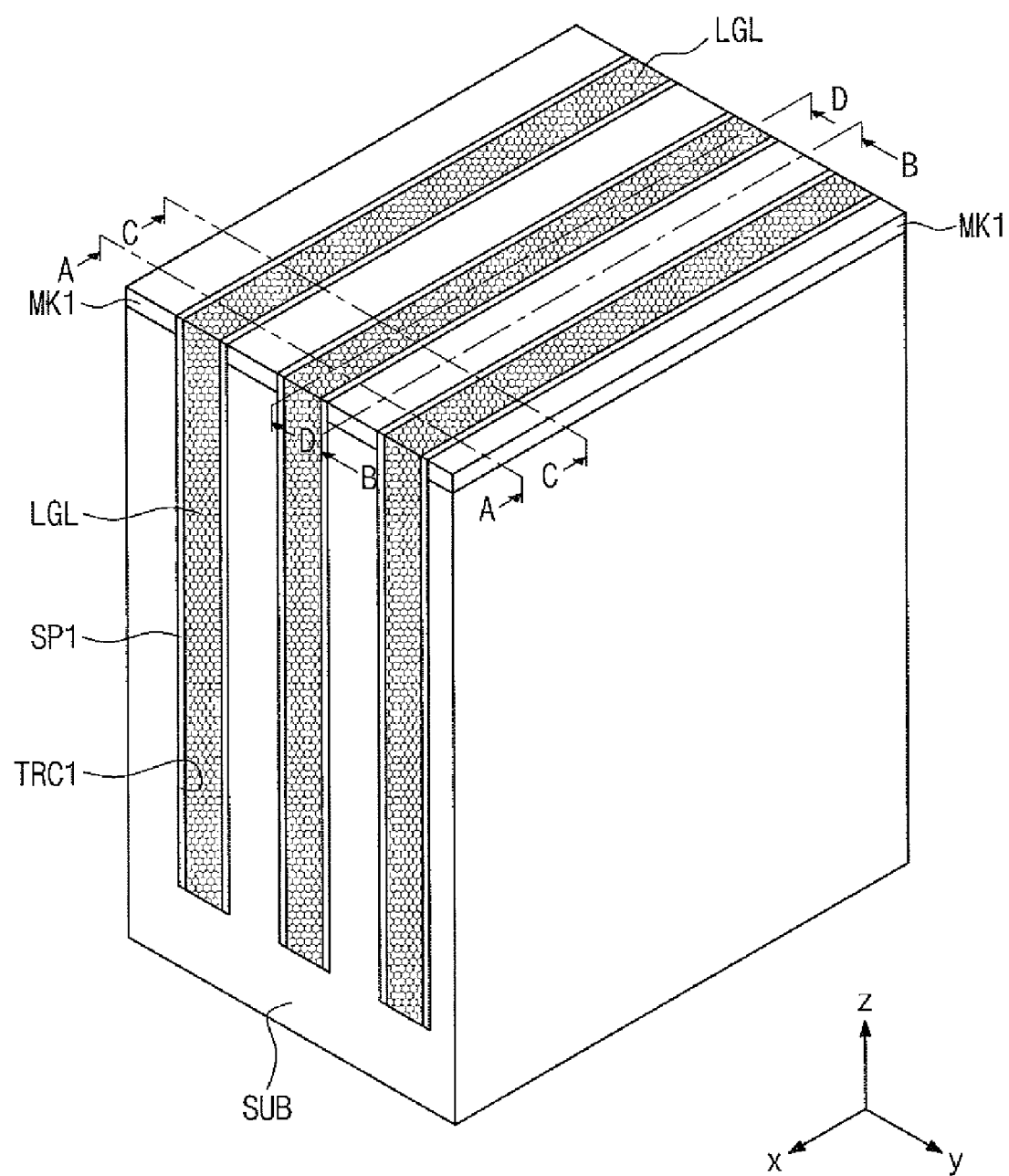

According to the current embodiment, as illustrated in FIGS. 33A and 33B, the lower gate layer LGL may be formed to substantially and completely fill the first trenches TRC1 with first spacers SP1.

Figure 34A:
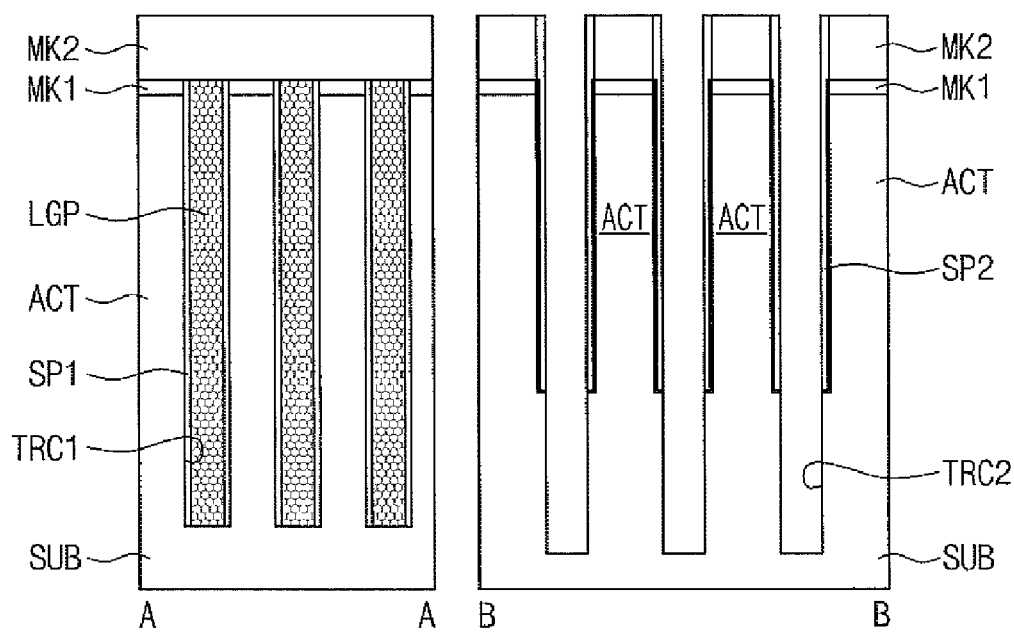
Figure 34A:
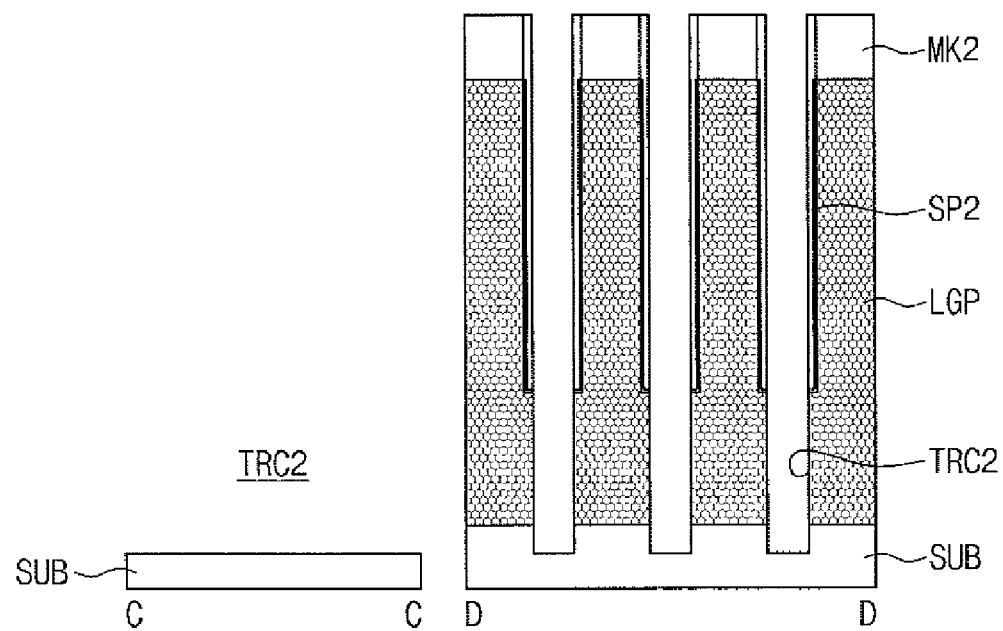
Figure 34B:
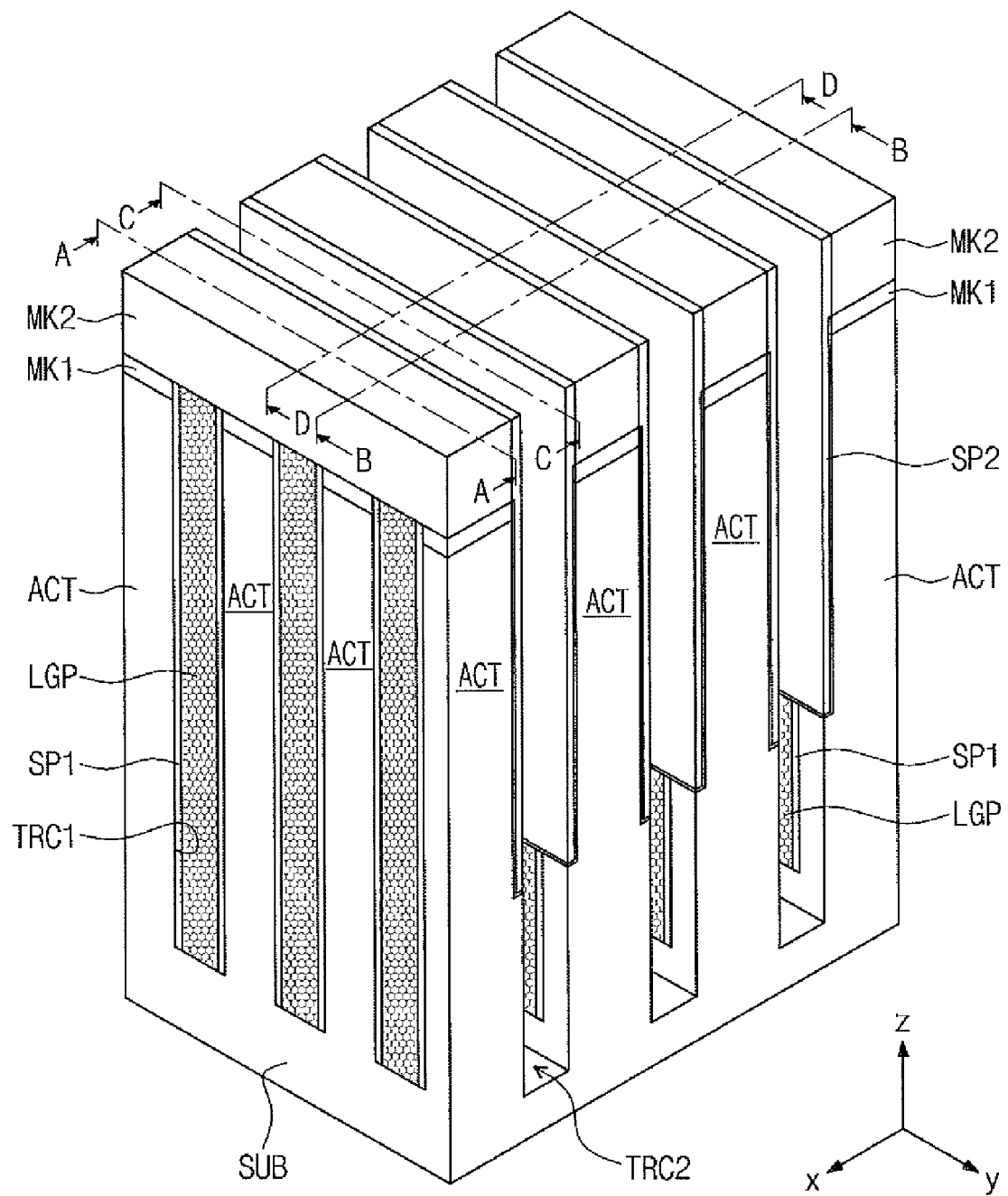

Afterwards, second mask patterns MK2 having a major axis crossing the first trenches TRC1 are formed, and then the substrate SUB and the lower gate layer LGL are patterned using the second mask pattern MK2 as an etch mask. Accordingly, in operation S33, second trenches TRC2 are formed, which define active patterns ACT and lower gate patterns LGP, as illustrated in FIGS. 34A and 34B. The operation S33 may be carried out using the fabrication method that has been described with reference to FIGS. 8A to 10A.

Figure 35A:
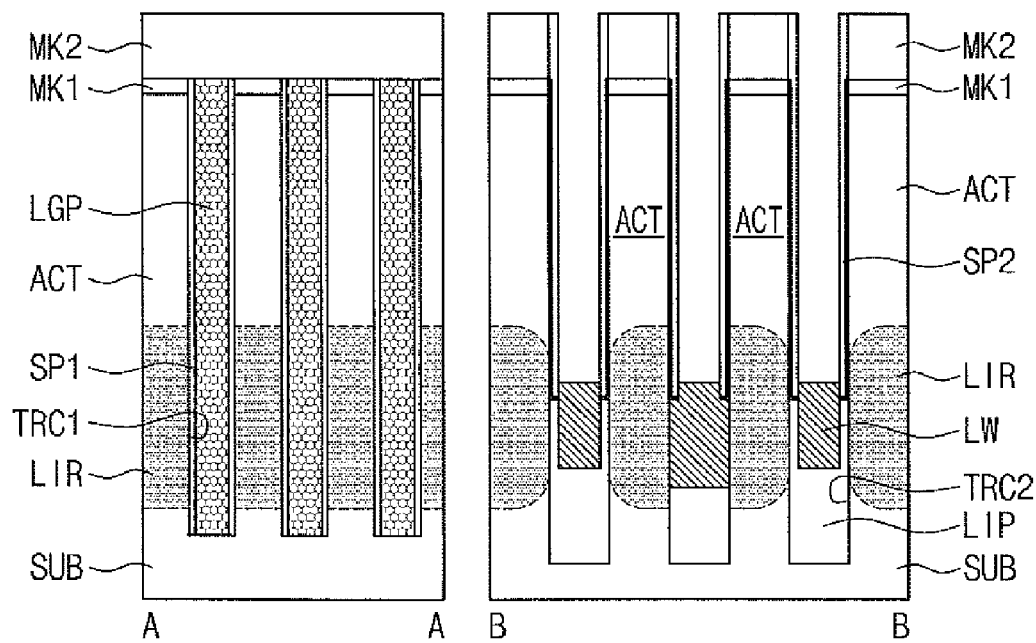
Figure 35A:
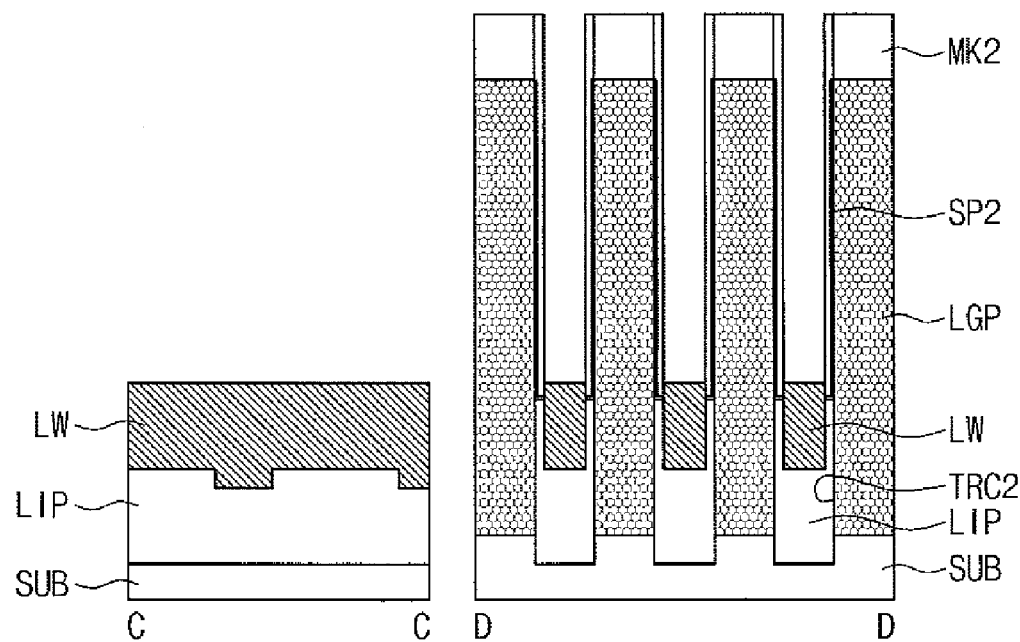
Figure 35B:
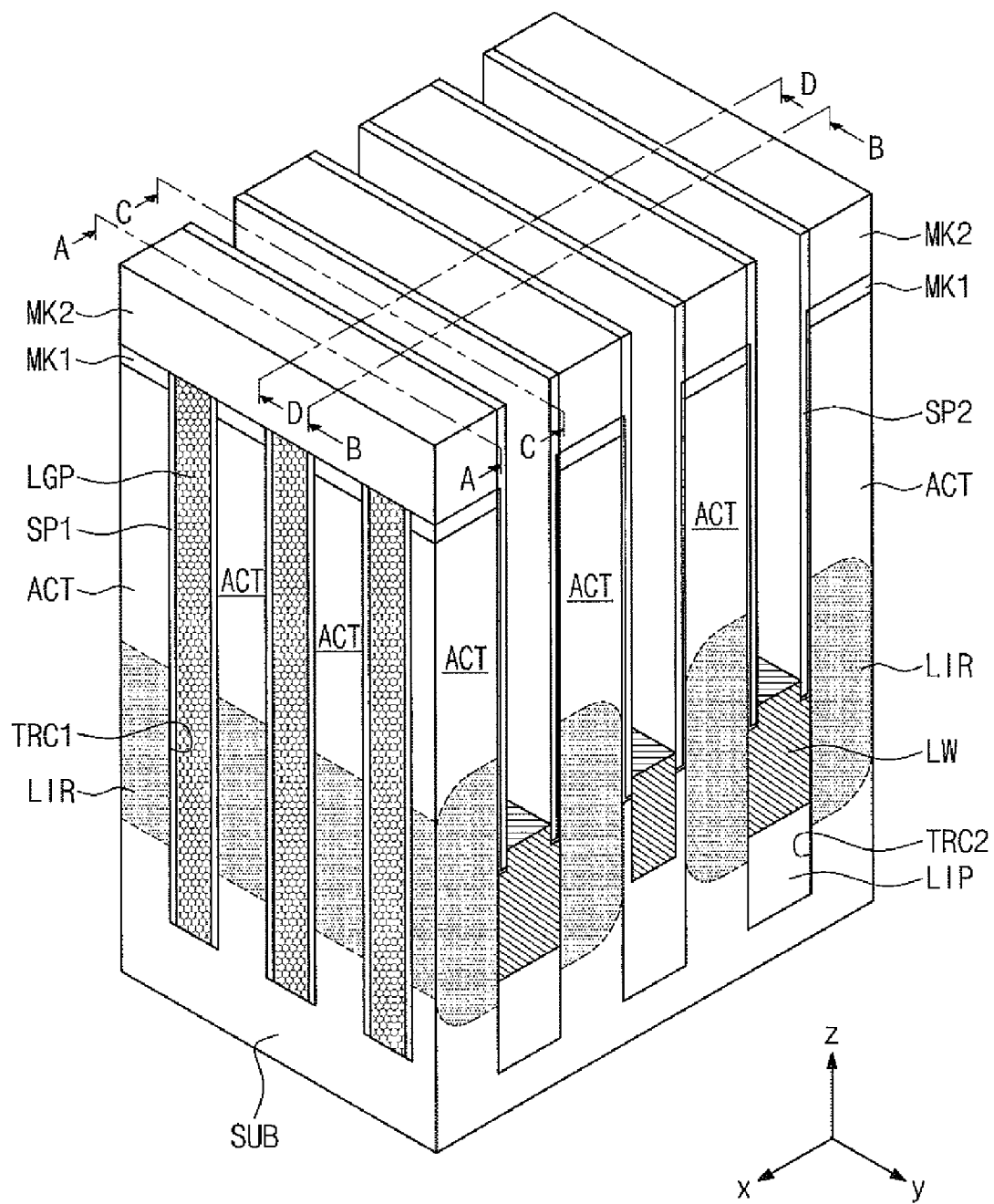

Subsequently, in operation S34, lower wirings LW are formed in the second trench TRC2. The operation S34 may be performed in the same manner as the embodiment described with reference to FIGS. 11A to 15A. As illustrated in FIGS. 35A and 35B, lower insulation patterns LIP, which are used as a template for forming the lower wiring LW, may be formed under the lower wiring LW, and lower impurity regions LIR connected by the lower wirings LW may be formed in the lower regions of the active patterns ACT.

Thereafter, in operation S35, plug insulation patterns PIP are formed on some of the lower gate patterns LGP. The operation S35 may include forming holes exposing top surfaces of some of the lower gate patterns LGP, and then filling the holes with an insulation material. During this operation S35, upper insulation patterns UIP filling the second trenches TRC2 having the lower wirings LW formed therein may be further formed.

Figure 36A:
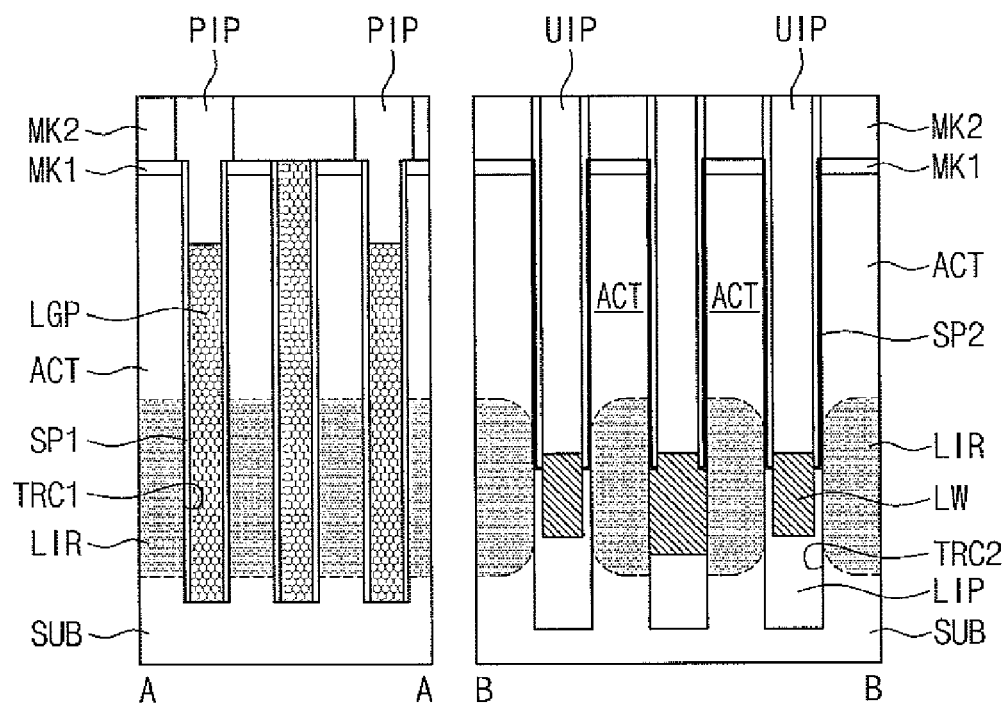
Figure 36A:
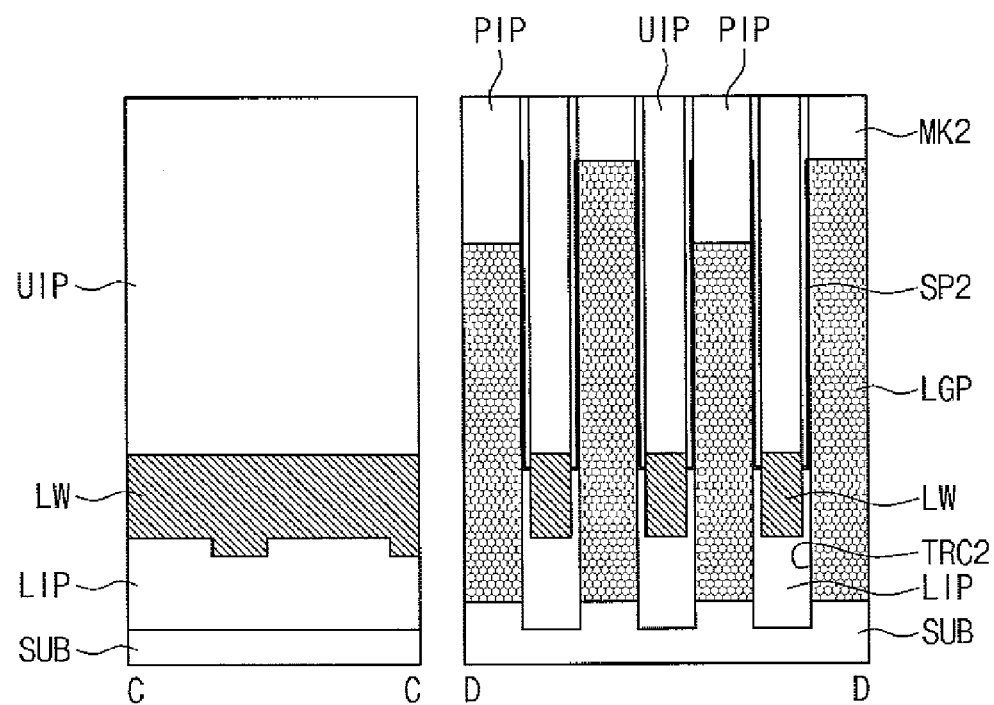
Figure 36B:
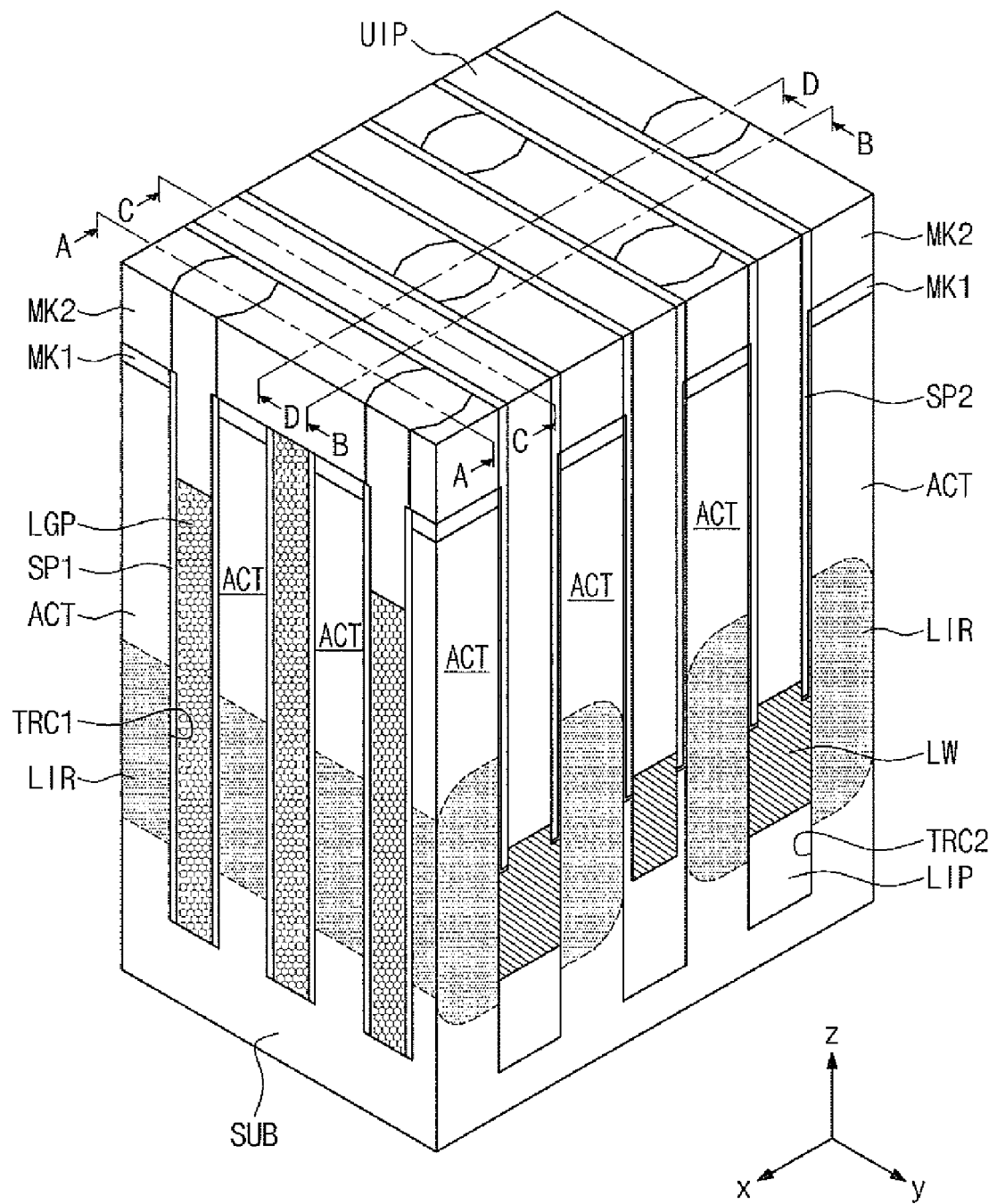

Referring to FIGS. 36A and 36B, a bottom surface of the hole may be positioned between a top surface of the lower wiring LW and a top surface of the active pattern ACT. The current embodiment may differ in depth of the holes from the embodiment described with reference to FIG. 4. The current embodiment differs from the embodiment described with reference to FIG. 4 in that, during forming the holes, the upper gate layer UGL of the first embodiment is not formed yet. Except for such differences, the method of forming the plug insulation patterns PIP may be performed using the method described with reference to FIGS. 16A and 16B. As illustrated in FIGS. 36A and 36B, the plug insulation patterns PIP of the current embodiment may be formed at the same positions as those of the embodiment described with reference to FIG. 4.

Figure 37A:
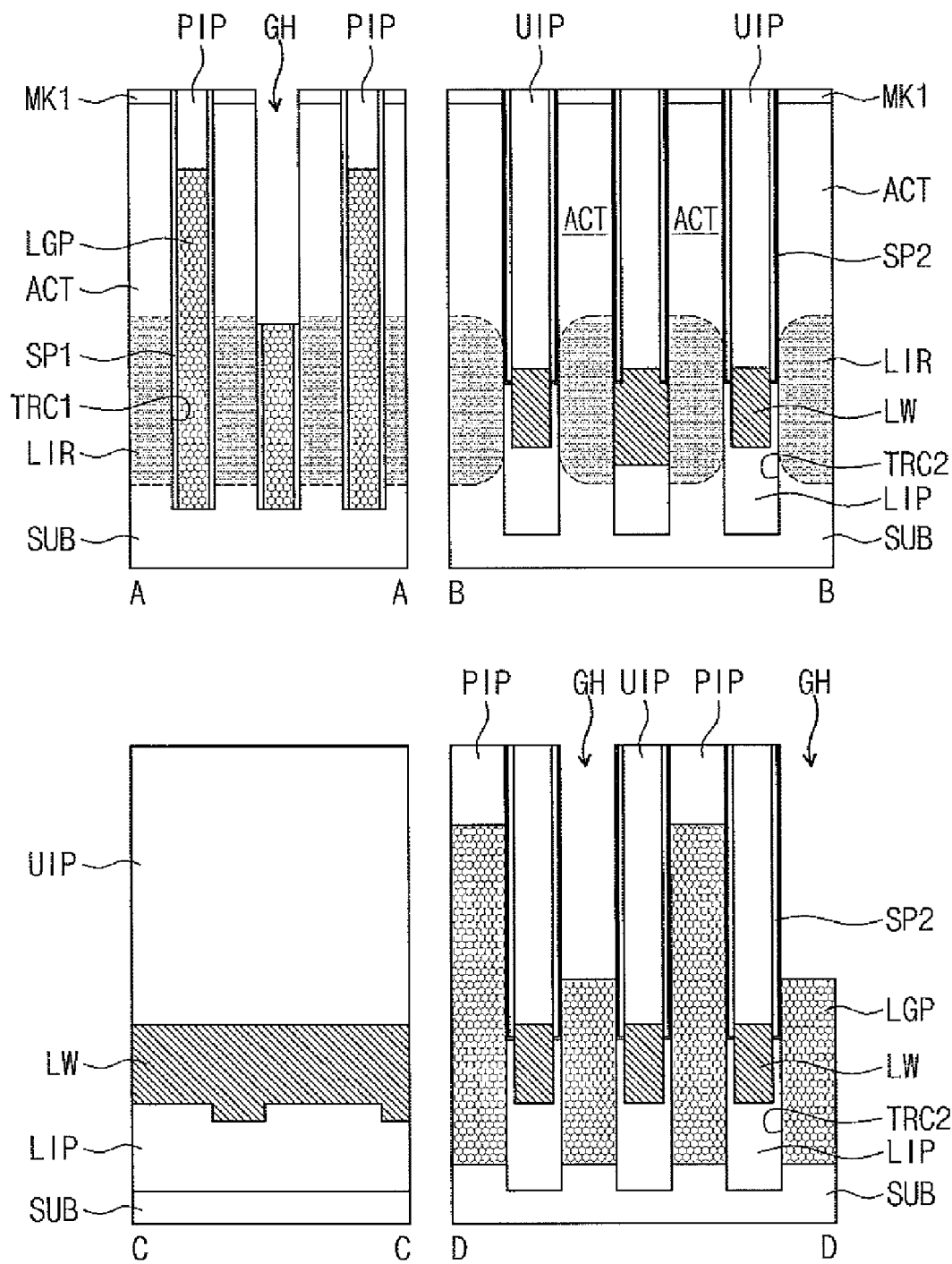
Figure 37B:
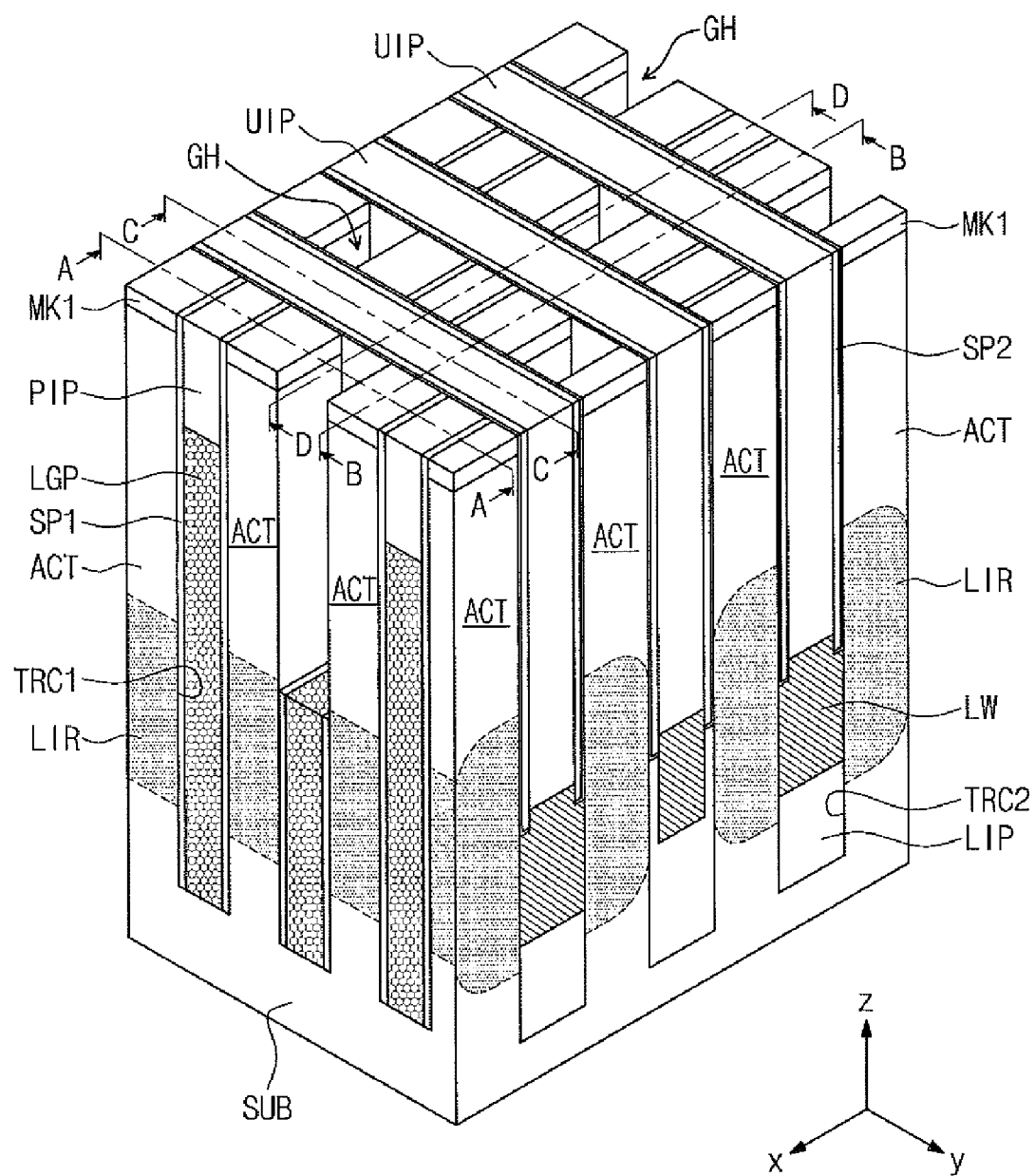
Figure 38A:
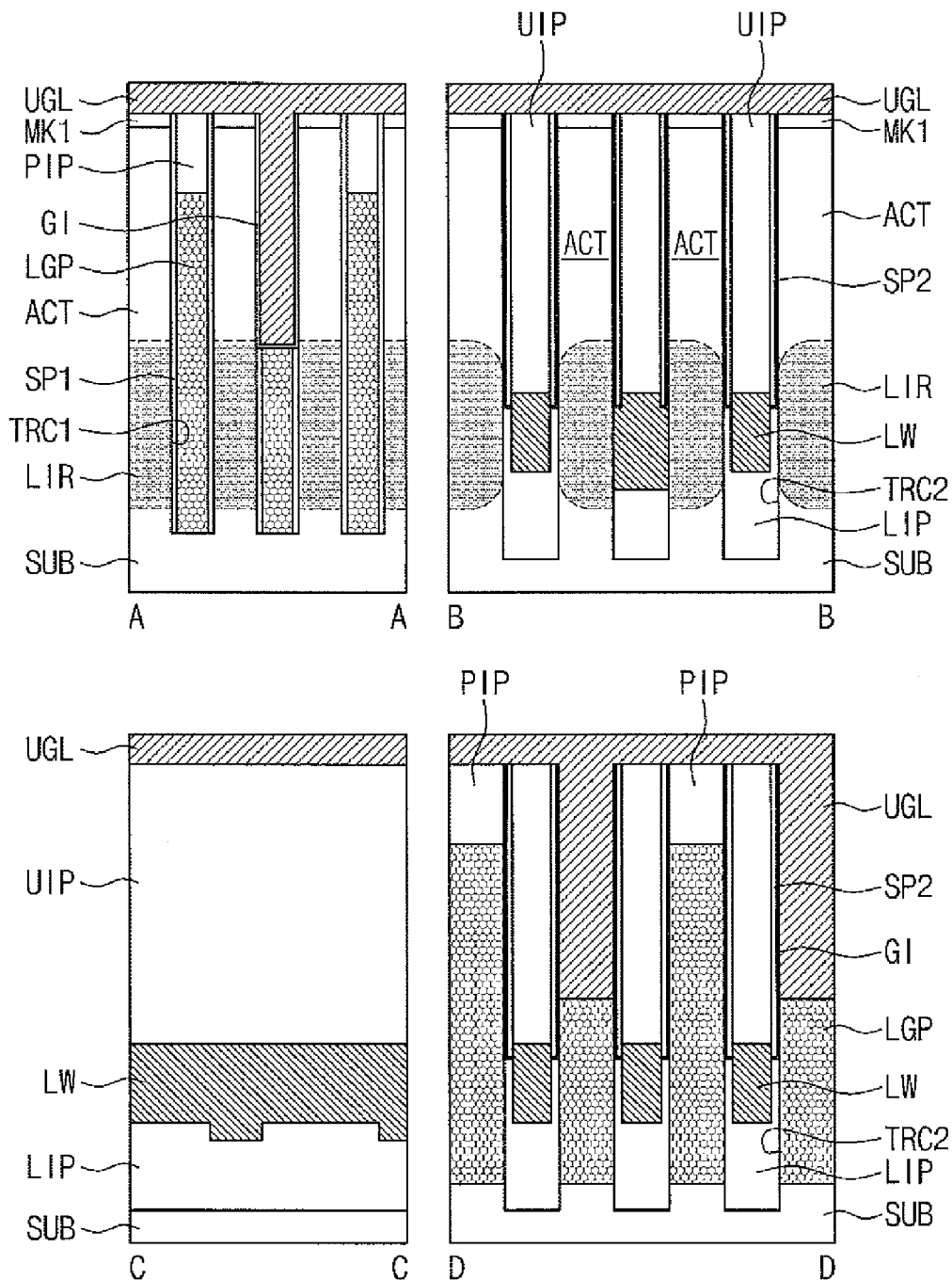
Figure 38B:
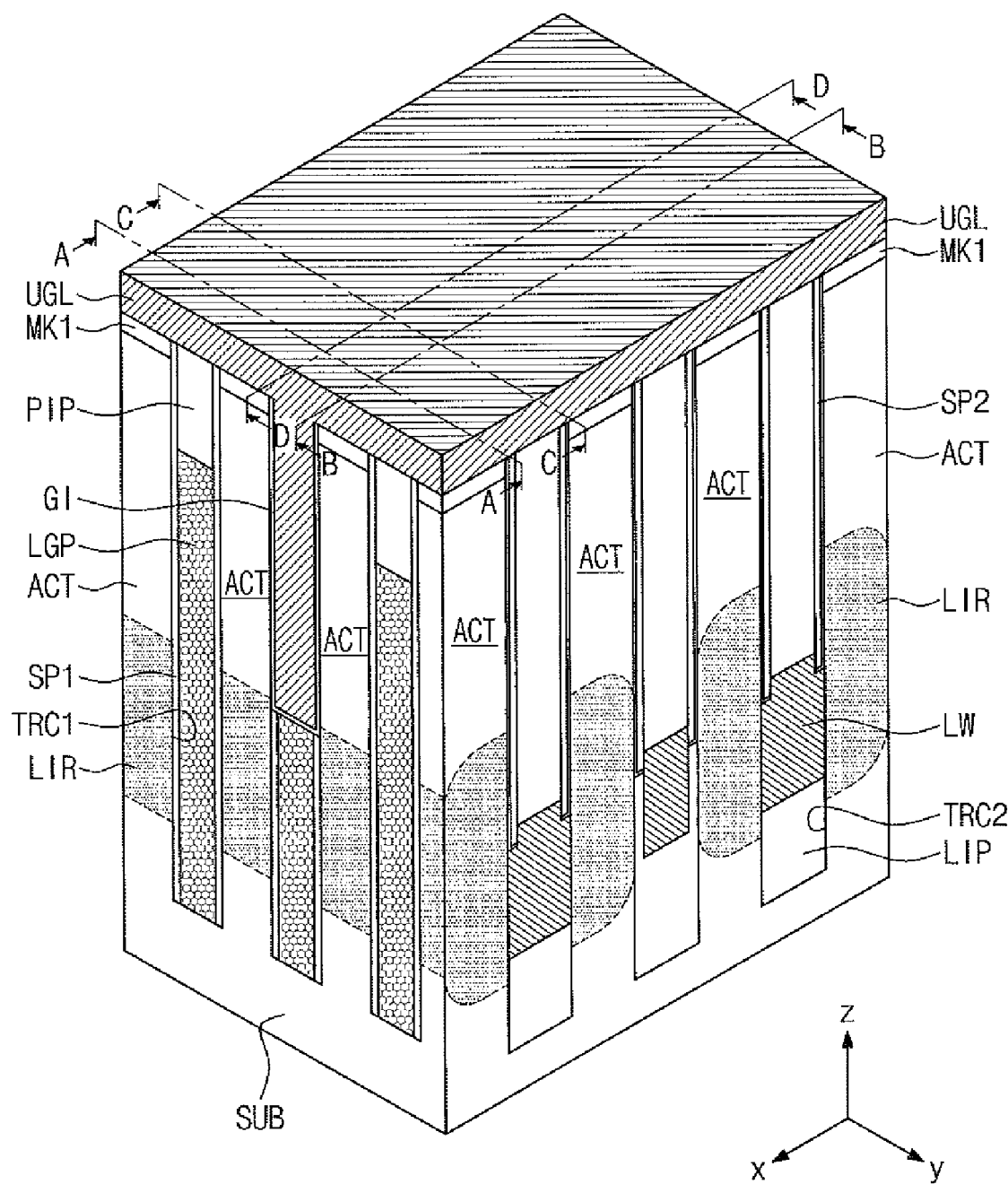

Subsequently, gate holes GH exposing top surfaces of some of the lower gate patterns LGP are formed as illustrated in FIGS. 37A and 37B, and thereafter, an upper gate layer UGL filling the gate holes GH is formed in operation S36. The operation S36 may be performed using the fabrication method described with reference to FIGS. 28A and 29A.

Figure 39A:
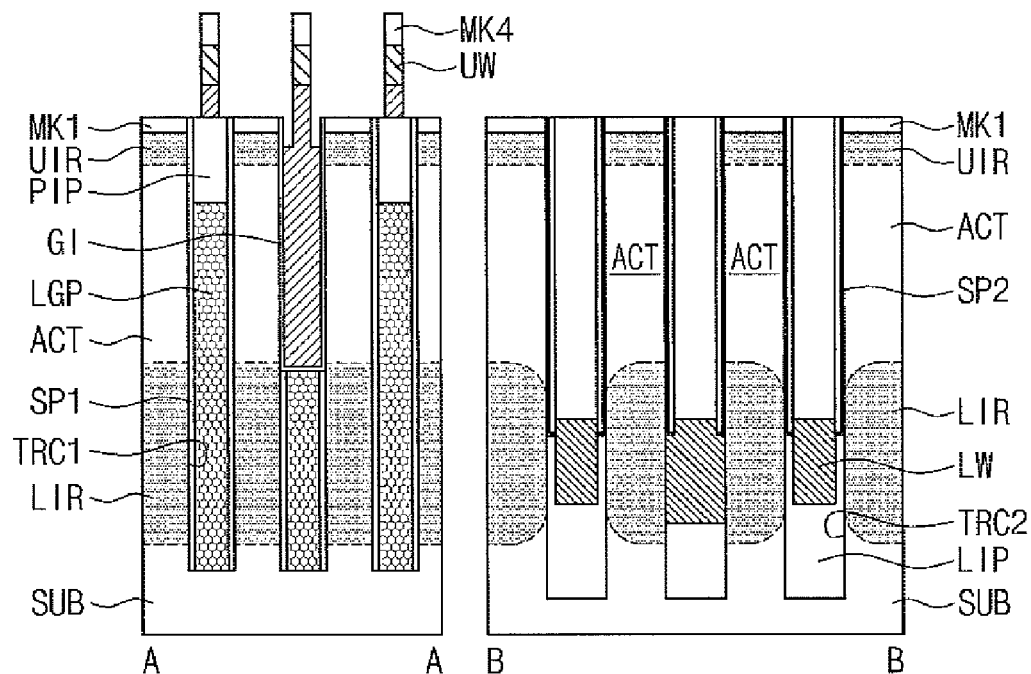
Figure 39A:
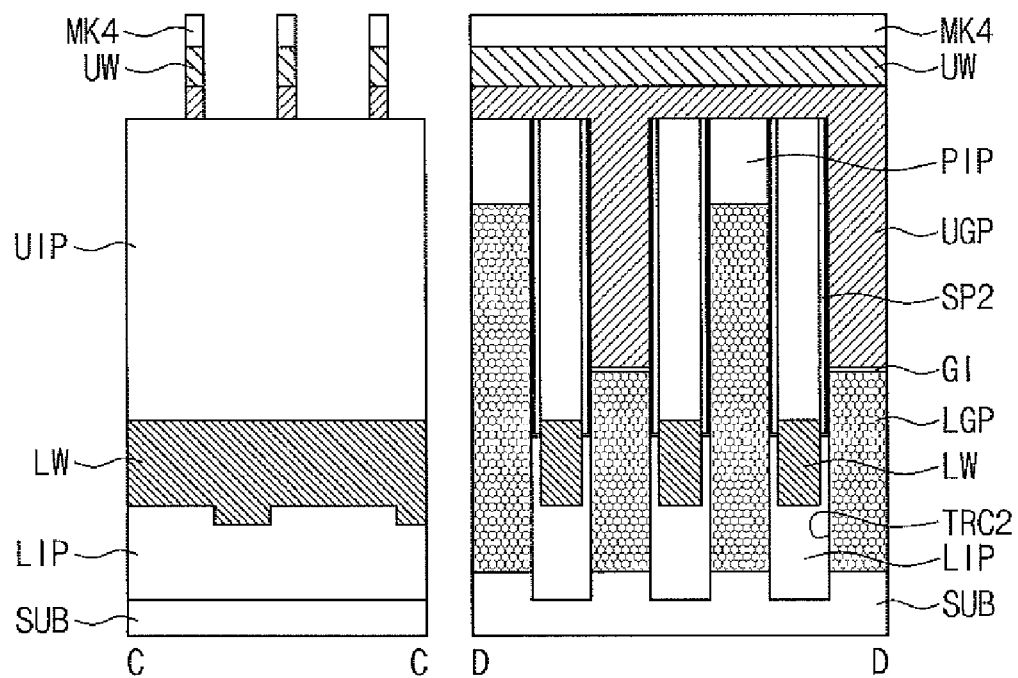
Figure 39B:
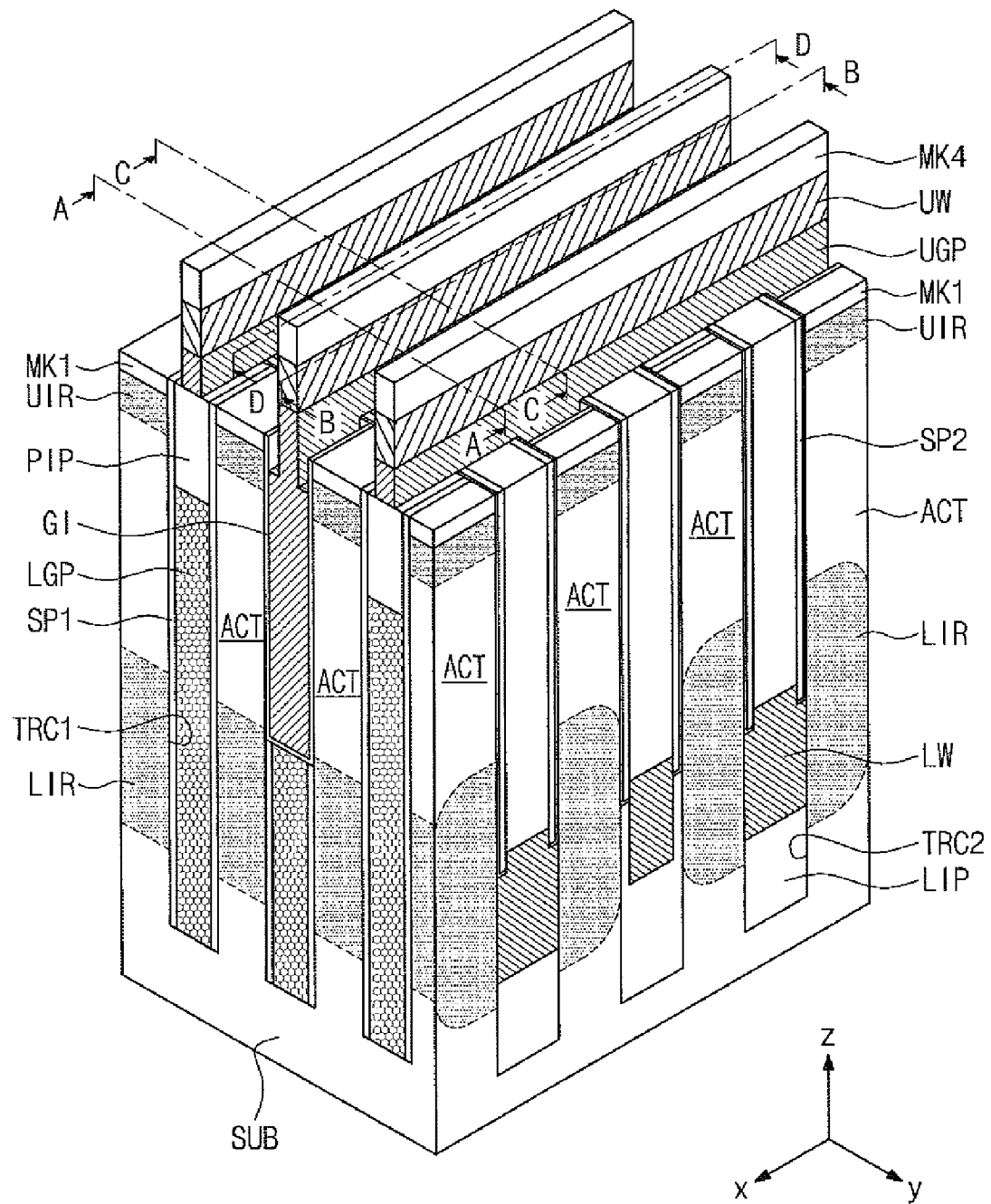
Figure 40A:
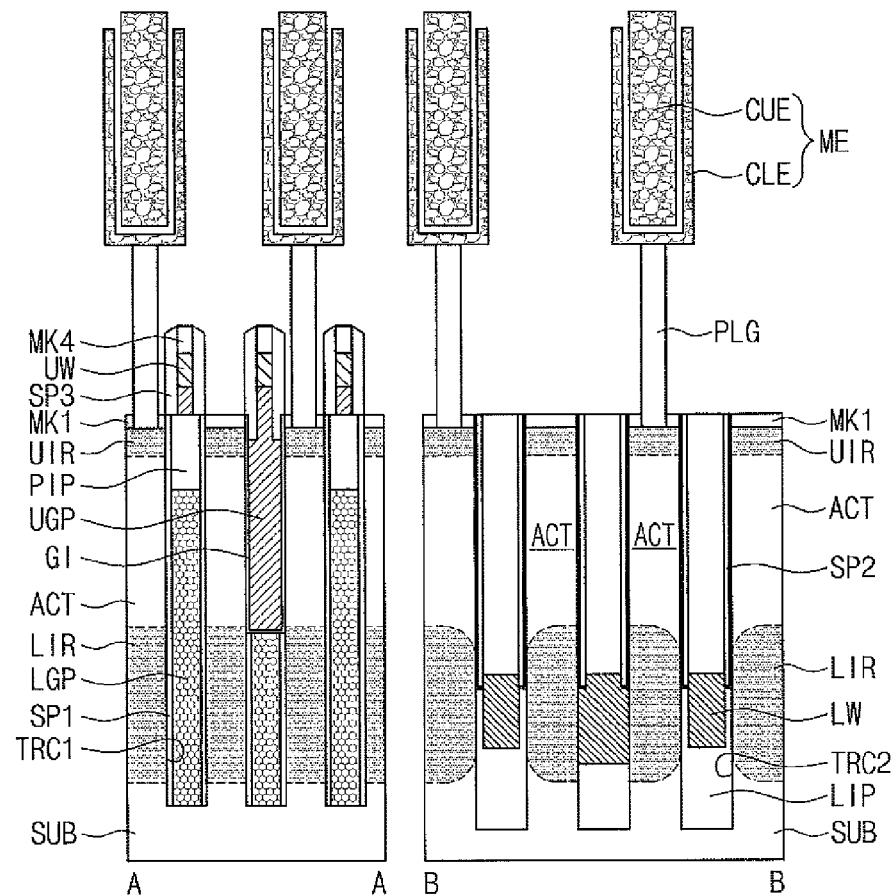
Figure 40A:
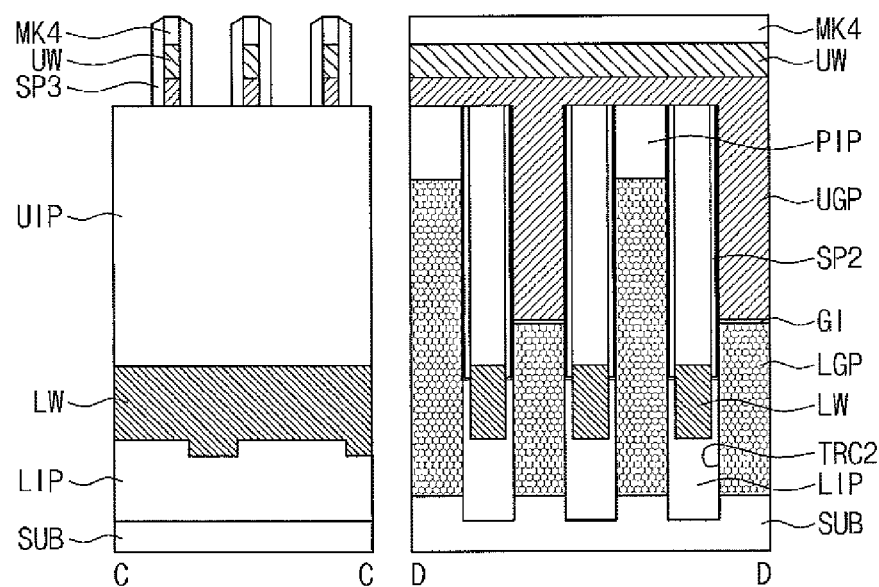
Figure 40B:
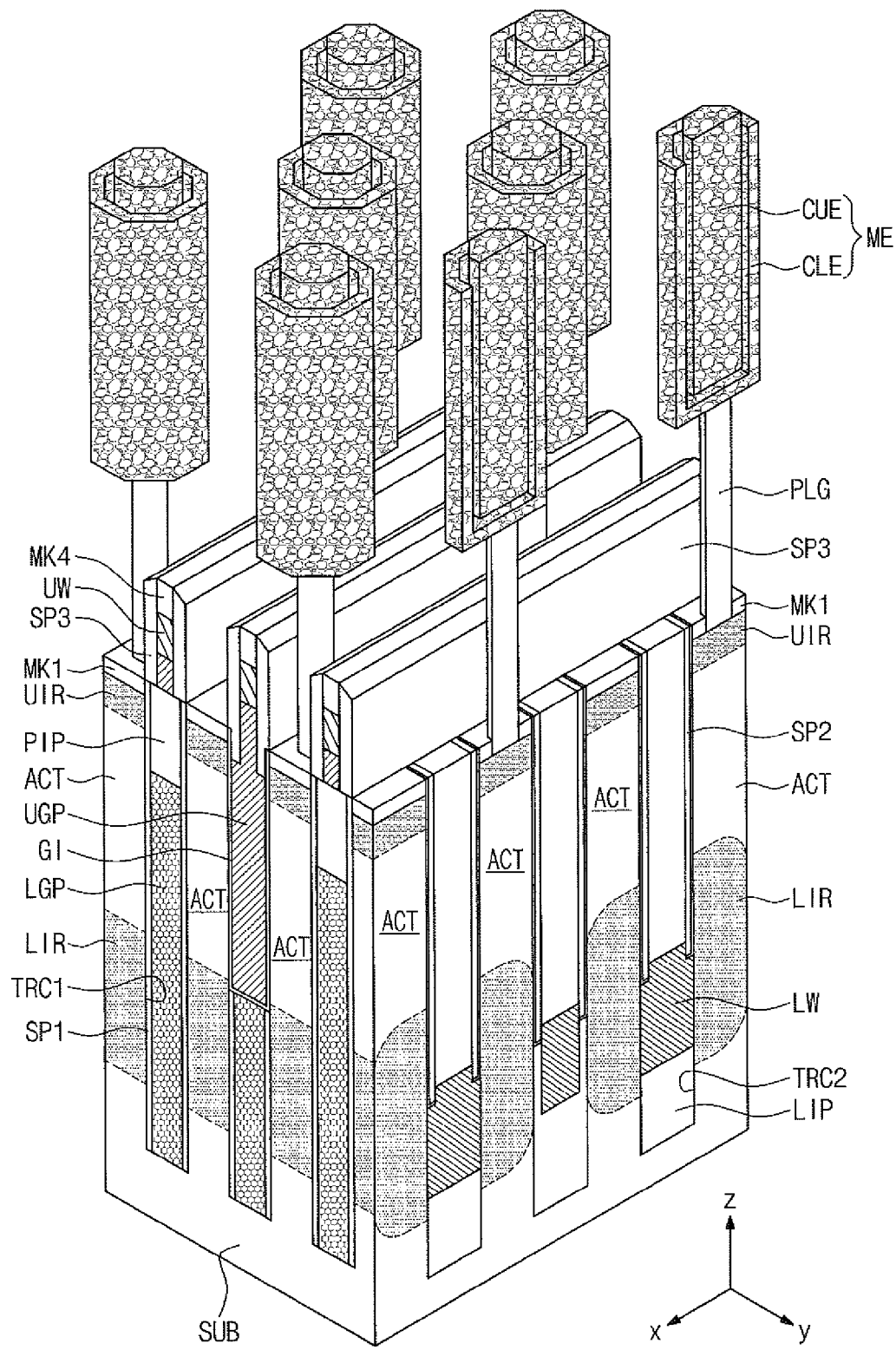

As illustrated in FIGS. 39A and 39B, in operation S37, the upper gate layer UGL are patterned using a fourth mask pattern MK4, thereby forming upper wirings UW and upper gate pattern UGP connected thereto. An upper impurity region UIR is formed in an upper region of the active pattern ACT, and then, in operation S38, plugs PLG connected to the upper impurity regions UIR and memory elements ME connected to the plugs PLG are formed, as illustrated in FIGS. 40A and 40B. These operations may be performed using the fabrication method described with reference to FIGS. 17A to 19A.

Figure 41:
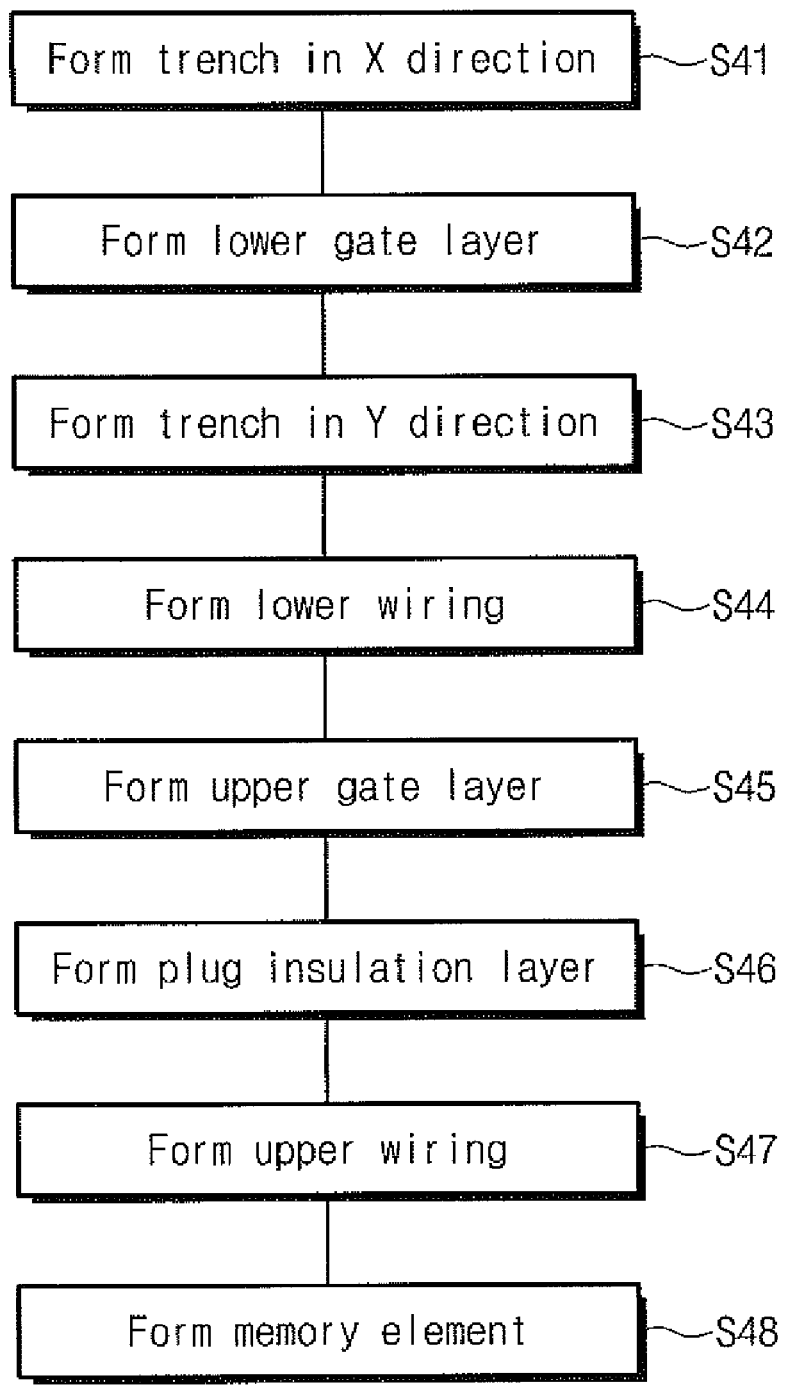
FIG. 41 is a flowchart illustrating a method of fabricating a semiconductor device according to an embodiment of the inventive concept.

FIG. 41 is a flowchart illustrating a method of fabricating a semiconductor device according to an embodiment of the inventive concept. FIGS. 42A to 46A are sectional views illustrating a method of fabricating a semiconductor device according to an embodiment of the inventive concept described with reference to FIG. 41. FIGS. 42B to 46B are perspective views illustrating a method of fabricating a semiconductor device according to an embodiment of the inventive concept described with reference to FIG. 41.

Comparing FIG. 41 with FIG. 32, the current embodiment differs from the third embodiment of FIG. 32 in that the operation S46 of forming a plug insulation layer is performed after the operation S45 of forming a gate layer.

Referring to FIG. 41, first trenches TRC1 are formed by patterning a substrate SUB in operation S41, and thereafter a lower gate layer LGL is formed in the first trenches TRC1. Subsequently, second trenches TRC2 defining the lower gate patterns LGP and the active patterns ACT are formed in operation S43, and then lower wirings LW disposed in the second trench TRC2 are formed in operation S44. These operations S41 to S44 may be performed in the same manner as the operations S31 to S34 of the third embodiment. According to this embodiment, after the forming of the lower wirings LW, upper insulation patterns UIP filling the second trenches TRC2 may be further formed.

Figure 42A:
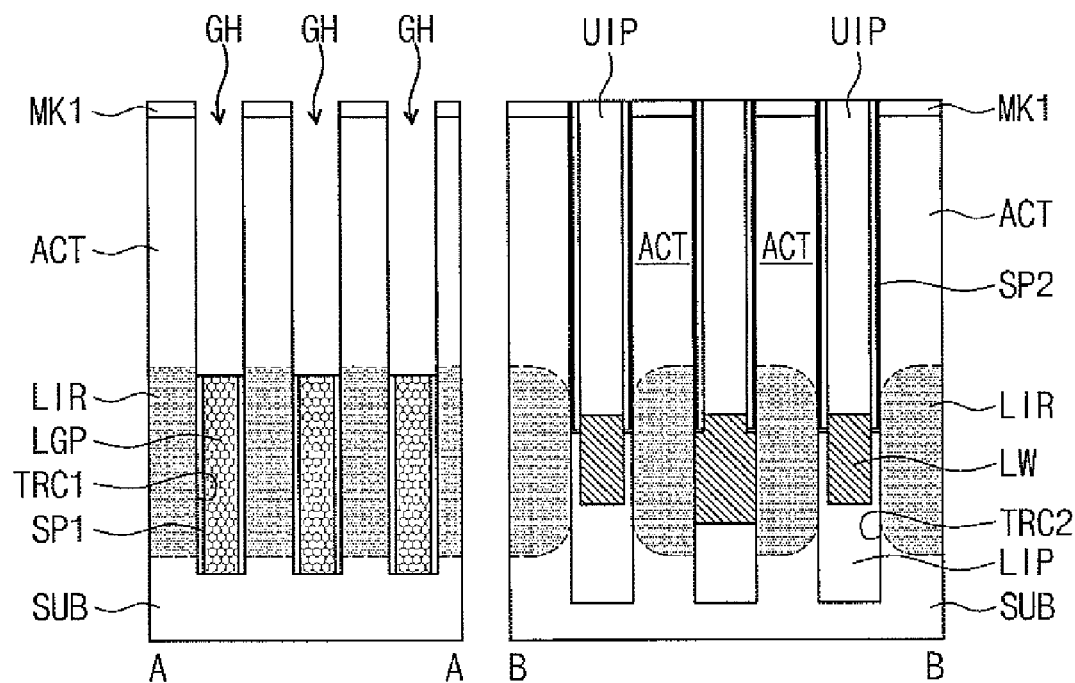
Figure 42A:
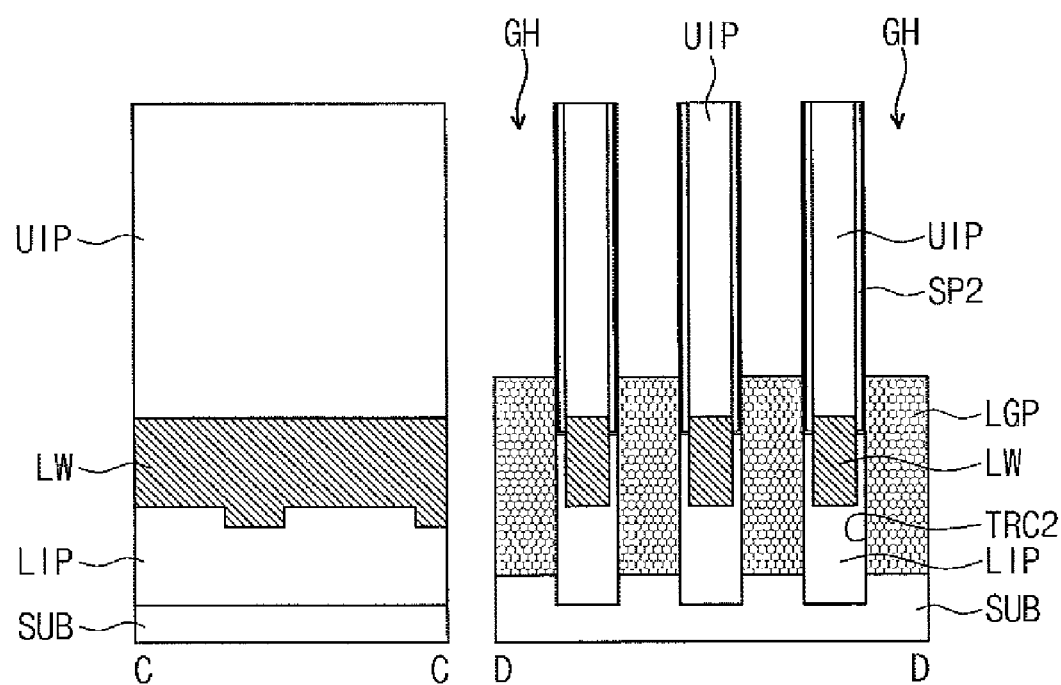
Figure 42B:
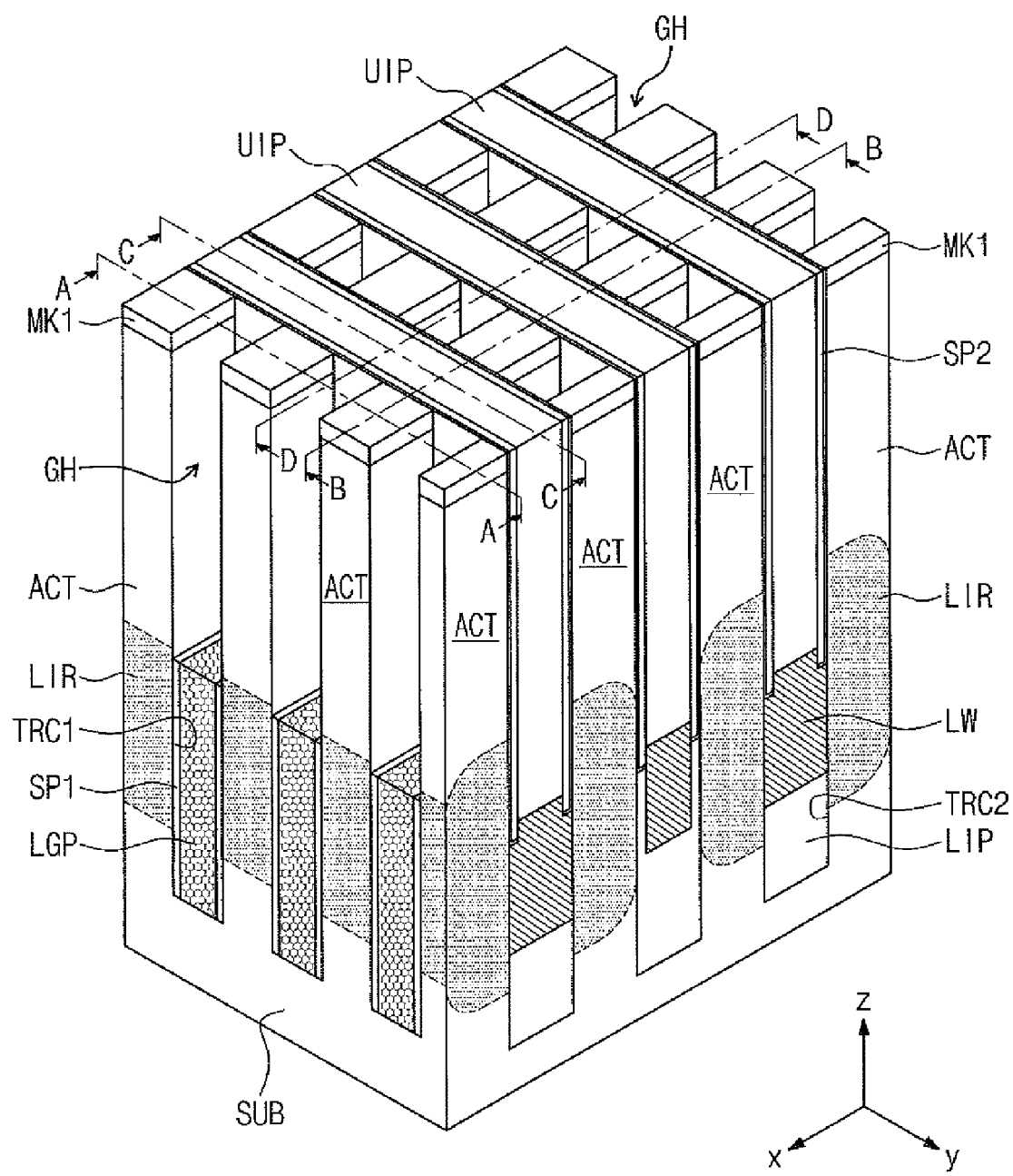

Thereafter, as illustrated in FIGS. 42A and 42B, gate holes GH exposing top surfaces of the lower gate patterns LGP are formed. According to this embodiment, the bottom surface of the gate hole GH may be positioned between the top surface of the lower wiring LW and the top surface of the active pattern ACT. Thus, this embodiment may differ in depths of the holes from the embodiment described with reference to FIG. 4.

Figure 43A:
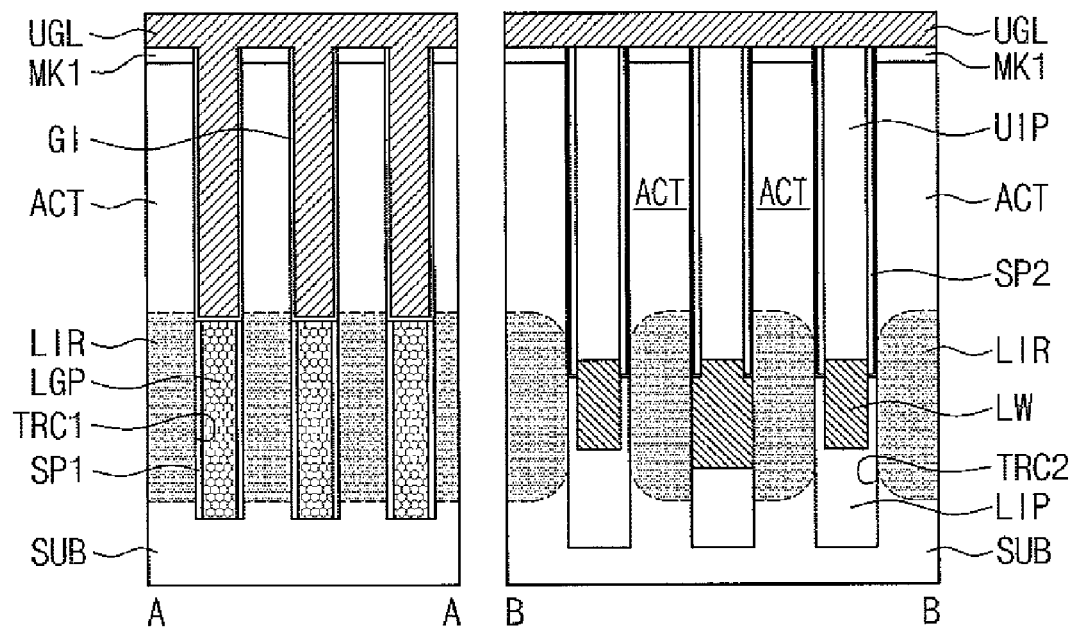
Figure 43A:
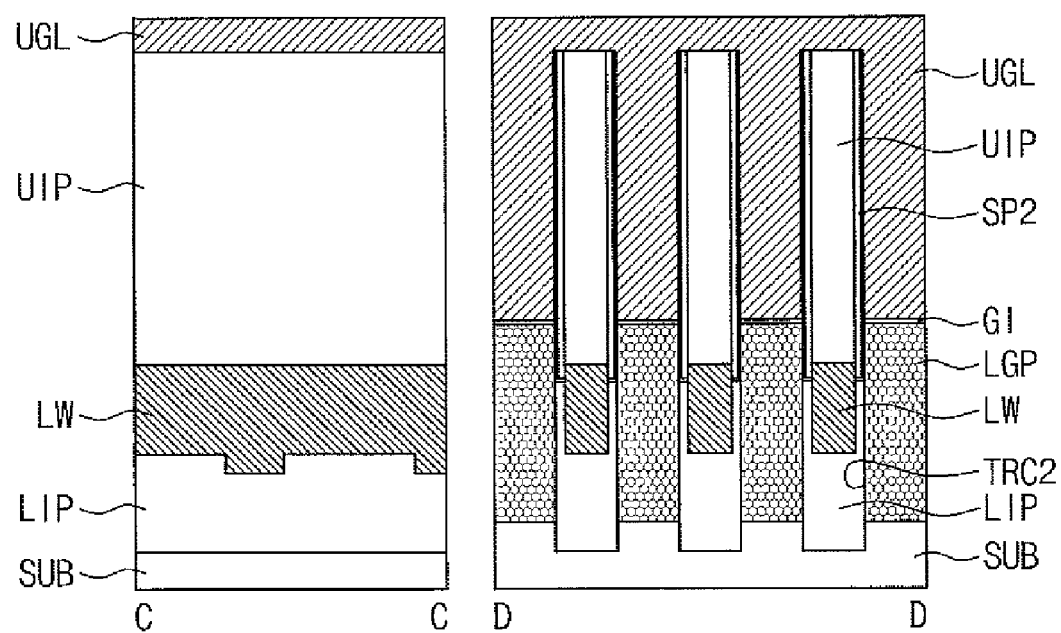
Figure 43B:
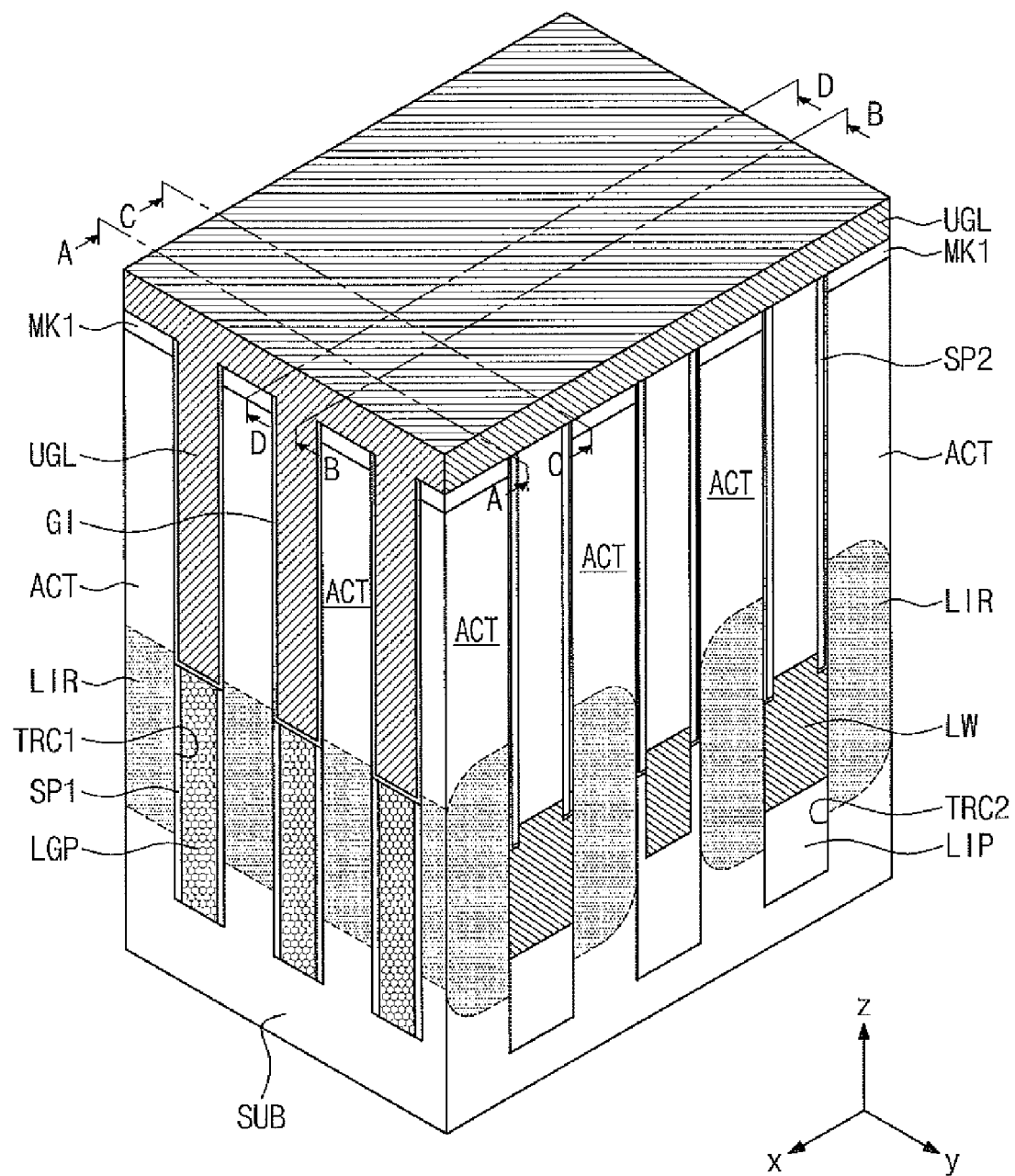

Afterwards, as illustrated in FIGS. 43A and 43B, in operation S45, a gate insulator GI and an upper gate layer UGL are formed in sequence, wherein the gate insulator GI covers inner walls of the gate holes GH and an upper gate layer UGL fills the gate holes GH with the gate insulator GI formed. According to this embodiment, the gate holes GH may be formed to expose top surfaces of all of the lower gate patterns LGP. Forming the gate insulator GI and the upper gate layer UGL may be performed using the method described with reference to FIG. 7A. According to the embodiment described with reference to FIG. 4, the upper gate layer UGL is formed to fill the first trench TRC1, however, the upper gate layer UGL is formed to fill the gate holes GH according to this embodiment.

Figure 44A:
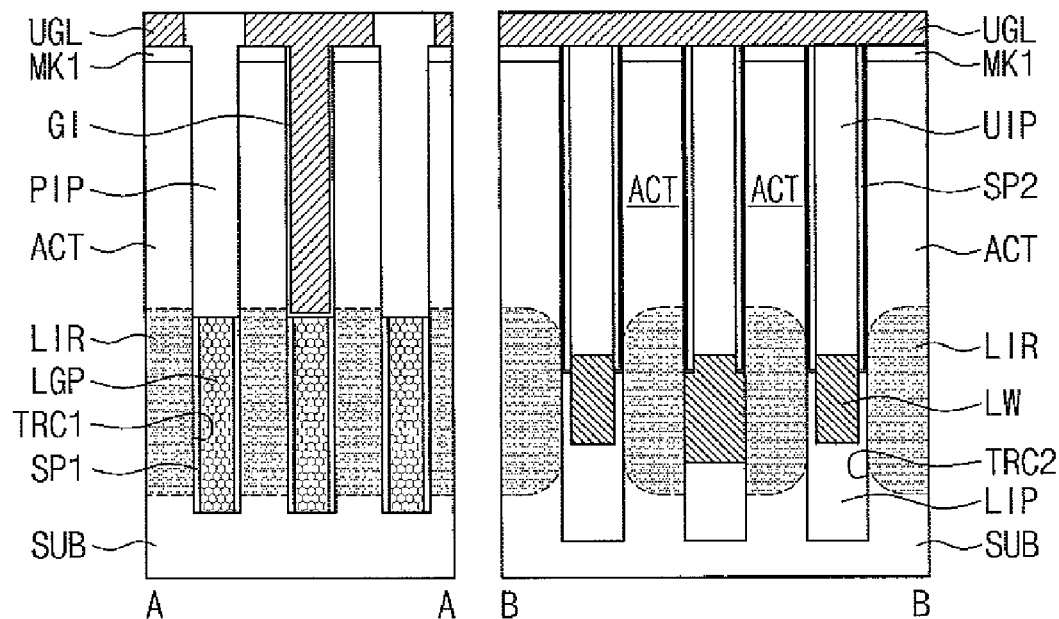
Figure 44A:
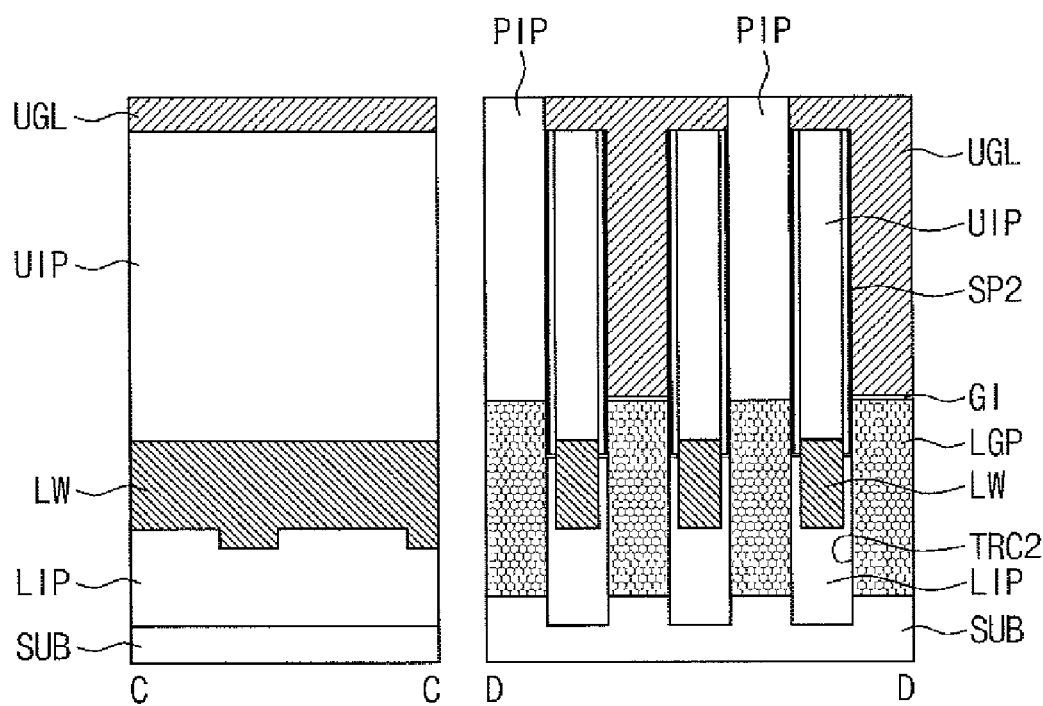
Figure 44B:
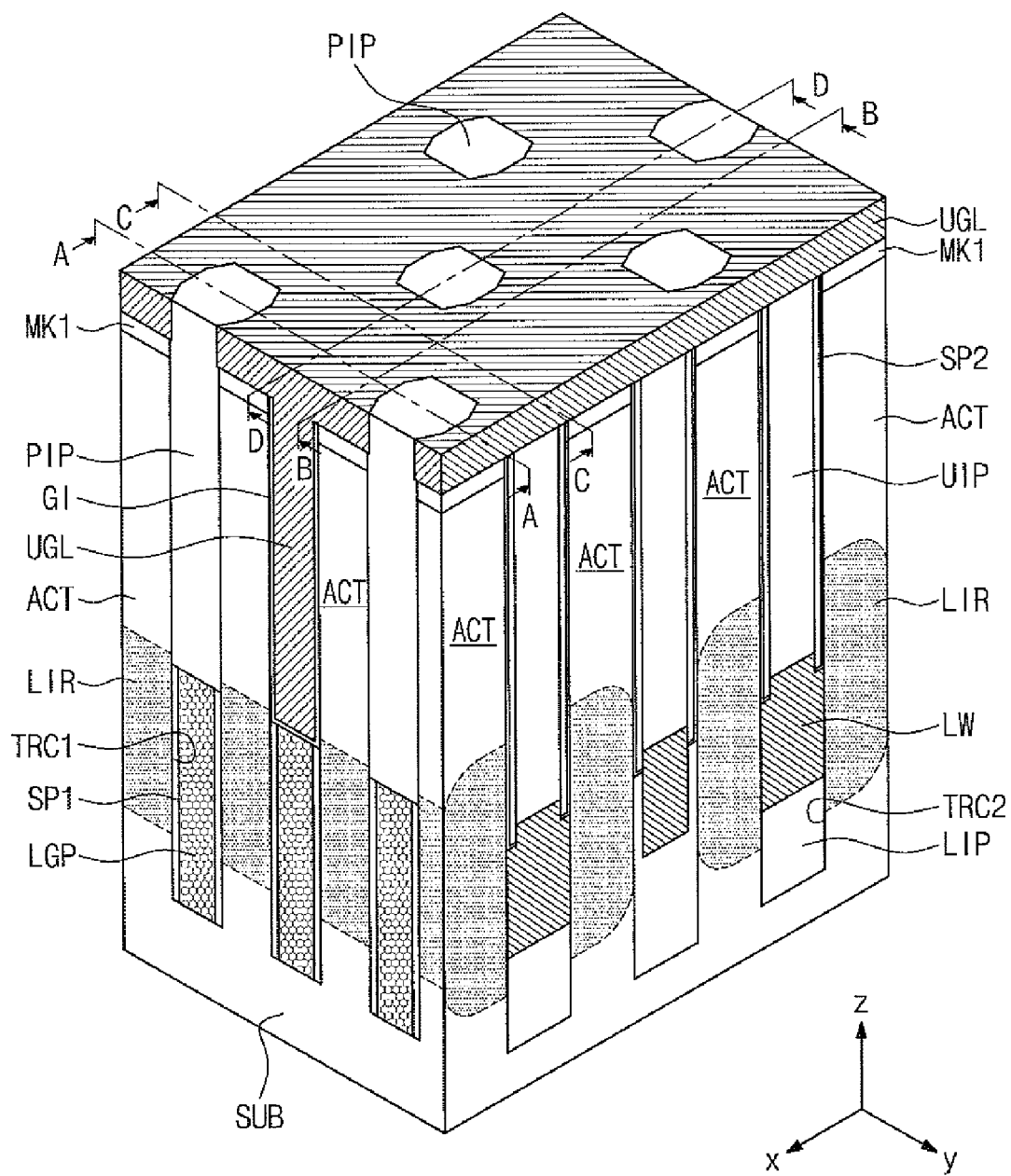

As illustrated in FIGS. 44A and 44B, in operation S46, plug insulation patterns PIP are formed on some of the lower gate patterns LGP. The operation S46 may include forming holes exposing top surfaces of some of the lower gate patterns LGP, filling the holes with an insulation material, and etching the insulation material to expose the upper gate patterns UGP. Forming the plug insulation patterns PIP may be performed using the method described with reference to FIGS. 16A and 16B, and positions where the plug insulation patterns PIP are formed may be identical to those of the embodiment described with reference to FIG. 4.

Figure 45A:
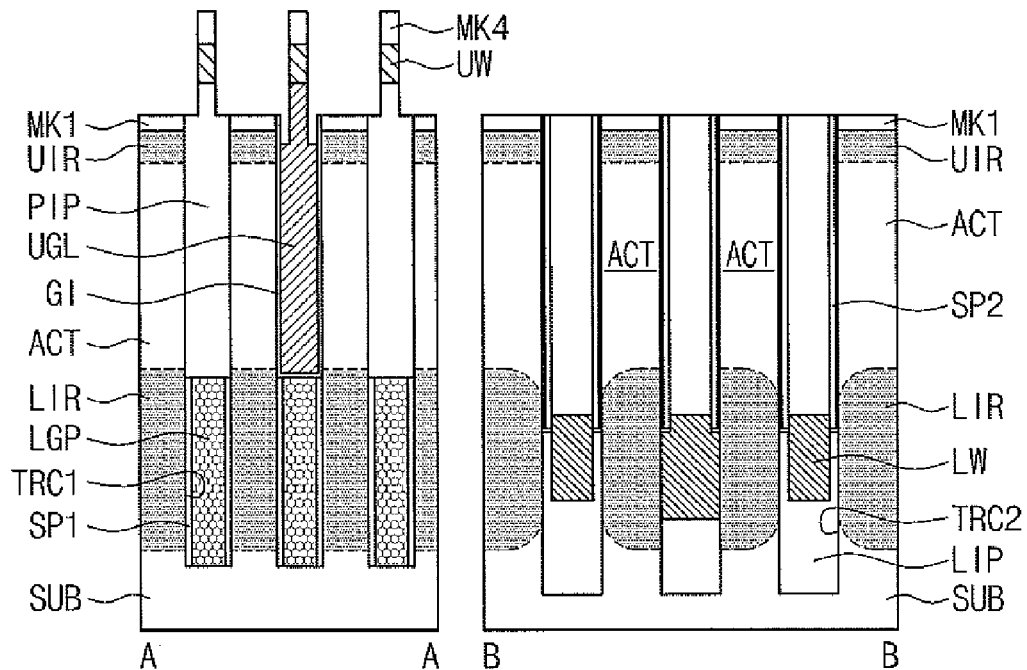
Figure 45A:
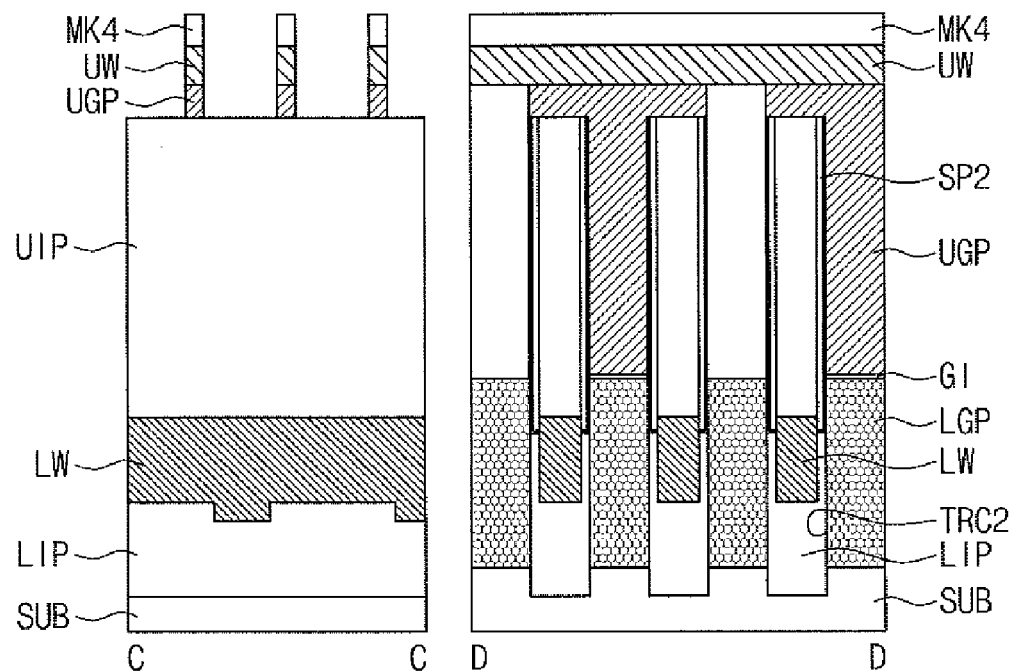
Figure 45B:
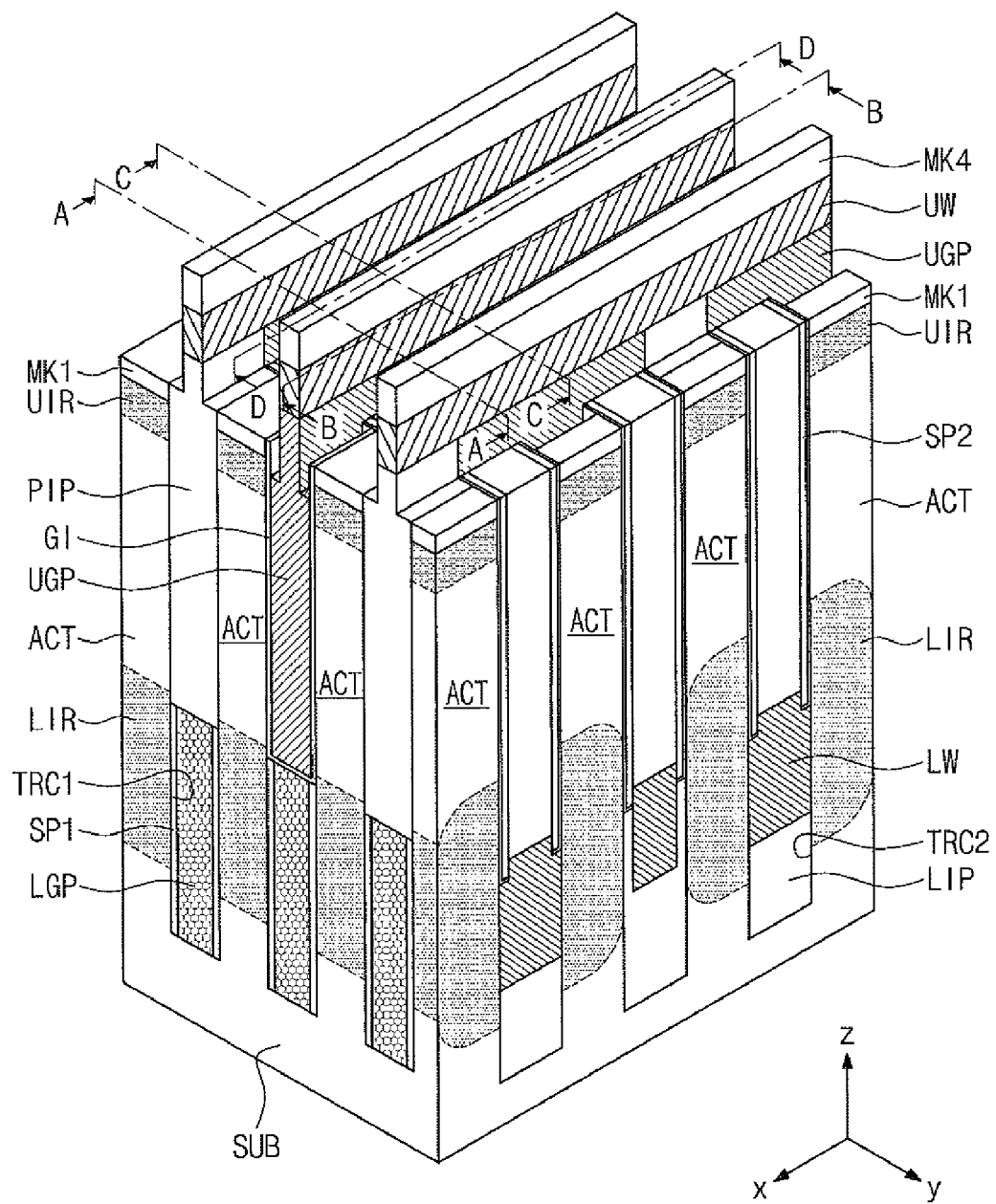
Figure 46A:
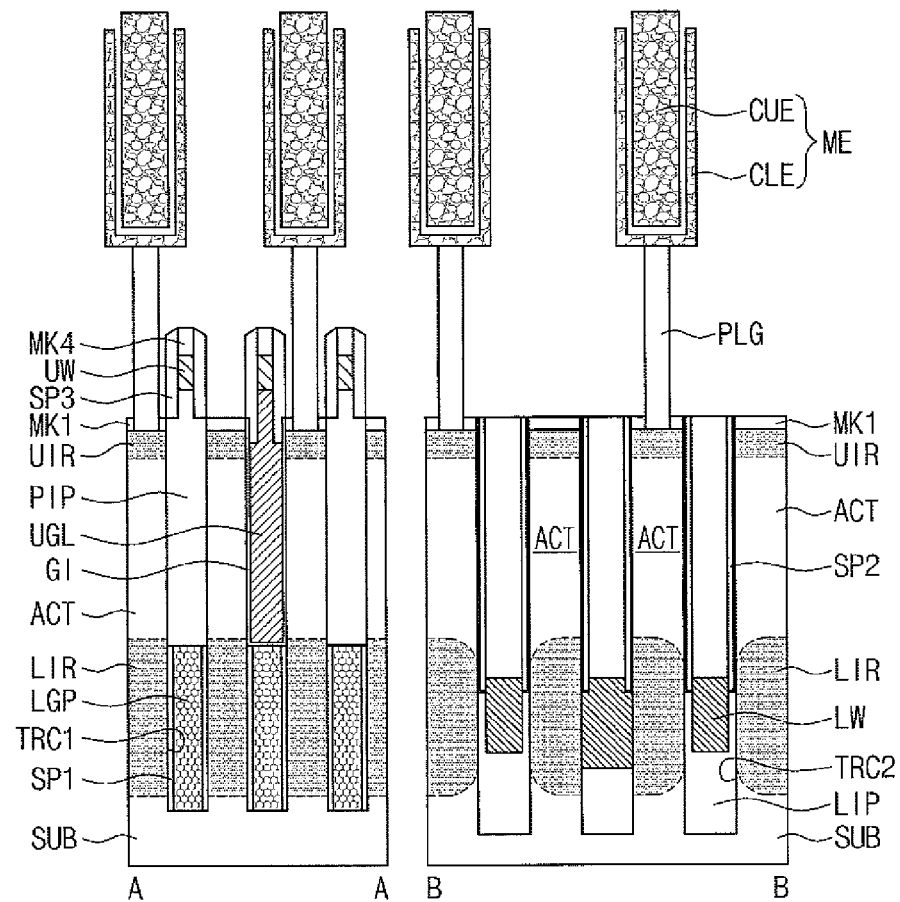
Figure 46A:
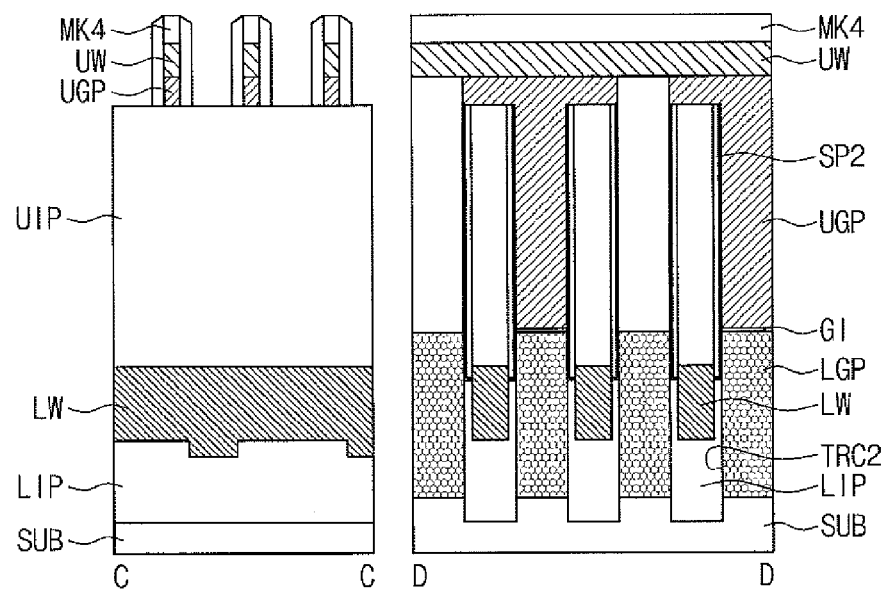
Figure 46B:
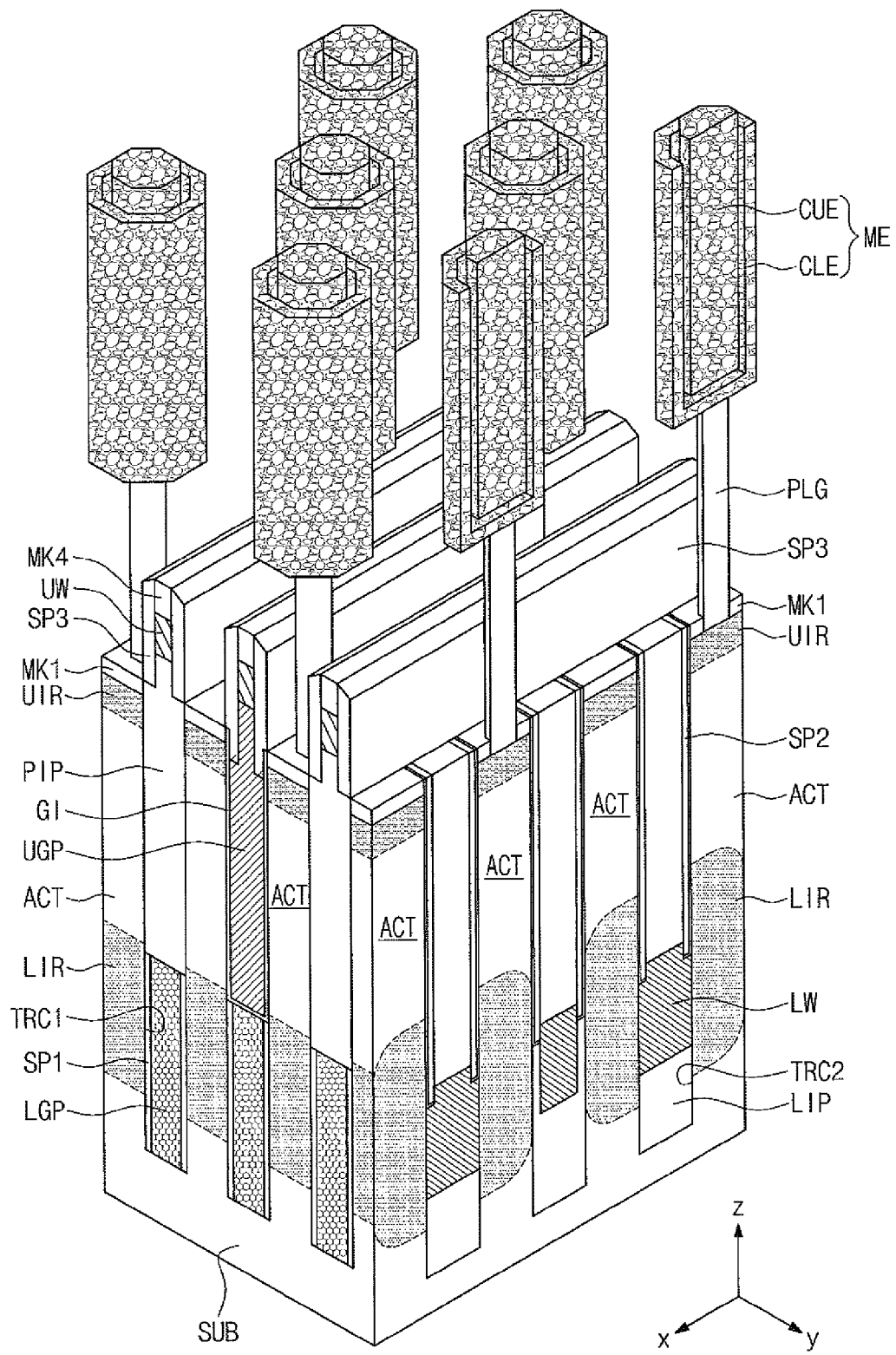

Subsequently, upper wirings UW and upper impurity regions UIR are formed in operation S47 as illustrated in FIGS. 45A and 45B, and then plugs PLG connected to the upper impurity regions UIR and memory elements ME connected to the plugs PLG are formed in operation S48, as illustrated in FIGS. 46A and 46B. These operations may be performed using the fabrication method described with reference to FIGS. 17A to 19A.

Figure 47:
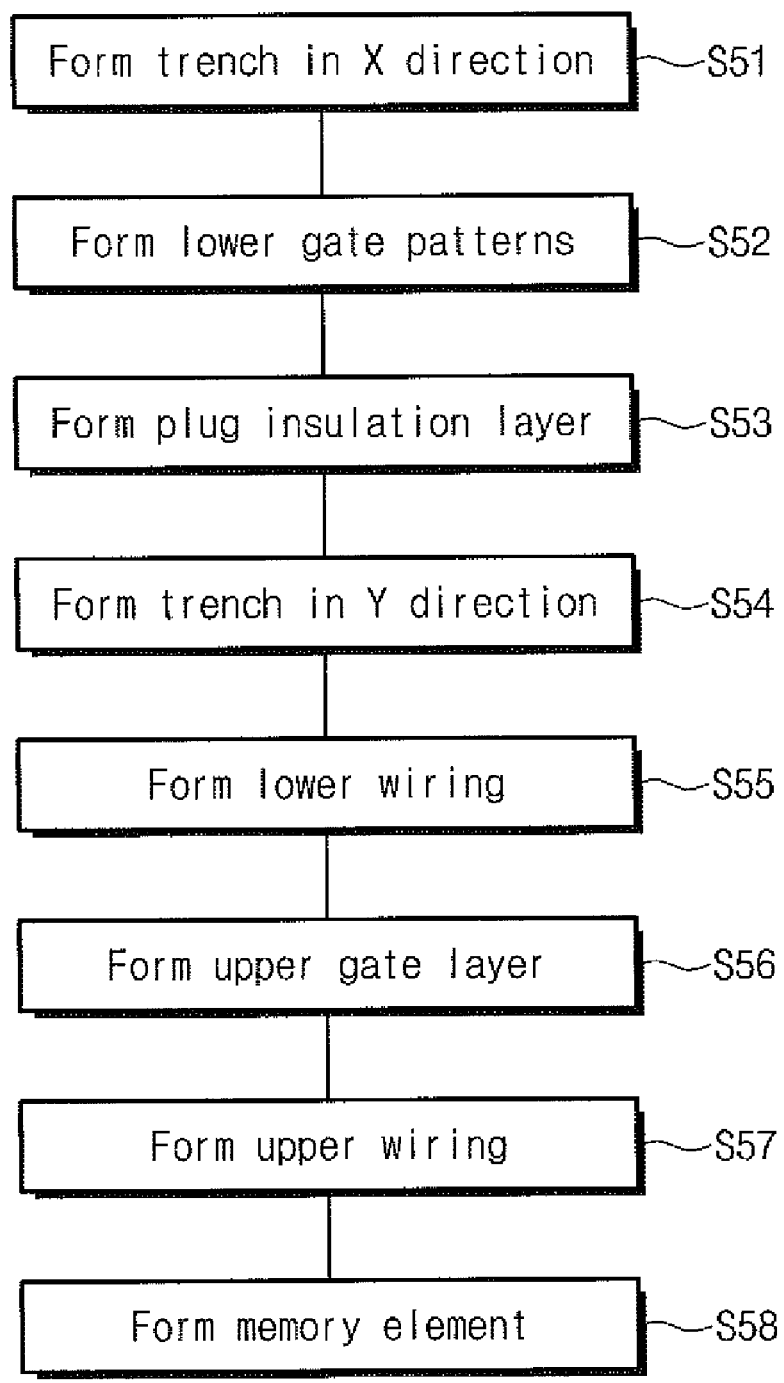
FIG. 47 is a flowchart illustrating a method of fabricating a semiconductor device according to an embodiment of the inventive concept.

FIG. 47 is a flowchart illustrating a method of fabricating a semiconductor device according to an embodiment of the inventive concept. FIGS. 48A to 56A are sectional views illustrating a method of fabricating a semiconductor device according to an embodiment of the inventive concept described with reference to FIG. 47. FIGS. 48B to 56B are perspective views illustrating a method of fabricating a semiconductor device according to an embodiment of the inventive concept described with reference to FIG. 47.

Comparing FIG. 47 with FIG. 23, this embodiment differs from the embodiment described with reference to FIG. 23 in that lower gate patterns LGP, which are 2-dimensionally separated, are formed prior to forming second trenches TRC2.

Figure 48A:
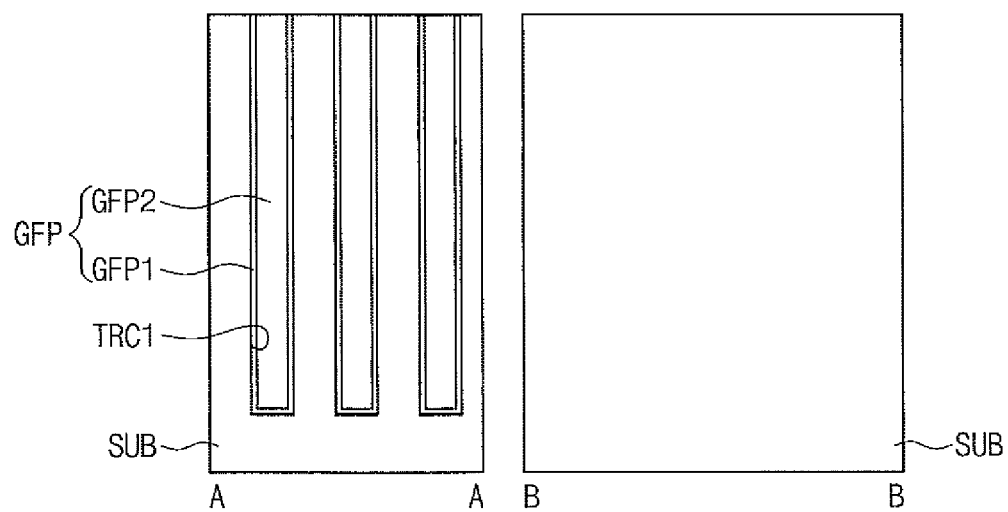
Figure 48A:
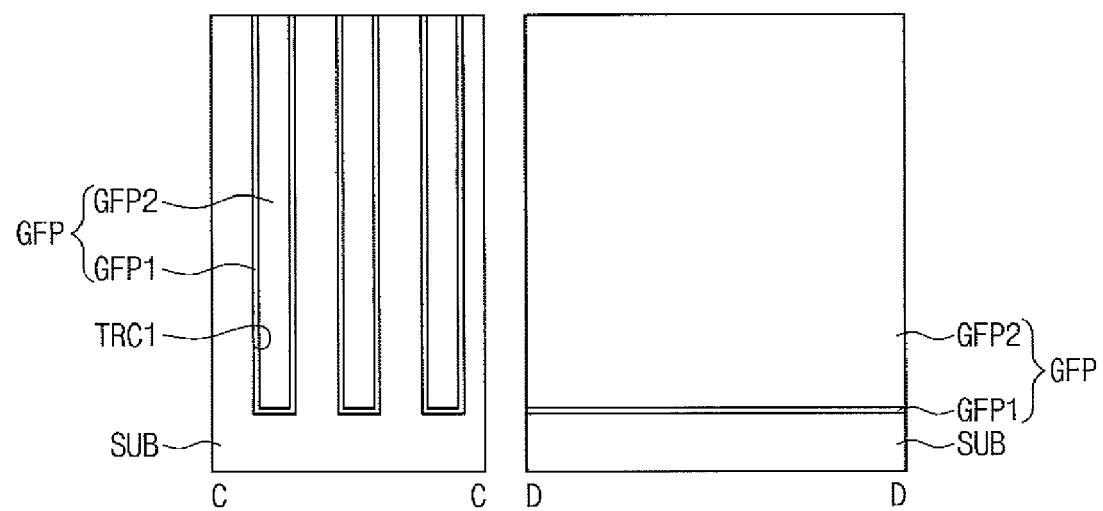
Figure 48B:
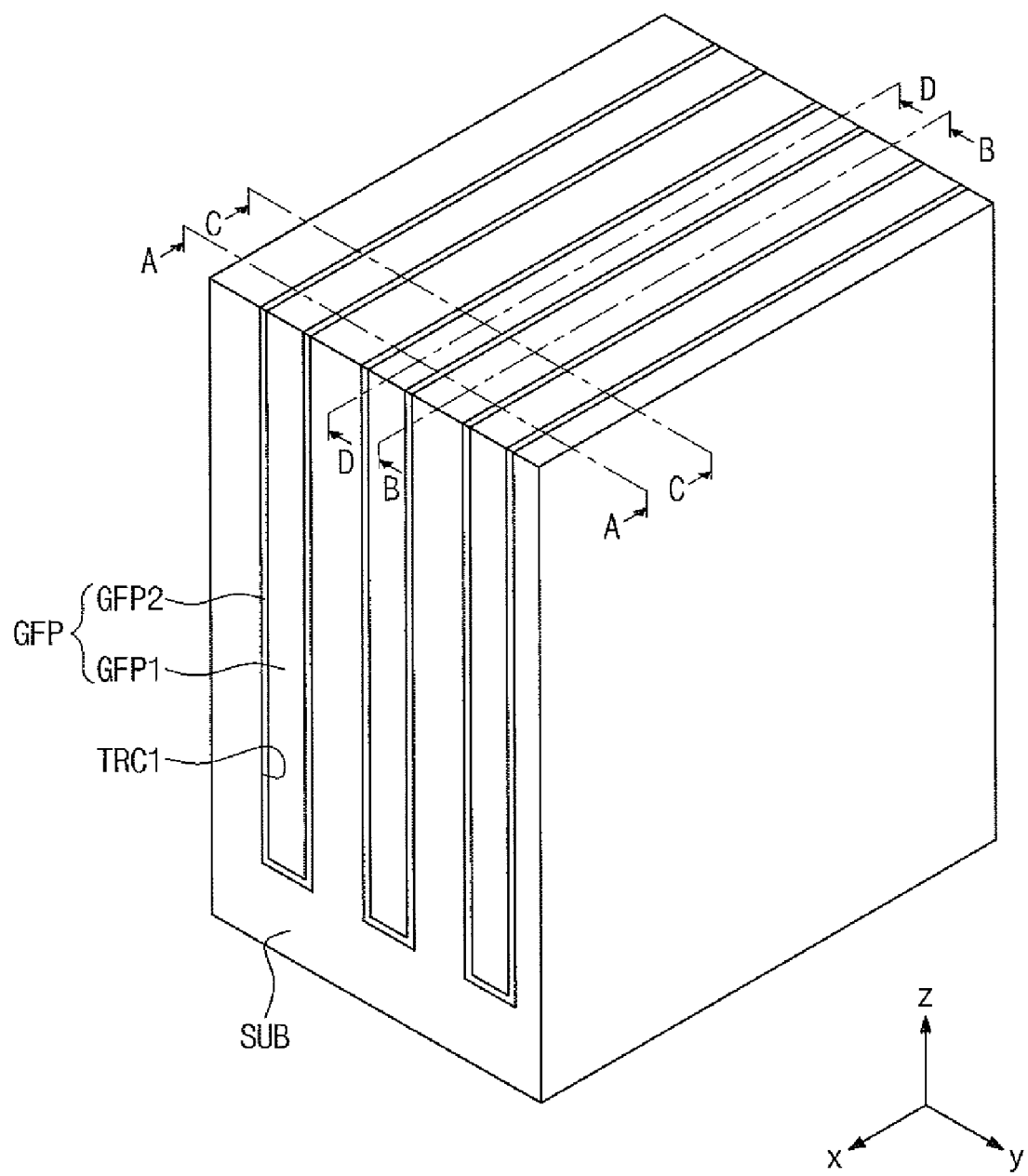

Referring to FIG. 47, in operation S51, a substrate SUB is patterned to form first trenches TRC1. Thereafter, gap-fill patterns GFP filling the first trenches TRC1 are formed. According to an embodiment, as illustrated in FIGS. 48A and 48B, each of the gap-fill patterns GFP may include a first gap-fill pattern GFP 1 covering an inner wall of the first trench TRC1 and a second gap-fill pattern filling the first trench TRC1 with the first gap-fill pattern GFP 1 formed. The first gap-fill pattern GFP 1 may be a thermal oxidation layer formed by thermally oxidizing an inner wall of the first trench TRC1, and the second gap-fill pattern GFP2 may include one of materials having an etch selectivity with respect to the first gap-fill pattern GFP1.

Figure 49A:
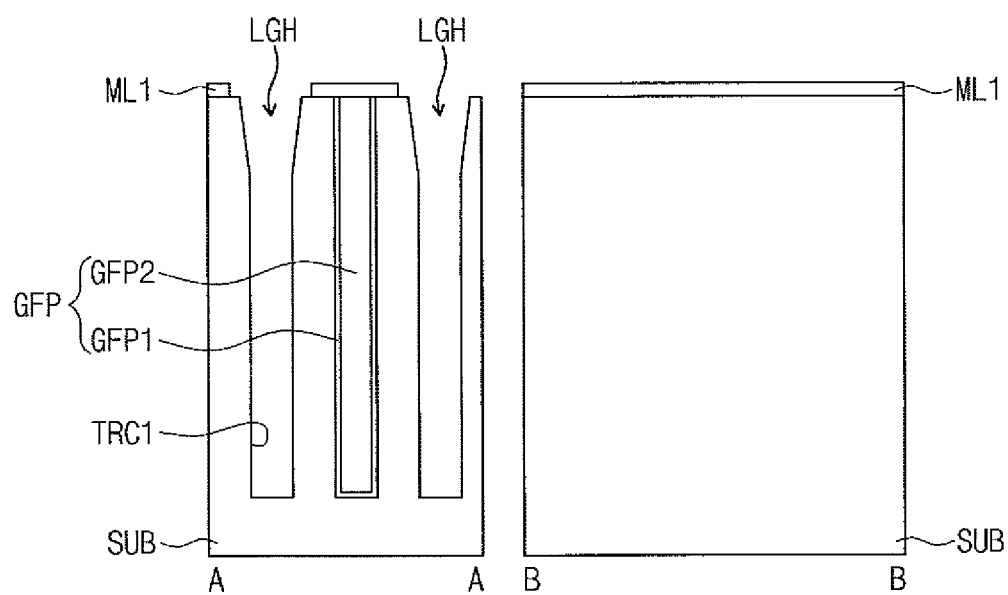
Figure 49A:
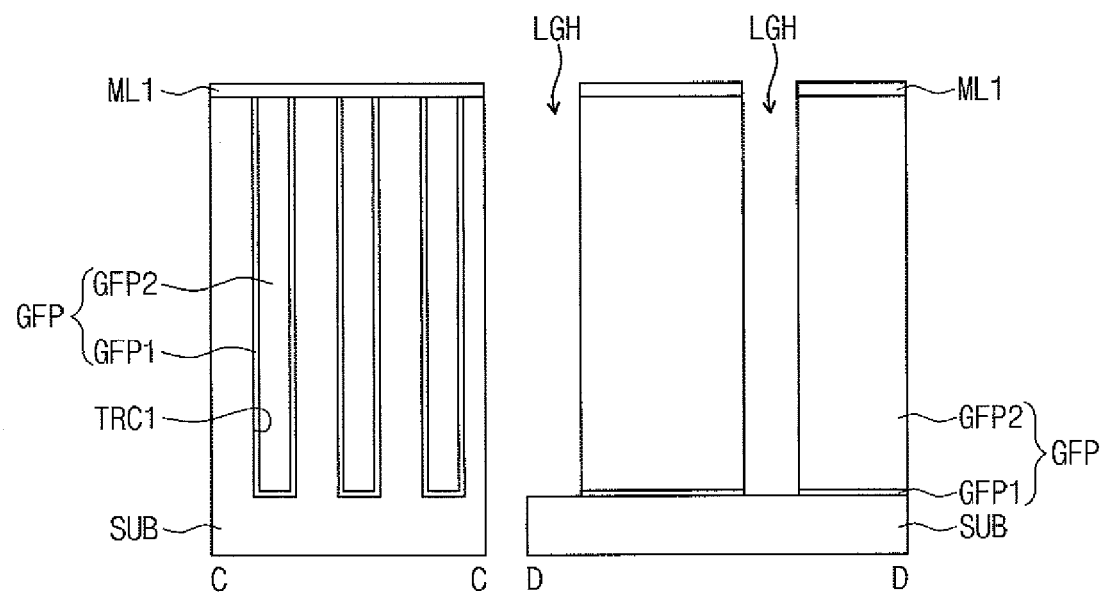
Figure 49B:
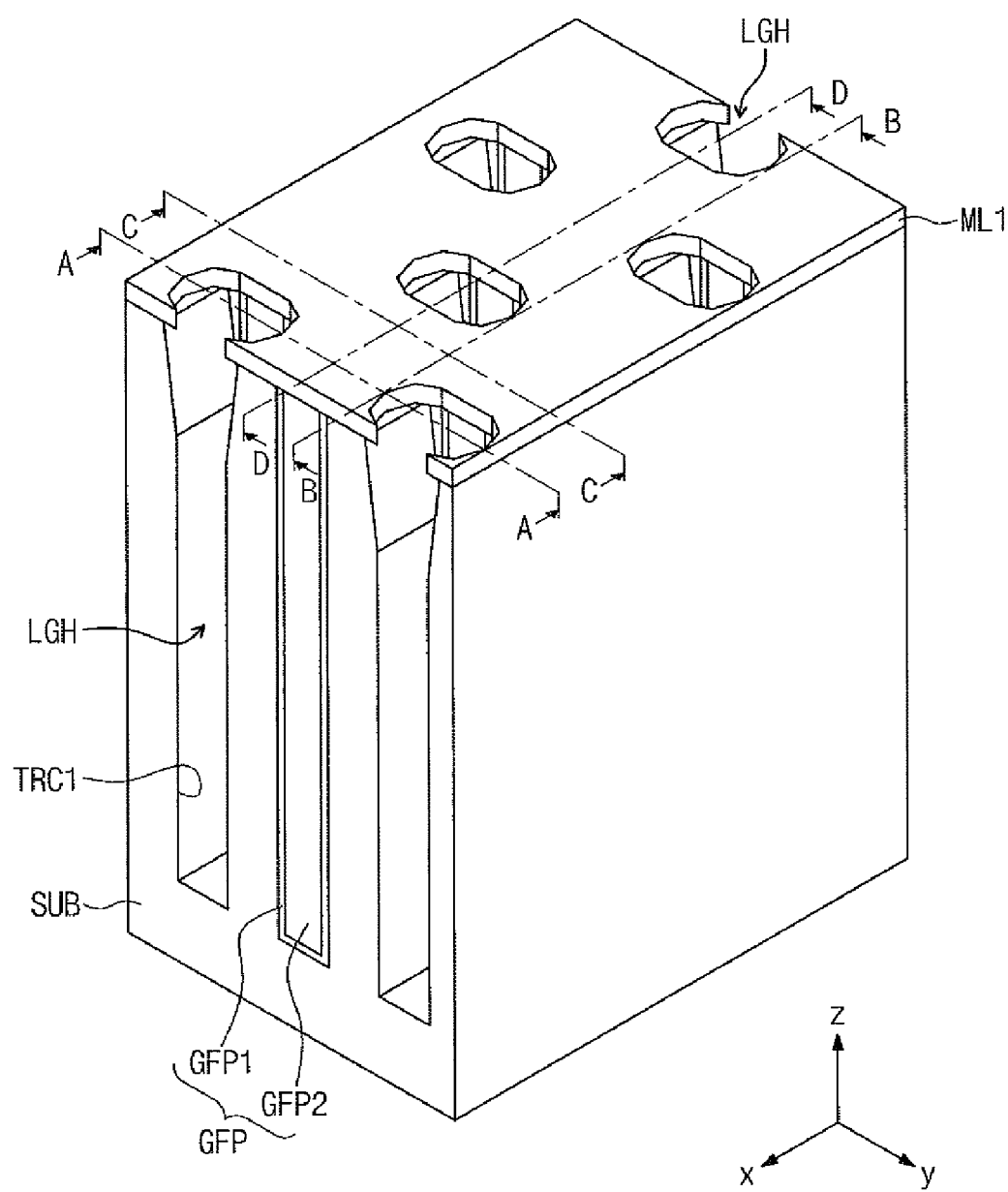
Figure 50A:
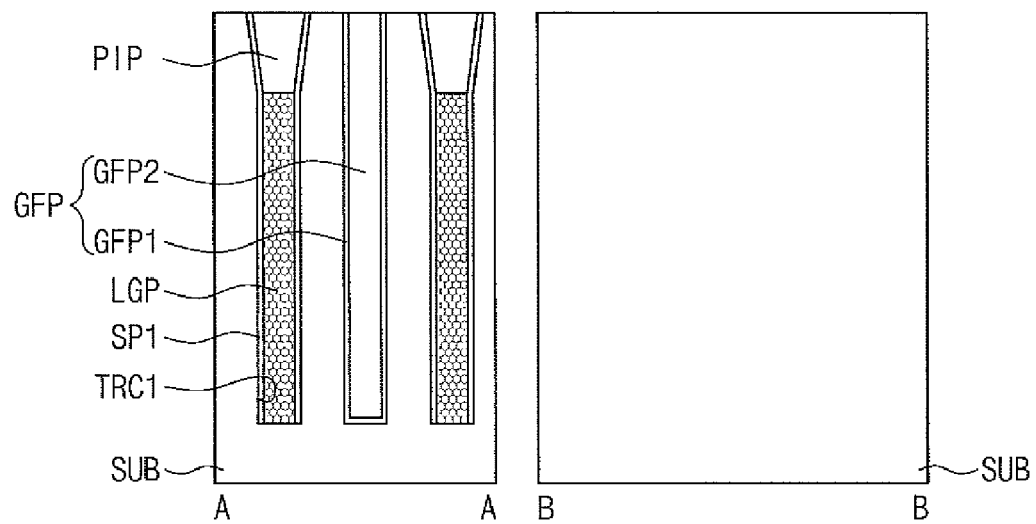
Figure 50A:
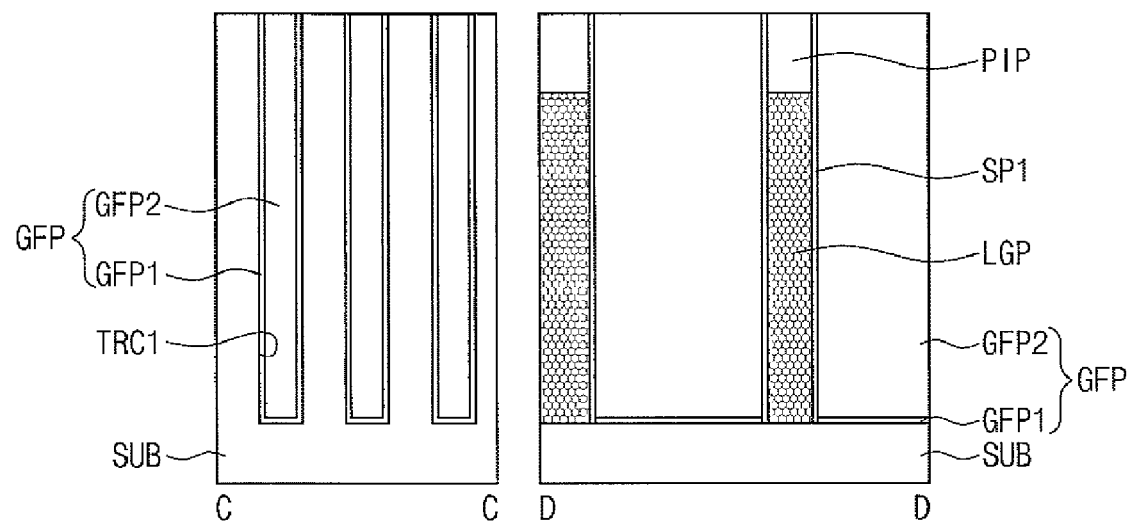
Figure 50B:
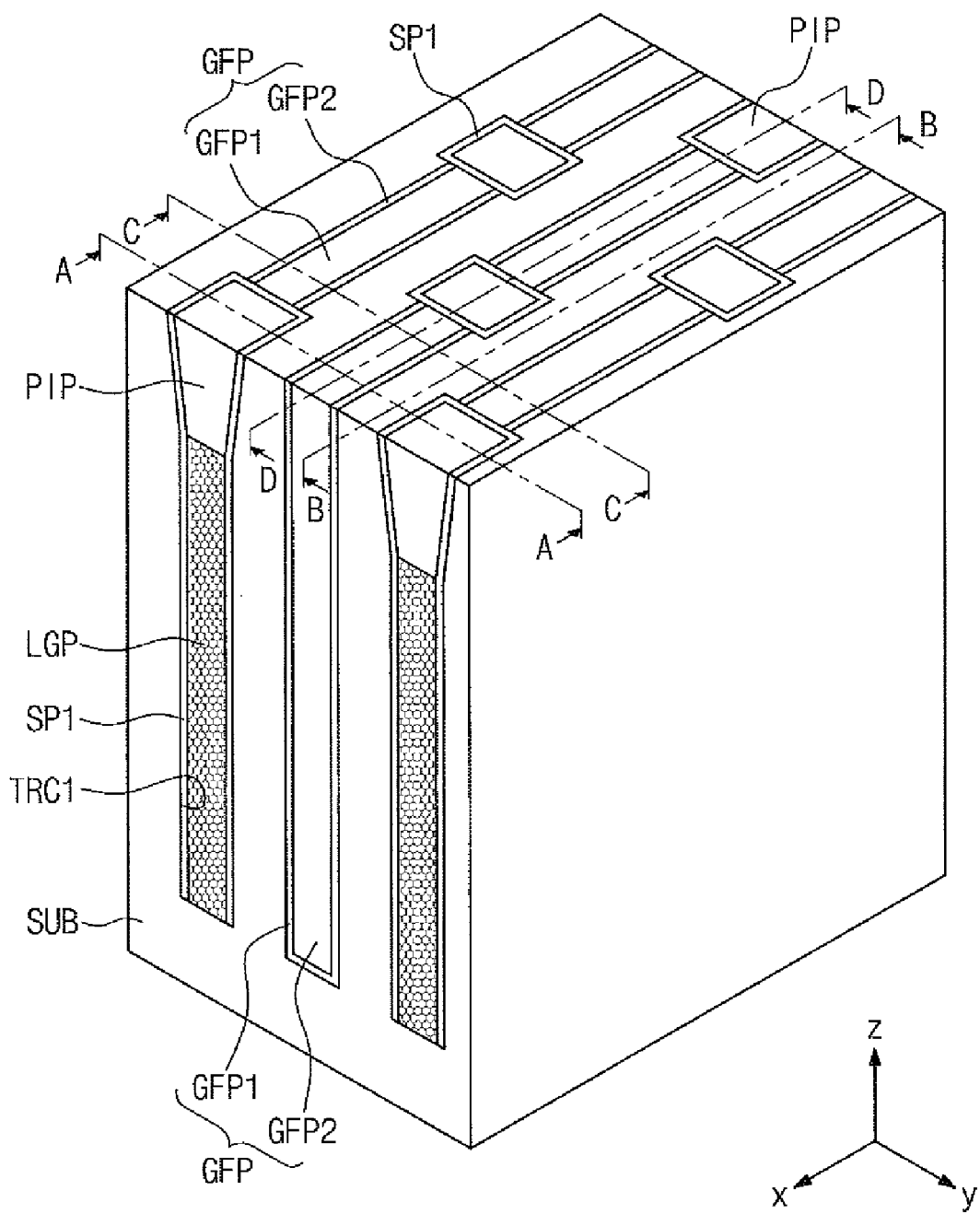

Subsequently, in operation S52, lower gate patterns LGP arranged 2-dimensionally are formed on the substrate SUB, as illustrated in FIGS. 50A and 50B. The operation S52 may include forming lower gate holes LGH arranged 2-dimensionally on the substrate SUB as illustrated in FIGS. 49A and 49B, and then forming lower gate patterns LGP and plug insulation patterns PIP filling the lower gate holes LGH as illustrated in FIGS. 50A and 50B.

In an embodiment, the lower gate holes LGH may be formed by forming a predetermined first mask layer ML1 having openings defining the positions of the lower gate holes LGH, and then patterning the gap-fill patterns GFP using the first mask layer ML1 as an etch mask. The positions of the lower gate holes LGH and the openings projected onto a plane parallel to the top surface of the substrate SUB may be substantially identical to those of the plug insulation patterns PIP in the first embodiment described with reference to FIGS. 16A and 16B. The first mask layer ML1 may be at least one of a photoresist layer, a silicon oxide layer, and a silicon nitride layer formed through photolithography.

Forming the lower gate pattern LGP may include forming first spacers SP1 on the inner sidewalls of the lower gate holes LGH, and then forming a lower gate layer filling the lower gate holes LGH with the first spacers SP1 formed. Subsequently, the top surface of the lower gate layer is recessed down to the surface of the substrate SUB by blanket-etching the lower gate layer. Accordingly, the lower gate layer is divided into the lower gate patterns LGP locally disposed in the respective lower gate holes LGH. According to this embodiment, since the first spacer SP1 covers the inner sidewall of the lower gate hole LGH, the side surfaces of the lower gate patterns LGP are surrounded by first spacer SP1. That is, the first spacer SP1 may be an open cylinder shape, disposed between the sidewalls of the first trenches TRC1 and the sidewall of the gap-fill pattern GFP.

Forming the plug insulation patterns PIP may include recessing the top surfaces of the lower gate patterns LGP, and forming a plug insulation layer filling the recessed region in operation S53. Thereafter, the top surface of the substrate SUB is exposed by blanket-etching the plug insulation layer, thereby completing the plug insulation patterns PIP. According to an embodiment, the plug insulation patterns PIP may comprise a silicon oxide layer.

Figure 51A:
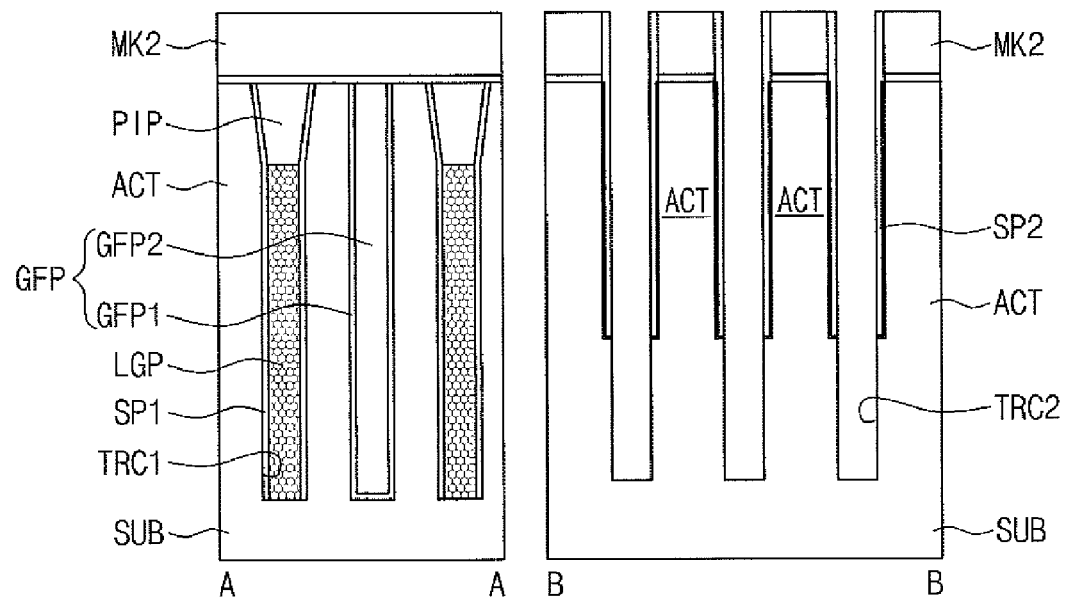
Figure 51A:
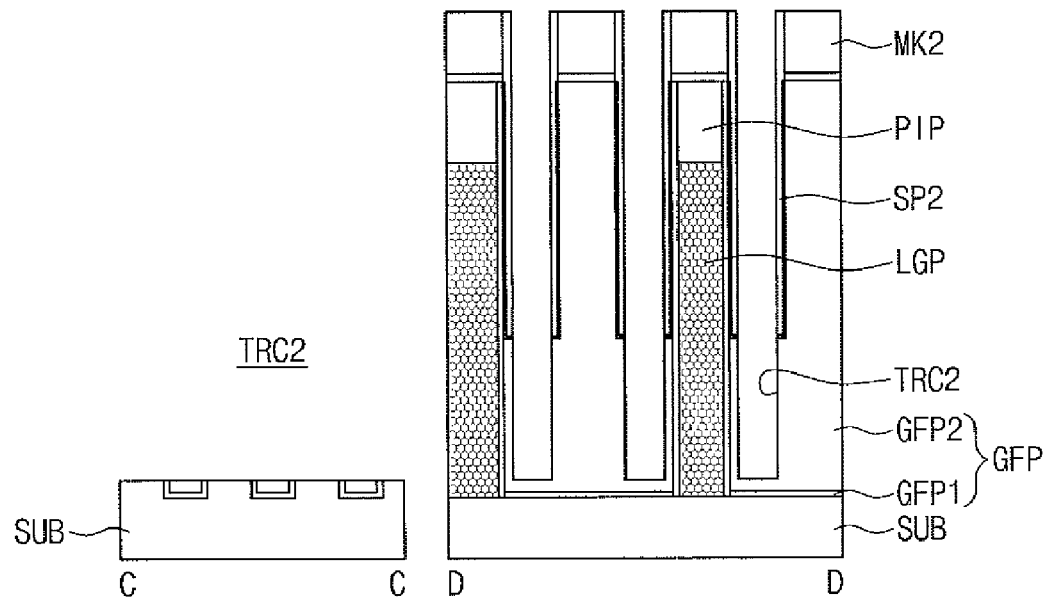
Figure 51B:
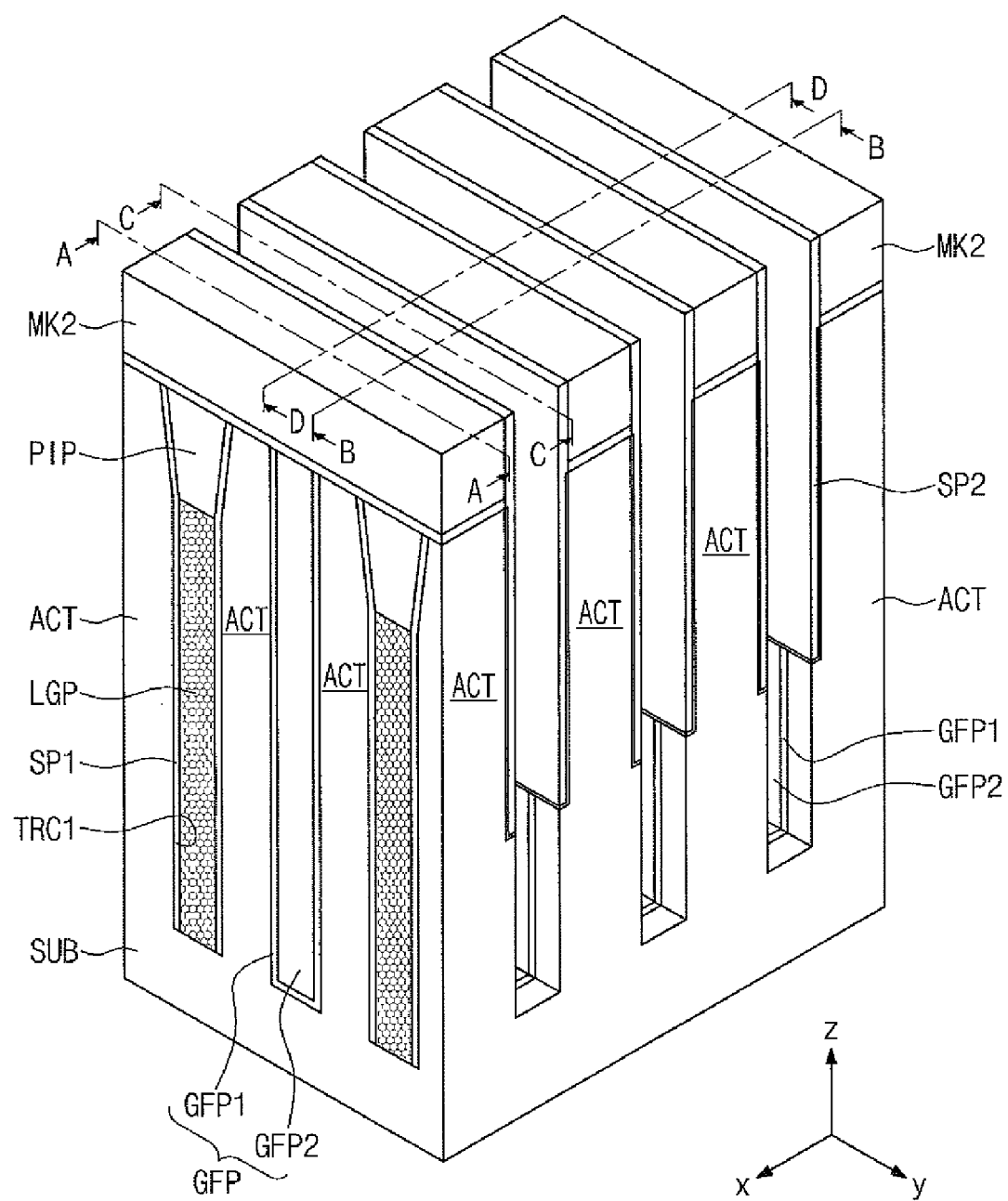

Subsequently, as illustrated in FIGS. 51A and 51B, second mask patterns MK2 having a major axis crossing the first trenches TRC1 are formed, and thereafter, in operation S54, second trenches TRC2 defining active patterns ACT are formed using the second mask patterns MK2 as an etch mask. This operation S54 may further include forming preliminary trenches TRC2$p$ and second spacers SP2 like the foregoing embodiments. In an embodiment, a series of operations of forming the second trenches TRC2 may be performed based on or by modifying the fabrication method of the first embodiment described with reference to FIGS. 8A to 10A.

Figure 52A:
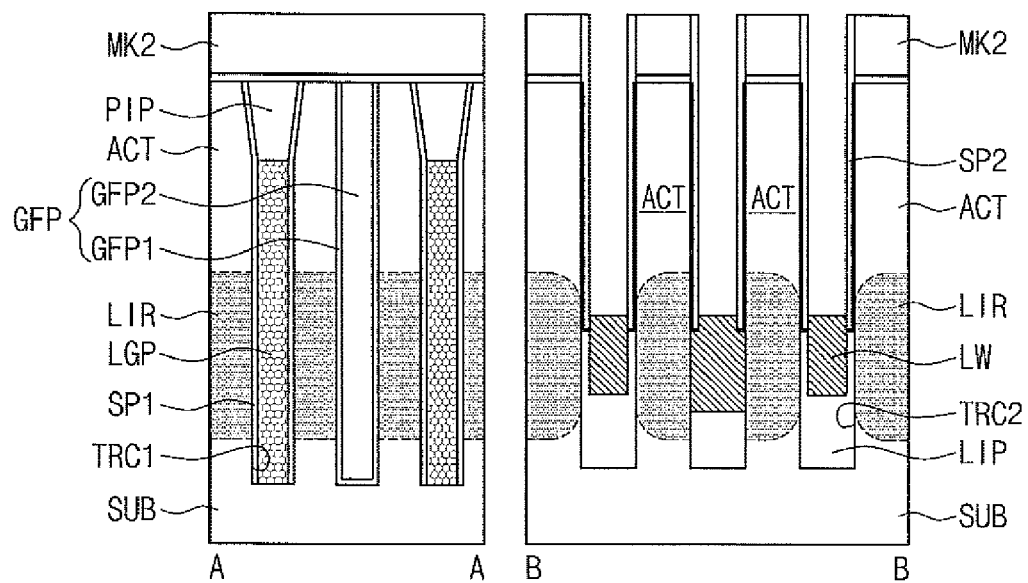
Figure 52A:
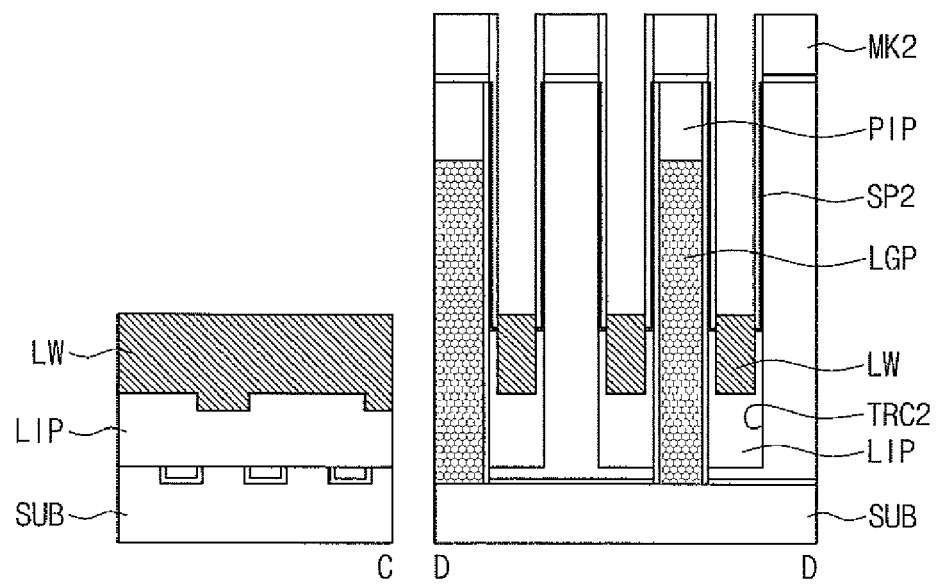
Figure 52B:
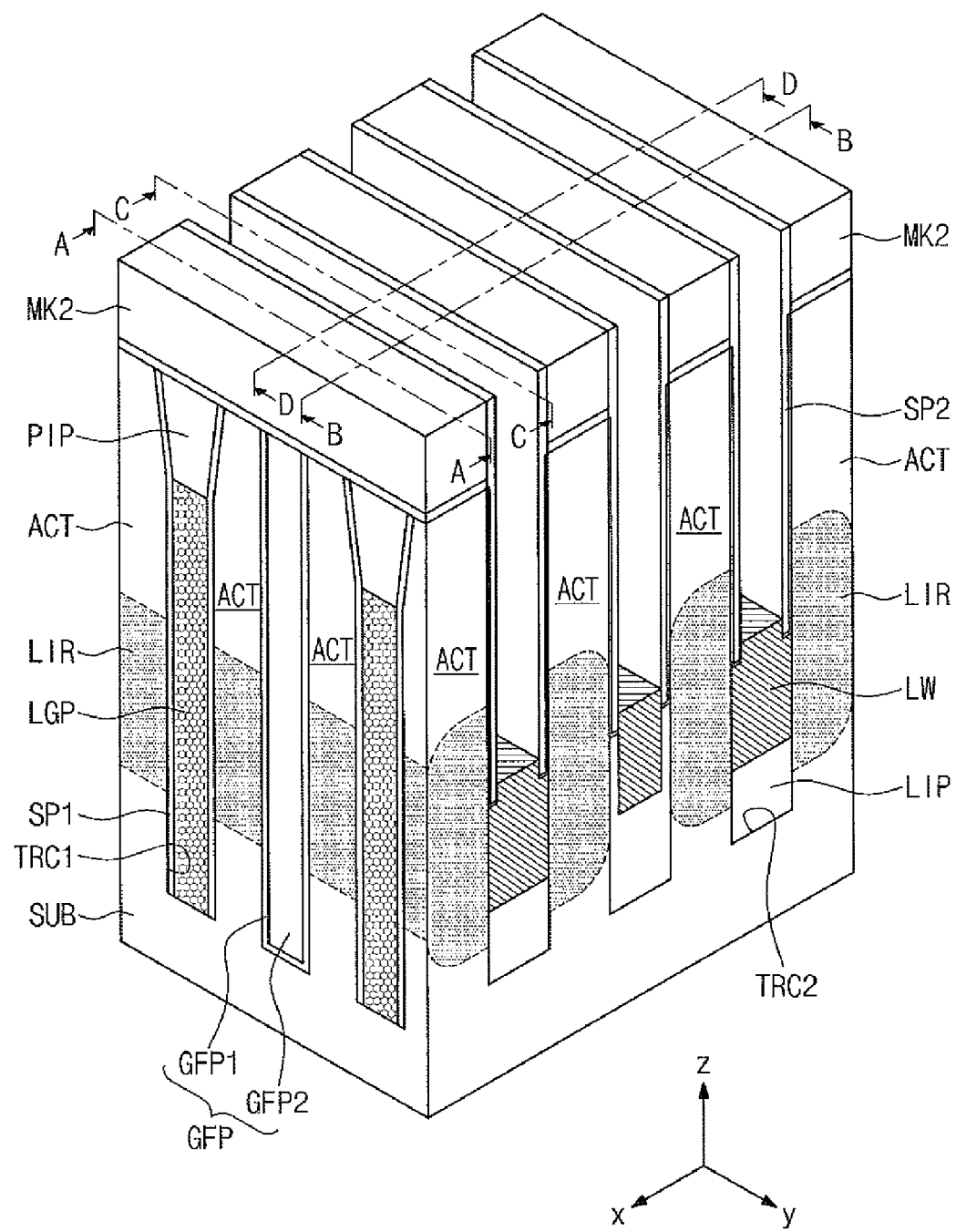

Afterwards, in operation S55, lower wirings LW are formed in the second trench TRC2. The operation S55 may be performed substantially in the same manner as the fabrication method of the first embodiment described with reference to FIGS. 11A to 15A. Accordingly, as illustrated in FIGS. 52A and 52B, lower insulation patterns LIP to be used as a template for forming the lower wiring LW may be formed under the lower wiring LW. In addition, lower impurity regions LIR connected by the lower wirings LW may be formed in the lower regions of the active patterns ACT.

Figure 53A:
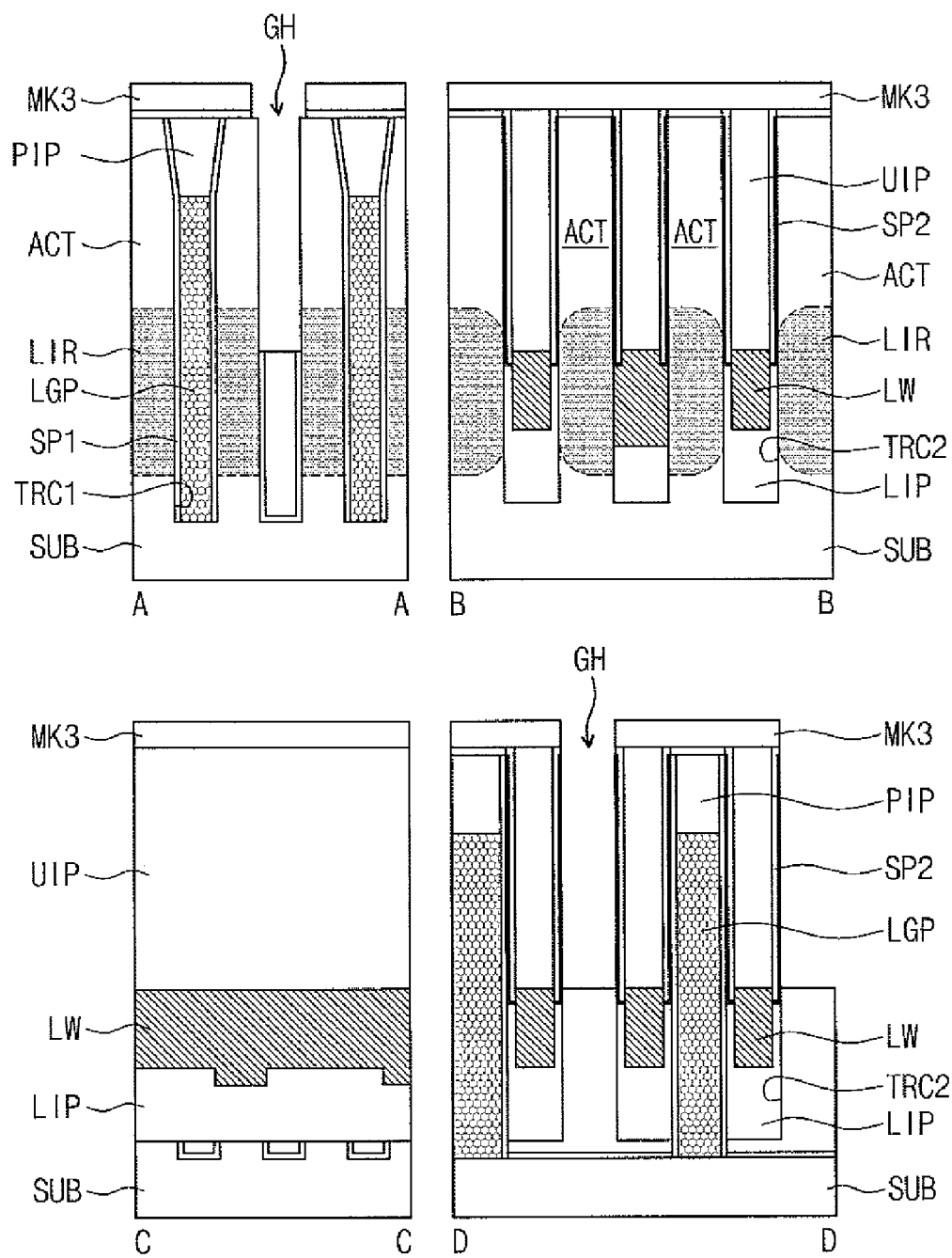
Figure 53B:
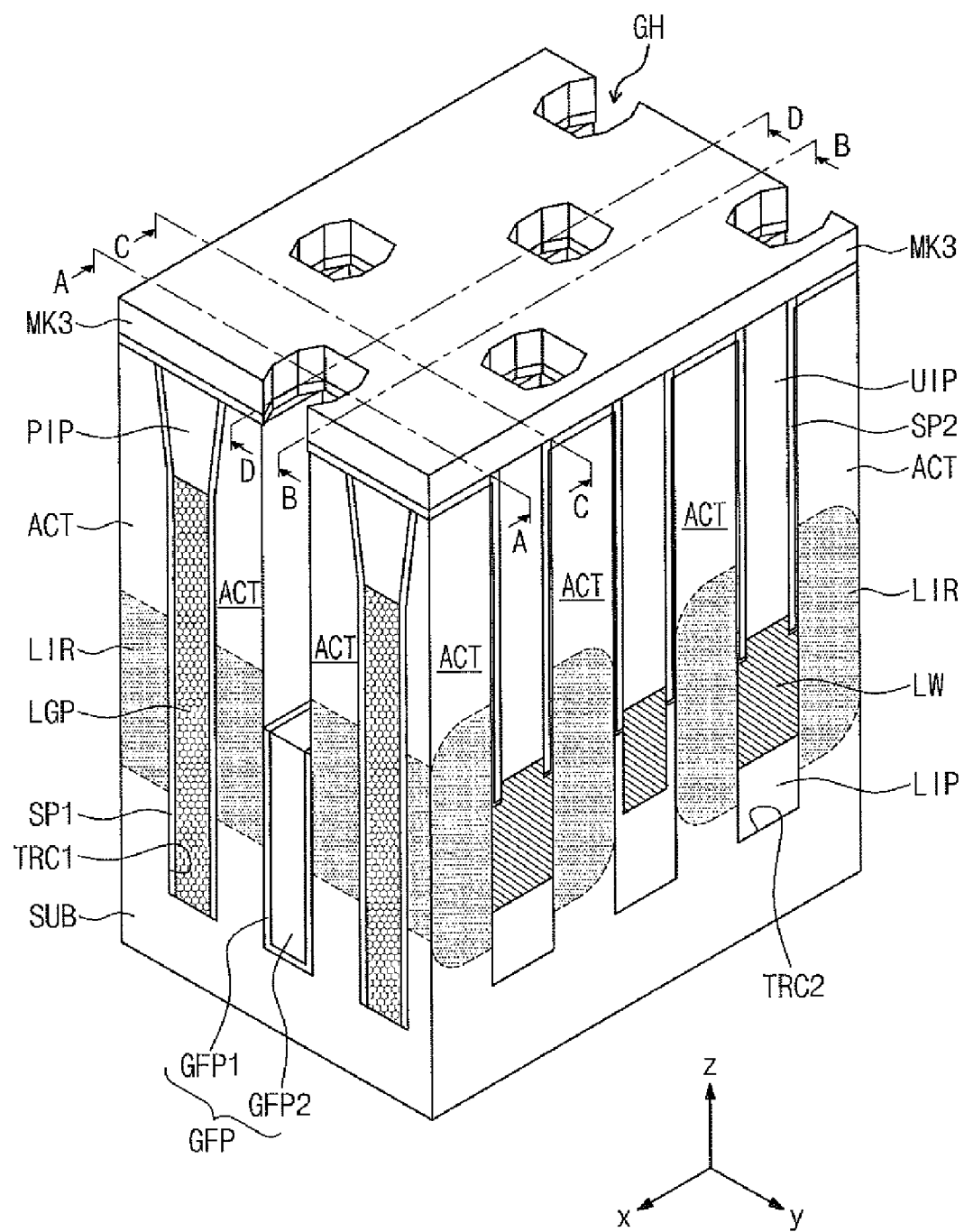
Figure 54A:
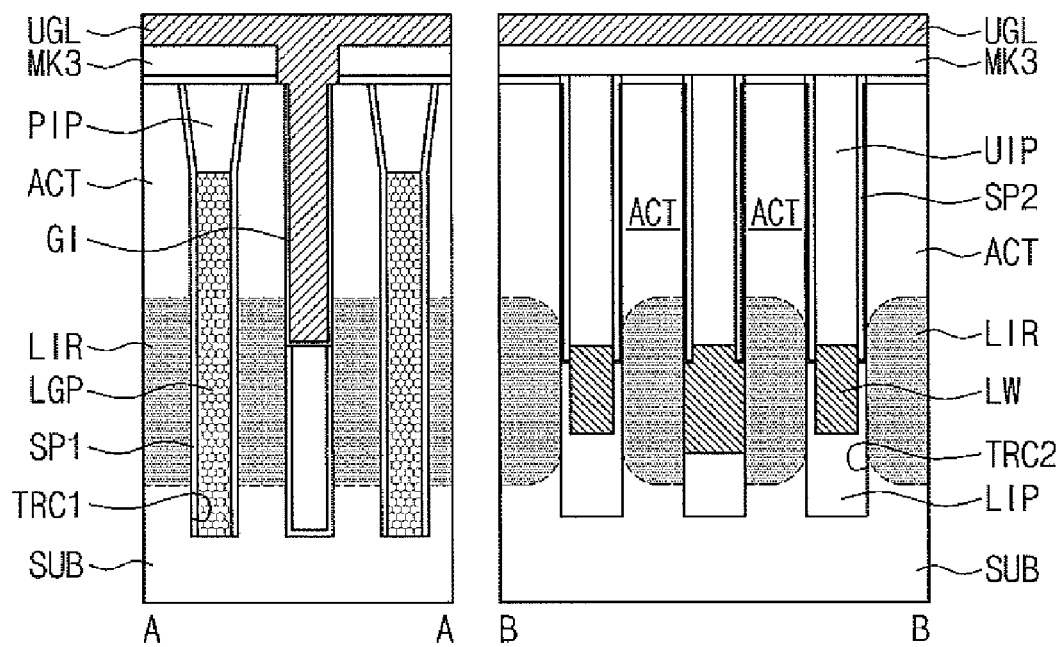
Figure 54A:
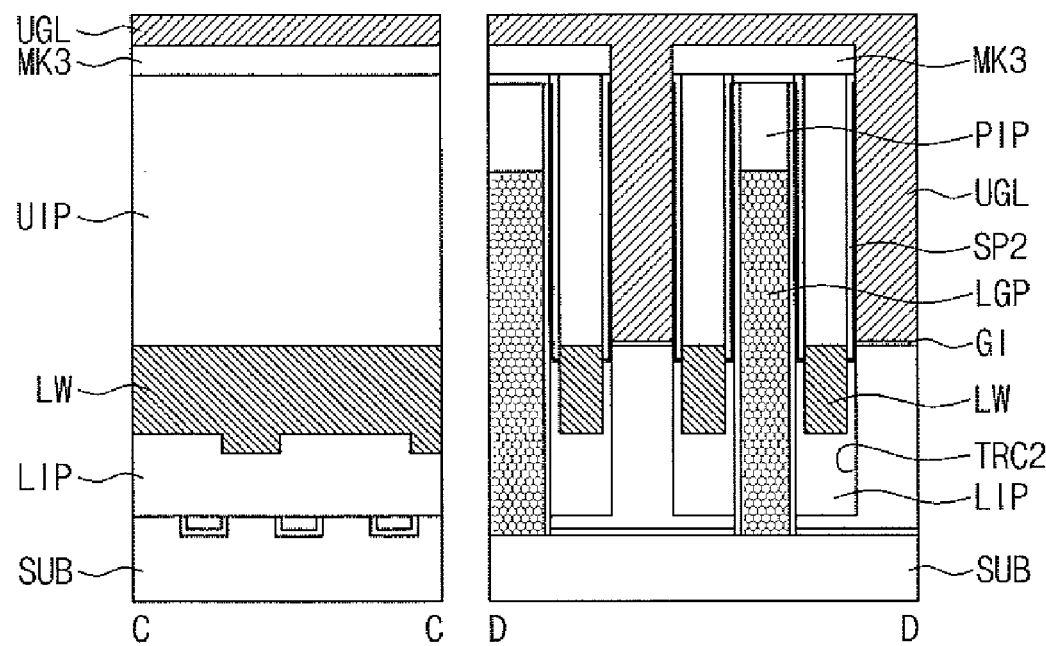
Figure 54B:
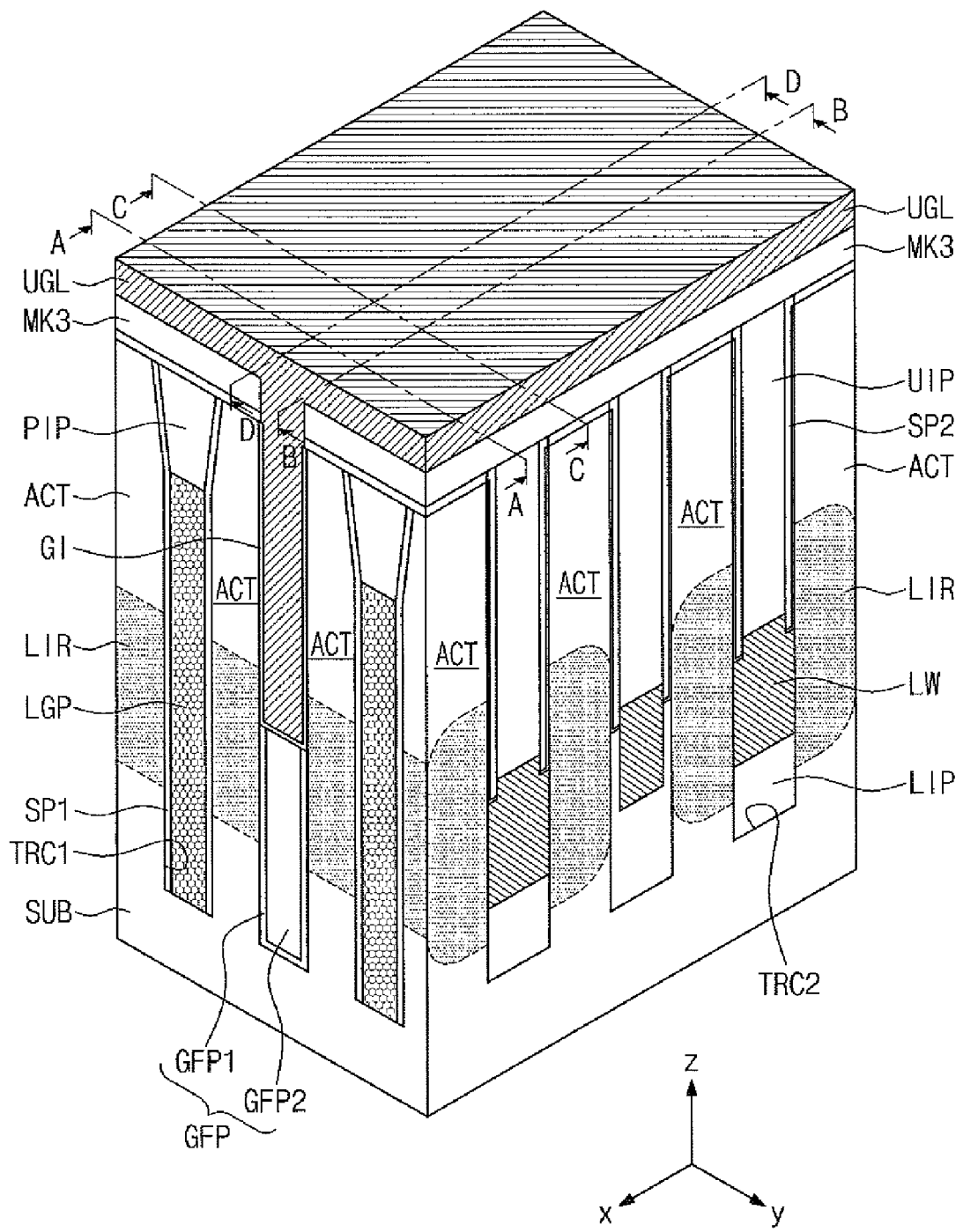

Next, in operation S56, an upper gate layer UGL is formed. The operation S56 may include forming gate holes GH by recessing some areas of the gap-fill patterns GFP, and filling the gate holes GH with the upper gate layer UGL. More specifically, the gate holes GH are formed by forming a third mask pattern MK3 having openings on the substrate SUB, and recessing the gap-fill patterns GFP using the third mask pattern MK3 as an etch mask. Accordingly, as illustrated in FIGS. 53A and 53B, the gate holes GH are formed to have bottom surfaces lower than the undersurface of the plug insulation pattern PIP. Thereafter, as illustrated in FIGS. 54A and 54B, a gate insulator GI is formed to cover inner sidewalls of the gate holes GH, and the gate holes GH with the gate insulator GI formed is filled with the upper gate layer UGL.

The gate holes GH may be formed substantially at the same position as the positions in the embodiments described with reference to FIGS. 23 and 32. Also, the gate holes GH and the upper gate layer UGL may be formed based on or by modifying the fabrication method described with reference to FIGS. 28A to 29A. The gate insulator GI may be an insulation thin film (e.g., silicon oxide layer) formed through thermal oxidation or deposition process. When the gate insulator GI is formed through deposition process, the gate insulator GI may be shaped like an open cylinder and formed to surround the side surface of the upper gate layer UGL (inserted into the gate hole GH), like the first spacer SP1.

Figure 55A:
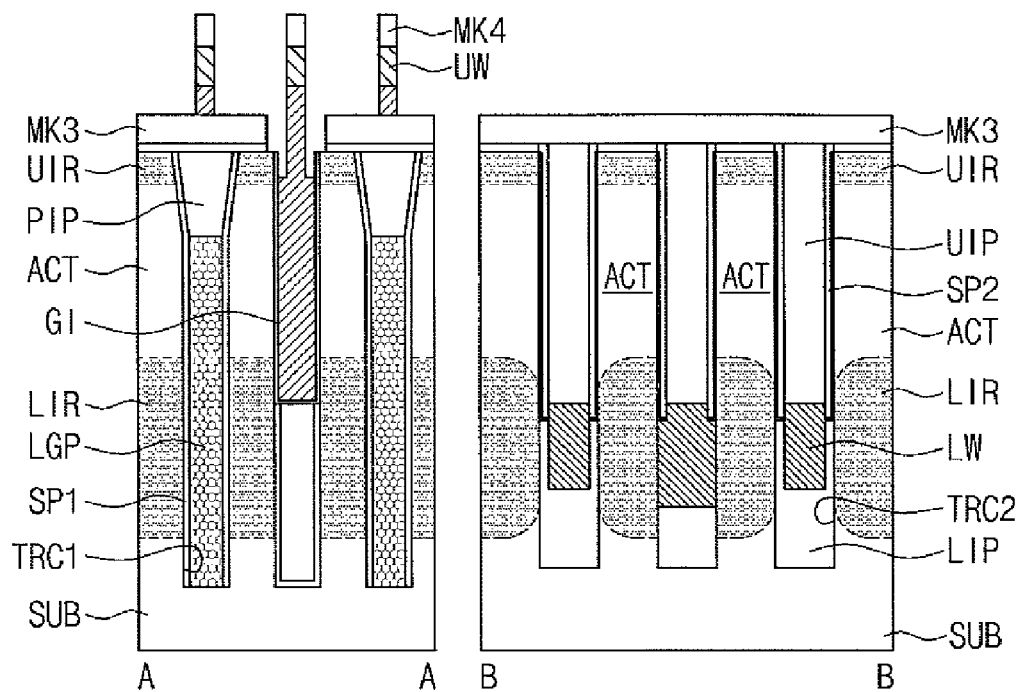
Figure 55A:
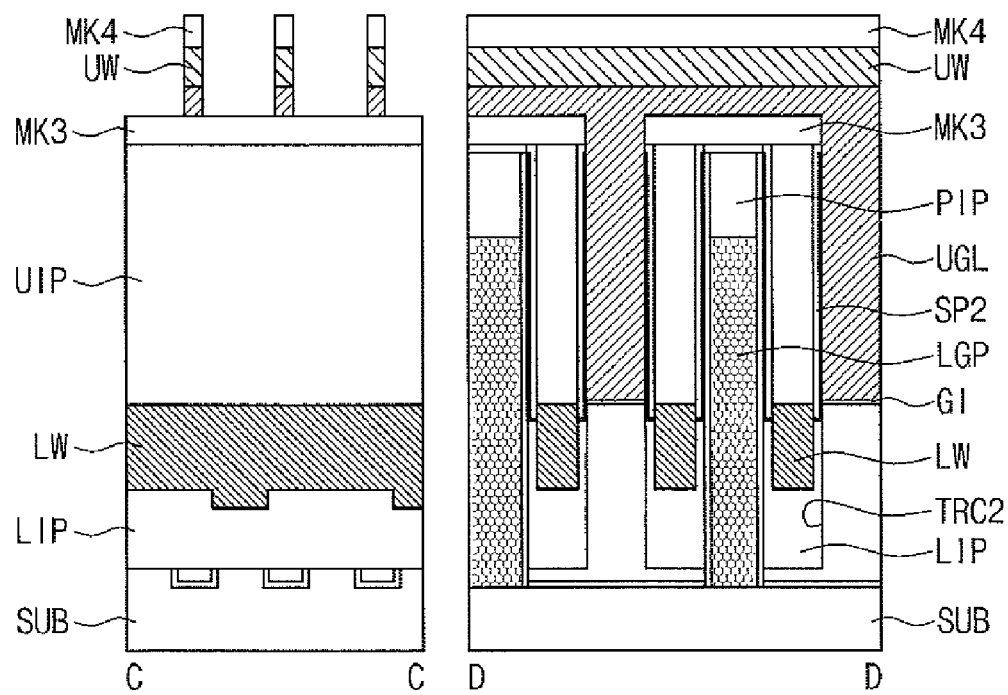
Figure 55B:
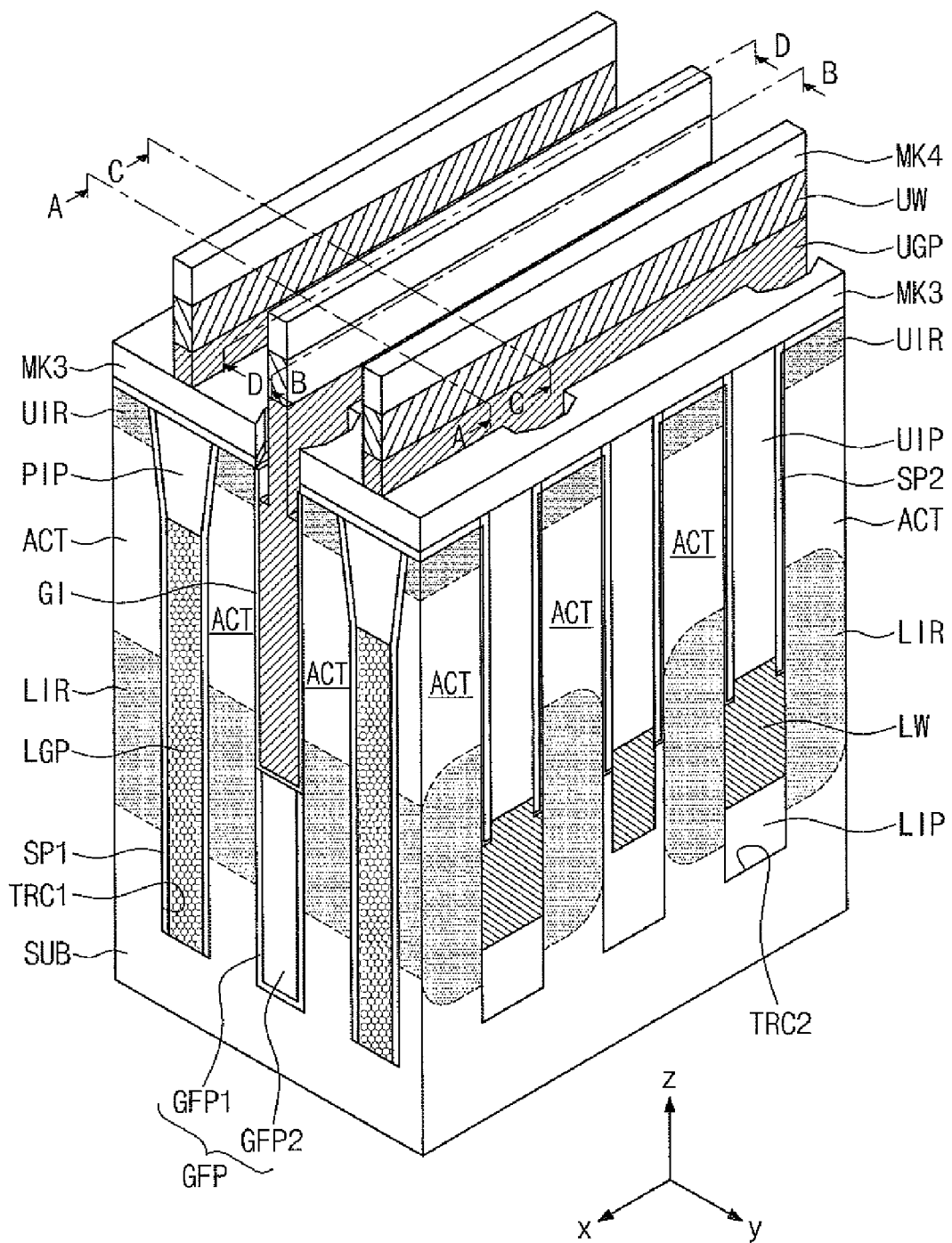
Figure 56A:
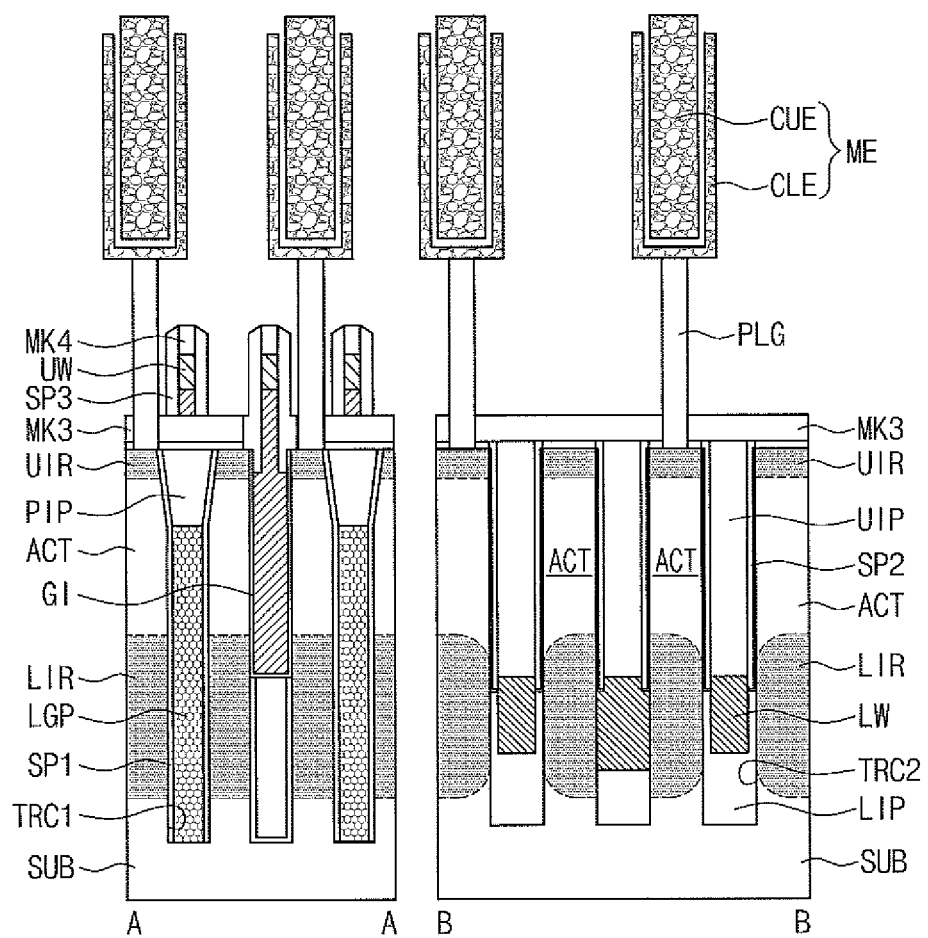
Figure 56A:
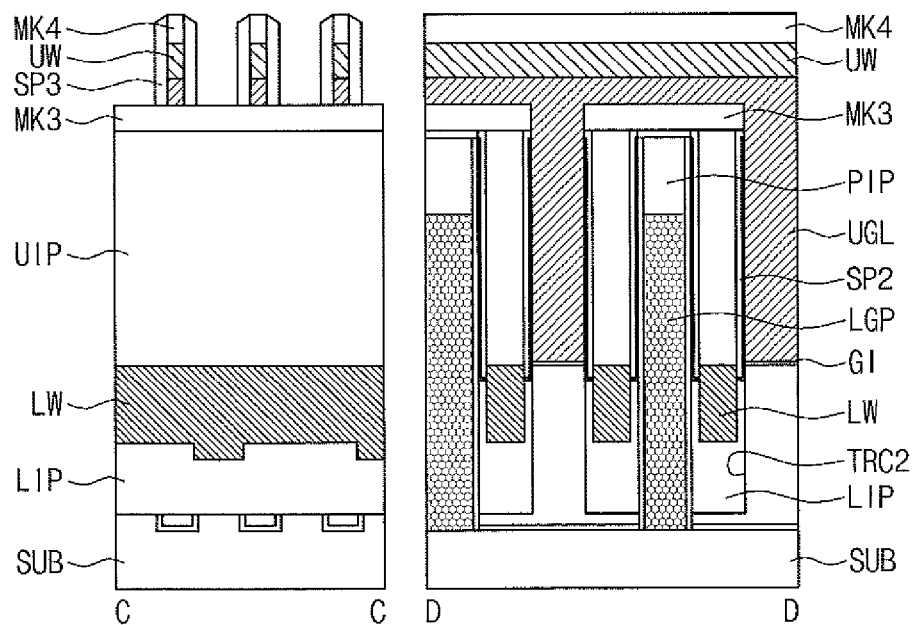
Figure 56B:
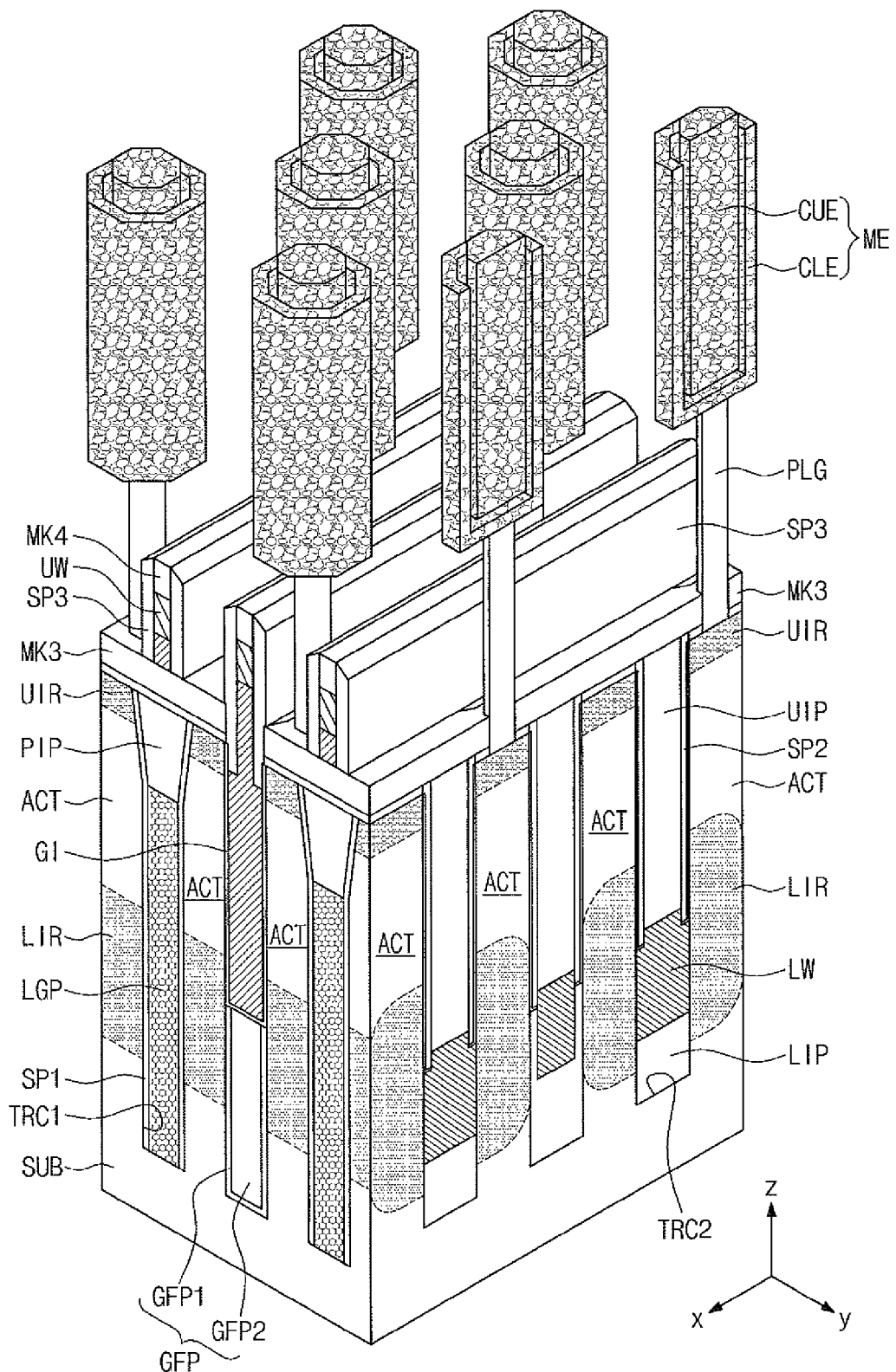
Figure 57:
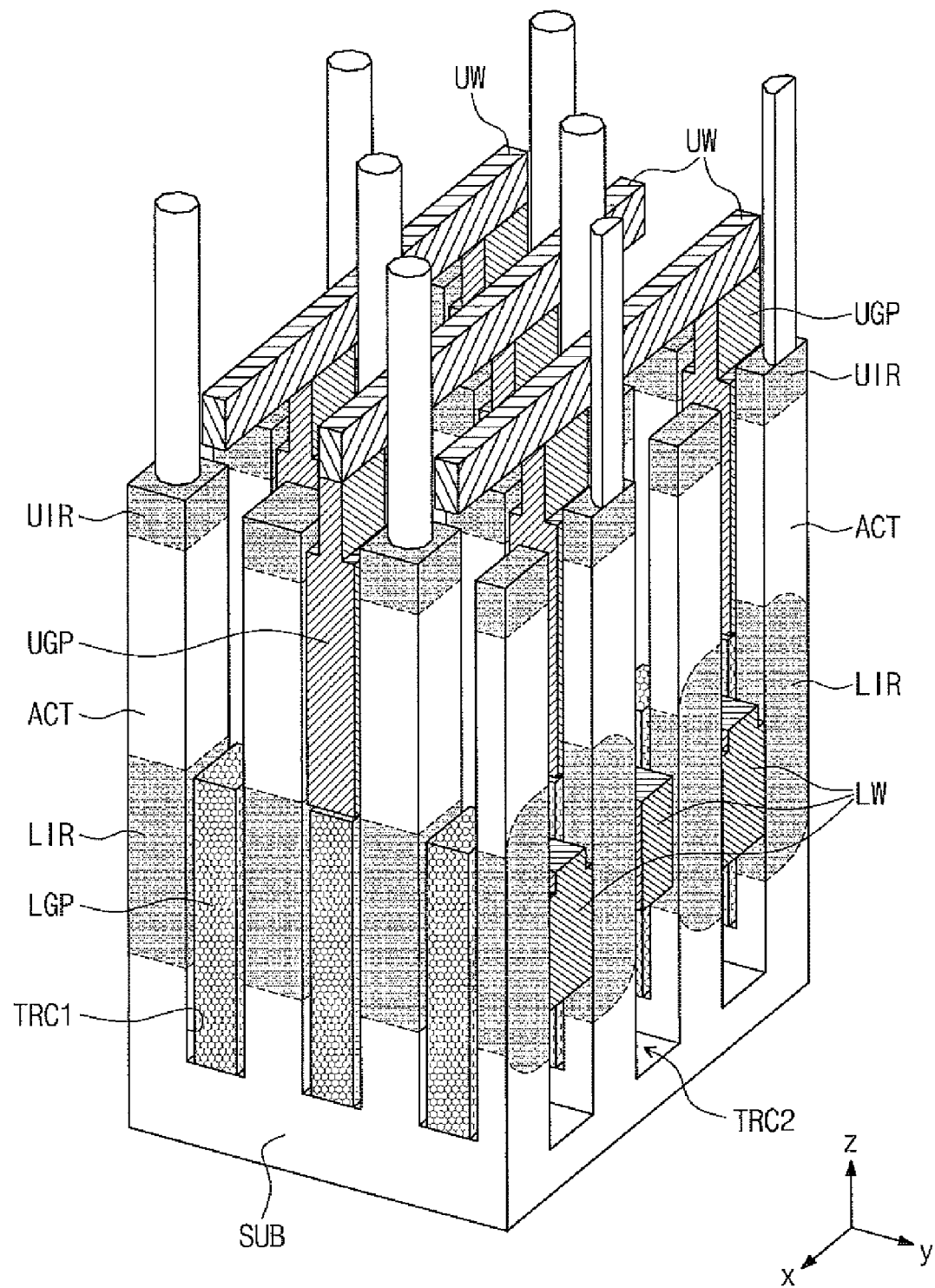
FIGS. 57 to 67 are perspective views illustrating semiconductor devices according to embodiments of the inventive concept.
Figure 58:
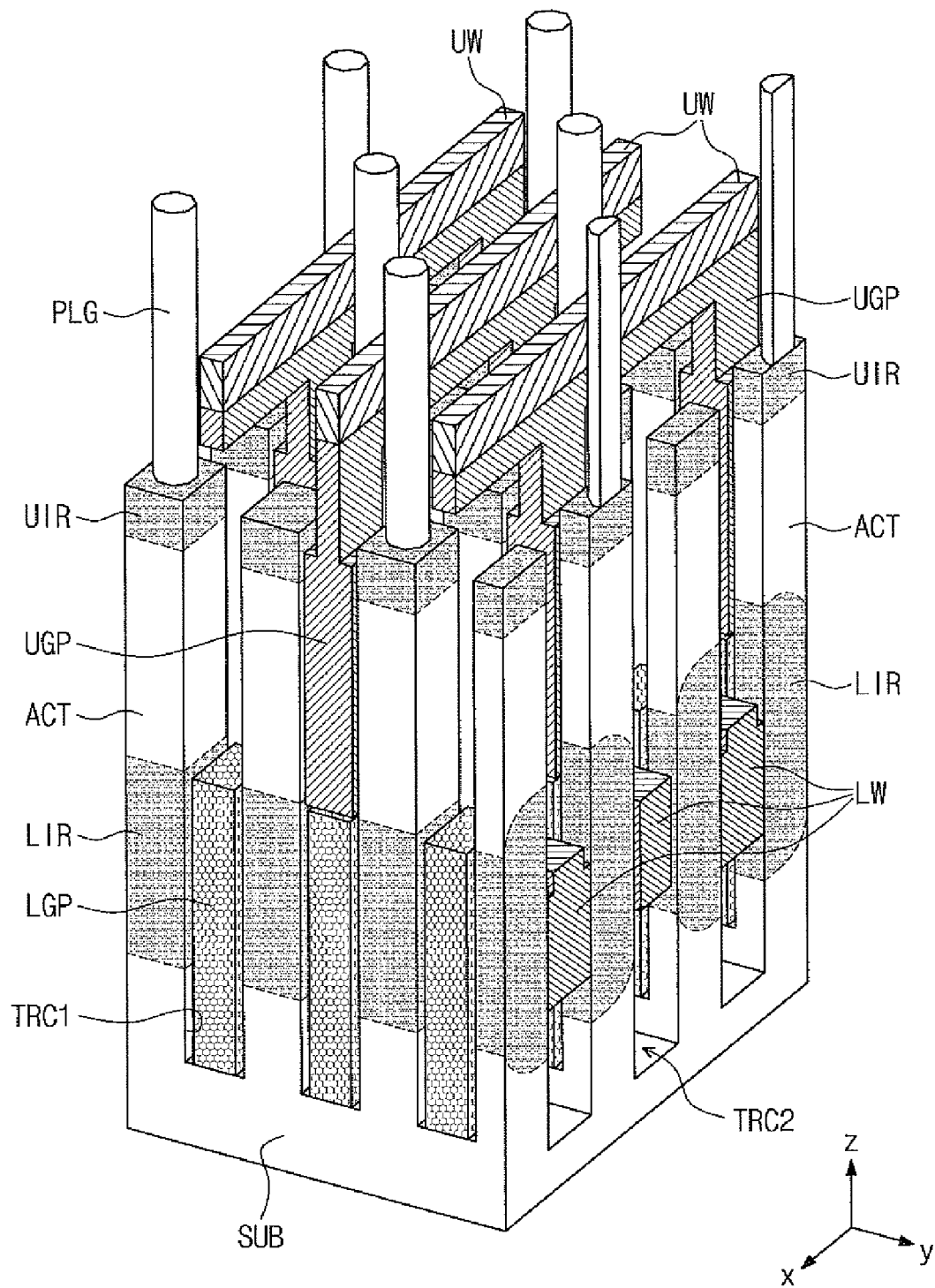

Subsequently, in operation S57, upper wirings UW and upper impurity regions UIR are formed as illustrated in FIGS. 55A and 55B, and, in operation S58, plugs PLG connected to the upper impurity regions UIR and memory elements ME connected to the plugs PLG are formed, as illustrated in FIGS. 56A and 56B. These operations S57 and S58 may be performed using the fabrication method described with reference to FIGS. 17A to 19A.

FIGS. 57 to 72 are perspective views exemplarily illustrating semiconductor devices fabricated through various embodiments according to the technical spirit of the inventive concept. For example, insulation materials which are not used as a pathway for transmission of electrical signals are omitted in FIGS. 57 to 64. For description of a connection structure between active pattern and lower wiring, elements other than active patterns and lower wirings were omitted in FIGS. 65 to 67.

Referring to FIGS. 57 to 66, active patterns ACT are arranged 2-dimensionally on a substrate SUB. The active patterns ACT may be a conductive material extended from the substrate SUB, and each of the active patterns ACT includes an upper impurity region UIR and a lower impurity region LIR which are vertically spaced apart from each other inside the active pattern ACT. According to embodiments of inventive concept, each of the active patterns ACT may have sidewalls defined by first trenches TRC1 parallel to the x-direction and second trenches TRC2 crossing the first trenches TRC1. That is, the active patterns ACT are disposed in regions between the first and second trenches TRC1 and TRC2.

Lowe gate patterns LGP and upper gate patterns UGP are disposed in regions which are included in the first trenches TRC1 but not included in the second trenches TRC2. The upper gate patterns UGP are vertically separated from the lower gate patterns LGP, over some of the lower gate patterns LGP.

The lower and upper gate patterns LGP and UGP are spaced apart from the sidewalls of the active patterns ACT. According to embodiments of the inventive concept, the lower gate patterns LGP are formed to face the sidewall of the lower impurity region LIR, thus forming a MOS capacitor therewith. The upper gate patterns UGP are disposed facing the sidewall of the active pattern ACT between the upper and lower impurity regions UIR and LIR, thus forming a MOS capacitor therewith. As for the electrical connection to the outside, the lower gate pattern LGP is ohmically connected to the substrate SUB through the bottom surface of the first trench TRC1, and the upper gate pattern UGP is electrically connected to one of upper wirings UW which cross the second trenches TRC2 over the upper gate pattern UGP.

Figure 59:
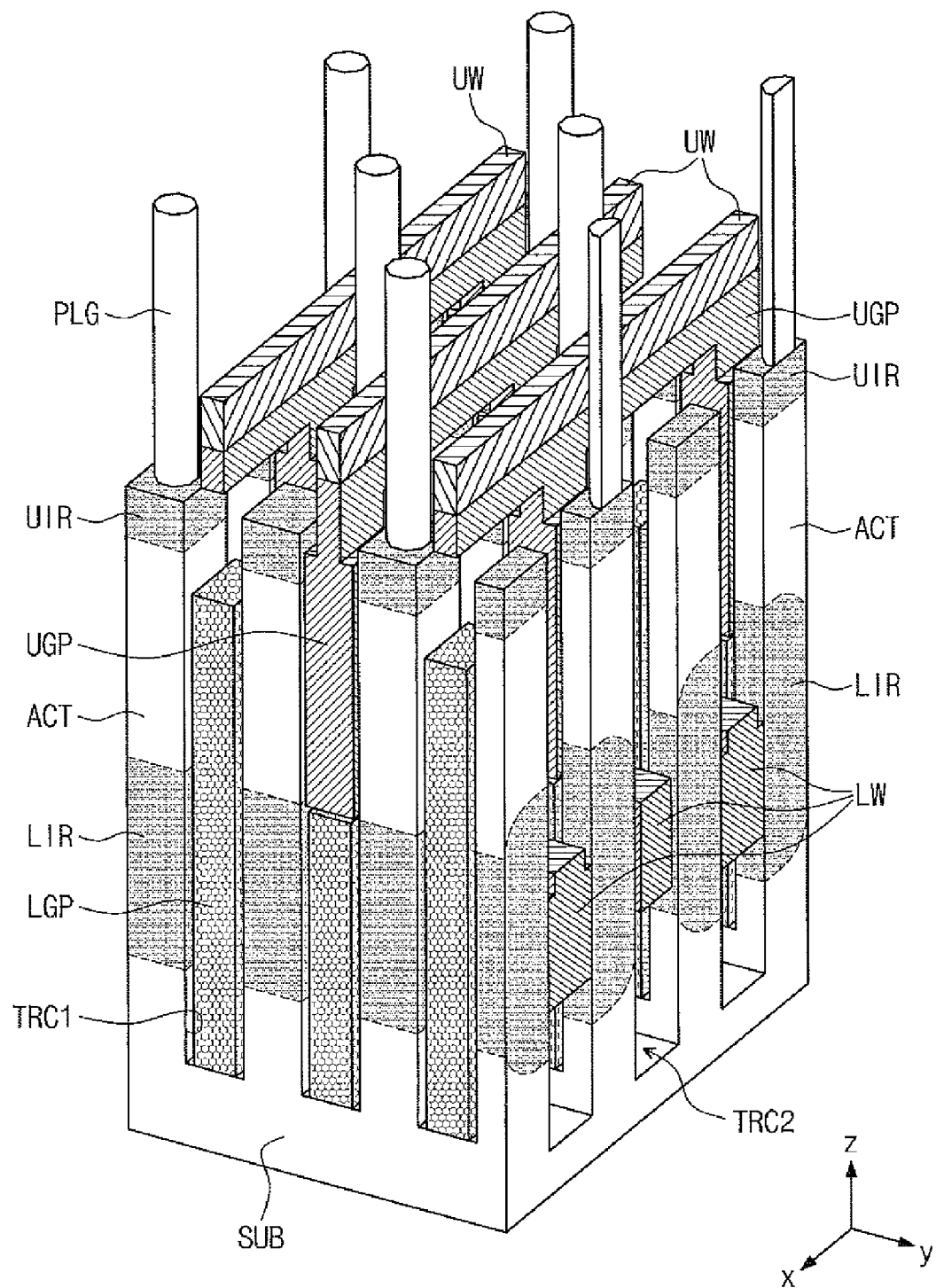
Figure 60:
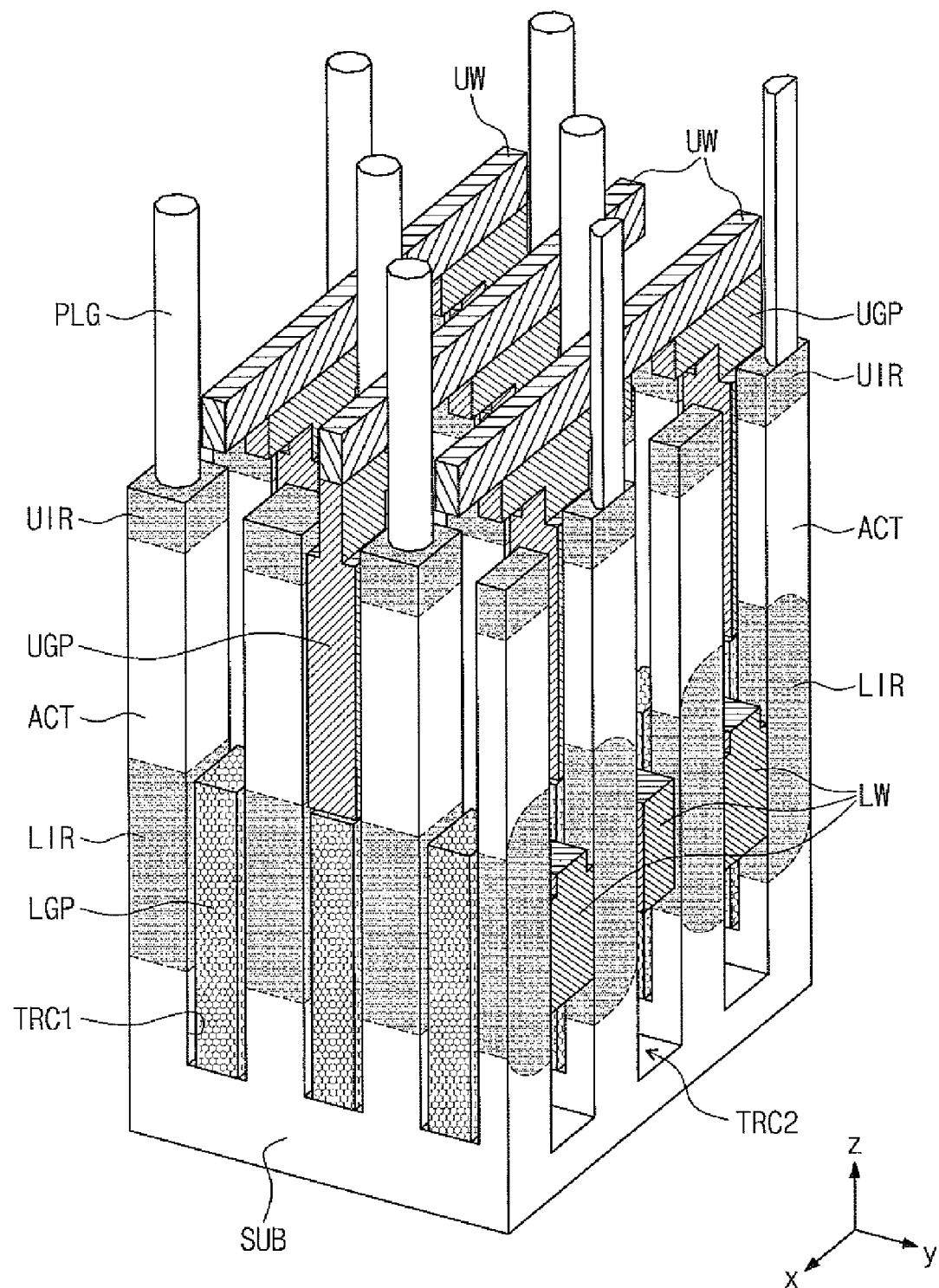
Figure 63:
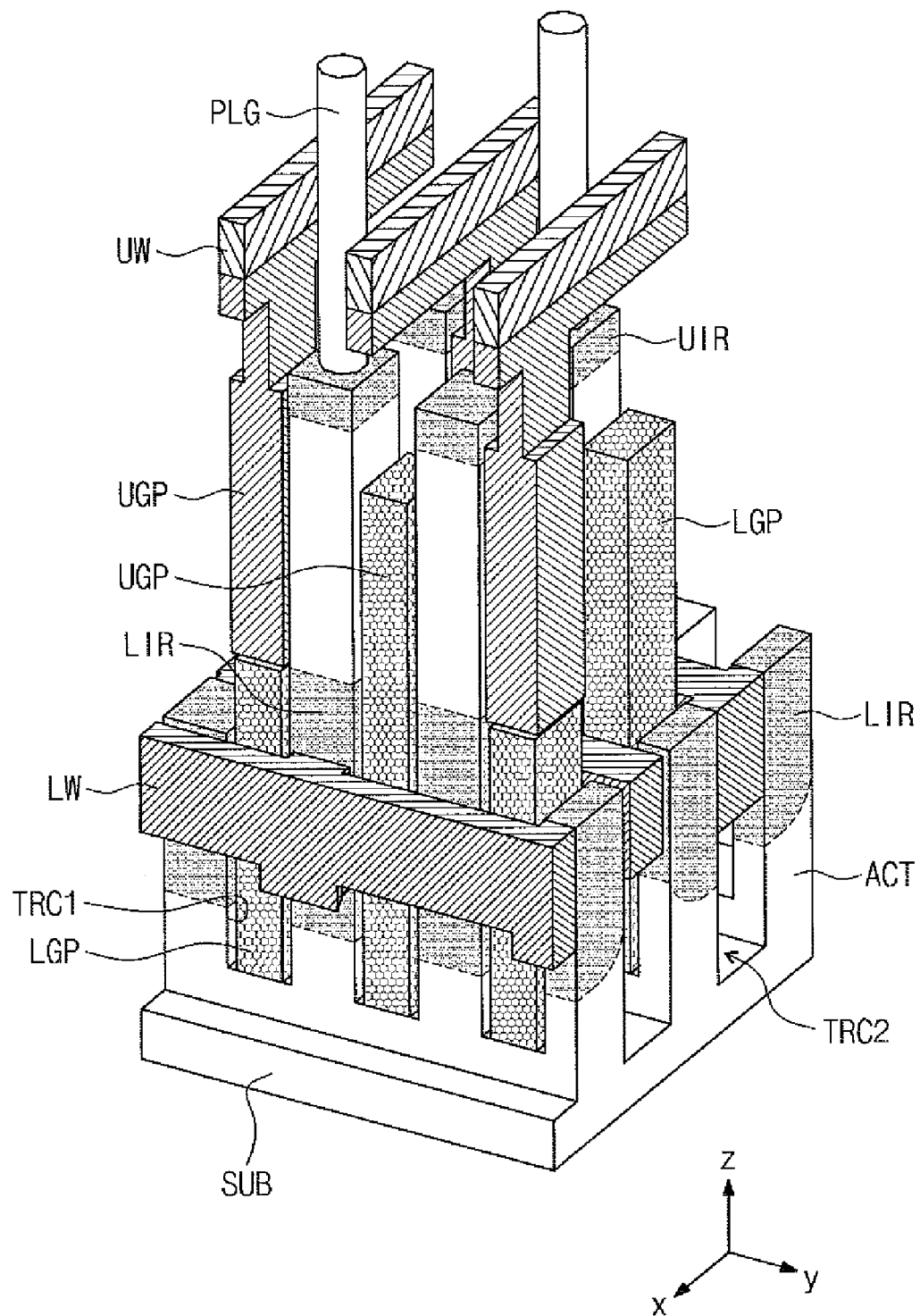

In horizontal configuration, the upper gate patterns UGP may be disposed in regions described with reference to FIGS. 16A and 16B. On the contrary, according to embodiments, the lower gate patterns LGP may be formed in all the regions which are included in the first trenches TRC1 but not included in the second trenches TRC2, as illustrated in FIGS. 57 to 60, 62, 63 and 65. Some of the lower gate patterns LGP differ in height from others of the lower gate patterns LGP. For example, as illustrated in FIGS. 59 and 63, some of the lower gate patterns LGP (hereinafter referred to as gate pattern) may be formed closer to the upper impurity region UIR than the others of the lower gate patterns LGP disposed under the upper gate patterns UGP. In this case, the first lower gate patterns are disposed facing the sidewall of the active pattern ACT between the upper and lower impurity regions UIR and LIR, thus forming a MOS capacitor therewith.

Figure 61:
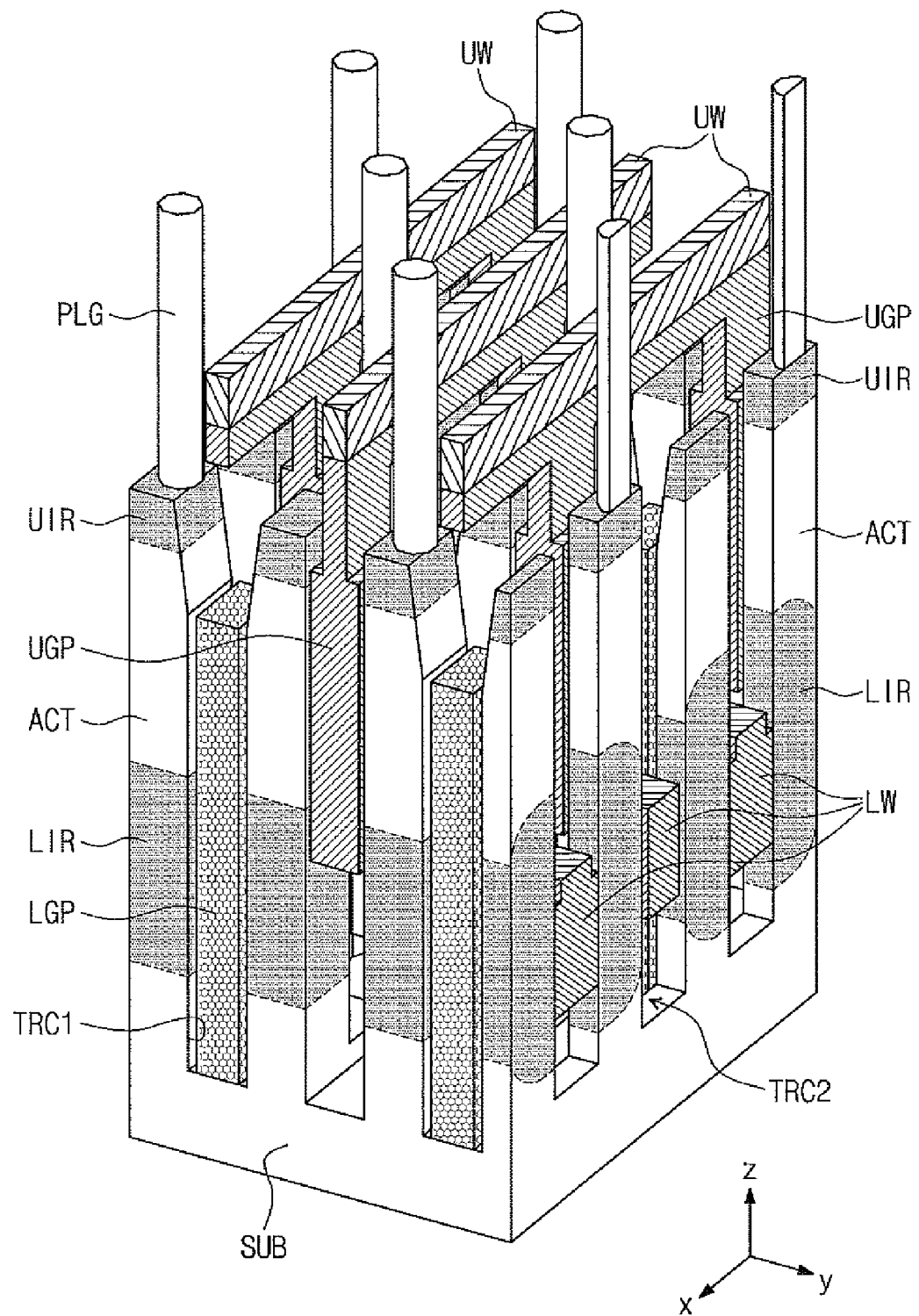
Figure 62:
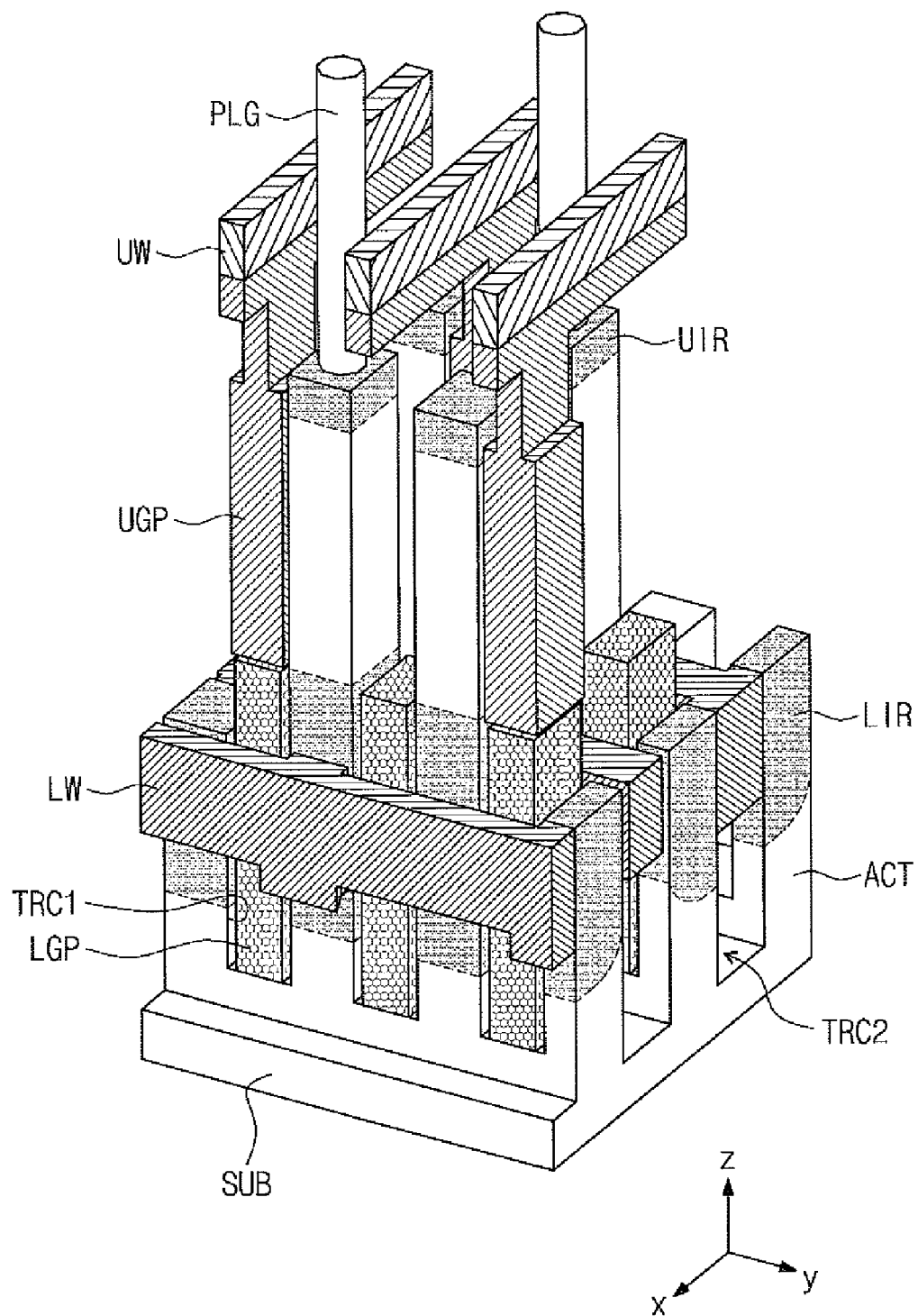
Figure 64:
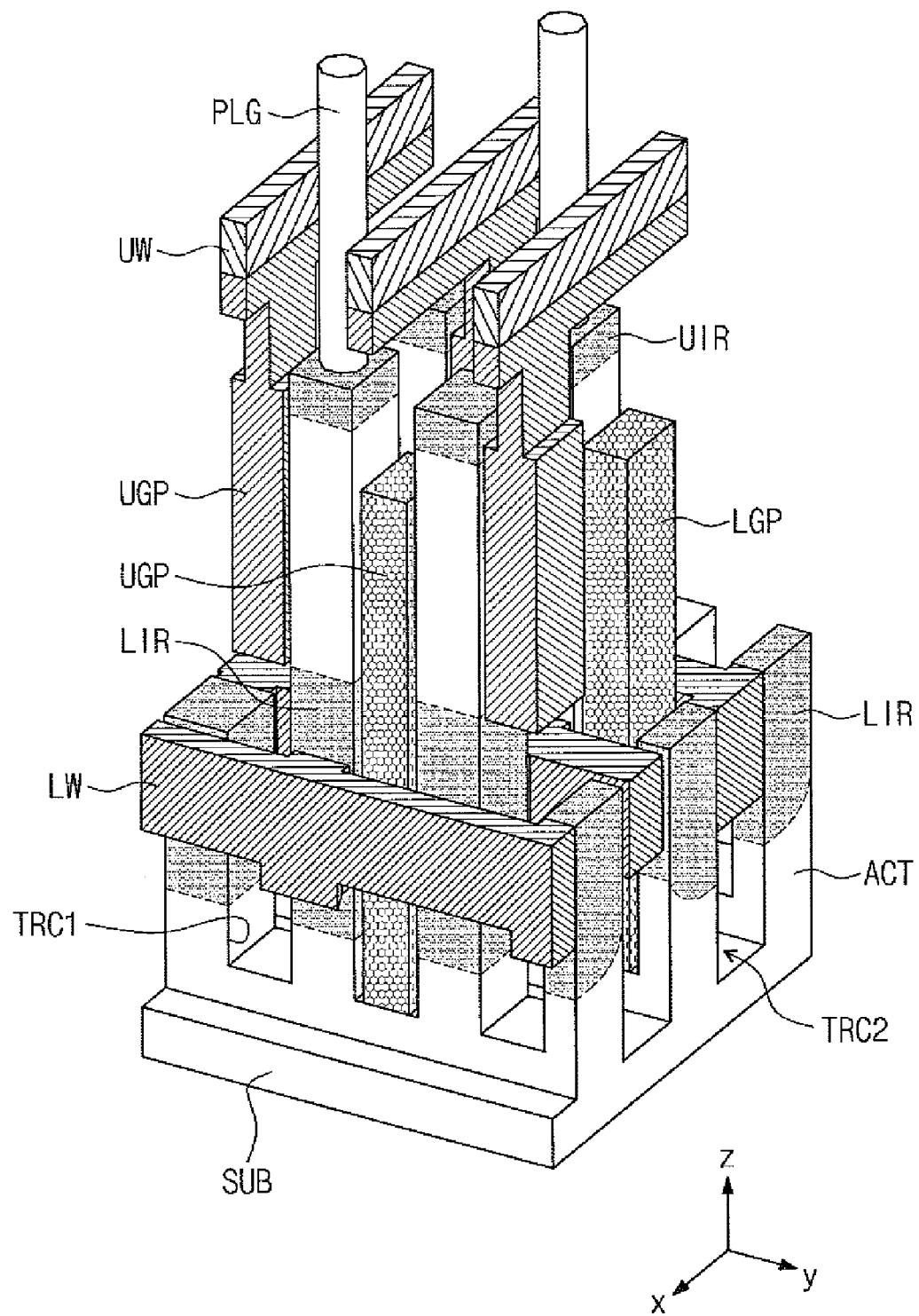
Figure 66:
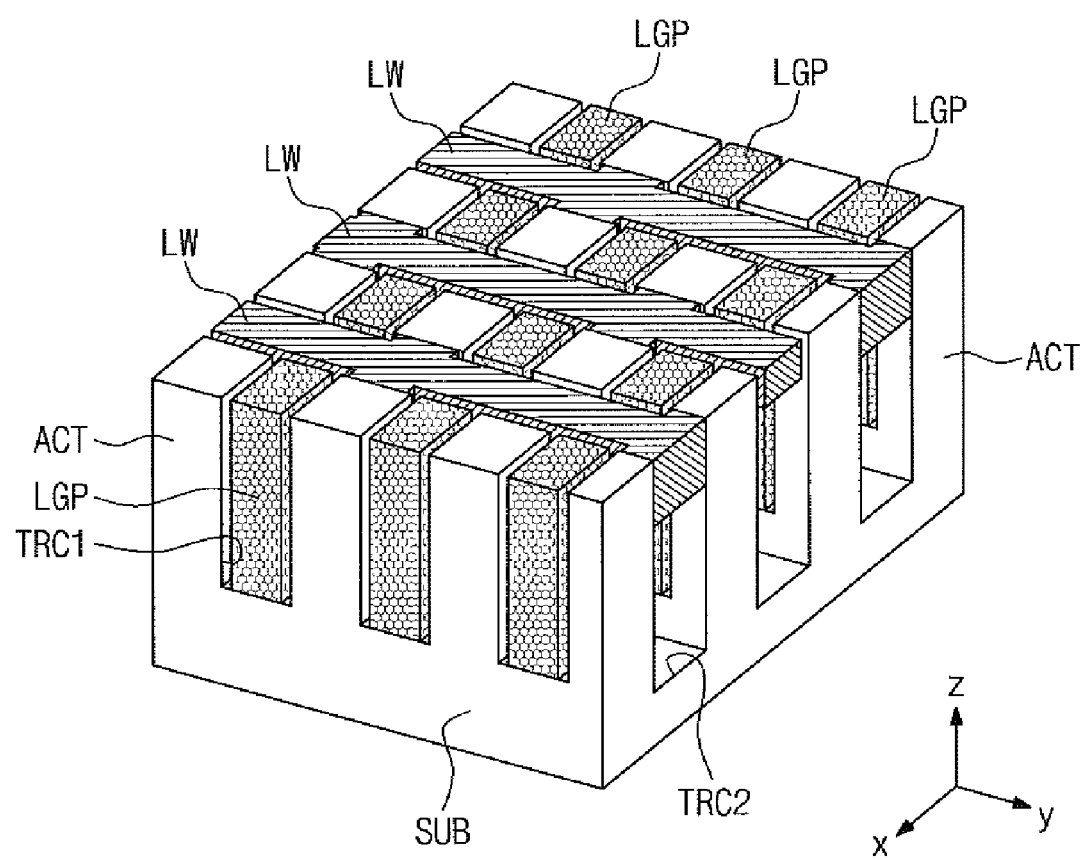

According to embodiments, the lower gate patterns LGP may be formed some of regions which are included in the first trenches TRC1 but not included in the second trenches TRC2. For example, as illustrated in FIGS. 61, 64 and 66, the lower gate patterns LGP may be formed in some regions of the first trenches TRC1, which are not included in the second trenches TRC2 and where the upper gate patterns UGP are not disposed.

Figure 65:
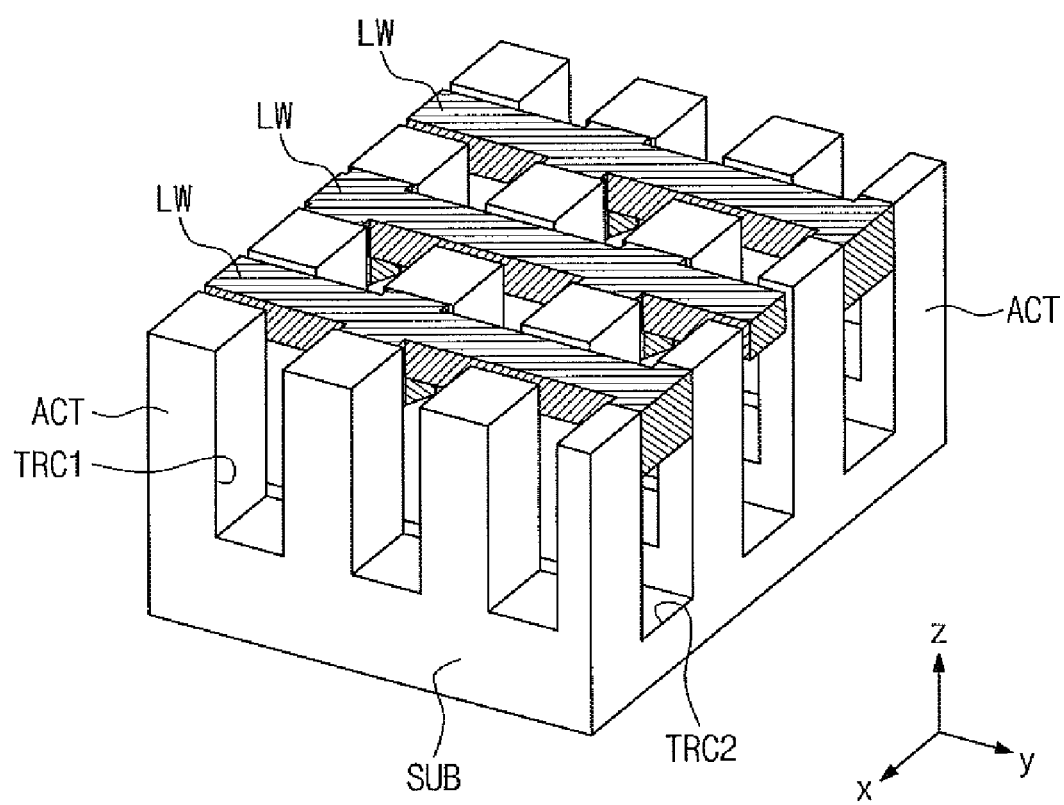
Figure 67:
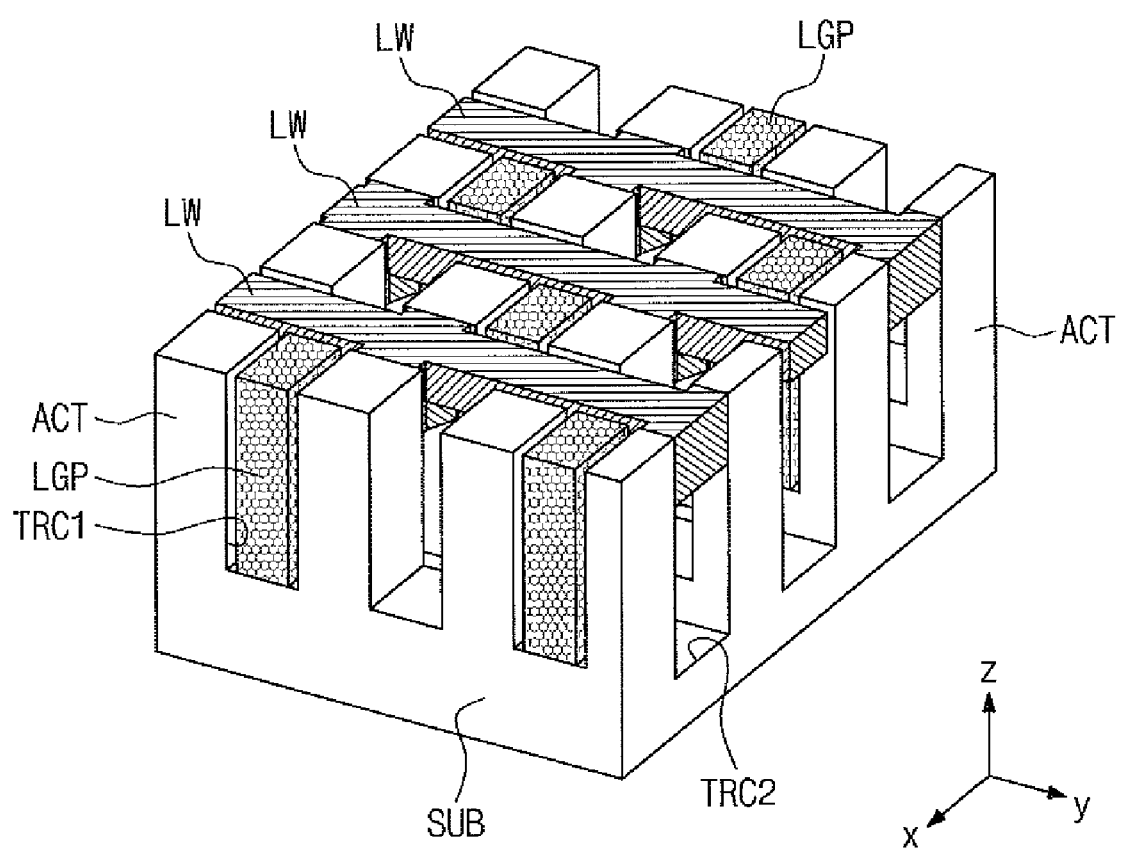
Figure 68:
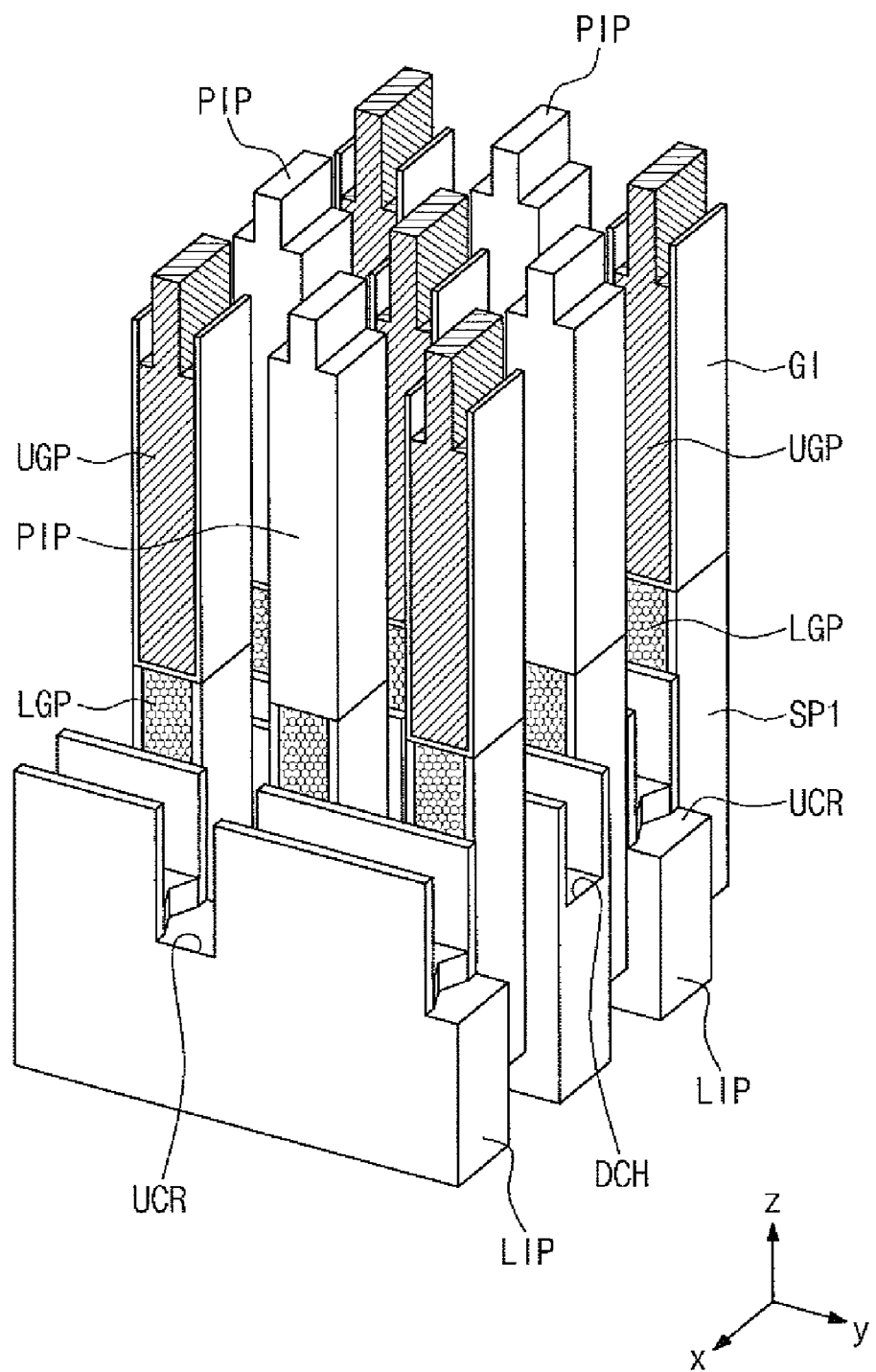
FIGS. 68 to 72 are perspective views illustrating semiconductor devices according to embodiments of the inventive concept.
Figure 69:
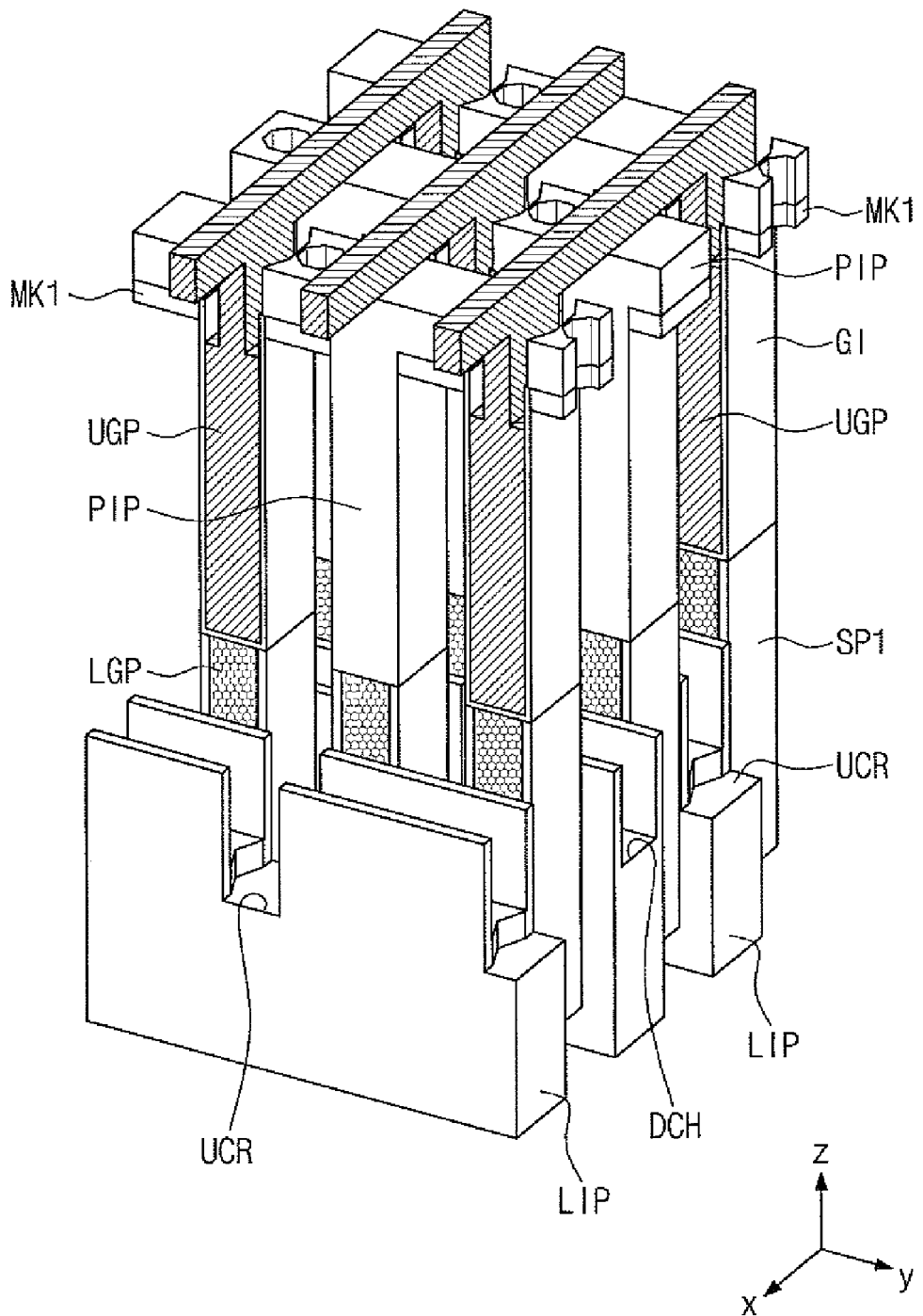
Figure 70:
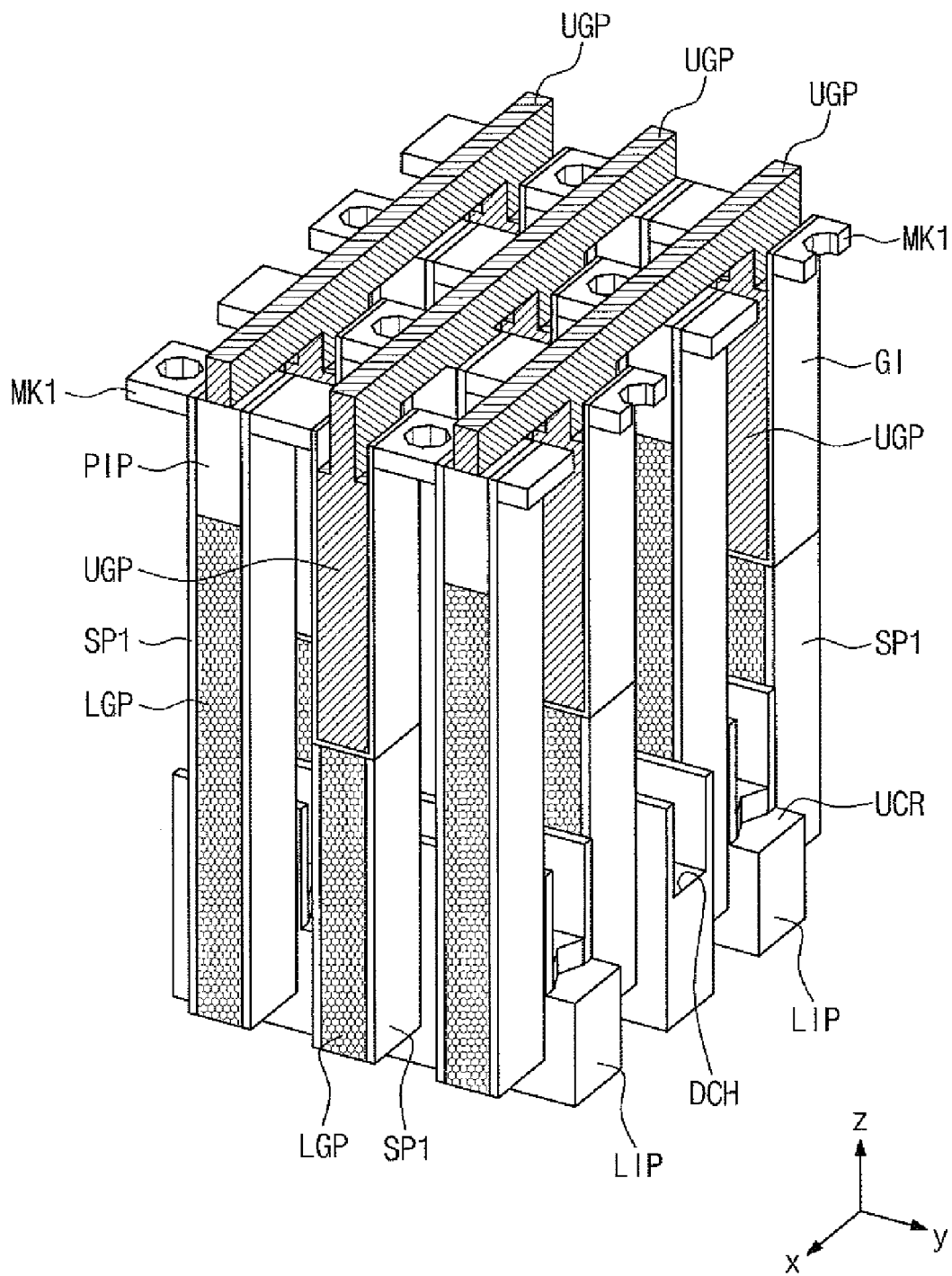
Figure 71:
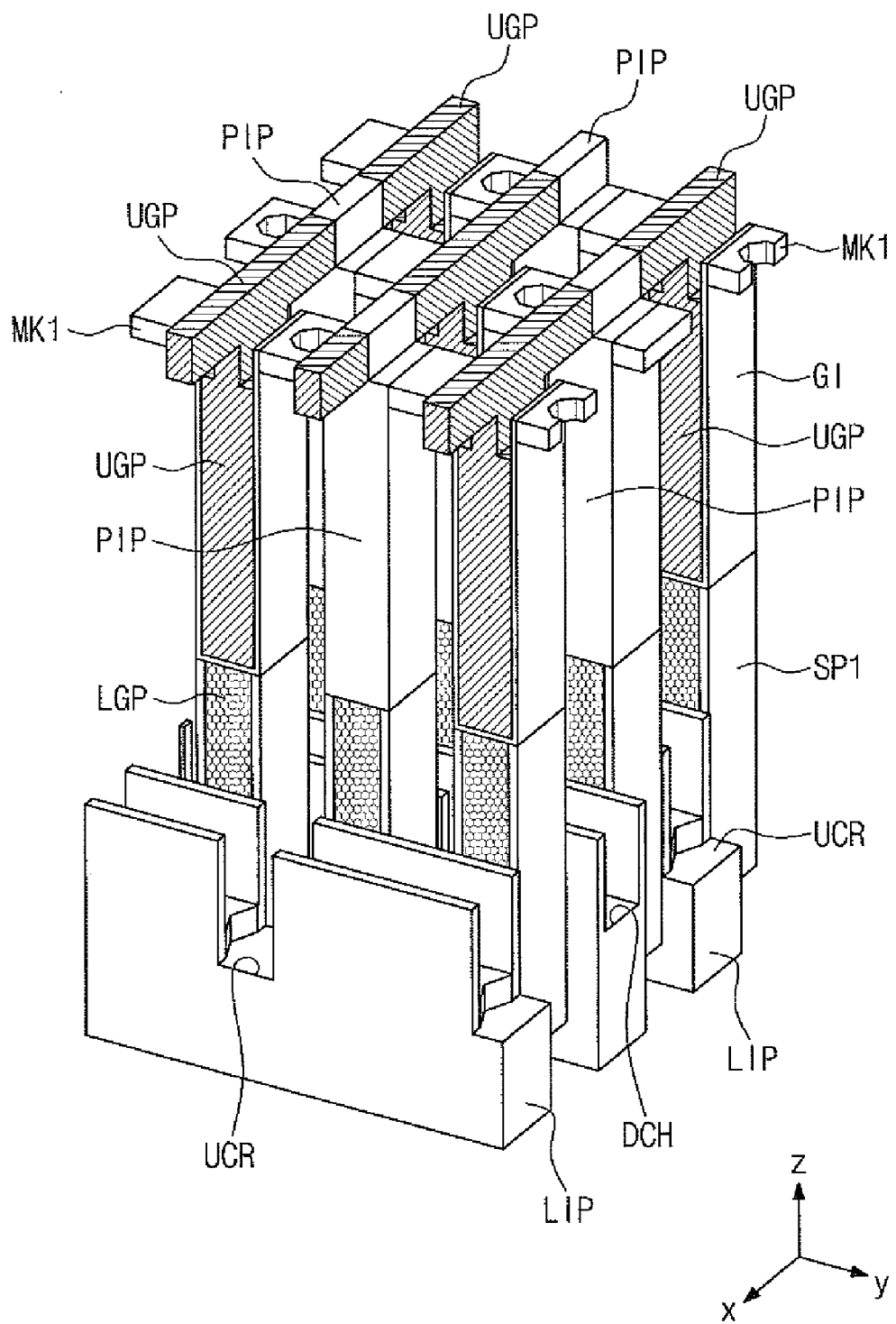
Figure 72:
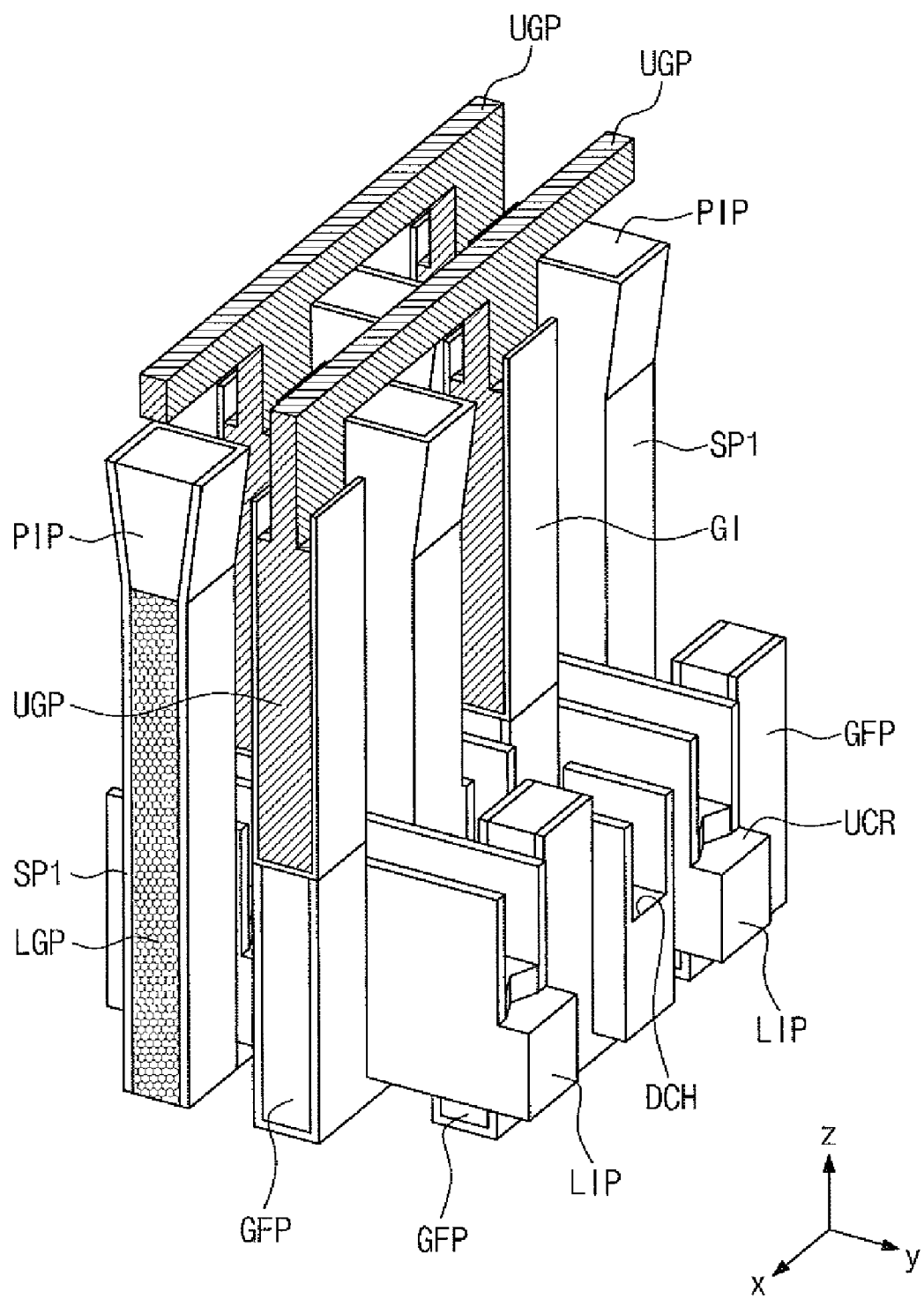

The lower impurity region LIR is electrically connected to the lower wirings LW which are disposed in the second trench TRC2 and cross the active patterns ACT. As illustrated in FIGS. 65 to 67, each of the active patterns ACT is not connected to two lower wirings LW disposed at both sides thereof, but connected to one of the two lower wirings LW. The electrical connected between the active patterns ACT and the lower wirings LW is determined by positions of the junction defining regions and undercut regions UCR, which have been described with reference to FIGS. 14A and 15A. FIG. 67 exemplarily illustrates the connection structure between the active patterns ACT and the lower wirings LW.

FIGS. 68 to 72 are perspective views exemplarily illustrating a semiconductor device according to the technical spirit of the inventive concept. FIGS. 68 to 72 are provided to more clearly visualize shapes and configurations of the insulation patterns (e.g., LIP, PIP, GI, GFP, etc.) or shapes and configuration of upper and lower gate patterns UGP and LGP, according to embodiments of the inventive concept.

Figure 73:
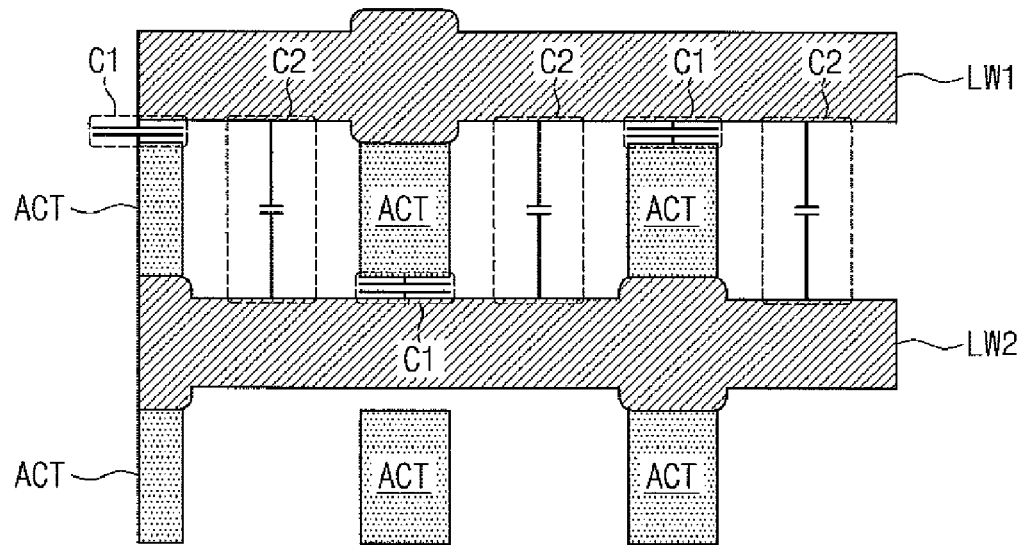
FIGS. 73 and 74 are plan views illustrating active regions of a semiconductor device according to an embodiment of the inventive concept.
Figure 74:
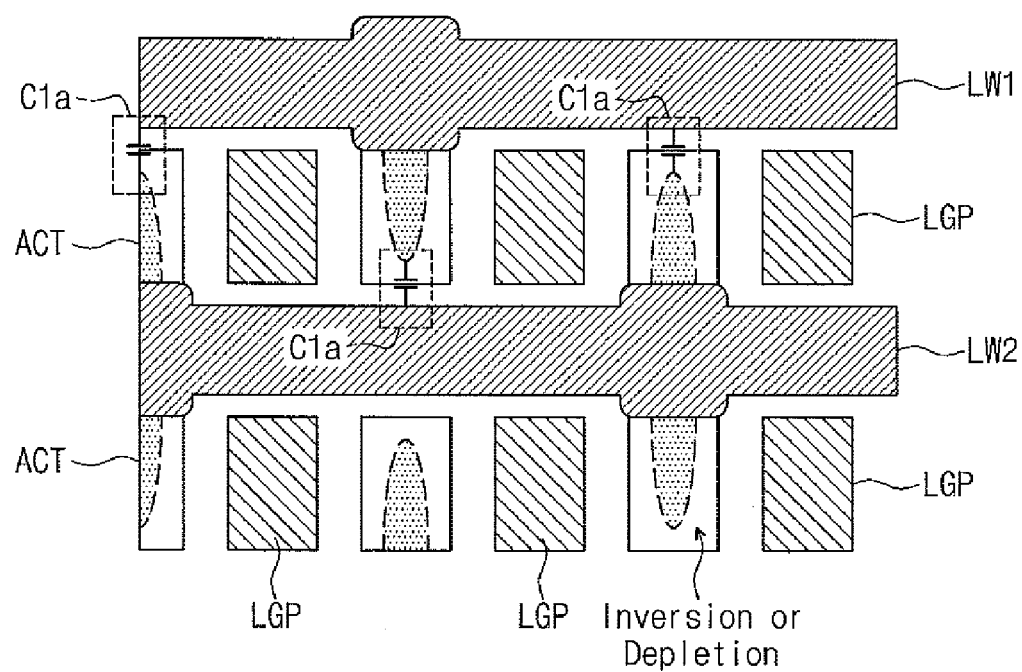

FIGS. 73 and 74 are plan views illustrating an aspect of the inventive concept. FIG. 73 illustrates an embodiment where lower gate patterns are not formed, and FIG. 74 illustrates an embodiment where lower gate patterns are formed between active patterns and between lower wirings. According to the above-described embodiments, since the lower wirings are formed between the active patterns, the two lower wirings LW1 and LW2 adjacent to each other are capacitively coupled and thus parasitic capacitors, which cause data to be disturbed and an operating speed to be decreased, may be formed between the lower wirings LW1 and LW2. For example, as illustrated in FIG. 73, the parasitic capacitors C1 and C2 may be mainly divided into a first parasitic capacitor C1 which is formed between the active pattern ACT and one of the lower wirings LW1 and LW2, and a second parasitic capacitor C2 which is formed between the lower wirings LW1 and LW2. The first parasitic capacitors C1 has a short distance between the lower wiring LW and the active pattern ACT is small, and may thus serve as a capacitor having high capacitance.

As illustrated in FIG. 74, when the lower bypass patterns LBP are formed between the active patterns and between the lower wirings, it is possible to relieve data disturbance or decrease in operating speed caused by the parasitic capacitors C1 and C2.

The lower gate patterns LGP formed of a material with low resistivity is connected to the substrate SUB, and therefore an electric field between the lower wirings LW may be shielded. Accordingly, the generation of the second parasitic capacitors C2 described with reference to FIG. 73 can be suppressed by the lower bypass patterns LBP serving as a shielding element.

Since the lower gate patterns LGP has the substantially same potential as the substrate SUB, portions of the active pattern ACT adjacent to the lower bypass pattern LBP may be in an inversion or depletion state, as illustrated in FIG. 3. This inversion or depletion state leads to a decrease of an area between electrodes of the first parasitic capacitor C1a and an increase in distance between the electrodes. Therefore, the first parasitic capacitor C1a in FIG. 74 may be substantially lower in capacitance than the first parasitic capacitor C1 in FIG. 73.

FIGS. 75 to 79 are perspective views illustrating a method of fabricating a semiconductor device according to an embodiment of the inventive concept.

Figure 75:
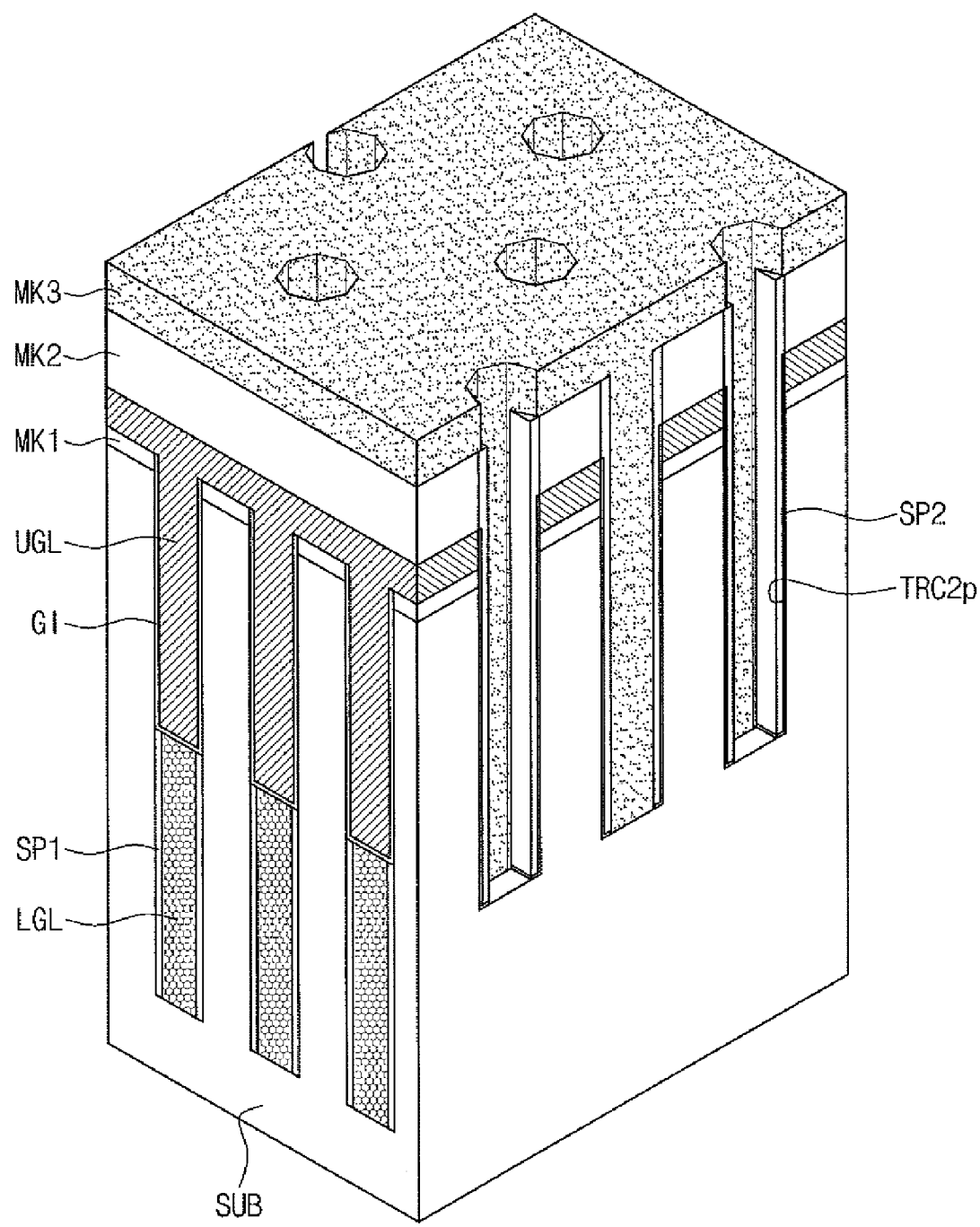
FIGS. 75 to 79 are perspective views illustrating a method of fabricating a semiconductor device according to an embodiment of the inventive concept.
Figure 76:
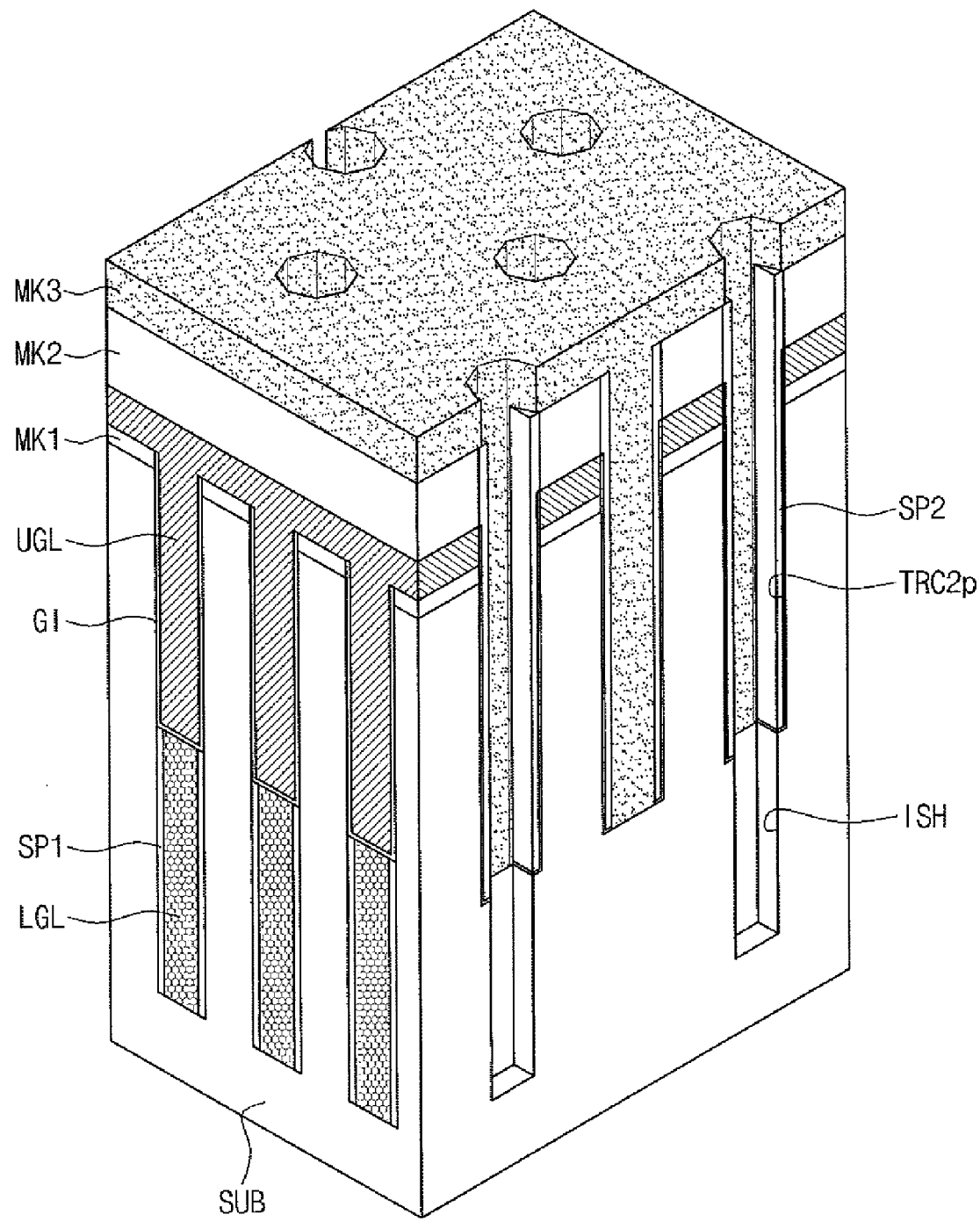

As illustrated in FIG. 75, a third mask pattern MK3 having 2-dimensionally arranged holes is formed on the resultant structure descried with reference to FIGS. 9A and 9B, and the substrate SUB is then etched using the third mask pattern MK3 as an etch mask to thereby form isolation holes ISH under the holes, as illustrated in FIG. 76.

Figure 77:
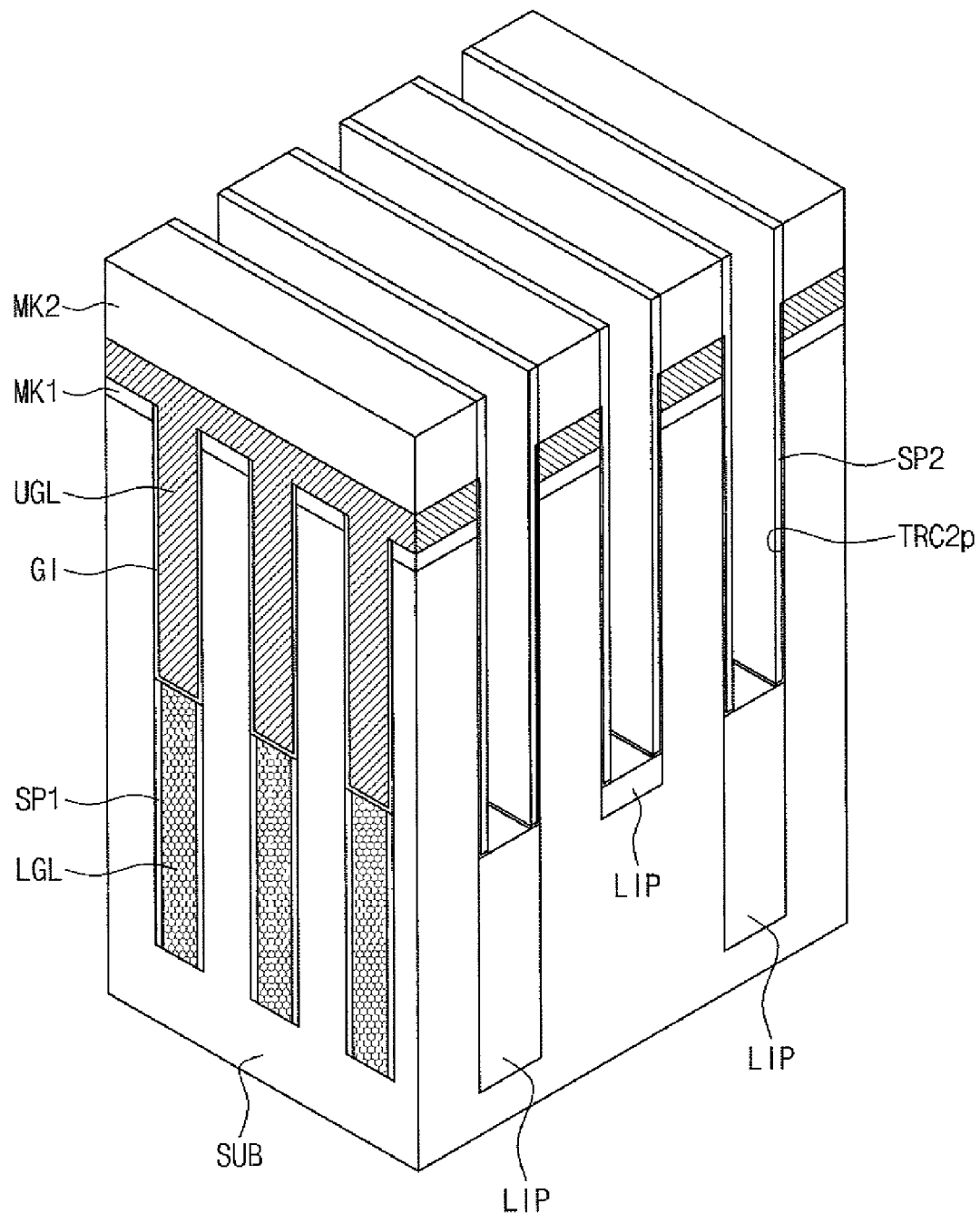

Thereafter, as illustrated in FIG. 77, the third mask pattern MK3 is removed, and a lower insulation pattern LIP is then formed to cover the exposed surface of the substrate SUB. The forming of the lower insulation pattern LIP may be performed using the method described with reference to FIGS. 11A and 11B, and the lower insulation pattern LIP may be formed to fill the isolation holes ISH.

Figure 78:
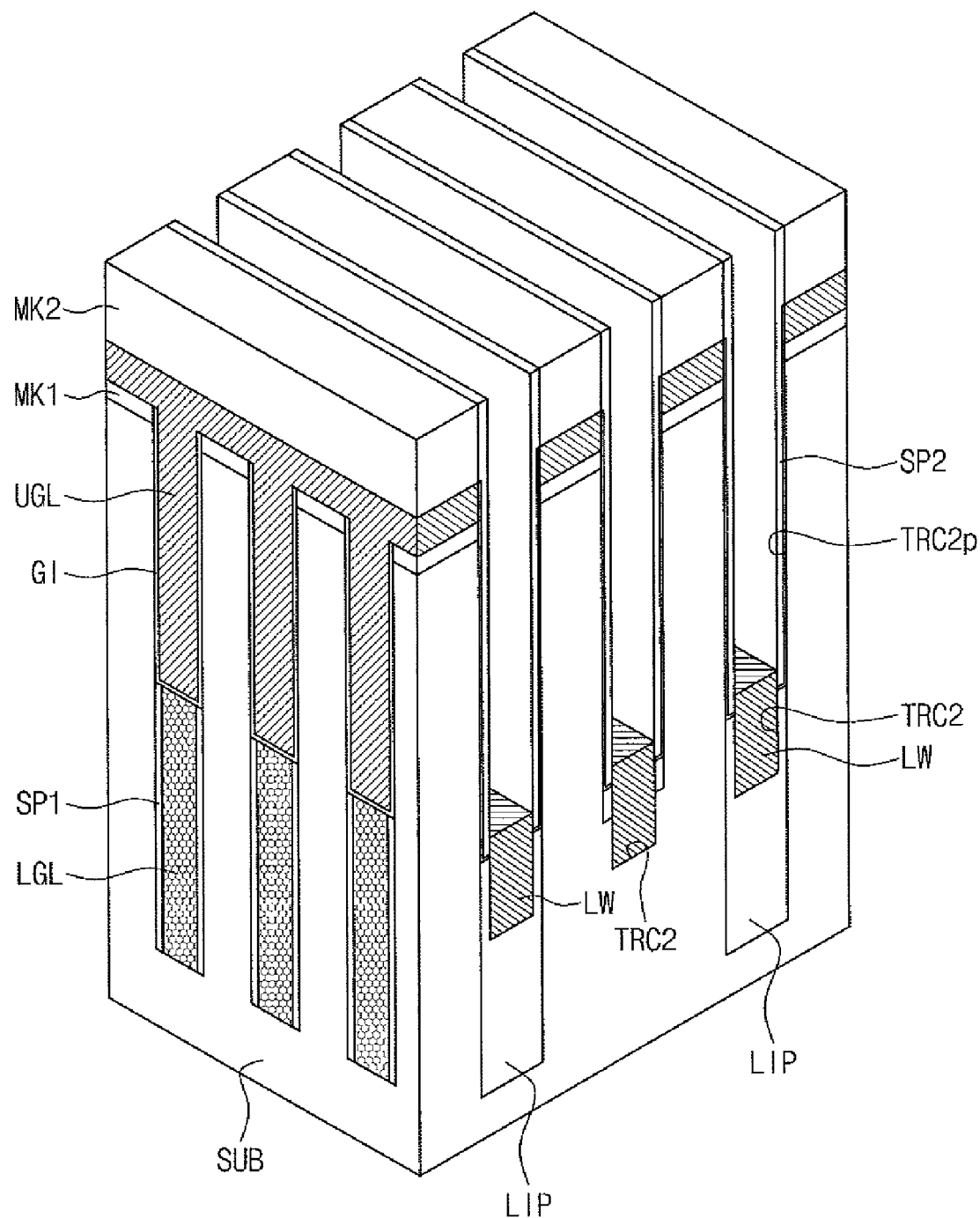
Figure 79:
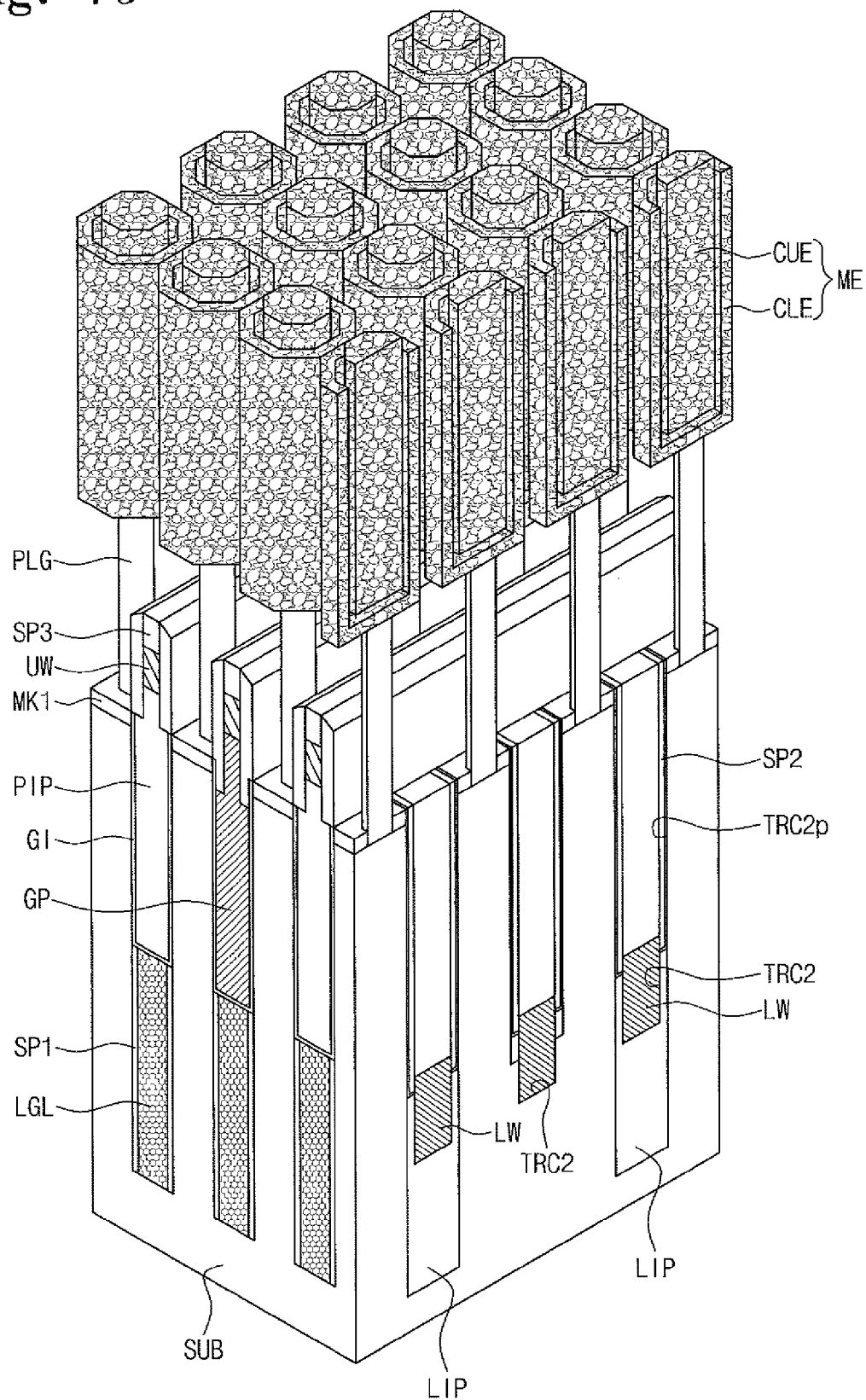

Afterwards, bottom surfaces of the preliminary trenches TRC2p are recessed using the second mask pattern MK2 and the second spacer SP2 as an etch mask. Accordingly, as illustrated in FIG. 78, a second trench TRC2 crossing the active patterns ACT is formed. Lower impurity regions LIR and lower wirings LW are formed using the fabrication method described with reference to FIGS. 15A and 15B. Subsequently, the fabrication processes described with reference to FIGS. 17A to 19A are performed. FIG. 79 exemplarily illustrates a semiconductor device on which theses processes are completely performed.

Figure 80:
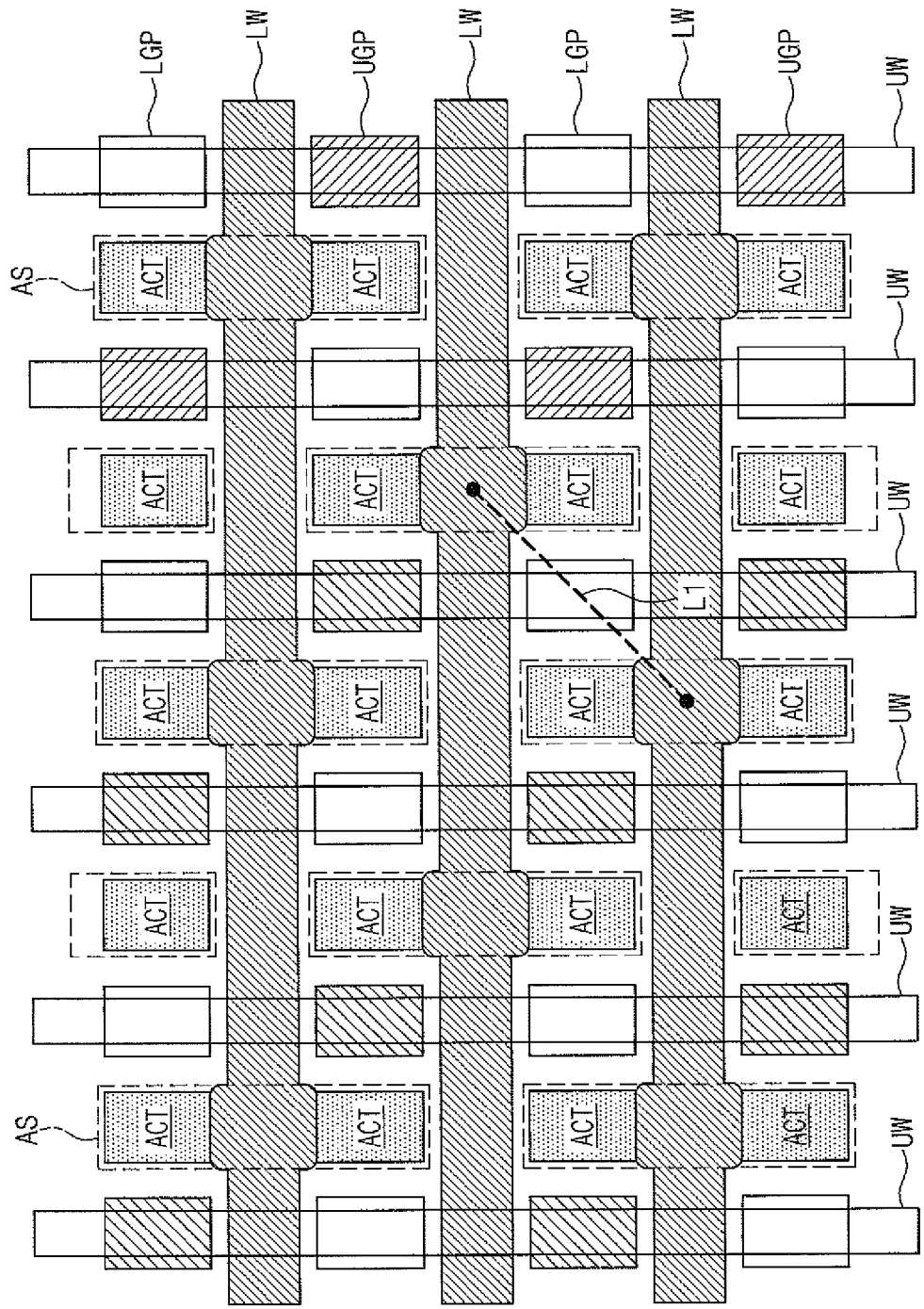
FIGS. 80 and 81 are respectively plan view and perspective view of a semiconductor device according to the embodiment described with reference to FIGS. 75 to 79.
Figure 81:
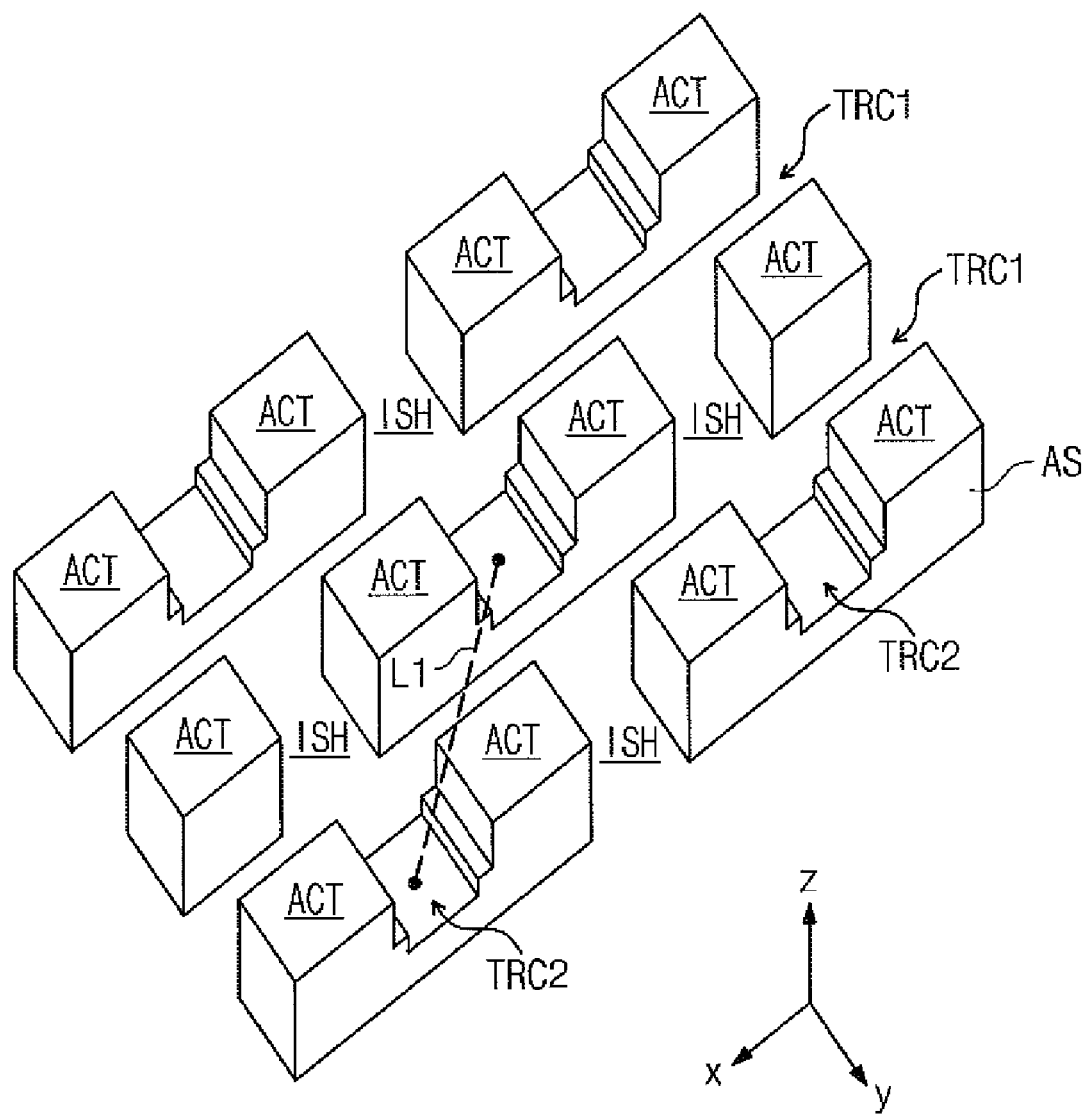

FIGS. 80 and 81 are respectively plan view and perspective view of the semiconductor device according to the embodiment described with reference to FIGS. 75 to 79.

As illustrated in FIGS. 80 and 81, the active patterns may constitute a plurality of active structures AS of which each may include a pair of active patterns ACT formed at both sides of the second trench TRC2. The active structure AS is provided with one pair of sidewalls defined by the first trenches TRC1 and the other pair of sidewalls defined by the isolation holes ISH. The isolation holes ISH are formed in a shape shown in FIG. 75, and thus the active structures AS are in an offset configuration. That is, line L1 connecting the center points of two active structures AS which are adjacent to each other and have different y-coordinates may not be parallel to both of y-axis and x-axis (in other words, both of the upper and lower wirings UW and LW).

Figure 82:
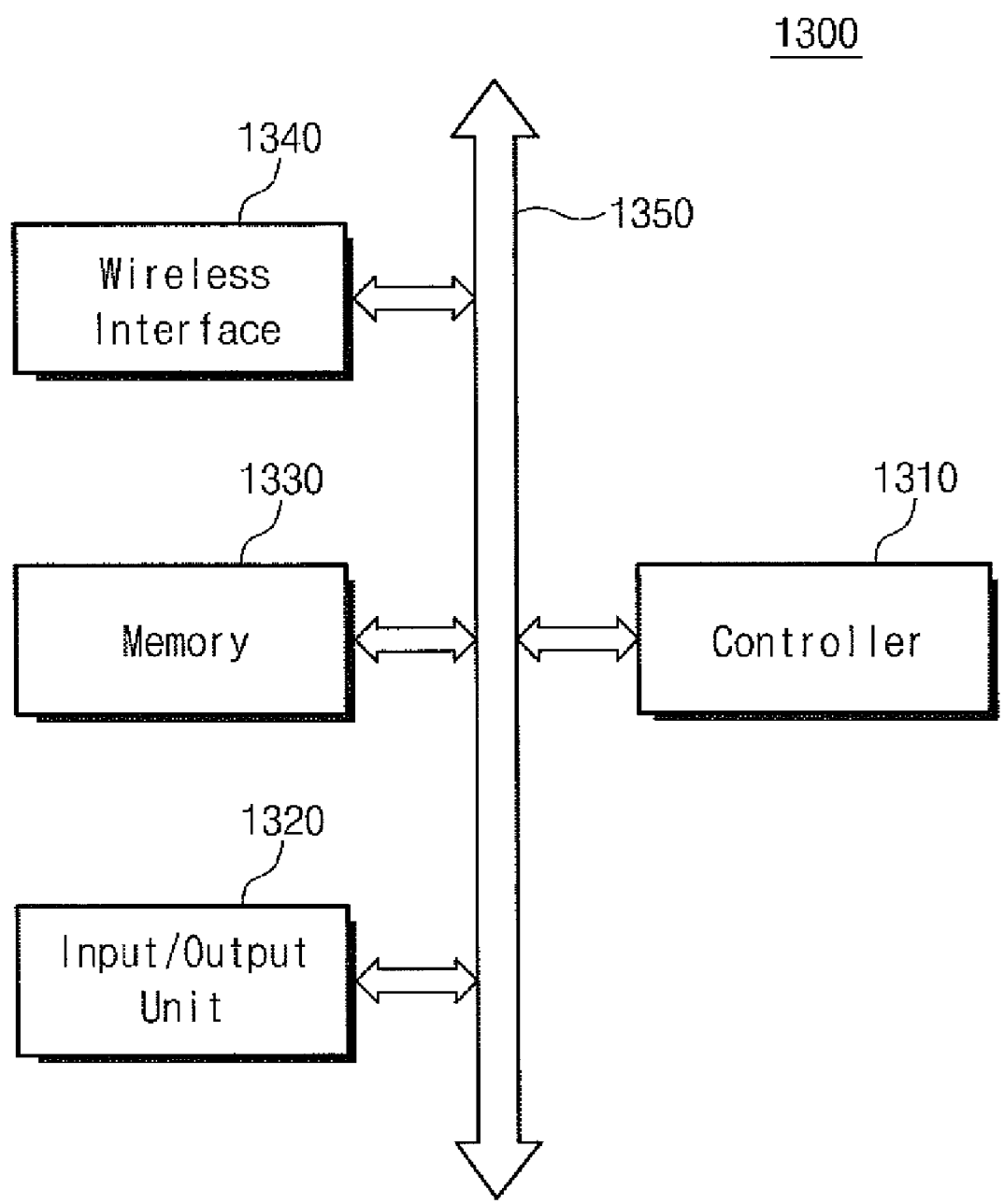
FIGS. 82 and 83 are block diagrams for schematically describing electronic devices including a vertical channel transistor according to embodiments of the inventive concept.
Figure 83:
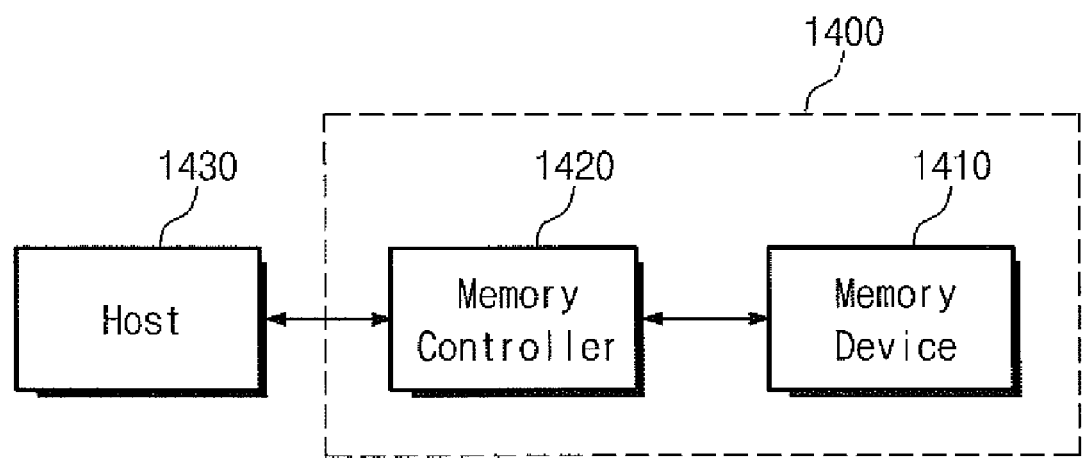

FIGS. 82 and 83 are block diagrams schematically illustrating electronic devices including a vertical channel transistor according to embodiments of the inventive concept.

Referring to FIG. 82, an electronic device 1300 including a vertical channel transistor according to embodiments of the inventive concept may be one of a personal digital assistant (PDA), a laptop computer, a portable computer, a web tablet, a wireless phone, a mobile phone, a digital music player, a wire/wireless electronic device, and a complex electronic device having at least two thereof. The electronic device 1300 may include a controller 1310, an input/output (I/O) unit 1320 such as a keypad, keyboard and a display, a memory 1330, and a wireless interface 1340, which are connected to each other through a bus 1350. The controller 1310 may include, for example, one or more microprocessors, a digital signal processor, a micro-controller, or others similar thereto. The memory 1330, for example, may be used to store a command executed by the controller 1310. The memory 1330 may be used to store user data. The memory 1330 includes a vertical channel transistor according to embodiments of the inventive concept. The electronic device 1300 may use a wireless interface 1340 in order to transmit data to a wireless communication network performing communication using an RF signal or receive data from a network. For example, the wireless interface 1340 may include an antenna, a wireless transceiver, or the like. The electronic device 1300 may be used in a communication interface protocol such as third generation communication system (e.g., CDMA, GSM, NADC, E-TDMA, WCDMA, CDMA2000).

Referring to FIG. 83, semiconductor memory devices according to embodiments of the inventive concept may be used to realize a memory system. The memory system 1400 may include a memory device for storing massive data, and a memory controller 1420. The memory controller 1420 controls stored data to be read from the memory device 1410 or data to be written to the memory device 1410 in response to a read or write request of a host 1430. The memory controller 1420 may constitute an address mapping table for mapping an address provided from the host 1430 such as a mobile apparatus or a computer system onto a physical address. The memory device 1410 may include a vertical channel transistor according to embodiments of the inventive concept.

According to exemplary embodiments of the inventive concept, first and second field effect transistors having different conductivity types are vertically stacked. Here, channel regions of the first and second field effect transistors are formed to directly contact each other. That is, the channel region of the first field effect transistor is used as source/drain electrodes of the second field effect transistor, and the channel region of the second field effect transistor is used as source/drain electrodes of the first field effect transistor. Therefore, a floating body phenomenon of the first or second field effect transistor can be prevented.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device comprising:
a semiconductor substrate;
a semiconductor pillar extending from the semiconductor substrate, the
semiconductor pillar comprising a first region, a second region, and a third region, the second region positioned between the first region and the third region, the third region positioned between the second region and the semiconductor substrate;
a first gate pattern disposed on a sidewall of the second region with a first insulating layer therebetween; and
a second gate pattern disposed on a sidewall of the third region with a second insulating layer therebetween.

2. The semiconductor memory device of claim 1, further comprising a capacitor electrically connected to the first region, a word line electrically connected to the first gate pattern, and a bit line electrically connected to the third region, the bit line disposed between the word line and the substrate, the bit line extending in a first direction and the word line extending in a second direction that is substantially perpendicular to the first direction.

3. The semiconductor memory device of claim 1, wherein the first region and the third region have a first conductivity type, and the second region and the substrate have a second conductivity type being different from the first conductivity type.

4. The semiconductor memory device of claim 1, wherein the first gate pattern and the second gate pattern comprise at least one of a semiconductor material or metal.

5. The semiconductor memory device of claim 1, further comprising a third gate pattern disposed on an opposite sidewall of the third region than that on which the second gate pattern is disposed and disposed substantially coplanar with the first gate pattern with respect to the semiconductor pillar with a third insulating layer therebetween.

6. The semiconductor memory device of claim 5, wherein the second gate pattern extends beyond a boundary between the second region and the third region toward the second region such that a part of the second gate pattern is disposed over the second region.

7. The semiconductor memory device of claim 1, wherein the second gate pattern extends beyond a boundary between the second region and the third region toward the second region such that a part of the second gate pattern is disposed over the second region.

8. A semiconductor memory device comprising:
a semiconductor substrate;
a semiconductor pillar extending from the semiconductor substrate, the semiconductor pillar comprising a first region, a second region, and a third region, the second region positioned between the first region and the third region, the third region positioned between the second region and the semiconductor substrate;

a first gate pattern disposed on a sidewall of the second region with a first insulating layer therebetween;

a second gate pattern disposed on a sidewall of the third region with a second insulating layer therebetween;

a third gate pattern disposed on an opposite sidewall of the third region than that on which the second gate pattern is disposed and disposed substantially coplanar with the first gate pattern with respect to the semiconductor pillar with a third insulating layer therebetween; and a capacitor electrically connected to the first region, a word line electrically connected to the first gate pattern, and a bit line electrically connected to the third region.

9. The semiconductor memory device of claim 8, wherein the first region and the third region have a first conductivity type, and the second region and the substrate have a second conductivity type being different from the first conductivity type.

10. The semiconductor memory device of claim 8, wherein the first gate pattern and the second gate pattern comprise at least one of a semiconductor material or metal.

11. The semiconductor memory device of claim 8, wherein the bit line is disposed between the word line and the substrate, the bit line extending in a first direction and the word line extending in a second direction that is substantially perpendicular to the first direction.

12. The semiconductor memory device of claim 1, wherein the second gate pattern is electrically connected to the semiconductor substrate to have substantially the same potential as the semiconductor substrate.

13. The semiconductor memory device of claim 8, wherein the second gate pattern is electrically connected to the semiconductor substrate to have substantially the same potential as the semiconductor substrate.

14. The semiconductor memory device of claim 1, wherein the second gate pattern is electrically separated from the third region by an insulator interposed therebetween.

15. The semiconductor memory device of claim 8, wherein the second gate pattern is electrically separated from the third region by an insulator interposed therebetween.

* * * * *